United States Patent
Kumar et al.

(10) Patent No.: US 11,532,316 B2
(45) Date of Patent: Dec. 20, 2022

(54) METHODS AND APPARATUS SYSTEMS FOR UNIFIED SPEECH AND AUDIO DECODING IMPROVEMENTS

(71) Applicant: Dolby International AB, Zuidoost (NL)

(72) Inventors: Rajat Kumar, Bangalore (IN); Ramesh Katuri, Bangalore (IN); Saketh Sathuvalli, Bangalore (IN); Reshma Rai, Bangalore (IN)

(73) Assignee: Dolby International AB, Amsterdam Zuidoost (NL)

( * ) Notice: Subject to any disclaimer, the term of this patent is extended or adjusted under 35 U.S.C. 154(b) by 310 days.

(21) Appl. No.: 16/955,075

(22) PCT Filed: Dec. 19, 2018

(86) PCT No.: PCT/EP2018/085938
§ 371 (c)(1),
(2) Date: Jun. 18, 2020

(87) PCT Pub. No.: WO2019/121980
PCT Pub. Date: Jun. 27, 2019

(65) Prior Publication Data
US 2021/0005212 A1    Jan. 7, 2021

Related U.S. Application Data

(60) Provisional application No. 62/665,746, filed on May 2, 2018.

(30) Foreign Application Priority Data

Dec. 19, 2017 (IN) .............................. 201741045575

(51) Int. Cl.
*G10L 19/26*    (2013.01)
*G06F 1/03*    (2006.01)
(Continued)

(52) U.S. Cl.
CPC ................ *G10L 19/26* (2013.01); *G06F 1/03* (2013.01); *G06F 17/142* (2013.01); *G06F 17/16* (2013.01);
(Continued)

(58) Field of Classification Search
CPC ....... G10L 19/26; G10L 19/032; G10L 19/18; G10L 19/07; G10L 19/0212;
(Continued)

(56) References Cited

U.S. PATENT DOCUMENTS 8,155,954 B2    4/2012 Edler
2001/0032227 A1    10/2001 Jaber
(Continued)

FOREIGN PATENT DOCUMENTS

| RU | 2520402 C2 | 6/2014 |
| RU | 2591661 C2 | 7/2016 |
| WO | 2016146492 | 9/2016 |

OTHER PUBLICATIONS

"Information Technology—MPEG Audio Technologies—Part 3: Unified Speech and Audio Coding" ISO/IEC 23003, Mar. 23, 2012, pp. 1-278.
(Continued)

*Primary Examiner* — Tan V Mai

(57) ABSTRACT

The present disclosure relates to an apparatus for decoding an encoded Unified Audio and Speech stream. The apparatus comprises a core decoder for decoding the encoded Unified Audio and Speech stream. The core decoder includes a fast Fourier transform, FFT, module implementation based on a Cooley-Tuckey algorithm. The FFT module is configured to determine a discrete Fourier transform, DFT. Determining the DFT involves recursively breaking down the DFT into small FFTs based on the Cooley-Tucker algorithm and using
(Continued)

radix-4 if a number of points of the FFT is a power of 4 and using mixed radix if the number is not a power of 4. Performing the small FFTs involves applying twiddle factors. Applying the twiddle factors involves referring to pre-computed values for the twiddle factors. The present disclosure further relates to an apparatus for decoding an encoded Unified Audio and Speech stream, in which the core decoder is configured to decode an LPC filter that has been quantized using a line spectral frequency, LSF, representation from the Unified Audio and Speech stream. Decoding the LPC filter from the Unified Audio and Speech stream comprises computing a first-stage approximation of a LSF vector, reconstructing a residual LSF vector, if an absolute quantization mode has been used for quantizing the LPC filter, determining inverse LSF weights for inverse weighting of the residual LSF vector by referring to pre-computed values for the inverse LSF weights or their respective corresponding LSF weights, inverse weighting the residual LSF vector by the determined inverse LSF weights, and calculating the LPC filter based on the inversely-weighted residual LSF vector and the first-stage approximation of the LSF vector. The present disclosure further relates to corresponding methods and storage media.

11 Claims, 8 Drawing Sheets

(51) Int. Cl.
  *G06F 17/14* (2006.01)
  *G06F 17/16* (2006.01)
  *G10L 19/032* (2013.01)
  *H03M 7/30* (2006.01)
(52) U.S. Cl.
  CPC ......... *G10L 19/032* (2013.01); *H03M 7/3082* (2013.01); *H03M 7/6005* (2013.01)
(58) Field of Classification Search
  CPC . G10L 19/008; H03M 7/3082; H03M 7/6005; G06F 17/16; G06F 17/142; G06F 1/03

USPC ........................................................ 704/500
See application file for complete search history.

(56) References Cited

U.S. PATENT DOCUMENTS

| | | |
|---|---|---|
| 2008/0263285 A1 | 10/2008 | Sharma |
| 2010/0023325 A1 | 1/2010 | Gournay |
| 2013/0034480 A1 | 2/2013 | Presswood, Jr. |
| 2013/0332156 A1 | 12/2013 | Tackin |
| 2015/0124974 A1 | 5/2015 | Kim |
| 2015/0269948 A1 | 9/2015 | Purnhagen |
| 2015/0317986 A1 | 11/2015 | Kjoerling |
| 2016/0142854 A1 | 5/2016 | Fueg |
| 2016/0232901 A1 | 8/2016 | Ghido |
| 2017/0134875 A1 | 5/2017 | Schuijers |
| 2017/0178653 A1 | 6/2017 | Davis |
| 2017/0278521 A1 | 9/2017 | Beack |
| 2017/0365261 A1 | 12/2017 | Purnhagen |

OTHER PUBLICATIONS

"ISO/IEC 23003-1 :2006/FDIS, MPEG Surround", 77. MPEG Meeting; Jul. 17, 2006-Jul. 21, 2006; Klagenfurt; (Motion Picture Expert Group or ISO/IEC JTC1/SC29/WG11), No. N8324, Jul. 21, 2006 (Jul. 21, 2006).

Anonymous: "Study on ISO/IEC 23003-3:201 x/DIS of Unified Speech and Audio Coding", 96. MPEG Meeting;Mar. 21, 2011-Mar. 25, 2011; Geneva; (Motion Picture Expert Group or ISO/ EC JTC1 /SC29/WG11 ), No. N12013, Apr. 22, 2011 (Apr. 22, 2011).

Ku, Kuein-An A. et al "Gather/Scatter Hardware Support for Accelerating Fast Fourier Transform" Journal of Systems Architecture 56 (2010) 667-684.

Mario, Garrido, "A New Representation of FFT Algorithms Using Triangular Matrices" IEEE Transactions on Circuits and Systems, IEEE, Sep. 27, 2016, pp. 1737-1745.

Neuendorf, M. et al "Unified Speech and Audio Coding Scheme for High Quality at Low Bitrates" Acoustics, Speech and Signal Processing, Conference on IEEE, Apr. 19, 2009, pp. 1-4.

Zhong, H. et al "QMF Based Harmonic Spectral Band Replication" AES, Oct. 2011, pp. 66-74.

METHODS AND APPARATUS SYSTEMS FOR UNIFIED SPEECH AND AUDIO DECODING IMPROVEMENTS

CROSS-REFERENCE TO RELATED APPLICATIONS

This application claims priority of the following priority applications: IN provisional application 201741045575 (reference: D17116CINP1), filed 19 Dec. 2017 and U.S. provisional application 62/665,746 (reference: D17116CUSP1), filed 2 May 2018, which are hereby incorporated by reference.

TECHNICAL FIELD

The present document relates to apparatus and methods for decoding an encoded Unified Audio and Speech (USAC) stream. The present document further relates to such apparatus and method that reduce a computational load at run time.

BACKGROUND

Encoders and decoders for unified speech and audio coding (USAC), as specified in the international standard ISO/IEC 23003-3:2012 (henceforth referred to as USAC standard) include several modules (units) that require multiple complex computation steps. Each of these computation steps may be taxing for hardware systems implementing these encoders and decoders. Examples of such modules include the MPS212 module (or tool), the QMF harmonic transposer, the LPC module, and the IMDCT module.

Thus, there is a need for an implementation of the modules of USAC encoders and decoders that reduce a computational load during run time.

SUMMARY

In view of the above problems, the present document provides apparatus and methods for decoding an encoded Unified Audio and Speech (USAC) stream as well as corresponding computer programs and storage media, having the features of the respective independent claims.

An aspect of the disclosure relates to an apparatus for decoding an encoded USAC stream. The apparatus may include a core decoder for decoding the encoded USAC stream. The core decoder may include an upmixing unit adapted to perform mono to stereo upmixing. The upmixing unit may include a decorrelator unit D adapted to apply a decorrelation filter to an input signal. The decorrelator unit may be adapted to determine filter coefficients for the decorrelation filter by referring to pre-computed values.

Another aspect of the disclosure relates to an apparatus for encoding an audio signal into a USAC stream. The apparatus may include a core encoder for encoding the USAC stream. The core encoder may be adapted to determine filter coefficients for a decorrelation filter off-line for use in an upmixing unit of a decoder for decoding the USAC stream.

Another aspect of the disclosure relates to a method of decoding an encoded USAC stream. The method may include decoding the encoded USAC stream. The decoding may include mono to stereo upmixing. The mono to stereo upmixing may include applying a decorrelation filter to an input signal. Applying the decorrelation filter may involve determining filter coefficients for the decorrelation filter by referring to pre-computed values.

Another aspect of the disclosure relates to a method of encoding an audio signal into a USAC stream. The method may include encoding the USAC stream. The encoding may include determining filter coefficients for a decorrelation filter off-line for use in an upmixing unit of a decoder for decoding the encoded USAC stream.

Another aspect of the disclosure relates to a further apparatus for decoding an encoded USAC stream. The apparatus may include a core decoder for decoding the encoded USAC stream. The core decoder may include an eSBR unit for extending a bandwidth of an input signal. The eSBR unit may include a QMF based harmonic transposer. The QMF based harmonic transposer may be configured to process the input signal in the QMF domain, in each of a plurality of synthesis subbands, to extend the bandwidth of the input signal. The QMF based harmonic transposer may be further configured to operate at least in part based on pre-computed information.

Another aspect of the disclosure relates to a further method of decoding an encoded USAC stream. The method may include decoding the encoded USAC stream. The decoding may include extending a bandwidth of an input signal. Extending the bandwidth of the input signal may involve processing the input signal in the QMF domain, in each of a plurality of synthesis subbands. The processing the input signal in the QMF domain may operate at least in part based on pre-computed information.

Another aspect of the disclosure relates to a further apparatus for decoding an encoded USAC stream. The apparatus may include a core decoder for decoding the encoded USAC stream. The core decoder may include a fast Fourier transform, FFT, module implementation based on a Cooley-Tuckey algorithm. The FFT module may be configured to determine a discrete Fourier transform, DFT. Determining the DFT may involve recursively breaking down the DFT into small FFTs based on the Cooley-Tucker algorithm. Determining the DFT may further involve using radix-4 if a number of points of the FFT is a power of 4 and using mixed radix if the number is not a power of 4. Performing the small FFTs may involve applying twiddle factors. Applying the twiddle factors may involve referring to pre-computed values for the twiddle factors.

Another aspect of the disclosure relates to a further apparatus for decoding an encoded USAC stream. The apparatus may include a core decoder for decoding the encoded USAC stream. The encoded USAC stream may include a representation of a linear predictive coding, LPC, filter that has been quantized using a line spectral frequency, LSF, representation. The core decoder may be configured to decode the LPC filter from the USAC stream. Decoding the LPC filter from the USAC stream may include computing a first-stage approximation of a LSF vector. Decoding the LPC filter from the USAC stream may further include reconstructing a residual LSF vector. Decoding the LPC filter from the USAC stream may further include, if an absolute quantization mode has been used for quantizing the LPC filter, determining inverse LSF weights for inverse weighting of the residual LSF vector by referring to pre-computed values for the inverse LSF weights or their respective corresponding LSF weights. Decoding the LPC filter from the USAC stream may further include inverse weighting the residual LSF vector by the determined inverse LSF weights. Decoding the LPC filter from the USAC stream may yet further include calculating the LPC filter based on the inversely-weighted residual LSF vector and the first-stage approximation of the LSF vector. The LSF weights may be obtainable using the following equations $$w(i) = \frac{1}{W} * \frac{400}{\sqrt{d_i \cdot d_{i+1}}}, i = 0...15$$

$$d_0 = LSF1st[0]$$

$$d_{16} = SF/2 - LSF1st[15]$$

$$d_i = LSF1st[i] - LSF1st[i-1], i = 1...15,$$

where i is an index indicating a component of the LSF vector, w(i) are the LSF weights, W is a scaling factor, and LSF1st is the first-stage approximation of the LSF vector.

Another aspect of the disclosure relates to a further method of decoding an encoded USAC stream. The method may include decoding the encoded USAC stream. The decoding may include using a fast Fourier transform, FFT, module implementation based on a Cooley-Tuckey algorithm. The FFT module implementation may include determining a discrete Fourier transform, DFT. Determining the DFT may involve recursively breaking down the DFT into smaller FFTs based on the Cooley-Tucker algorithm. Determining the DFT may further involve using radix-4 if a number of points of the FFT is a power of 4 and using mixed radix if the number is not power of 4. Performing the small FFTs may involve applying twiddle factors. Applying the twiddle factors may involve referring to pre-computed values for the twiddle factors.

Another aspect of the disclosure relates to a further method of decoding an encoded USAC stream. The method may include decoding the encoded USAC stream. The encoded USAC stream may include a representation of a linear predictive coding, LPC, filter that has been quantized using a line spectral frequency, LSF, representation. The decoding may include decoding the LPC filter from the USAC stream. Decoding the LPC filter from the USAC stream may include computing a first-stage approximation of a LSF vector. Decoding the LPC filter from the USAC stream may further include reconstructing a residual LSF vector. Decoding the LPC filter from the USAC stream may further include, if an absolute quantization mode has been used for quantizing the LPC filter, determining inverse LSF weights for inverse weighting of the residual LSF vector by referring to pre-computed values for the inverse LSF weights or their respective corresponding LSF weights. Decoding the LPC filter from the USAC stream may further include inverse weighting the residual LSF vector by the determined inverse LSF weights. Decoding the LPC filter from the USAC stream may yet further include calculating the LPC filter based on the inversely-weighted residual LSF vector and the first-stage approximation of the LSF vector. The LSF weights may be obtainable using the following equations $$w(i) = \frac{1}{W} * \frac{400}{\sqrt{d_i \cdot d_{i+1}}}, i = 0...15$$

$$d_0 = LSF1st[0]$$

$$d_{16} = SF/2 - LSF1st[15]$$

$$d_i = LSF1st[i] - LSF1st[i-1], i = 1...15,$$

where i is an index indicating a component of the LSF vector, w(i) are the LSF weights, W is a scaling factor, and LSF1st is the first-stage approximation of the LSF vector.

Further aspects of the disclosure relate to recording media including software programs adapted for execution on a processor and for performing the method steps of the methods according to the above aspects of the disclosure.

DETAILED DESCRIPTION

Figure 1:
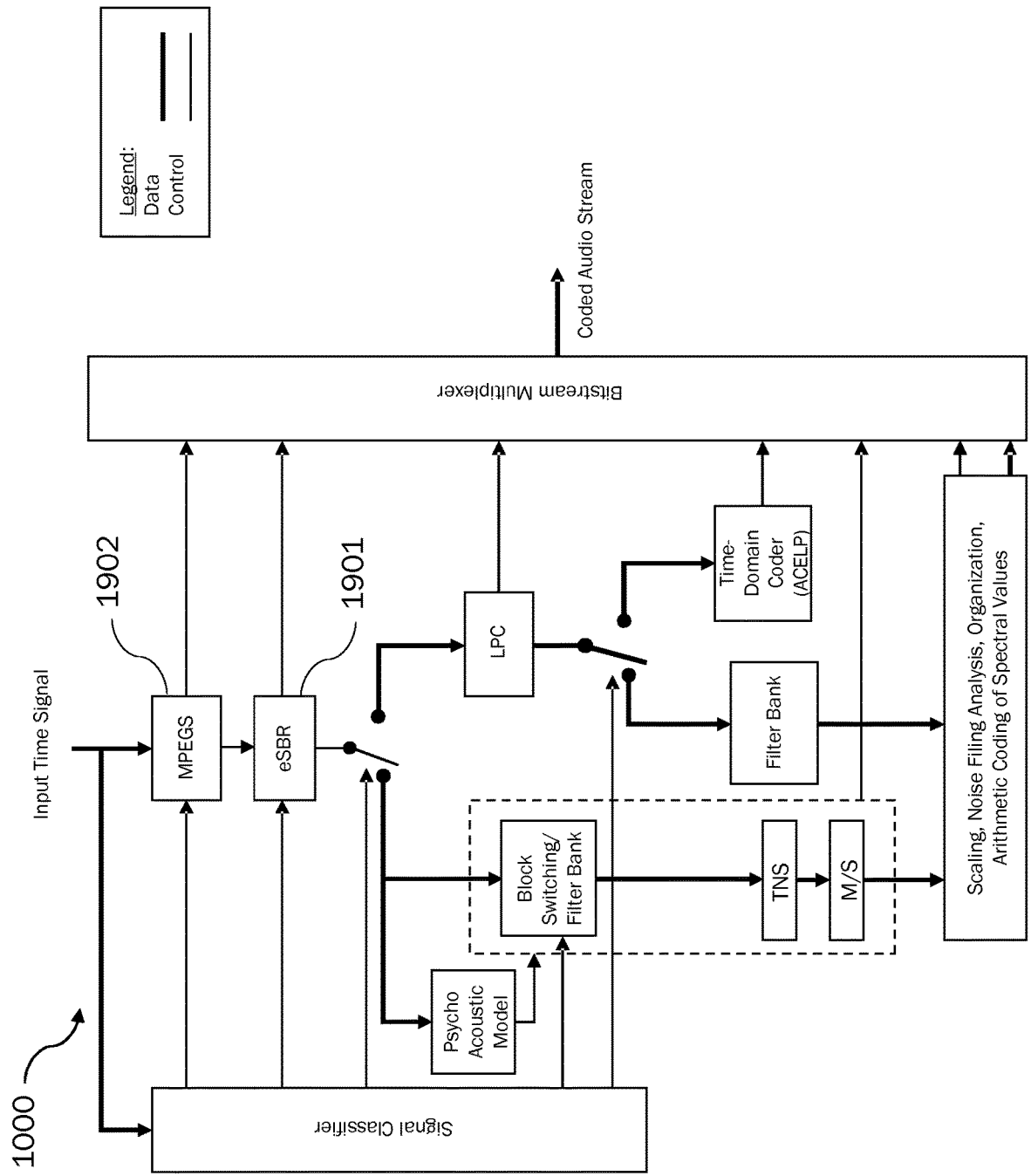
FIG. 1 schematically illustrates an example of an encoder for USAC.
Figure 2:
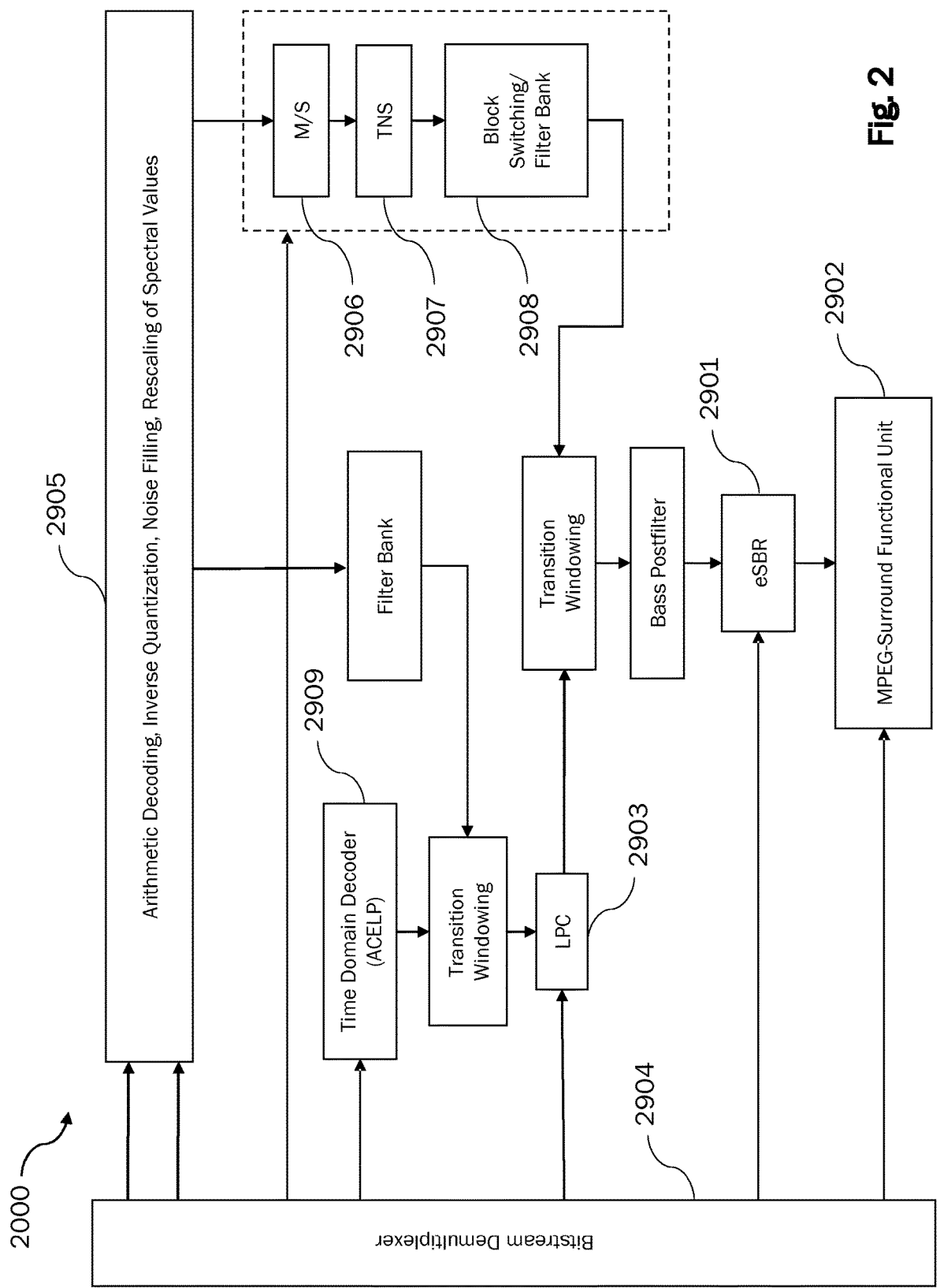
FIG. 2 schematically illustrates an example of a decoder for USAC.

FIGS. 1 and 2 illustrate an example of an encoder 1000 and an example of a decoder 2000, respectively, for unified speech and audio coding (USAC).

FIG. 1 illustrates an example of a USAC encoder 1000. The USAC encoder 1000 includes an MPEG Surround (MPEGS) functional unit 1902 to handle stereo or multi-channel processing and an enhanced SBR (eSBR) unit 1901 that handles the parametric representation of the higher audio frequencies in the input signal. Then there are two branches 1100, 1200, a first path 1100 including a modified Advanced Audio Coding (AAC) tool path and a second path 1200 including a linear prediction coding (LP or LPC domain) based path, which in turn features either a frequency domain representation or a time domain representation of the LPC residual. All transmitted spectra for both, AAC and LPC, may be represented in the MDCT domain following quantization and arithmetic coding. The time domain representation may use an ACELP excitation coding scheme.

As noted above, there may be a common (initial) pre/post processing process performed by the MPEGS functional 1902 unit to handle stereo or multi-channel processing and the eSBR unit 2901, respectively, which handles the parametric representation of the higher audio frequencies in the input signal and which may make use of the harmonic transposition methods outlined in the present document.

The eSBR unit 1901 of the encoder 1000 may comprise the high frequency reconstruction systems outlined in the present document. In particular, the eSBR unit 1901 may comprise an analysis filter bank in order to generate a plurality of analysis subband signals. This analysis subband signals may then be transposed in a non-linear processing unit to generate a plurality of synthesis subband signals, which may then be inputted to a synthesis filter bank in order to generate a high frequency component. Encoded data related to the high frequency component is merged with the other encoded information in a bitstream multiplexer and forwarded as an encoded audio stream to a corresponding decoder 2000.

Figure 3:
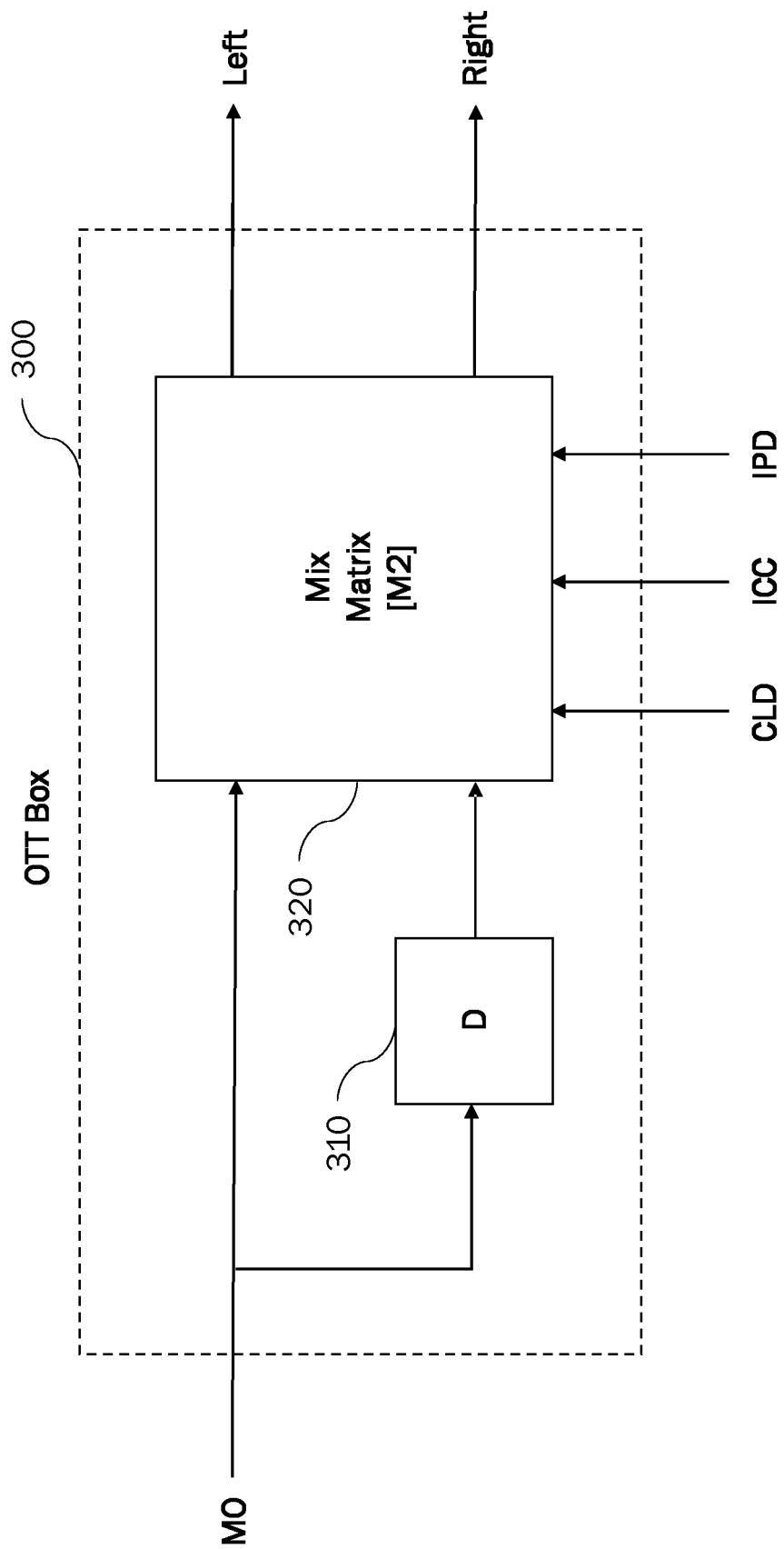
FIG. 3 schematically illustrates an OTT box of the decoder of FIG. 2.

FIG. 2 illustrates an example of a USAC decoder 2000. The USAC decoder 2000 includes an MPEG Surround functional unit 2902 to handle stereo or multi-channel processing. The MPEG Surround functional unit 2902 may be described in clause 7.11 of the USAC standard, for example. This clause is hereby incorporated by reference in its entirety. The MPEG Surround functional unit 2902 may include an OTT box (OTT decoding block), as an example of an upmixing unit, which can perform mono to stereo upmixing. An example of the OTT box 300 is illustrated in FIG. 3. The OTT box 300 may include a decorrelator D 310 (decorrelator block) that is provided a mono input signal MO. The OTT box 300 may further include a mixing matrix (or mixing module applying a mixing matrix) 320. The decorrelator D 310 may provide a decorrelated version of the input mono signal MO. The mixing matrix 320 may mix the input mono signal MO and the decorrelated version thereof to generate the channels (e.g., Left, Right) of the desired stereo signal. The mixing matrix may be based on control parameters CLD, ICC, and IPD, for example. The decorrelator D 310 may comprise an all-pass decorrelator $D_{AP}$.

Figure 4:
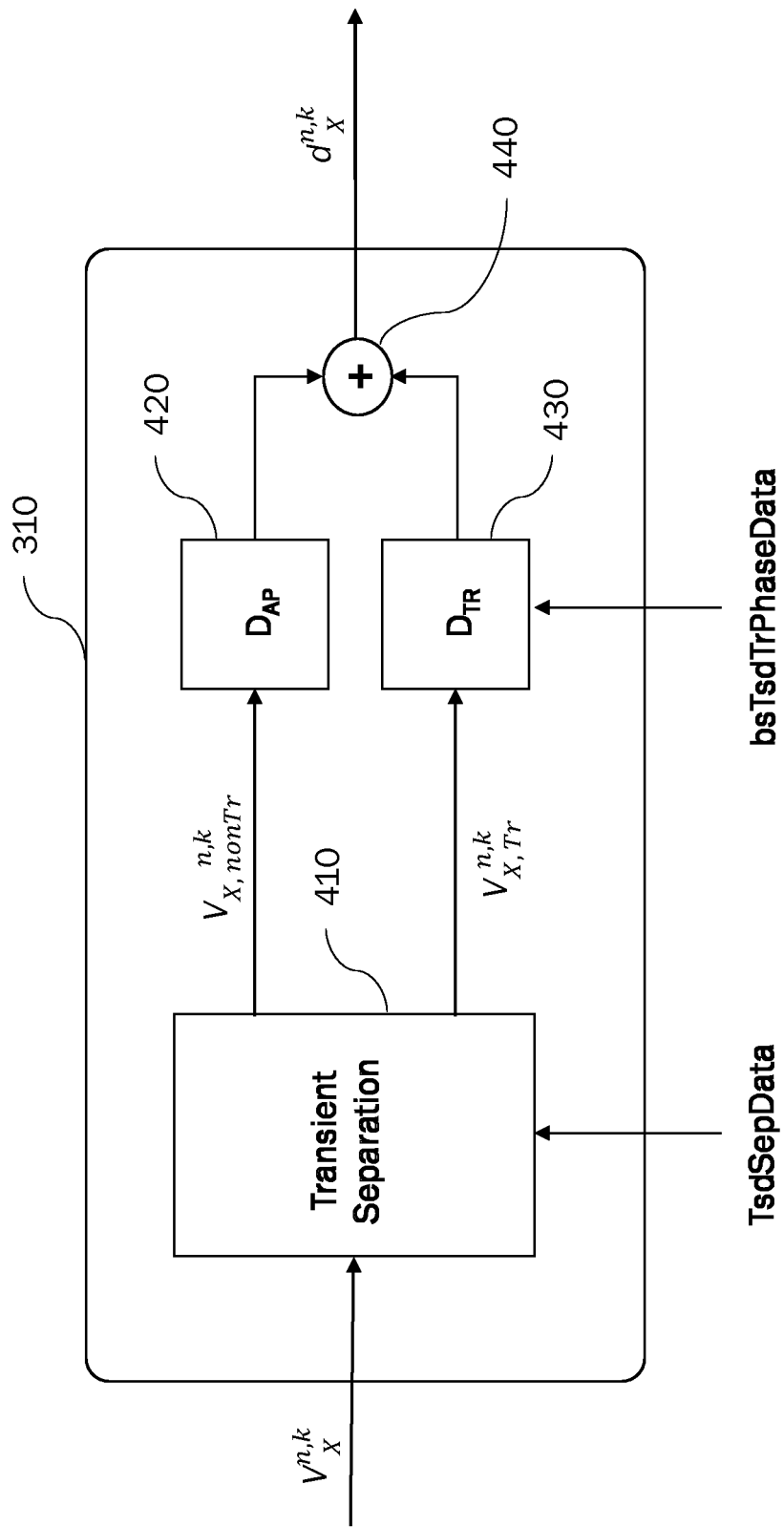
FIG. 4 schematically illustrates a decorrelator block of the OTT box of FIG. 3.

An example of the decorrelator D 310 is illustrated in FIG. 4. The decorrelator D 310 may comprise (e.g., consist of) a signal separator 410 (e.g., for transient separation), two decorrelator structures 420, 430 and a signal combiner 440. The signal separator 410 (separation unit) may separate a transient signal component of the input signal from a non-transient signal component of the input signal. One of the decorrelator structures in the decorrelator D may be the all-pass decorrelator $D_{AP}$ 420. The other one of the decorrelator structures may be a transient decorrelator $D_{TR}$ 430. The transient decorrelator $D_{TR}$ 430 may process the signal that is provided thereto, for example by apply a phase to this signal. The all-pass decorrelator $D_{AP}$ 420 may include a de-correlation filter with a frequency-dependent pre-delay followed by all-pass (e.g., IIR) sections. The filter coefficients may be derived from lattice coefficients in various manners that depend on whether or not fractional delay is used. In other words, the filter coefficients are derived from the lattice coefficients in a different manner, depending on whether fractional delay is used or not. For a fractional delay decorrelator, a fractional delay is applied by adding a frequency dependent phase-offset to the lattice coefficients. The all-pass filter coefficients may be determined off-line using lattice coefficients. That is, the all-pass filter coefficients may be pre-computed. At run time, the pre-computed all-pass filter coefficients may be obtained and used for the all-pass decorrelator Day 420. For example, the all-pass filter coefficients may be determined based on one or more look-up tables.

In general, the lattice coefficients (also known as the reflection coefficients) are converted into filter coefficients $a_x^{n,k}$ and $b_x^{n,k}$ according to:

$$a_X^{i,k} = \alpha_p(i)$$
$$b_X^{i,k} = \left(a_X^{L_{1_X}-i,k}\right)^*$$

for $0 \leq i < L_{1_X}$, $p = L_{1_X}$, where $$\left(a_X^{L_{1_X}-i,k}\right)$$

denotes the complex conjugate of $$a_X^{L_{1_X}-i,k},$$

and where $\alpha_p(i)$ are filter coefficients for a filter of order p, given by the following recursion:

$$\alpha_p(0)=1$$

$$\alpha_p(p)=\phi_X^{p-1,k}$$

$$\alpha_p(i)=\alpha_{p-1}(i)+\phi_X^{i-1,k}\alpha_{p-1}^*(p-i)$$

for $1 \leq i \leq p-1$, $p=1, 2, \ldots L_{1_X}$

The formula above may be implemented off-line to derive (e.g., pre-compute) filter coefficients prior to run time. At run time, the pre-computed all-pass filter coefficients may be referred to as needed, without computing them from the lattice coefficients. For example, the all-pass filter coefficients may be obtained (e.g., read, retrieved) from one or more look-up tables. The actual arrangement of the all-pass filter coefficients within the look-up table(s) may vary, as long as the decoder is provided with a routine to retrieve the appropriate all-pass filter coefficient(s) at run time.

When pre-computing the all-pass filter coefficients, the frequency axis may be subdivided into a plurality of non-overlapping and consecutive regions, e.g., first to fourth regions. Typically, each region my correspond to a set of consecutive frequency bands. Then, a distinct look-up table may be provided for each region, wherein the respective look-up table includes the all-pass filter coefficients for that region of frequency.

For example, the filter coefficients for lattice coefficients for a first region along the frequency axis may be determined based on:
  static    FLOAT32    lattice_coeff_0_filt_den_coeff [DECORR_FILT_0_ORD+1]={1.000000f, −0.314818f, −0.256828f, −0.173641f, −0.115077f, 0.000599f, 0.033343f, 0.122672f, −0.356362f, 0.128058f, 0.089800f};
  static    FLOAT32    lattice_coeff_0_filt_num_coeff [DECORR_FILT_0_ORD+1]={0.089800f, 0.128058f, −0.356362f, 0.122672f, 0.033343f, 0.000599f, −0.115077f, −0.173641f, −0.256828f, −0.314818f, 1.000000f};

The filter coefficients for lattice coefficients for a second region along the frequency axis may be determined based on:
  static    FLOAT32    lattice_coeff_1_filt_den_coeff [DECORR_FILT_1_ORD+1]={1.000000f, −0.287137f, −0.088940f, 0.123204f, −0.126111f, 0.064218f, 0.045768f, −0.016264f, −0.122100f};
  static    FLOAT32    lattice_coeff_1_filtnum_coeff [DECORR_FILT_1_ORD+1]={−0.122100f, −0.016264f, 0.045768f, 0.064218f, −0.126111f, 0.123204f, −0.088940f, −0.287137f, 1.000000f};

The filter coefficients for lattice coefficients for a third region along the frequency axis may be determined based on:
  static    FLOAT32    lattice_coeff_2_filt_den_coeff [DECORR_FILT_2_ORD+1]={1.000000f, 0.129403f, −0.032633f, 0.035700f};
  static    FLOAT32    lattice_coeff_2_filt_num_coeff [DECORR_FILT_2_ORD+1]={0.035700f, −0.032633f, 0.129403f, 1.000000f};

The filter coefficients for lattice coefficients for a fourth region along the frequency axis may be determined based on:

static FLOAT32 lattice_coeff_3_filtden_coeff [DECORR_FILT_3_ORD+1]={1.000000f, 0.034742f, −0.013000f};

static FLOAT32 lattice_coeff_3_filt_num_coeff [DECORR_FILT_3_ORD+1]={−0.013000f, 0.034742f, 1.000000f}.

In the below function ixheaacd_mps_decor_filt_init self→den is initialized with the corresponding filter coefficient (lattice_coeff_0_filt_den_coeff/ lattice_coeff_1_filt_den_coeff/ lattice_coeff_2_filt_den_coeff/ lattice_coeff_3_filt_den_coeff) based on the reverberation band. This self→den (which is a pointer to a filter coefficient) is used in the ixheaacd_mps_allpass_apply as shown below.

be pre-computed off-line and prior to run time (e.g., prior to decoding), and may be stored in one or more look-up tables. A distinct look-up table may be provided for each of a plurality of non-overlapping ranges of frequency bands. Determining the filter coefficients may involve calling the pre-computed values for the filter coefficients from one or more look-up tables during decoding.

The core decoder may comprise an MPEG surround functional unit that includes the upmixing unit. The decorrelation filter may include a frequency-dependent pre-delay followed by all-pass sections.

The filter coefficients may be determined for the all-pass sections. The upmixing unit may be an OTT box that can perform mono to stereo upmixing.

The input signal may be a mono signal. The upmixing unit may further include a mixing module for applying a mixing matrix, for mixing the input signal with an output of the decorrelator unit. The decorrelator unit may include a sepa-

```
static void ixheaacd_mps_decor_filt_init(ia_mps_decor_filt_struct * self,
    WORD32 qmf_band, WORD32 reverb_band) {
  switch (reverb_hand) {
  case 0:
    self->num_len = self->den_len = DECORR_FILT_0_ORD + 1;
    self->num = lattice_coeff_0_filt_num_coeff;
    self->den = lattice_coeff_0_filt_den_coeff;
    break;
  case 1:
    self->num_len = self->den_len = DECORR_FILT_1_ORD + 1;
    self->num = lattice_coeff_1_filt_num_coeff;
    self->den = lattice_coeff_1_filt_den_coeff;
    break;
  case 2:
    self->num_len = self->den_len = DECORR_FILT_2_ORD + 1;
    self->num = lattice_coeff_2_filt_num_coeff;
    self->den = lattice_coeff_2_filt_den_coeff;
    break;
  case 3:
    self->num_len = self->den_len = DECORR_FILT_3_ORD + 1;
    self->num = lattice_coeff_3_filt_num_coeff;
    self->den = lattice_coeff_3_filt_den_coeff;
    break;
  }
  self->state_len = self->num_len;
  memset(self->state, 0,
      sizeof(ia_cmplx_flt_struct) * (MAX_DECORR_FIL_ORDER + 1));
  return;
}
static VOID ixheaacd_mps_allpass_apply(ia_mps_decor_filt_struct * self,
    ia_cmplx_flt_struct *input, WORD32 len, ia_cmplx_flt_struct *output) {
  WORD32 i, j;
  for (i = 0; i < len; i++) {
    output[i].re = self->state[0].re + input[i].re * self->num[0];
    output[i].im = self->state[0].im + input[i].im * self->num[0];
    for (j = 1; j < self->num_len; j++) {
      self->state[j - 1].re = self->state[j].re
        + self->num[j] * input[i].re - self->den[j] * output[i].re;
      self->state[j - 1].im = self->state[j].im
        + self->num[j] * input[i].im - self->den[j] * output[i].im;
    }
  }
}
```

To summarize, the above may correspond to the processing of an apparatus for decoding an encoded USAC stream that is configured as follows. The apparatus may comprise a core decoder for decoding the encoded USAC stream. The core decoder may include an upmixing unit (e.g., OTT box) adapted to perform mono to stereo upmixing. The upmixing unit in turn may include a decorrelator unit D adapted to apply a decorrelation filter to an input signal. The decorrelator unit D may be adapted to determine filter coefficients for the decorrelation filter by referring to pre-computed values. The filter coefficients for the decorrelation filter may ration unit for separating a transient signal component of the input signal from a non-transient signal component of the input signal, an all-pass decorrelator unit adapted to apply the decorrelation filter to the non-transient signal component of the input signal, a transient decorrelator unit adapted to process the transient signal component of the input signal, and a signal combining unit for combining an output of the all-pass decorrelator unit and an output of the transient decorrelator unit. The all-pass decorrelator unit may be adapted to determine the filter coefficients for the decorrelation filter by referring to the pre-computed values.

Figure 7:
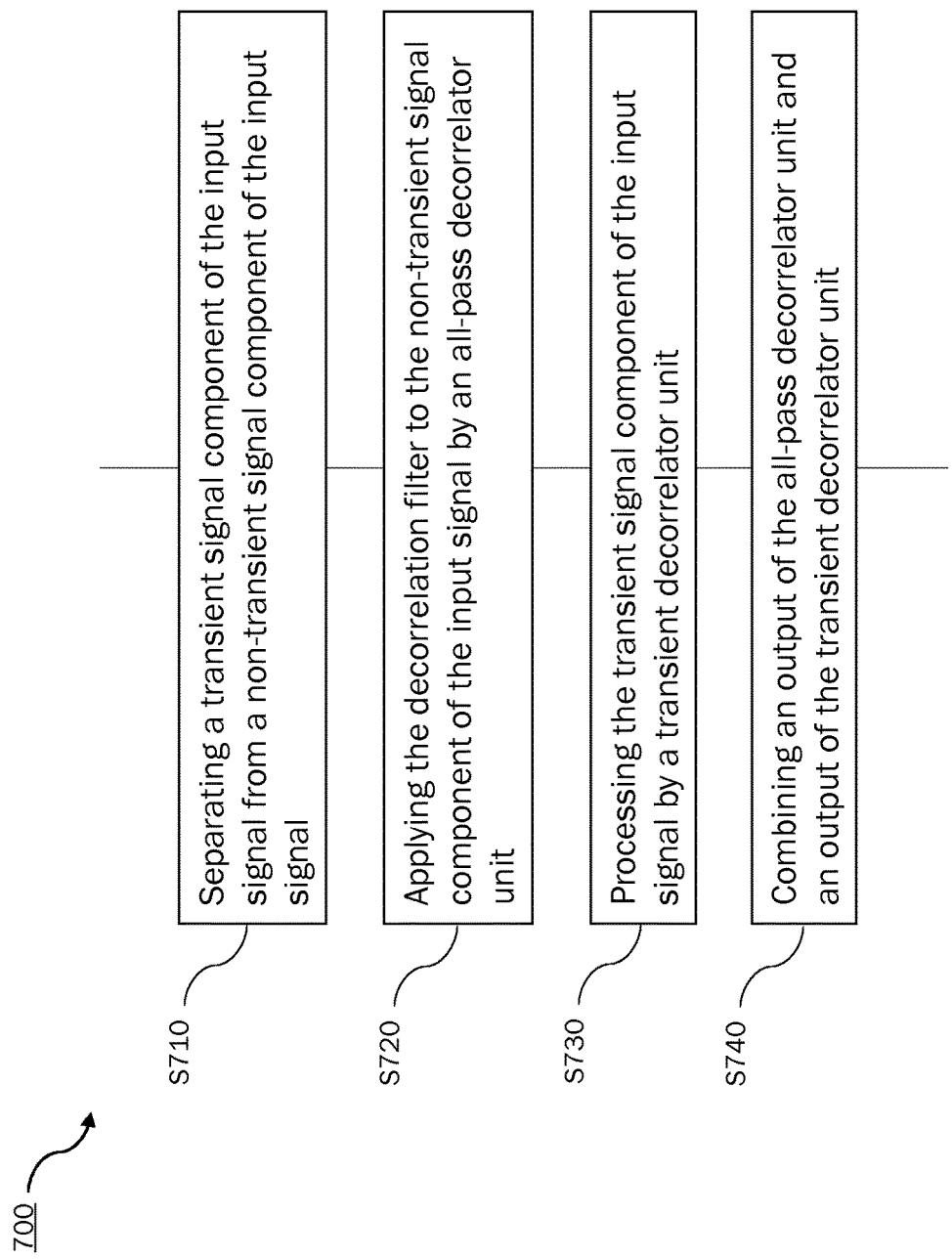

An example of a corresponding method 700 of applying a decorrelation filter in the context of mono to stereo upmixing in decoding an encoded USAC stream is shown in the flowchart of FIG. 7.

At step S710, a transient signal component of the input signal is separated from a non-transient signal component of the input signal. At step S720, the decorrelation filter is applied to the non-transient signal component of the input signal by an all-pass decorrelator unit. The filter coefficients for the decorrelation filter are determined by referring to the pre-computed values. At step S730, the transient signal component of the input signal is processed by a transient decorrelator unit. At step S740, an output of the all-pass decorrelator unit and an output of the transient decorrelator unit are combined.

As illustrated in FIG. 2, the USAC decoder 2000 further includes an enhanced Spectral Bandwidth Replication (eSBR) unit 2901. The eSBR unit 2901 may be described in clause 7.5 of the USAC standard, for example. This clause is hereby incorporated by reference in its entirety. The eSBR unit 2901 receives the encoded audio bitstream or the encoded signal from an encoder. The eSBR unit 2901 may generate a high frequency component of the signal, which is merged with the decoded low frequency component to yield a decoded signal. In other words, the eSBR unit 2901 may regenerate the highband of the audio signal. It may be based on replication of the sequences of harmonics, truncated during encoding. Further, it may adjust the spectral envelope of the generated high-band and apply inverse filtering, and add noise and sinusoidal components in order to recreate the spectral characteristics of the original signal. The output of the eSBR tool may be either a time domain signal or a filterbank-domain (e.g., QMF-domain) representation of a signal, e.g., in case MPS 212 is used.

The eSBR unit 2901 may comprise different components, such as an analysis filter bank, a non-linear processing unit and a synthesis filter bank. The eSBR unit 2901 may include a QMF based harmonic transposer. The QMF based harmonic transposer may be described in clause 7.5.4 of the USAC standard, for example. This clause is hereby incorporated by reference in its entirety. In the QMF based harmonic transposer, bandwidth extension of an input signal (e.g., a core coder time-domain-signal) may be carried out entirely in the QMF domain, for example using a modified phase vocoder structure, performing decimation followed by time stretching for every QMF subband. Transposition using several transpositions factors (e.g., T=2, 3, 4) may be carried out in a common QMF analysis/synthesis transform stage. For example, in the case of sbrRatio="2:1" the output signal of the transposer will have a sampling rate twice that of the input signal (for sbrRatio="8:3":8/3 the sampling frequency), which means that, for a transposition factor of T=2, the complex QMF subband signals resulting from the complex transposer QMF analysis bank will be time stretched but not decimated and fed into a QMF synthesis bank of twice the physical subband spacing as in the transposer QMF analysis bank. The combined system may be interpreted as three parallel transposers using transposition factors of 2, 3 and 4 respectively. To reduce complexity, the factor 3 and 4 transposers (3rd and 4th order transposers) may be integrated into the factor 2 transposer (2nd order transposer) by means of interpolation. Hence, the only QMF analysis and synthesis transform stages are the stages required for a 2nd order transposer. Since the QMF based harmonic transposer does not feature signal adaptive frequency domain oversampling, the corresponding flag in the bitstream is ignored.

In the QMF transposer, a complex output gain value may be defined for all synthesis subbands based on:

$$\Omega(k) = \begin{cases} \exp\left[-j\pi\frac{385}{128}\left(k+\frac{1}{2}\right)\right], & xOverQmf(0) \leq k < xOverQmf(1) \\ 0.7071 \cdot \exp\left[-j\pi\frac{385}{128}\left(k+\frac{1}{2}\right)\right], & xOverQmf(1) \leq k < xOverQmf(2) \\ 2 \cdot \exp\left[-j\pi\frac{385}{128}\left(k+\frac{1}{2}\right)\right], & xOverQmf(2) \leq k < xOverQmf(3) \end{cases}$$

wherein k indicates a subband sample.

Instead of computing complex exponentials real and imaginary parts of the complex output gains during runtime, these values are pre-computed offline (and stored) and accessed at run time, for example from corresponding look up tables.

That is, the complex exponentials real and imaginary parts are pre-computed (offline) and stored. At run time, the pre-computed complex exponentials real and imaginary parts may be referred to as needed, without computation. For example, the complex exponentials real and imaginary parts may be obtained (e.g., read, retrieved) from one or more look-up tables. The actual arrangement of the complex exponentials real and imaginary parts within the look-up table(s) may vary, as long as the decoder is provided with a routine to retrieve the appropriate complex exponentials real and imaginary parts at run time.

For example, one look-up table may be provided for the real parts of the complex exponentials (e.g., table phase_vocoder_cos_tab), and another look-up table may be provided for the imaginary parts of the complex exponentials (e.g., table phase_vocoder_sin_tab). At run time, the band index k (which may be denoted by qmf_band_idx) may be used to reference these look-up tables and retrieve the appropriate real and imaginary parts.

The complex multiplication of the QMF samples with the output gain in each synthesis subband for applying the output gains $\Omega(k)$ may be carried out based on the ixheaacd_qmf_hbe_apply(ixheaacd_hbe_trans.c) function given below, where qmf_r_out_buf[i] and qmf_i_out_buf[i] indicate the real and imaginary parts, respectively, of QMF sample i in the respective synthesis subband (indicated by index qmf_band_idx).

```
for(i = 0 i < ptr_hbe_txposer->no_bins i++ )
{
    for(qmf_band_idx = ptr_hbe_txposer->start_band; qmf_band_idx < ptr_hbe_txposer->end_band; qmf_band_idx++)
    {
        pv_qmf_buf_real[i][qmf_band_idx] =
            (FLOAT32)(ptr_hbe_txposer->qmf_r_out_buf[i][qmf_band_idx]*phase_vocoder_cos_tab[qmf_band_idx] –
            ptr_hbe_txposer->qmf_r_out_buf [i][qmf_band_idx]*phase_vocoder_sin_tab[qmf_band_idx]);
```

-continued

```
    pv_qmf_buf_imag[i][qmf_band_idx] =
        (FLOAT32)(ptr_hbe_txposer->qmf_r_out_buf[i][qmf_band_idx ]*phase_vocoder_sin_tab[qmf_band_idx] +
            ptr_hbe_txposer->qmf_i_out_buf[i][qmf_band_idx ]*phase_vocoder_cos_tab[qmf_band_idx]);
    }
}
```

As noted above, the multiplication for applying the output gains Ω(k) may be based on the phase_vocoder_cos_tab[k] table (for the real parts) and phase_vocoder_sin_tab[k] table (for the imaginary part), which may be given as follows:

```
const FLOAT32 phase_vocoder_cos_tab[64] =
{
  0.012272f,   -0.036807f,   0.061321f,   -0.085797f,
  0.110222f,   -0.134581f,   0.158858f,   -0.183040f,
  0.207111f,   -0.231058f,   0.254866f,   -0.278520f,
  0.302006f,   -0.325310f,   0.348419f,   -0.371317f,
  0.393992f,   -0.416430f,   0.438616f,   -0.460539f,
  0.482184f,   -0.503538f,   0.524590f,   -0.545325f,
  0.565732f,   -0.585798f,   0.605511f,   -0.624859f,
  0.643832f,   -0.662416f,   0.680601f,   -0.698376f,
  0.715731f,   -0.732654f,   0.749136f,   -0.765167f,
  0.780737f,   -0.795837f,   0.810457f,   -0.824589f,
  0.838225f,   -0.851355f,   0.863973f,   -0.876070f,
  0.887640f,   -0.898674f,   0.909168f,   -0.919114f,
  0.928506f,   -0.937339f,   0.945607f,   -0.953306f,
  0.960431f,   -0.966976f,   0.972940f,   -0.978317f,
  0.983105f,   -0.987301f,   0.990903f,   -0.993907f,
  0.996313f,   -0.998118f,   0.999322f,   -0.999925f,
};
const FLOAT32 phase_vocoder_sin_tab[64] =
{
  0.999925f,   -0.999322f,   0.998118f,   -0.996313f,
  0.993907f,   -0.990903f,   0.987301f,   -0.983105f,
  0.978317f,   -0.972940f,   0.966976f,   -0.960431f,
  0.953306f,   -0.945607f,   0.937339f,   -0.928506f,
  0.919114f,   -0.909168f,   0.898674f,   -0.887640f,
  0.876070f,   -0.863973f,   0.851355f,   -0.838225f,
  0.824589f,   -0.810457f,   0.795837f,   -0.780737f,
  0.765167f,   -0.749136f,   0.732654f,   -0.715731f,
  0.698376f,   -0.680601f,   0.662416f,   -0.643832f,
  0.624859f,   -0.605511f,   0.585798f,   -0.565732f,
  0.545325f,   -0.524590f,   0.503538f,   -0.482184f,
  0.460539f,   -0.438616f,   0.416430f,   -0.393992f,
  0.371317f,   -0.348419f,   0.325310f,   -0.302006f,
  0.278520f,   -0.254866f,   0.231058f,   -0.207111f,
  0.183040f,   -0.158858f,   0.134581f,   -0.110222f,
  0.085797f,   -0.061321f,   0.036807f,   -0.012272f,
};
```

To summarize, the above may correspond to the processing of an apparatus for decoding an encoded USAC stream that is configured as follows. The apparatus may comprise a core decoder for decoding the encoded USAC stream. The core decoder may include an eSBR unit for extending a bandwidth of an input signal, the eSBR unit including a QMF based harmonic transposer. The QMF based harmonic transposer may be configured to process the input signal in the QMF domain, in each of a plurality of synthesis subbands, to extend the bandwidth of the input signal. The QMF based harmonic transposer may be further configured to operate at least in part based on pre-computed information.

The pre-computed information may be stored in one or more look-up tables. Then, the QMF based harmonic transposer may be adapted to access the pre-computed information from the one or more look-up tables at run time.

The eSBR unit may be configured to regenerate a high-band frequency component of the input signal based on replication of sequences of harmonics that have been truncated during encoding, to thereby extend the bandwidth of the input signal. The eSBR unit may be configured to handle the parametric representation of the higher audio frequencies in the input signal.

The QMF based harmonic transposer may be further configured to obtain a respective complex output gain value for each of the plurality of synthesis subbands and to apply the complex output gain values to their respective synthesis subbands. The pre-computed information may relate to the complex output gain values. The complex output gain values may include real and imaginary parts that are accessed from one or more look-up tables at run time.

Also in the QMF transposer, core coder time-input-signal may transformed to the QMF domain, using blocks of coreCoderFrameLength input samples. To save computational complexity, the transform is implemented by applying a critical sampling processing on the subband signals from the 32-band analysis QMF bank that is already present in the SBR tool. A critical sampling processing may transform a matrix $X_{Low}$ into new QMF submatrices $\Gamma(\mu,v)$ with doubled resolution with subband samples. These QMF submatrices may be operated by a subband block processing with time extent of twelve subband samples at a subband sample stride equal to one. The processing may perform linear extractions and nonlinear operations on those submatrices and overlap-adds the modified submatrices at a subband sample stride equal to two. The result is that the QMF output undergoes a subband domain stretch of a factor two and subband domain transpositions of factors T/2=1, 3/2, 2. Upon synthesis with a QMF bank of twice the physical subband spacing as the transposer analysis bank, the required transposition with factors T=2, 3, 4 will result.

In one example, nonlinear processing of a single submatrix of samples may be provided based on a variable u=0, 1, 2, . . . that denotes the position of the submatrix. For notational purposes, this index may be omitted in the following as it is fixed. Instead, the following indexing of the submatrix may be used:

$$B(m,n)=\Gamma(m+6+u,n), m=-6,\ldots,5 \quad n=0,\ldots,2M_S-1.$$

The output of the nonlinear modification is denoted by Y(m,k) where m=-6, . . . , 5 and xOverQMF(0) ≤k<xOverQmf(numPatches). Each synthesis subband with index k may be the result of one transposition order and as the processing may be slightly different depending on this order. A common feature is that analysis subbands with indices approximating 2 k/T are chosen.

In one case, for xOverQmf(1)≤k<xOverQmf(2), where T=3, non-linear processing may use linear interpolation for extraction of non-integer subband samples.

Two analysis subband indices n and ñ may be defined. For example, the analysis subband index ñ may be defined as the integer part of 2 k/T=2 k/3, and the analysis subband index n may be defined as n=ñ+κ, where $$\kappa = \begin{cases} 1 & k \in 3Z_+ + 1 \\ 0 & \text{else} \end{cases}$$

and $Z_+$ denotes the positive integer set.

A block with a given time extent (e.g., eight subband samples) may be extracted for v=n,ñ as $$X(m,v)=B(3m/2,v), m=-4,\ldots,3.$$

The non-integer subband sample entries may obtained by a two tap interpolation of the form)

$$B(\mu+0.5,v)=h_0(v)B(\mu,v)+h_1(v)B(\mu+1,v)$$

with the filter coefficients defined for v=n,ñ and ε=0,1 by $$h_\varepsilon(v) = 0.56342741195967 \cdot \exp\left[j(-1)^\varepsilon \frac{\pi}{2}\left(v+\frac{1}{2}\right)\right].$$

The QMF samples X(m,v) obtained in this manner may be converted to polar coordinates for v=n,ñ as $$\begin{cases} \phi(m,v) = \angle\{X(m,v)\} \\ r(m,v) = |X(m,v)| \end{cases}$$

The output may then defined for m=−4, . . . , 3 by $$Y^{(3)}(m,k) = \Omega(k) \cdot$$

$$\begin{cases} (2-\kappa)\cdot r(0,\tilde{n})^{1-\frac{1}{T}} \cdot r(m,n)^{\frac{1}{T}} \cdot \exp[j\cdot((T-1)\cdot\phi(0,\tilde{n})+\phi(m,n))] + \\ \kappa \cdot r(0,m)^{1-\frac{1}{T}} \cdot r(m,\tilde{n})^{\frac{1}{T}} \cdot \exp[j\cdot((T-1)\cdot\phi(0,n)+\phi(m,\tilde{n}))] \end{cases}$$

and $Y^{(3)}(m,k)$ may be extended by zeros for m∈{−6, −5,4,5}. This latter operation may be equivalent to a synthesis window with a rectangular window of length eight. Multiplication by the complex output gain $\Omega(k)$ may involve the techniques described above.

The necessity to determine non-integer subband sample entries may also arise in the context of the addition of cross products, which is described next.

For each k with xOverQmf(0)≤k≤xOverQmf(numPatches), a unique transposition factor T=2, 3, 4, is defined by the rule xOverQmf(T−2)≤k≤xOverQmf(T−1). A cross product gain $\Omega_C(m,k)$ is set to zero if the cross product pitch parameter satisfies p<1. p may be determined from the bitstream parameter sbrPitchInBins[ch] as $$p=\text{sbrPitchInBins}[ch]/12$$

If p≥1, then $\Omega_C(m,k)$ and the intermediate integer parameters $\mu_1(k)$, $\mu_2(k)$, and t(k) may be defined by the following procedure. Let M be the maximum of the at most values T−1 values min{|B(0,n₁)|,|B(0,n₂)|}, where n₁ is the integer part of $$\frac{2k+1-tp}{T}$$

and n₁>0;

n₂ is the integer part of n₁+p and n₂<2M_S;
t=1, . . . T−1.

If M≤|B(0,μ(k))|, where μ(k) is defined as the integer part of 2 k/T, then the cross product addition is canceled and $\Omega_C(m,k)=0$. Otherwise, t(k) is defined to be the smallest t=1, . . . , T−1 for which min{|B(0,n₁)|, |B(0,n₂)|}=M and the integer pair ($\mu_1(k)$, $\mu_2(k)$) is defined as the corresponding maximizing pair (n₁, n₂). Two downsampling factors $D_1(k)$ and $D_2(k)$ may be determined from the values of T and t(k) as the particular solutions to the equation (T−t(k))D₁+t(k)D₂=T/2 that are given in the following Table:

| T | t(k) | D₁(k) | D₂(k) |
|---|------|-------|-------|
| 2 | 1 | 0 | 1 |
| 3 | 1 | 0 | 1.5 |
| 3 | 2 | 1.5 | 0 |
| 4 | 1 | 0 | 2 |
| 4 | 2 | 0 | 1 |
| 4 | 3 | 2 | 0 |

In the cases where p≥1 and M>|B(0, μ(k))| the cross product gain may then be defined by $$\Omega_C(m,k) = (7-T)\cdot\Omega(k)\exp\left[-i\pi p\frac{t(k)(T-t(k))}{T}(D_2(k)-D_1(k))m\right],$$
$$m=-1,0.$$

Two blocks with time extent of for example two subband samples may be extracted. For example, this extraction may be performed according to $$\begin{cases} X_1(m) = B(D_1(k)m, \mu_1(k)) \\ X_2(m) = B(D_2(k)m, \mu_2(k)) \end{cases} m=-1,0$$

where the use of a downsampling factor equal to zero may correspond to repetition of a single subband sample value and the use of a non-integer downsampling factor will require the computation of non-integer subband sample entries. These entries may be obtained by the same two tap interpolation of the form:

$$B(\mu+0.5,v)=h_0(v)B(\mu,v)+h_1(v)B(\mu+1,v)$$

with the filter coefficients defined for v=n,ñ and ε=0,1 by $$h_\varepsilon(v) = 0.56342741195967 \cdot \exp\left[j(-1)^\varepsilon \frac{\pi}{2}\left(v+\frac{1}{2}\right)\right].$$

The extracted QMF samples $X_1(m)$ and $X_2(m)$ are converted to polar coordinates $$\begin{cases} \phi(m,v) = \angle\{X(m,v)\} \\ r(m,v) = |X(m,v)| \end{cases}, i=1,2, \quad m=-1,0.$$

The cross product term is then computed as $$Y_C^{(T)}(m,k) = \Omega_C(m,k) \cdot r_1(m)^{1-\frac{t(k)}{T}} \cdot r_2(m)^{\frac{t(k)}{T}} \cdot$$
$$\exp[j\cdot((T-t(k))\phi_1(m)+t(k)\phi_2(m))], m=-1,0.$$

$Y_C^{(T)}(m,k)$ may be extended by zeros for m∈{−6, −5, −4, −3, −2,1,2,3,4,5}.

A combined QMF output may then be obtained by adding the contributions $Y^{(T)}$ and $Y_C^{(T)}$.

From the above formula for $h_\varepsilon(v)$ we can see that $$\text{Real}(h_1(v)) = \text{Real}(h_0(v))$$

$$\text{Imag}(h_1(v)) = -\text{Imag}(h_0(v)) \text{ and}$$

$$\text{Real}(h_0(v)) = \cos(((2*v+1)*\pi)/4)$$

$$\text{Imag}(h_0(v)) = \sin(((2*v+1)*\pi)/4)$$

Where Real ($h_\varepsilon(v)$) refers to real part of $h_\varepsilon(v)$ and Imag ($h_\varepsilon(v)$) refers to imaginary part of the complex number $h_\varepsilon(v)$. Thus, the (only) relevant values are Real $h_0(v)$ and Imag $h_0(v)$.

The formula for determining the filter coefficients $h_\varepsilon(v)$ (or, equivalently, Real $h_0(v)$ and Imag $h_0(v)$) may be implemented off-line to derive (e.g., pre-compute) filter coefficients prior to run time. At run time, the pre-computed filter coefficients $h_\varepsilon(v)$ may be referred to as needed, without computation. For example, the filter coefficients $h_\varepsilon(v)$ may be obtained (e.g., read, retrieved) from one or more look-up tables. The actual arrangement of the filter coefficients $h_\varepsilon(v)$ within the look-up table(s) may vary, as long as the decoder is provided with a routine to retrieve the appropriate filter coefficient(s) at run time.

For example, the look-up table may be accessed based on the value of v. As an example, the following table is accessed based on the value of v, the table values corresponding to a given v as follows

```
Real (h0(v) ) = hbe_post_anal_proc_interp_coeff[(( v + 1) & 3)][0];
Imag (h0(v) ) = hbe_post_anal_proc_interp_coeff[(( v + 1) & 3)][1];
const FLOAT32 hbe_post_anal_proc_interp_coeff[4][2] =
{
  /*real imag */
  { 0.3984033437f, 0.3984033437f},
  { 0.3984033437f,-0.3984033437f},
  {-0.3984033437f,-0.3984033437f},
  {-0.3984033437f, 0.3984033437f},
};
```

From the table it can be seen that the absolute value of the real and imaginary parts of the coefficients are the same. Thus, multiplications with the filter coefficients $h_\varepsilon(v)$ may be replaced with additions and subtractions (e.g., of the real an imaginary parts of the integer subband samples $B(\mu,v)$ and $B(\mu+1,v)$, respectively) followed by single multiplication of the result with 0.3984033437 (0.3984033437f).

To summarize, the above may correspond to the processing of an apparatus for decoding an encoded USAC stream as described above (among others, including a QMF harmonic transposer), for which the plurality of synthesis subbands may include non-integer synthesis subbands with a fractional subband index. The QMF based harmonic transposer may be configured to process samples extracted from the input signal the input signal in these non-integer synthesis subbands. The pre-computed information may relate to interpolation coefficients for interpolating samples in the non-integer subbands from samples in neighboring integer subbands with integer subband indices. The interpolation coefficients may be determined off-line and stored in one or more look-up tables. The QMF based harmonic transposer may be configured to access the interpolation coefficients from the one or more look-up tables at run time.

Also determination of the cross product gain value defined by the following formula $$\Omega_C(m,k) = (7-T)\cdot\Omega(k)\exp\left[-i\pi p\frac{t(k)(T-t(k))}{T}(D_2(k)-D_1(k))m\right],$$

$$m = -1,0.$$

may be implemented off-line to derive (e.g., pre-compute) cross product gains prior to run time. At run time, the pre-computed cross product gains may be referred to as needed, without computation. For example, the cross product gains may be obtained (e.g., read, retrieved) from one or more look-up tables. The actual arrangement of the cross product gains within the look-up table(s) may vary, as long as the decoder is provided with a routine to retrieve the appropriate cross product gain(s) at run time. Retrieving the pre-computed cross product gains may be performed by the same non-linear processing block as described above.

For example, the above complex cross product gain value may be replaced with the following look up tables: hbe_x_prod_cos_table_trans_2, hbe_x_prod_cos_table_trans_3, hbe_x_prod_cos_table_trans_4 These tables may be computed by direct substitution of these values and may be accessed based on the values of $t(k)$, $D_1(k)$ and $D_2(k)$. For example, the tables may be given by:

```
const FLOAT32 hbe_x_prod_cos_table_trans_2 [(128 + 128) * 2] =
{
{
  /*For Up Sampling Factor not equal to 4*/
  1.000000, 0.000000, 0.991445, 0.130526, 0.965926, 0.258819,
  0.923880, 0.382683, 0.866025, 0.500000, 0.793353, 0.608761,
  0.707107, 0.707107, 0.608761, 0.793353, 0.500000, 0.866025,
  0.382683, 0.923880, 0.258819, 0.965926, 0.130526, 0.991445,
  -0.000000, 1.000000, -0.130526, 0.991445, -0.258819, 0.965926,
  -0.382683, 0.923880, -0.500000, 0.866025, -0.608761, 0.793353,
  -0.707107, 0.707107, -0.793353, 0.608761, -0.866025, 0.500000,
  -0.923880, 0.382683, -0.965926, 0.258819, -0.991445, 0.130526,
  -1.000000, -0.000000, -0.991445, -0.130526, -0.965926, -0.258819,
  -0.923880, -0.382683, -0.866025, -0.500000, -0.793353, -0.608762,
  -0.707107, -0.707107, -0.608761, -0.793353, -0.500000, -0.866025,
  -0.382683, -0.923880, -0.258819, -0.965926, -0.130526, -0.991445,
  0.000000, -1.000000, 0.130526, -0.991445, 0.258819, -0.965926,
  0.382684, -0.923879, 0.500000, -0.866025, 0.608762, -0.793353,
  0.707107, -0.707107, 0.793353, -0.608761, 0.866026, -0.500000,
  0.923880, -0.382683, 0.965926, -0.258819, 0.991445, -0.130526,
  1.000000, 0.000000, 0.991445, 0.130527, 0.965926, 0.258819,
  0.923879, 0.382684, 0.866025, 0.500000, 0.793353, 0.608762,
  0.707107, 0.707107, 0.608761, 0.793353, 0.500000, 0.866025,
  0.382683, 0.923880, 0.258819, 0.965926, 0.130526, 0.991445,
  -0.000000, 1.000000, -0.130526, 0.991445, -0.258819, 0.965926,
  -0.382684, 0.923879, -0.500000, 0.866025, -0.608762, 0.793353,
  -0.707107, 0.707106, -0.793353, 0.608761, -0.866026, 0.500000,
  -0.923880, 0.382684, -0.965926, 0.258819, -0.991445, 0.130526,
  -1.000000, -0.000000, -0.991445, -0.130527, -0.965926, -0.258819,
  -0.923879, -0.382684, -0.866025, -0.500000, -0.793353, -0.608762,
  -0.707107, -0.707107, -0.608761, -0.793353, -0.500000, -0.866025,
  -0.382683, -0.923880, -0.258819, -0.965926, -0.130526, -0.991445,
  0.000000, -1.000000, 0.130526, -0.991445, 0.258819, -0.965926,
  0.382684, -0.923880, 0.500000, -0.866025, 0.608762, -0.793353,
  0.707107, -0.707107, 0.793354, -0.608761, 0.866026, -0.500000,
  0.923880, -0.382683, 0.965926, -0.258819, 0.991445, -0.130526,
  1.000000, 0.000000, 0.991445, 0.130526, 0.965926, 0.258820,
  0.923879, 0.382684, 0.866025, 0.500000, 0.793353, 0.608761,
  0.707107, 0.707107, 0.608761, 0.793354, 0.500000, 0.866025,
  0.382683, 0.923880, 0.258819, 0.965926, 0.130526, 0.991445,
  -0.000000, 1.000000, -0.130527, 0.991445, -0.258819, 0.965926,
  -0.382684, 0.923879, -0.500000, 0.866025, -0.608761, 0.793353,
  -0.707107, 0.707107, -0.793354, 0.608761, -0.866026, 0.499999,
  -0.923880, 0.382683, -0.965926, 0.258819, -0.991445, 0.130526,
```

-1.000000, -0.000001, -0.991445, -0.130527, -0.965926, -0.258819,
-0.923879, -0.382683, -0.866025, -0.500000, -0.793353, -0.608762,
-0.707106, -0.707107, -0.608761, -0.793354
/*For Up Sampling Factor equal to 4*/
1.000000, 0.000000, 0.997859, 0.065403, 0.991445, 0.130526,
0.980785, 0.195090, 0.965926, 0.258819, 0.946930, 0.321439,
0.923880, 0.382683, 0.896873, 0.442289, 0.866025, 0.500000,
0.831470, 0.555570, 0.793353, 0.608761, 0.751840, 0.659346,
0.707107, 0.707107, 0.659346, 0.751840, 0.608761, 0.793353,
0.555570, 0.831470, 0.500000, 0.866025, 0.442289, 0.896873,
0.382683, 0.923880, 0.321439, 0.946930, 0.258819, 0.965926,
0.195090, 0.980785, 0.130526, 0.991445, 0.065403, 0.997859,
-0.000000, 1.000000, -0.065403, 0.997859, -0.130526, 0.991445,
-0.195090, 0.980785, -0.258819, 0.965926, -0.321440, 0.946930,
-0.382683, 0.923880, -0.442289, 0.896873, -0.500000, 0.866025,
-0.555570, 0.831470, -0.608761, 0.793353, -0.659346, 0.751840,
-0.707107, 0.707107, -0.751840, 0.659346, -0.793353, 0.608761,
-0.831470, 0.555570, -0.866025, 0.500000, -0.896873, 0.442289,
-0.923880, 0.382683, -0.946930, 0.321439, -0.965926, 0.258819,
-0.980785, 0.195090, -0.991445, 0.130526, -0.997859, 0.065403,
-1.000000, -0.000000, -0.997859, -0.065403, -0.991445, -0.130526,
-0.980785, -0.195090, -0.965926, -0.258819, -0.946930, -0.321440,
-0.923880, -0.382683, -0.896873, -0.442289, -0.866025, -0.500000,
-0.831470, -0.555570, -0.793353, -0.608762, -0.751840, -0.659346,
-0.707107, -0.707107, -0.659346, -0.751840, -0.608761, -0.793353,
-0.555570, -0.831470, -0.500000, -0.866025, -0.442289, -0.896873,
-0.382683, -0.923880, -0.321439, -0.946930, -0.258819, -0.965926,
-0.195090, -0.980785, -0.130526, -0.991445, -0.065403, -0.997859,
0.000000, -1.000000, 0.065403, -0.997859, 0.130526, -0.991445,
0.195090, -0.980785, 0.258819, -0.965926, 0.321440, -0.946930,
0.382684, -0.923879, 0.442289, -0.896873, 0.500000, -0.866025,
0.555570, -0.831469, 0.608762, -0.793353, 0.659346, -0.751840,
0.707107, -0.707107, 0.751840, -0.659346, 0.793353, -0.608761,
0.831470, -0.555570, 0.866025, -0.500000, 0.896873, -0.442289,
0.923880, -0.382683, 0.946930, -0.321439, 0.965926, -0.258819,
0.980785, -0.195090, 0.991445, -0.130526, 0.997859, -0.065403,
1.000000, 0.000000, 0.997859, 0.065403, 0.991445, 0.130527,
0.980785, 0.195091, 0.965924, 0.258819, 0.946930, 0.321439,
0.923879, 0.382684, 0.896873, 0.442289, 0.866025, 0.500000,
0.831470, 0.555571, 0.793353, 0.608762, 0.751840, 0.659346,
0.707107, 0.707107, 0.659346, 0.751840, 0.608761, 0.793353,
0.555570, 0.831470, 0.500000, 0.866025, 0.442289, 0.896873,
0.382683, 0.923880, 0.321439, 0.946930, 0.258819, 0.965926,
0.195090, 0.980785, 0.130526, 0.991445, 0.065403, 0.997859,
-0.000000, 1.000000, -0.065403, 0.997859, -0.130526, 0.991445,
-0.195091, 0.980785, -0.258819, 0.965926, -0.321440, 0.946930,
-0.382684, 0.923879, -0.442289, 0.896873
};
const FLOAT32 hbe_x_prod_cos_table_trans_3 [(128 + 128)*2] =
{
/*For Up Sampling Factor not equal to 4*/
1.000000, 0.000000, 0.965926, 0.258819, 0.866025, 0.500000,
0.707107, 0.707107, 0.500000, 0.866025, 0.258819, 0.965926,
-0.000000, 1.000000, -0.258819, 0.965926, -0.500000, 0.866025,
-0.707107, 0.707107, -0.866025, 0.500000, -0.965926, 0.258819,
-1.000000, -0.000000, -0.965926, -0.258819, -0.866025, -0.500000,
-0.707107, -0.707107, -0.500000, -0.866025, -0.258819, -0.965926,
0.000000, -1.000000, 0.258819, -0.965926, 0.500000, -0.866025,
0.707107, -0.707107, 0.866026, -0.500000, 0.965926, -0.258819,
1.000000, 0.000000, 0.965926, 0.258819, 0.866025, 0.500000,
0.707107, 0.707107, 0.500000, 0.866026, 0.258819, 0.965926,
-0.000000, 1.000000, -0.258819, 0.965926, -0.500000, 0.866025,
-0.707107, 0.707106, -0.866025, 0.500000, -0.965926, 0.258819,
-1.000000, -0.000000, -0.965926, -0.258819, -0.866025, -0.500000,
-0.707107, -0.707107, -0.500000, -0.866025, -0.258819, -0.965926,
0.000000, -1.000000, 0.258819, -0.965926, 0.500000, -0.866025,
0.707107, -0.707107, 0.866026, -0.500000, 0.965926, -0.258819,
1.000000, 0.000000, 0.965926, 0.258819, 0.866025, 0.500000,
0.707107, 0.707107, 0.500000, 0.866025, 0.258819, 0.965926,
-0.000000, 1.000000, -0.258819, 0.965926, -0.500000, 0.866025,
-0.707107, 0.707107, -0.866026, 0.499999, -0.965926, 0.258819,
-1.000000, -0.000001, -0.965926, -0.258819, -0.866025, -0.500000,
-0.706106, -0.707107, -0.500000, -0.866026, -0.258819, -0.965926,
0.000000, -1.000000, 0.258820, -0.965926, 0.500000, -0.866025,
0.707107, -0.707107, 0.866026, -0.499999, 0.965926, -0.258818,
1.000000, 0.000000, 0.965926, 0.258820, 0.866025, 0.500001,
0.707106, 0.707107, 0.500000, 0.866025, 0.258819, 0.965926,
-0.000001, 1.000000, -0.258820, 0.965926, -0.500000, 0.866026,
-0.707107, 0.707106, -0.866026, 0.500000, -0.965926, 0.258819, -1.000000, -0.000001, -0.965926, -0.258820, -0.866025, -0.500000,
-0.707106, -0.707107, -0.499999, -0.866026, -0.258818, -0.965926,
0.000001, -1.000000, 0.258820, -0.965925, 0.500001, -0.866025,
0.707107, -0.707107, 0.866026, -0.500000, 0.965926, -0.258818,
1.000000, 0.000001, 0.965926, 0.258819, 0.866025, 0.500001,
0.707106, 0.707107, 0.499999, 0.866026, 0.258818, 0.965926,
-0.000001, 1.000000, -0.258820, 0.965926, -0.500001, 0.866025,
-0.707107, 0.707106, -0.866026, 0.499999, -0.965926, 0.258818,
-1.000000, -0.000000, -0.965926, -0.258820, -0.866025, -0.500001,
-0.707106, -0.707107, -0.499999, -0.866026, -0.258818, -0.965926,
0.000001, -1.000000, 0.258820, -0.965925, 0.500001, -0.866025,
0.707107, -0.707106, 0.866026, -0.500000, 0.965926, -0.258819,
1.000000, 0.000001, 0.965926, 0.258820, 0.866025, 0.500000,
0.707106, 0.707107, 0.499999, 0.866026, 0.258818, 0.965926,
-0.000001, 1.000000, -0.258820, 0.965925
/*For Up Sampling Factor equal to 4*/
1.000000, 0.000000, 0.991445, 0.130526, 0.965926, 0.258819,
0.923880, 0.382683, 0.866025, 0.500000, 0.793353, 0.608761,
0.707107, 0.707107, 0.608761, 0.793353, 0.500000, 0.866025,
0.382683, 0.923880, 0.258819, 0.965926, 0.130526, 0.991445,
-0.000000, 1.000000, -0.130526, 0.991445, -0.258819, 0.965926,
-0.382683, 0.923880, -0.500000, 0.866025, -0.608761, 0.793353,
-0.707107, 0.707107, -0.793353, 0.608761, -0.866025, 0.500000,
-0.923880, 0.382683, -0.965926, 0.258819, -0.991445, 0.130526,
-1.000000, -0.000000, -0.991445, -0.130526, -0.965926, -0.258819,
-0.923880, -0.382683, -0.866025, -0.500000, -0.793353, -0.608762,
-0.707107, -0.707107, -0.608761, -0.793353, -0.500000, -0.866025,
-0.382683, -0.923880, -0.258819, -0.965926, -0.130526, -0.991445,
0.000000, -1.000000, 0.130526, -0.991445, 0.258819, -0.965926,
0.382684, -0.923879, 0.500000, -0.866025, 0.608762, -0.793353,
0.707107, -0.707107, 0.793353, -0.608761, 0.866026, -0.500000,
0.923880, -0.382683, 0.965926, -0.258819, 0.991445, -0.130526,
1.000000, 0.000000, 0.991445, 0.130527, 0.965926, 0.258819,
0.923879, 0.382684, 0.866025, 0.500000, 0.793353, 0.608762,
0.707107, 0.707107, 0.608761, 0.793353, 0.500000, 0.866026,
0.382683, 0.923880, 0.258819, 0.965926, 0.130526, 0.991445,
-0.000000, 1.000000, -0.130526, 0.991445, -0.258819, 0.965926,
-0.382683, 0.923880, -0.500000, 0.866025, -0.608762, 0.793353,
-0.707107, 0.707106, -0.793353, 0.608761, -0.866026, 0.500000,
-0.923880, 0.382684, -0.965926, 0.258819, -0.991445, 0.130526,
-1.000000, -0.000000, -0.991445, -0.130527, -0.965926, -0.258819,
-0.923879, -0.382684, -0.866025, -0.500000, -0.793353, -0.608762,
-0.707107, -0.707107, -0.608761, -0.793353, -0.500000, -0.866025,
-0.382683, -0.923880, -0.258819, -0.965926, -0.130526, -0.991445,
0.000000, -1.000000, 0.130526, -0.991445, 0.258819, -0.965926,
0.382684, -0.923880, 0.500000, -0.866025, 0.608762, -0.793353,
0.707107, -0.707107, 0.793354, -0.608761, 0.866026, -0.500000,
0.923880, -0.382683, 0.965926, -0.258819, 0.991445, -0.130526,
1.000000, 0.000000, 0.991445, 0.130526, 0.965926, 0.258820,
0.923879, 0.382684, 0.866025, 0.500000, 0.793353, 0.608761,
0.707107, 0.707107, 0.608761, 0.793354, 0.500000, 0.866026,
0.382683, 0.923880, 0.258819, 0.965926, 0.130526, 0.991445,
-0.000000, 1.000000, -0.130527, 0.991445, -0.258819, 0.965926,
-0.382684, 0.923879, -0.500000, 0.866025, -0.608762, 0.793353,
-0.707107, 0.707107, -0.793354, 0.608761, -0.866026, 0.499999,
-0.923880, 0.382683, -0.965926, 0.258819, -0.991445, 0.130526,
-1.000000, -0.000001, -0.991445, -0.130527, -0.965926, -0.258819,
-0.923879, -0.382683, -0.866025, -0.500000, -0.793353, -0.608762,
-0.707106, -0.707107, -0.608761, -0.793354
};
const FLOAT32 hbe_x_prod_cos_table_trans_4 [(128 +128) *2] =
{
/*For Up Sampling Factor not equal to 4*/
1.000000, 0.000000, 0.923880, 0.382683, 0.707107, 0.707107,
0.382683, 0.923880, -0.000000, 1.000000, -0.382683, 0.923880,
-0.707107, 0.707107, -0.923880, 0.382683, -1.000000, -0.000000,
-0.923880, -0.382683, -0.707107, -0.707107, -0.382683, -0.923880,
0.000000, -1.000000, 0.382684, -0.923879, 0.707107, -0.707107,
0.923880, -0.382683, 1.000000, 0.000000, 0.923879, 0.382684,
0.707107, 0.707107, 0.382683, 0.923880, -0.000000, 1.000000,
-0.382684, 0.923879, -0.707107, 0.707106, -0.923880, 0.382684,
-1.000000, -0.000000, -0.923879, -0.382684, -0.707107, -0.707107,
-0.382683, -0.923880, 0.000000, -1.000000, 0.382684, -0.923880,
0.707107, -0.707107, 0.923880, -0.382683, 1.000000, 0.000000,
0.923879, 0.382684, 0.707107, 0.707107, 0.382683, 0.923880,
-0.000000, 1.000000, -0.382684, 0.923879, -0.707107, 0.707107,
-0.923880, 0.382683, -1.000000, -0.000001, -0.923879, -0.382683,
-0.707106, -0.707107, -0.382683, -0.923880, 0.000000, -1.000000,
0.382684, -0.923879, 0.707107, -0.707107, 0.923880, -0.382683, 1.000000, 0.000000, 0.923879, 0.382684, 0.707106, 0.707107,
0.382683, 0.923880, −0.000001, 1.000000, −0.382684, 0.923880,
−0.707107, 0.707106, −0.923880, 0.382683, −1.000000, −0.000001,
−0.923879, −0.382684, −0.707107, −0.707107, −0.382683, −0.923880,
0.000001, −1.000000, 0.382684, −0.923879, 0.707107, −0.707107,
0.923880, −0.382682, 1.000000, 0.000001, 0.923879, 0.382683,
0.707106, 0.707107, 0.382683, 0.923880, −0.000001, 1.000000,
−0.382684, 0.923879, −0.707107, 0.707106, −0.923880, 0.382683,
−1.000000, −0.000000, −0.923879, −0.382685, −0.707106, −0.707107,
−0.382683, −0.923880, 0.000001, −1.000000, 0.382684, −0.923880,
0.707107, −0.707106, 0.923880, −0.382683, 1.000000, 0.000001,
0.923879, 0.382684, 0.707106, 0.707107, 0.382683, 0.923880,
−0.000001, 1.000000, −0.382684, 0.923880, −0.707107, 0.707106,
−0.923880, 0.382682, −1.000000, −0.000003, −0.923879, −0.382683,
−0.707106, −0.707108, −0.382683, −0.923880, 0.000001, −1.000000,
0.382684, −0.923879, 0.707107, −0.707106, 0.923880, −0.382681,
1.000000, 0.000000, 0.923879, 0.382685, 0.707106, 0.707108,
0.382682, 0.923879, −0.000001, 1.000000, −0.382684, 0.923879,
−0.707108, 0.707105, −0.923880, 0.382683, −1.000000, −0.000001,
−0.923879, −0.382686, −0.707106, −0.707107, −0.382682, −0.923880,
0.000001, −1.000000, 0.382685, −0.923880, 0.707108, −0.707106,
0.923880, −0.382682, 1.000000, 0.000003, 0.923879, 0.382683,
0.707106, 0.707108, 0.382682, 0.923880, −0.000001, 1.000000,
−0.382685, 0.923879, −0.707108, 0.707106, −0.923880, 0.382681,
−1.000000, −0.000000, −0.923879, −0.382685, −0.707106, −0.707108,
−0.382682, −0.923879, 0.000001, −1.000000, 0.382685, −0.923879,
0.707108, −0.707105, 0.923880, −0.382683
/*For Up Sampling Factor equal to 4*/
1.000000, 0.000000, 0.980785, 0.195090, 0.923880, 0.382683,
0.831470, 0.555570, 0.707107, 0.707107, 0.555570, 0.831470,
0.382683, 0.923880, 0.195090, 0.980785, −0.000000, 1.000000,
−0.195090, 0.980785, −0.382683, 0.923880, −0.555570, 0.831470,
−0.707107, 0.707107, −0.831470, 0.555570, −0.923880, 0.382683,
−0.980785, 0.195090, −1.000000, −0.000000, −0.980785, −0.195090,
−0.923880, −0.382683, −0.831470, −0.555570, −0.707107, −0.707107,
−0.555570, −0.831470, −0.382683, −0.923880, −0.195090, −0.980785,
0.000000, −1.000000, 0.195090, −0.980785, 0.382684, −0.923879,
0.555570, −0.831469, 0.707107, −0.707107, 0.831470, −0.555570,
0.923880, −0.382683, 0.980785, −0.195090, 1.000000, 0.000000,
0.980785, 0.195091, 0.923879, 0.382684, 0.831470, 0.555571,
0.707107, 0.707107, 0.555570, 0.831470, 0.382683, 0.923880,
0.195090, 0.980785, −0.000000, 1.000000, −0.195091, 0.980785,
−0.382684, 0.923879, −0.555570, 0.831470, −0.707107, 0.707106,
−0.831470, 0.555570, −0.923880, 0.382684, −0.980785, 0.195090,
−1.000000, −0.000000, −0.980785, −0.195091, −0.923879, −0.382684,
−0.831469, −0.555571, −0.707107, −0.707107, −0.555570, −0.831470,
−0.382683, −0.923880, −0.195090, −0.980785, −0.000000, −1.000000,
0.195091, −0.980785, 0.382684, −0.923880, 0.555570, −0.831469,
0.707107, −0.707107, 0.831470, −0.555570, 0.923880, −0.382683,
0.980785, −0.195090, 1.000000, 0.000000, 0.980785, 0.195090,
0.923879, 0.382684, 0.831469, 0.555570, 0.707107, 0.707107,
0.555570, 0.831470, 0.382683, 0.923880, 0.195090, 0.980785,
−0.000000, 1.000000, −0.195091, 0.980785, −0.382684, 0.923879,
−0.555571, 0.831469, −0.707107, 0.707107, −0.831470, 0.555570,
−0.923880, 0.382683, −0.980785, 0.195090, −1.000000, −0.000001,
−0.980785, −0.195091, −0.923879, −0.382683, −0.831469, −0.555571,
−0.707106, −0.707107, −0.555570, −0.831469, −0.382683, −0.923880,
−0.195090, −0.980785, 0.000000, −1.000000, 0.195091, −0.980785,
0.382684, −0.923879, 0.555570, −0.831469, 0.707107, −0.707107,
0.831470, −0.555570, 0.923880, −0.382683, 0.980785, −0.195089,
1.000000, 0.000000, 0.980785, 0.195091, 0.923879, 0.382684,
0.831469, 0.555570, 0.707106, 0.707107, 0.555570, 0.831470,
0.382683, 0.923880, 0.195090, 0.980785, −0.000001, 1.000000,
−0.195091, 0.980785, −0.382684, 0.923880, −0.555571, 0.831469,
−0.707107, 0.707106, −0.831470, 0.555571, −0.923880, 0.382683,
−0.980785, 0.195090, −1.000000, −0.000001, −0.980785, −0.195090,
−0.923879, −0.382684, −0.831469, −0.555571, −0.707106, −0.707107,
−0.555570, −0.831470, −0.382683, −0.923880, −0.195090, −0.980786,
0.000001, −1.000000, 0.195091, −0.980785, 0.382684, −0.923879,
0.555571, −0.831470, 0.707107, −0.707107, 0.831470, −0.555569,
0.923880, −0.382682, 0.980785, −0.195090
};
const FLOAT32 hbe_x_prod_cos_table_trans_4_1[2*(128 + 128)] =
{
/*For Up Sampling Factor not equal to 4*/
1.000000, 0.000000, 0.965926, 0.258819, 0.866025, 0.500000,
0.707107, 0.707107, 0.500000, 0.866025, 0.258819, 0.965926,
−0.000000, 1.000000, −0.258819, 0.965926, −0.500000, 0.866025,
−0.707107, 0.707107, −0.866025, 0.500000, −0.965926, 0.258819,
−1.000000, −0.000000, −0.965926, −0.258819, −0.866025, −0.500000,
−0.707107, −0.707107, −0.500000, −0.866025, −0.258819, −0.965926,
0.000000, −1.000000, 0.258819, −0.965926, 0.500000, −0.866025,
0.707107, −0.707107, 0.866026, −0.500000, 0.965926, −0.258819,
1.000000, 0.000000, 0.965926, 0.258819, 0.866026, 0.500000,
0.707107, 0.707107, 0.500000, 0.866026, 0.258819, 0.965926,
−0.000000, 1.000000, −0.258819, 0.965926, −0.500000, 0.866025,
−0.707107, 0.707106, −0.866026, 0.500000, −0.965926, 0.258819,
−1.000000, −0.000000, −0.965926, −0.258819, −0.866025, −0.500000,
−0.707107, −0.707107, −0.500000, −0.866025, −0.258819, −0.965926,
0.000000, −1.000000, 0.258819, −0.965926, 0.500000, −0.866025,
0.707107, −0.707107, 0.866026, −0.500000, 0.965926, −0.258819,
1.000000, 0.000000, 0.965926, 0.258819, 0.866025, 0.500000,
0.707107, 0.707107, 0.500000, 0.866025, 0.258819, 0.965926,
−0.000000, 1.000000, −0.258819, 0.965926, −0.500000, 0.866025,
−0.707107, 0.707107, −0.866026, 0.499999, −0.965926, 0.258819,
−1.000000, −0.000001, −0.965926, −0.258819, −0.866025, −0.500000,
−0.707107, −0.707107, −0.500000, −0.866026, −0.258819, −0.965926,
0.000000, −1.000000, 0.258820, −0.965926, 0.500000, −0.866025,
0.707107, −0.707107, 0.866026, −0.499999, 0.965926, −0.258818,
1.000000, 0.000000, 0.965926, 0.258820, 0.866025, 0.500001,
0.707106, 0.707107, 0.500000, 0.866025, 0.258819, 0.965926,
−0.000001, 1.000000, −0.258820, 0.965926, −0.500000, 0.866026,
−0.707107, 0.707106, −0.866026, 0.500000, −0.965926, 0.258819,
−1.000000, −0.000001, −0.965926, −0.258820, −0.866025, −0.500000,
−0.707107, −0.707107, −0.499999, −0.866026, −0.258818, −0.965926,
0.000001, −1.000000, 0.258820, −0.965925, 0.500001, −0.866025,
0.707107, −0.707107, 0.866026, −0.500000, 0.965926, −0.258818,
1.000000, 0.000001, 0.965926, 0.258819, 0.866025, 0.500001,
0.707107, 0.707107, 0.499999, 0.866025, 0.258819, 0.965926,
−0.000001, 1.000000, −0.258820, 0.965926, −0.500001, 0.866025,
−0.707107, 0.707106, −0.866026, 0.499999, −0.965926, 0.258818,
−1.000000, −0.000000, −0.965926, −0.258820, −0.866025, −0.500001,
−0.707107, −0.707107, −0.499999, −0.866026, −0.258818, −0.965926,
0.000001, −1.000000, 0.258820, −0.965926, 0.500001, −0.866025,
0.707107, −0.707106, 0.866026, −0.500000, 0.965926, −0.258819,
1.000000, 0.000001, 0.965926, 0.258820, 0.866025, 0.500000,
0.707106, 0.707107, 0.499999, 0.866025, 0.258818, 0.965926,
−0.000001, 1.000000, −0.258820, 0.965925
/*For Up Sampling Factor equal to 4*/
1.000000, 0.000000, 0.991445, 0.130526, 0.965926, 0.258819,
0.923880, 0.382683, 0.866025, 0.500000, 0.793353, 0.608761,
0.707107, 0.707107, 0.608761, 0.793353, 0.500000, 0.866025,
0.382683, 0.923880, 0.258819, 0.965926, 0.130526, 0.991445,
−0.000000, 1.000000, −0.130526, 0.991445, −0.258819, 0.965926,
−0.382683, 0.923880, −0.500000, 0.866025, −0.608761, 0.793353,
−0.707107, 0.707107, −0.793353, 0.608761, −0.866025, 0.500000,
−0.923880, 0.382683, −0.965926, 0.258819, −0.991445, 0.130526,
−1.000000, −0.000000, −0.991445, −0.130526, −0.965926, −0.258819,
−0.923880, −0.382683, −0.866025, −0.500000, −0.793353, −0.608762,
−0.707107, −0.707107, −0.608761, −0.793353, −0.500000, −0.866025,
−0.382683, −0.923880, −0.258819, −0.965926, −0.130526, −0.991445,
0.000000, −1.000000, 0.130526, −0.991445, 0.258819, −0.965926,
0.382684, −0.923879, 0.500000, −0.866025, 0.608762, −0.793353,
0.707107, −0.707107, 0.793353, −0.608761, 0.866026, −0.500000,
0.923880, −0.382683, 0.965926, −0.258819, 0.991445, −0.130526,
1.000000, 0.000000, 0.991445, 0.130527, 0.965926, 0.258819,
0.923879, 0.382684, 0.866025, 0.500000, 0.793353, 0.608762,
0.707107, 0.707107, 0.608761, 0.793353, 0.500000, 0.866026,
0.382683, 0.923880, 0.258819, 0.965926, 0.130526, 0.991445,
−0.000000, 1.000000, −0.130526, 0.991445, −0.258819, 0.965926,
−0.382684, 0.923879, −0.500000, 0.866025, −0.608762, 0.793353,
−0.707107, 0.707106, −0.793353, 0.608761, −0.866026, 0.500000,
−0.923880, 0.382684, −0.965926, 0.258819, −0.991445, 0.130526,
−1.000000, −0.000000, −0.991445, −0.130527, −0.965926, −0.258819,
−0.923879, −0.382684, −0.866025, −0.500000, −0.793353, −0.608762,
−0.707107, −0.707107, −0.608761, −0.793353, −0.500000, −0.866025,
−0.382683, −0.923880, −0.258819, −0.965926, −0.130526, −0.991445,
0.000000, −1.000000, 0.130526, −0.991445, 0.258819, −0.965926,
0.382684, −0.923880, 0.500000, −0.866025, 0.608762, −0.793353,
0.707107, −0.707107, 0.793354, −0.608761, 0.866026, −0.500000,
0.923880, −0.382683, 0.965926, −0.258819, 0.991445, −0.130526,
1.000000, 0.000000, 0.991445, 0.130526, 0.965926, 0.258820,
0.923879, 0.382684, 0.866025, 0.500000, 0.793353, 0.608761,
0.707107, 0.707107, 0.608761, 0.793354, 0.500000, 0.866026,
0.382683, 0.923880, 0.258819, 0.965926, 0.130526, 0.991445,
−0.000000, 1.000000, −0.130527, 0.991445, −0.258819, 0.965926,
−0.382684, 0.923879, −0.500000, 0.866025, −0.608762, 0.793353,
−0.707107, 0.707107, −0.793354, 0.608761, −0.866026, 0.499999, -continued

```
−0.923880, 0.382683, −0.965926, 0.258819, −0.991445, 0.130526,
−1.000000, −0.000001, −0.991445, −0.130527, −0.965926, −0.258819,
−0.923879, −0.382683, −0.866025, −0.500000, −0.793353, −0.608762,
−0.707106, −0.707107, −0.608761, −0.793354
};
```

To summarize, the above may correspond to the processing of an apparatus for decoding an encoded USAC stream as described above (among others, including a QMF harmonic transposer), for which the QMF based harmonic transposer may be configured to extract samples from subbands of the input signal, to obtain cross product gain values for pairs of the extracted samples, and to apply the cross product gain values to respective pairs of the extracted samples. The pre-computed information may relate to the cross product gain values. The cross product gain values may be determined off-line based on a cross product gain formula factors and stored in one or more look-up tables. The QMF based harmonic transposer may be configured to access the cross product gain values from the one or more look-up tables at run time.

The QMF transposer may include sub-sampled filter banks for QMF critical sampling processing. Such sub-sampled filter banks for QMF critical sampling processing may be described for example in clause 7.5.4.2 of the USAC standard, which clause is hereby incorporated by reference in its entirety. A subset of the subbands covering the source range for the transposer may be synthesized to the time domain by a small sub-sampled real-valued QMF bank. The time domain output from this filter bank is then fed to a complex-valued analysis QMF bank of twice the filter bank size. This approach enables a substantial saving in computational complexity as only the relevant source range is transformed to the QMF subband domain having doubled frequency resolution. The small QMF banks are obtained by sub-sampling of the original 64-band QMF bank, where the prototype filter coefficients are obtained by linear interpolation of the original prototype filter.

The QMF transposer may include a real-valued sub-sampled $M_S$-channel synthesis filter bank. The real-valued sub-sampled $M_S$-channel synthesis filter bank of the QMF transposer may be described in clause 7.5.4.2.2 of the USAC standard, for example. This clause is hereby incorporated by reference in its entirety. In the filter bank, a set of $M_S$ real-valued subband samples may be calculated from the $M_S$ new complex-valued subband samples according to $$V(k - k_L) = \mathrm{Re}\left\{X_{Low}(k) \cdot \exp\left(i\frac{\pi}{2}\left(k_L - \frac{(k+0.5)\cdot 191}{64}\right)\right)\right\}, k_L \le k < k_L + M_S$$

In the equation, exp( ) denotes the complex exponential function, i is the imaginary unit. $k_L$ represents the subband index of the first channel from the QMF bank (e.g., 32-band QMF bank) to enter the sub-sampled synthesis filter bank, i.e., the start band. When coreCoderFrameLength=768 samples and $k_L + M_{SQ} \ge 24$, $k_L$ is calculated as $k_L = 24 - M_S$.

The formula for determining the complex coefficients (i.e., the complex exponentials) may be implemented off-line to derive (e.g., pre-compute) complex coefficients prior to run time. At run time, the pre-computed complex coefficients may be referred to as needed, without computation. For example, the complex coefficients may be obtained (e.g., read, retrieved) from one or more look-up tables. The actual arrangement of the complex coefficients within the look-up table(s) may vary, as long as the decoder is provided with a routine to retrieve the appropriate complex coefficient(s) at run time.

For example, in the process of determining real-valued sub-sampled $M_S$-channel synthesis in the QMF bank, the complex coefficients (i.e., the complex exponentials) mentioned above may be determined based on a look-up table. Odd indexed values in that table may correspond to the sine (imaginary component of the complex value) and even indexed values may correspond to the cosine (real component of the complex values). Different tables may be provided for different startbands $k_L$.

For example, the look-up table may be given as follows (for $M_S = 32$):

```
const FLOAT32 cos_tab_trans_qmf [7][32 * 2] =
{
    /*if startband is 0*/
    {
    −0.698376249409f,0.715730825284f,      0.732654271672f,0.680600997795f,
    0.662415777590f,−0.749136394523f,      −0.765167265622f,−0.643831542890f,
    −0.624859488142f,0.780737228572f,      0.795836904609f,0.605511041404f,
    0.585797857456f,−0.810457198253f,      −0.824589302785f,−0.565731810784f,
    −0.545324988422f,0.838224705555f,      0.851355193105f,0.524589682678f,
    0.503538383726f,−0.863972856122f,      −0.876070094195f,−0.482183772079f,
    −0.460538710958f,0.887639620403f,      0.898674465694f,0.438616238539f,
    0.416429560098f,−0.909167983091f,      −0.919113851690f,−0.393992040061f,
    −0.371317193952f,0.928506080473f,      0.937339011913f,0.348418680249f,
    0.325310292162f,−0.945607325381f,      −0.953306040354f,−0.302005949319f,
    −0.278519689385f,0.960430519416f,      0.966976471045f,0.254865659605f,
    0.231058108281f,−0.972939952206f,      −0.978317370720f,−0.207111376192f,
    −0.183039887955f,0.983105487431f,      0.987301418158f,0.158858143334f,
    0.134580708507f,−0.990902635428f,      −0.993906970002f,−0.110222207294f,
    −0.085797312344f,0.996312612183f,      0.998118112900f,0.061320736302f,
    0.036807222941f,−0.999322384588f,      −0.999924701839f,−0.012271538286f,
    },
    /*if startband is 2*/
    {
    −0.662415777590f,0.749136394523f,      0.765167265622f,0.643831542890f,
    0.624859488142f,−0.780737228572f,      −0.795836904609f,−0.605511041404f,
    −0.585797857456f,0.810457198253f,      0.824589302785f,0.565731810784f,
    0.545324988422f,−0.838224705555f,      −0.851355193105f,−0.524589682678f,
    −0.503538383726f,0.863972856122f,      0.876070094195f,0.482183772079f,
    0.460538710958f,−0.887639620403f,      −0.898674465694f,−0.438616238539f,
```

-0.416429560098f,0.909167983091f, 0.919113851690f,0.393992040061f,
0.371317193952f,−0.928506080473f, −0.937339011913f,−0.348418680249f,
−0.325310292162f,0.945607325381f, 0.953306040354f,0.302005949319f,
0.278519689385f,−0.960430519416f, −0.966976471045f,−0.254865659605f,
−0.231058108281f,0.972939952206f, 0.978317370720f,0.207111376192f,
0.183039887955f,−0.983105487431f, −0.987301418158f,−0.158858143334f,
−0.134580708507f,0.990902635428f, 0.993906970002f,0.110222207294f,
0.085797312344f,−0.996312612183f, −0.998118112900f,−0.061320736302f,
−0.036807222941f,0.999322384588f, 0.999924701839f,0.012271538286f,
−0.012271538286f,−0.999924701839f, −0.999322384588f,0.036807222941f,
},
/*if startband is 4*/
{
−0.624859488142f,0.780737228572f, 0.795836904609f,0.605511041404f,
0.585797857456f,−0.810457198253f, −0.824589302785f,−0.565731810784f,
−0.545324988422f,0.838224705555f, 0.851355193105f,0.524589682678f,
0.503538383726f,−0.863972856122f, −0.876070094195f,−0.482183772079f,
−0.460538710958f,0.887639620403f, 0.898674465694f,0.438616238539f,
0.416429560098f,−0.909167983091f, −0.919113851690f,−0.393992040061f,
−0.371317193952f,0.928506080473f, 0.937339011913f,0.348418680249f,
0.325310292162f,−0.945607325381f, −0.953306040354f,−0.302005949319f,
−0.278519689385f,0.960430519416f, 0.966976471045f,0.254865659605f,
0.231058108281f,−0.972939952206f, −0.978317370720f,−0.207111376192f,
−0.183039887955f,0.983105487431f, 0.987301418158f,0.158858143334f,
0.134580708507f,−0.990902635428f, −0.993906970002f,−0.110222207294f,
−0.085797312344f,0.996312612183f, 0.998118112900f,0.061320736302f,
0.036807222941f,−0.999322384588f, −0.999924701839f,−0.012271538286f,
0.012271538286f,0.999924701839f, 0.999322384588f,−0.036807222941f,
−0.061320736302f,−0.998118112900f, −0.996312612183f,0.085797312344f,
},
/*if startband is 6*/
{
−0.585797857456f,0.810457198253f, 0.824589302785f,0.565731810784f,
0.545324988422f,−0.838224705555f, −0.851355193105f,−0.524589682678f,
−0.503538383726f,0.863972856122f, 0.876070094195f,0.482183772079f,
0.460538710958f,−0.887639620403f, −0.898674465694f,−0.438616238539f,
−0.416429560098f,0.909167983091f, 0.919113851690f,0.393992040061f,
0.371317193952f,−0.928506080473f, −0.937339011913f,−0.348418680249f,
−0.325310292162f,0.945607325381f, 0.953306040354f,0.302005949319f,
0.278519689385f,−0.960430519416f, −0.966976471045f,−0.254865659605f,
−0.231058108281f,0.972939952206f, 0.978317370720f,0.207111376192f,
0.183039887955f,−0.983105487431f, −0.987301418158f,−0.158858143334f,
−0.134580708507f,0.990902635428f, 0.993906970002f,0.110222207294f,
0.085797312344f,−0.996312612183f, −0.998118112900f,−0.061320736302f,
−0.036807222941f,0.999322384588f, 0.999924701839f,0.012271538286f,
−0.012271538286f,−0.999924701839f, −0.999322384588f,0.036807222941f,
0.061320736302f, 0.998118112900f, 0.996312612183f,−0.085797312344f,
−0.110222207294f,−0.993906970002f, −0.990902635428f,0.134580708507f,
},
/*if startband is 8*/
{
−0.545324988422f,0.838224705555f, 0.851355193105f,0.524589682678f,
0.503538383726f,−0.863972856122f, −0.876070094195f,−0.482183772079f,
−0.460538710958f,0.887639620403f, 0.898674465694f,0.438616238539f,
0.416429560098f,−0.909167983091f, −0.919113851690f,−0.393992040061f,
−0.371317193952f,0.928506080473f, 0.937339011913f,0.348418680249f,
0.325310292162f,−0.945607325381f, −0.953306040354f,−0.302005949319f,
−0.278519689385f,0.960430519416f, 0.966976471045f,0.254865659605f,
0.231058108281f,−0.972939952206f, −0.978317370720f,−0.207111376192f,
−0.183039887955f,0.983105487431f, 0.987301418158f,0.158858143334f,
0.134580708507f,−0.990902635428f, −0.993906970002f,−0.110222207294f,
−0.085797312344f,0.996312612183f, 0.998118112900f,0.061320736302f,
0.036807222941f,−0.999322384588f, −0.999924701839f,−0.012271538286f,
0.012271538286f,0.999924701839f, 0.999322384588f,−0.036807222941f,
−0.061320736302f,−0.998118112900f, −0.996312612183f,0.085797312344f,
0.110222207294f,0.993906970002f, 0.990902635428f,−0.134580708507f,
−0.158858143334f,−0.987301418158f, −0.983105487431f,0.183039887955f,
},
/*if startband is 10*/
{
−0.503538383726f,0.863972856122f, 0.876070094195f,0.482183772079f,
0.460538710958f,−0.887639620403f, −0.898674465694f,−0.438616238539f,
−0.416429560098f,0.909167983091f, 0.919113851690f,0.393992040061f,
0.371317193952f,−0.928506080473f, −0.937339011913f,−0.348418680249f,
−0.325310292162f,0.945607325381f, 0.953306040354f,0.302005949319f,
0.278519689385f,−0.960430519416f, −0.966976471045f,−0.254865659605f,
−0.231058108281f,0.972939952206f, 0.978317370720f,0.207111376192f,
0.183039887955f,−0.983105487431f, −0.987301418158f,−0.158858143334f,
−0.134580708507f,0.990902635428f, 0.993906970002f,0.110222207294f, -continued

```
0.085797312344f,-0.996312612183f,      -0.998118112900f,-0.061320736302f,
-0.036807222941f,0.999322384588f,       0.999924701839f,0.012271538286f,
-0.012271538286f,-0.999924701839f,     -0.999322384588f,0.036807222941f,
 0.061320736302f,0.998118112900f,       0.996312612183f,-0.085797312344f,
-0.110222207294f,-0.993906970002f,     -0.990902635428f,0.134580708507f,
 0.158858143334f,0.987301418158f,       0.983105487431f,-0.183039887955f,
-0.207111376192f,-0.978317370720f,     -0.972939952206f,0.231058108281f,
},
/*if startband is 12*/
{
-0.460538710958f,0.887639620403f,       0.898674465694f,0.438616238539f,
 0.416429560098f,-0.909167983091f,     -0.919113851690f,-0.393992040061f,
-0.371317193952f,0.928506080473f,       0.937339011913f,0.348418680249f,
 0.325310292162f,-0.945607325381f,     -0.953306040354f,-0.302005949319f,
-0.278519689385f,0.960430519416f,       0.966976471045f,0.254865659605f,
 0.231058108281f,-0.972939952206f,     -0.978317370720f,-0.207111376192f,
-0.183039887955f,0.983105487431f,       0.987301418158f,0.158858143334f,
 0.134580708507f,-0.990902635428f,     -0.993906970002f,-0.110222207294f,
-0.085797312344f,0.996312612183f,       0.998118112900f,0.061320736302f,
 0.036807222941f,-0.999322384588f,     -0.999924701839f,-0.012271538286f,
 0.012271538286f,0.999924701839f,       0.999322384588f,-0.036807222941f,
-0.061320736302f,-0.998118112900f,     -0.996312612183f,0.085797312344f,
 0.110222207294f,0.993906970002f,       0.990902635428f,-0.134580708507f,
-0.158858143334f,-0.987301418158f,     -0.983105487431f,0.183039887955f,
 0.207111376192f,0.978317370720f,       0.972939952206f,-0.231058108281f,
-0.254865659605f,-0.966976471045f,     -0.960430519416f,0.278519689385f,
}
};
```

To summarize, the above may correspond to the processing of an apparatus for decoding an encoded USAC stream as described above (among others, including a QMF harmonic transposer), for which the QMF based harmonic transposer may comprise a real-valued $M_S$ channel synthesis filterbank configured to calculate a set of $M_S$ real-valued subband samples from a set of $M_S$ new complex-valued subband samples. Each real-valued subband sample and each new complex-valued subband sample may be associated with a respective subband among $M_S$ subbands. Calculating the set of $M_S$ real-valued subband samples from the set of $M_S$ new complex-valued subband samples may involve, for each of the $M_S$ new complex-values subband samples, applying a respective complex exponential to that new complex-valued subband sample and taking the real part thereof. The respective complex exponential may depend on a subband index of that new complex-valued subband sample. The pre-computed information may relate to the complex exponentials for the $M_S$ subbands. The complex exponentials may be determined off-line and stored in one or more look-up tables. The QMF based harmonic transposer may be configured to access the complex exponentials from the one or more look-up tables at run time.

Further in the real-valued sub-sampled $M_S$-channel synthesis filter bank of the QMF transposer, the samples in an array v may be shifted by $2M_S$ positions. The oldest $2M_S$ samples may be discarded. The $M_S$ real-valued subband samples may be multiplied by the matrix N, i.e. the matrix-vector product N·V is computed, where the entries of the matrix N are given by $$N(k,n) = \frac{1}{M_S} \cdot \cos\left(\frac{\pi \cdot (k+0.5) \cdot (2 \cdot n - M_S)}{2M_S}\right), \begin{cases} 0 \leq k < M_S \\ 0 \leq n < 2M_S \end{cases}$$

The matrix N (i.e., its entries) may be pre-computed (offline) for all possible values of $M_S$ prior to run time. At run time, the pre-computed matrices N (i.e., their entries) may be referred to as needed, without computation. For example, the matrices N may be obtained (e.g., read, retrieved) from one or more look-up tables. The actual arrangement of the (entries of the) matrices N within the look-up table(s) may vary, as long as the decoder is provided with a routine to retrieve the appropriate matrix (entries) at run time.

For example, entries of the matrix N for all possible values of $M_s$ (e.g., $M_s$=4, 8, 12, 16, 20) may be pre computed and stored in following tables synth_cos_tab_kl_4, synth_cos_tab_kl_8, synth_cos_tab_kl_12, synth_cos_tab_kl_16, synth_cos_tab_kl_20, where

```
const FLOAT32 synth_cos_tab_kl_4 [8 * 4] =
{
    0.176777f,   -0.176777f,   -0.176777f,    0.176777f,
    0.230970f,    0.095671f,   -0.095671f,   -0.230970f,
    0.250000f,    0.250000f,    0.250000f,    0.250000f,
    0.230970f,    0.095671f,   -0.095671f,   -0.230970f,
    0.176777f,   -0.176777f,   -0.176777f,    0.176777f,
    0.095671f,   -0.230970f,    0.230970f,   -0.095671f,
    0.000000f,   -0.000000f,    0.000000f,   -0.000000f,
   -0.095671f,    0.230970f,   -0.230970f,    0.095671f,
};
const FLOAT32 synth_cos_tab_kl 8 [16 * 8] = {
    0.088388f,   -0.088388f,   -0.088388f,    0.088388f,
    0.088388f,   -0.088388f,   -0.088388f,    0.088388f,
    0.103934f,   -0.024386f,   -0.122598f,   -0.069446f,
    0.069446f,    0.122598f,    0.024386f,   -0.103934f,
    0.115485f,    0.047835f,   -0.047835f,   -0.115485f,
   -0.115485f,   -0.047835f,    0.047835f,    0.115485f,
    0.122598f,    0.103934f,    0.069446f,    0.024386f,
   -0.024386f,   -0.069446f,   -0.103934f,   -0.122598f,
    0.125000f,    0.125000f,    0.125000f,    0.125000f,
    0.125000f,    0.125000f,    0.125000f,    0.125000f,
    0.122598f,    0.103934f,    0.069446f,    0.024386f,
   -0.024386f,   -0.069446f,   -0.103934f,   -0.122598f,
    0.115485f,    0.047835f,   -0.047835f,   -0.115485f,
   -0.115485f,   -0.047835f,    0.047835f,    0.115485f,
    0.103934f,   -0.024386f,   -0.122598f,   -0.069446f,
    0.069446f,    0.122598f,    0.024386f,   -0.103934f,
    0.088388f,   -0.088388f,   -0.088388f,    0.088388f,
    0.088388f,   -0.088388f,   -0.088388f,    0.088388f,
    0.069446f,   -0.122598f,    0.024386f,    0.103934f,
```

```
        -0.103934f,   -0.024386f,    0.122598f,   -0.069446f,
         0.047835f,   -0.115485f,    0.115485f,   -0.047835f,
        -0.047835f,    0.115485f,   -0.115485f,    0.047835f,
         0.024386f,   -0.069446f,    0.103934f,   -0.122598f,
         0.122598f,   -0.103934f,    0.069446f,   -0.024386f,
         0.000000f,   -0.000000f,    0.000000f,   -0.000000f,
         0.000000f,   -0.000000f,    0.000000f,   -0.000000f,
        -0.024386f,    0.069446f,   -0.103934f,    0.122598f,
        -0.122598f,    0.103934f,   -0.069446f,    0.024386f,
        -0.047835f,    0.115485f,   -0.115485f,    0.047835f,
         0.047835f,   -0.115485f,    0.115485f,   -0.047835f,
        -0.069446f,    0.122598f,   -0.024386f,   -0.103934f,
         0.103934f,    0.024386f,   -0.122598f,    0.069446f,
};
const FLOAT32 synth_cos_tab_kl_12 [24 * 12] = {
         0.058926f,   -0.058926f,   -0.058926f,    0.058926f,
         0.058926f,   -0.058926f,   -0.058926f,    0.058926f,
         0.058926f,   -0.058926f,   -0.058926f,    0.058926f,
         0.066113f,   -0.031890f,   -0.082620f,   -0.010877f,
         0.076990f,    0.050730f,   -0.050730f,   -0.076990f,
         0.010877f,    0.082620f,    0.031890f,   -0.066113f,
         0.072169f,   -0.000000f,   -0.072169f,   -0.072169f,
         0.000000f,    0.072169f,    0.072169f,   -0.000000f,
        -0.072169f,   -0.072169f,    0.000000f,    0.072169f,
         0.076990f,    0.031890f,   -0.031890f,   -0.076990f,
        -0.076990f,   -0.031890f,    0.031890f,    0.076990f,
         0.076990f,    0.031890f,   -0.031890f,   -0.076990f,
         0.080494f,    0.058926f,    0.021568f,   -0.021568f,
        -0.058926f,   -0.080494f,   -0.080494f,   -0.058926f,
        -0.021568f,    0.021568f,    0.058926f,    0.080494f,
         0.082620f,    0.076990f,    0.066113f,    0.050730f,
         0.031890f,    0.010877f,   -0.010877f,   -0.031890f,
        -0.050730f,   -0.066113f,   -0.076990f,   -0.082620f,
         0.083333f,    0.083333f,    0.083333f,    0.083333f,
         0.083333f,    0.083333f,    0.083333f,    0.083333f,
         0.083333f,    0.083333f,    0.083333f,    0.083333f,
         0.082620f,    0.076990f,    0.066113f,    0.050730f,
         0.031890f,    0.010877f,   -0.010877f,   -0.031890f,
        -0.050730f,   -0.066113f,   -0.076990f,   -0.082620f,
         0.080494f,    0.058926f,    0.021568f,   -0.021568f,
        -0.058926f,   -0.080494f,   -0.080494f,   -0.058926f,
        -0.021568f,    0.021568f,    0.058926f,    0.080494f,
         0.076990f,    0.031890f,   -0.031890f,   -0.076990f,
        -0.076990f,   -0.031890f,    0.031890f,    0.076990f,
         0.076990f,    0.031890f,   -0.031890f,   -0.076990f,
         0.072169f,   -0.000000f,   -0.072169f,   -0.072169f,
         0.000000f,    0.072169f,    0.072169f,   -0.000000f,
        -0.072169f,   -0.072169f,    0.000000f,    0.072169f,
         0.066113f,   -0.031890f,   -0.082620f,   -0.010877f,
         0.076990f,    0.050730f,   -0.050730f,   -0.076990f,
         0.010877f,    0.082620f,    0.031890f,   -0.066113f,
         0.058926f,   -0.058926f,   -0.058926f,    0.058926f,
         0.058926f,   -0.058926f,   -0.058926f,    0.058926f,
         0.058926f,   -0.058926f,   -0.058926f,    0.058926f,
         0.050730f,   -0.076990f,   -0.010877f,    0.082620f,
        -0.031890f,   -0.066113f,    0.066113f,    0.031890f,
        -0.082620f,    0.010877f,    0.076990f,   -0.050730f,
         0.041667f,   -0.083333f,    0.041667f,    0.041667f,
        -0.083333f,    0.041667f,    0.041667f,   -0.083333f,
         0.041667f,    0.041667f,   -0.083333f,    0.041667f,
         0.031890f,   -0.076990f,    0.076990f,   -0.031890f,
        -0.031890f,    0.076990f,   -0.076990f,    0.031890f,
         0.031890f,   -0.076990f,    0.076990f,   -0.031890f,
         0.021568f,   -0.058926f,    0.080494f,   -0.080494f,
         0.058926f,   -0.021568f,   -0.021568f,    0.058926f,
        -0.080494f,    0.080494f,   -0.058926f,    0.021568f,
         0.010877f,   -0.031890f,    0.050730f,   -0.066113f,
         0.076990f,   -0.082620f,    0.082620f,   -0.076990f,
         0.066113f,   -0.050730f,    0.031890f,   -0.010877f,
        -0.000000f,    0.000000f,   -0.000000f,    0.000000f,
        -0.000000f,    0.000000f,   -0.000000f,    0.000000f,
        -0.000000f,    0.000000f,   -0.000000f,    0.000000f,
        -0.010877f,    0.031890f,   -0.050730f,    0.066113f,
        -0.076990f,    0.082620f,   -0.082620f,    0.076990f,
        -0.066113f,    0.050730f,   -0.031890f,    0.010877f,
        -0.021568f,    0.058926f,   -0.080494f,    0.080494f,
        -0.058926f,    0.021568f,    0.021568f,   -0.058926f,
         0.080494f,   -0.080494f,    0.058926f,   -0.021568f,
         0.010877f,   -0.031890f,    0.050730f,   -0.066113f,
         0.076990f,   -0.082620f,    0.082620f,   -0.076990f,
         0.066113f,   -0.050730f,    0.031890f,   -0.010877f,
        -0.021568f,    0.058926f,   -0.080494f,    0.080494f,
        -0.058926f,    0.021568f,    0.021568f,   -0.058926f,
         0.080494f,   -0.080494f,    0.058926f,   -0.021568f,
        -0.031890f,    0.076990f,   -0.076990f,    0.031890f,
         0.031890f,   -0.076990f,    0.076990f,   -0.031890f,
        -0.031890f,    0.076990f,   -0.076990f,    0.031890f,
        -0.041667f,    0.083333f,   -0.041667f,   -0.041667f,
         0.083333f,   -0.041667f,   -0.041667f,    0.083333f,
        -0.041667f,   -0.041667f,    0.083333f,   -0.041667f,
        -0.050730f,    0.076990f,    0.010877f,   -0.082620f,
         0.031890f,    0.066113f,   -0.066113f,   -0.031890f,
         0.082620f,   -0.010877f,   -0.076990f,    0.050730f,
};
const FLOAT32 synth_cos_tab_kl_16 [32 * 16] = {
         0.044194f,   -0.044194f,   -0.044194f,    0.044194f,
         0.044194f,   -0.044194f,   -0.044194f,    0.044194f,
         0.044194f,   -0.044194f,   -0.044194f,    0.044194f,
         0.044194f,   -0.044194f,   -0.044194f,    0.044194f,
         0.048313f,   -0.029462f,   -0.059809f,    0.006126f,
         0.062199f,    0.018143f,   -0.055120f,   -0.039650f,
         0.039650f,    0.055120f,   -0.018143f,   -0.062199f,
        -0.006126f,    0.059809f,    0.029462f,   -0.048313f,
         0.051967f,   -0.012193f,   -0.061299f,   -0.034723f,
         0.034723f,    0.061299f,    0.012193f,   -0.051967f,
        -0.051967f,    0.012193f,    0.061299f,    0.034723f,
        -0.034723f,   -0.061299f,   -0.012193f,    0.051967f,
         0.055120f,    0.006126f,   -0.048313f,   -0.059809f,
        -0.018143f,    0.039650f,    0.062199f,    0.029462f,
        -0.029462f,   -0.062199f,   -0.039650f,    0.018143f,
         0.059809f,    0.048313f,   -0.006126f,   -0.055120f,
         0.057742f,    0.023918f,   -0.023918f,   -0.057742f,
        -0.057742f,   -0.023918f,    0.023918f,    0.057742f,
         0.057742f,    0.023918f,   -0.023918f,   -0.057742f,
        -0.057742f,   -0.023918f,    0.023918f,    0.057742f,
         0.059809f,    0.039650f,    0.006126f,   -0.029462f,
        -0.055120f,   -0.062199f,   -0.048313f,   -0.018143f,
         0.018143f,    0.048313f,    0.062199f,    0.055120f,
         0.029462f,   -0.006126f,   -0.039650f,   -0.059809f,
         0.061299f,    0.051967f,    0.034723f,    0.012193f,
        -0.012193f,   -0.034723f,   -0.051967f,   -0.061299f,
        -0.061299f,   -0.051967f,   -0.034723f,   -0.012193f,
         0.012193f,    0.034723f,    0.051967f,    0.061299f,
         0.062199f,    0.059809f,    0.055120f,    0.048313f,
         0.039650f,    0.029462f,    0.018143f,    0.006126f,
        -0.006126f,   -0.018143f,   -0.029462f,   -0.039650f,
        -0.048313f,   -0.055120f,   -0.059809f,   -0.062199f,
         0.062500f,    0.062500f,    0.062500f,    0.062500f,
         0.062500f,    0.062500f,    0.062500f,    0.062500f,
         0.062500f,    0.062500f,    0.062500f,    0.062500f,
         0.062500f,    0.062500f,    0.062500f,    0.062500f,
         0.062199f,    0.059809f,    0.055120f,    0.048313f,
         0.039650f,    0.029462f,    0.018143f,    0.006126f,
        -0.006126f,   -0.018143f,   -0.029462f,   -0.039650f,
        -0.048313f,   -0.055120f,   -0.059809f,   -0.062199f,
         0.061299f,    0.051967f,    0.034723f,    0.012193f,
        -0.012193f,   -0.034723f,   -0.051967f,   -0.061299f,
        -0.061299f,   -0.051967f,   -0.034723f,   -0.012193f,
         0.012193f,    0.034723f,    0.051967f,    0.061299f,
         0.059809f,    0.039650f,    0.006126f,   -0.029462f,
        -0.055120f,   -0.062199f,   -0.048313f,   -0.018143f,
         0.018143f,    0.048313f,    0.062199f,    0.055120f,
         0.029462f,   -0.006126f,   -0.039650f,   -0.059809f,
         0.057742f,    0.023918f,   -0.023918f,   -0.057742f,
        -0.057742f,   -0.023918f,    0.023918f,    0.057742f,
         0.057742f,    0.023918f,   -0.023918f,   -0.057742f,
        -0.057742f,   -0.023918f,    0.023918f,    0.057742f,
         0.055120f,    0.006126f,   -0.048313f,   -0.059809f,
        -0.018143f,    0.039650f,    0.062199f,    0.029462f,
        -0.029462f,   -0.062199f,   -0.039650f,    0.018143f,
         0.059809f,    0.048313f,   -0.006126f,   -0.055120f,
         0.051967f,   -0.012193f,   -0.061299f,   -0.034723f,
         0.034723f,    0.061299f,    0.012193f,   -0.051967f,
        -0.051967f,    0.012193f,    0.061299f,    0.034723f,
        -0.034723f,   -0.061299f,   -0.012193f,    0.051967f,
         0.048313f,   -0.029462f,   -0.059809f,    0.006126f,
         0.062199f,    0.018143f,   -0.055120f,   -0.039650f,
         0.039650f,    0.055120f,   -0.018143f,   -0.062199f,
        -0.006126f,    0.059809f,    0.029462f,   -0.048313f,
         0.044194f,   -0.044194f,   -0.044194f,    0.044194f,
         0.044194f,   -0.044194f,   -0.044194f,    0.044194f,
         0.044194f,   -0.044194f,   -0.044194f,    0.044194f,
         0.044194f,   -0.044194f,   -0.044194f,    0.044194f,
         0.039650f,   -0.055120f,   -0.018143f,    0.062199f,
```

```
        -0.006126f,   -0.059809f,    0.029462f,    0.048313f,
        -0.048313f,   -0.029462f,    0.059809f,    0.006126f,
        -0.062199f,    0.018143f,    0.055120f,   -0.039650f,
         0.034723f,   -0.061299f,    0.012193f,    0.051967f,
        -0.051967f,   -0.012193f,    0.061299f,   -0.034723f,
        -0.034723f,    0.061299f,   -0.012193f,   -0.051967f,
         0.051967f,    0.012193f,   -0.061299f,    0.034723f,
         0.029462f,   -0.062199f,    0.039650f,    0.018143f,
        -0.059809f,    0.048313f,    0.006126f,   -0.055120f,
         0.055120f,   -0.006126f,   -0.048313f,    0.059809f,
        -0.018143f,   -0.039650f,    0.062199f,   -0.029462f,
         0.023918f,   -0.057742f,    0.057742f,   -0.023918f,
        -0.023918f,    0.057742f,   -0.057742f,    0.023918f,
         0.023918f,   -0.057742f,    0.057742f,   -0.023918f,
        -0.023918f,    0.057742f,   -0.057742f,    0.023918f,
         0.018143f,   -0.048313f,    0.062199f,   -0.055120f,
         0.029462f,    0.006126f,   -0.039650f,    0.059809f,
        -0.059809f,    0.039650f,   -0.006126f,   -0.029462f,
         0.055120f,   -0.062199f,    0.048313f,   -0.018143f,
         0.012193f,   -0.034723f,    0.051967f,   -0.061299f,
         0.061299f,   -0.051967f,    0.034723f,   -0.012193f,
        -0.012193f,    0.034723f,   -0.051967f,    0.061299f,
        -0.061299f,    0.051967f,   -0.034723f,    0.012193f,
         0.006126f,   -0.018143f,    0.029462f,   -0.039650f,
         0.048313f,   -0.055120f,    0.059809f,   -0.062199f,
         0.062199f,   -0.059809f,    0.055120f,   -0.048313f,
         0.039650f,   -0.029462f,    0.018143f,   -0.006126f,
         0.000000f,   -0.000000f,    0.000000f,   -0.000000f,
         0.000000f,   -0.000000f,    0.000000f,   -0.000000f,
        -0.000000f,    0.000000f,   -0.000000f,    0.000000f,
        -0.000000f,    0.000000f,   -0.000000f,    0.000000f,
        -0.006126f,    0.018143f,   -0.029462f,    0.039650f,
        -0.048313f,    0.055120f,   -0.059809f,    0.062199f,
        -0.062199f,    0.059809f,   -0.055120f,    0.048313f,
        -0.039650f,    0.029462f,   -0.018143f,    0.006126f,
        -0.012193f,    0.034723f,   -0.051967f,    0.061299f,
        -0.061299f,    0.051967f,   -0.034723f,    0.012193f,
         0.012193f,   -0.034723f,    0.051967f,   -0.061299f,
         0.061299f,   -0.051967f,    0.034723f,   -0.012193f,
        -0.018143f,    0.048313f,   -0.062199f,    0.055120f,
        -0.029462f,   -0.006126f,    0.039650f,   -0.059809f,
         0.059809f,   -0.039650f,    0.006126f,    0.029462f,
        -0.055120f,    0.062199f,   -0.048313f,    0.018143f,
        -0.023918f,    0.057742f,   -0.057742f,    0.023918f,
         0.023918f,   -0.057742f,    0.057742f,   -0.023918f,
        -0.023918f,    0.057742f,   -0.057742f,    0.023918f,
         0.023918f,   -0.057742f,    0.057742f,   -0.023918f,
        -0.029462f,    0.062199f,   -0.039650f,   -0.018143f,
         0.059809f,   -0.048313f,   -0.006126f,    0.055120f,
        -0.055120f,    0.006126f,    0.048313f,   -0.059809f,
         0.018143f,    0.039650f,   -0.062199f,    0.029462f,
        -0.034723f,    0.061299f,   -0.012193f,   -0.051967f,
         0.051967f,    0.012193f,   -0.061299f,    0.034723f,
         0.034723f,   -0.061299f,    0.012193f,    0.051967f,
        -0.051967f,   -0.012193f,    0.061299f,   -0.034723f,
        -0.039650f,    0.055120f,    0.018143f,   -0.062199f,
         0.006126f,    0.059809f,   -0.029462f,   -0.048313f,
         0.048313f,    0.029462f,   -0.059809f,   -0.006126f,
         0.062199f,   -0.018143f,   -0.055120f,    0.039650f,
};
const FLOAT32 synth_cos_tab_kl_20 [40 * 20] = {
         0.035355f,   -0.035355f,   -0.035355f,    0.035355f,
         0.035355f,   -0.035355f,   -0.035355f,    0.035355f,
         0.035355f,   -0.035355f,   -0.035355f,    0.035355f,
         0.035355f,   -0.035355f,   -0.035355f,    0.035355f,
         0.035355f,   -0.035355f,   -0.035355f,    0.035355f,
         0.038020f,   -0.026125f,   -0.046194f,    0.011672f,
         0.049846f,    0.003923f,   -0.048618f,   -0.019134f,
         0.042632f,    0.032472f,   -0.032472f,   -0.042632f,
         0.019134f,    0.048618f,   -0.003923f,   -0.049846f,
        -0.011672f,    0.046194f,    0.026125f,   -0.038020f,
         0.040451f,   -0.015451f,   -0.050000f,   -0.015451f,
         0.040451f,    0.040451f,   -0.015451f,   -0.050000f,
        -0.015451f,    0.040451f,    0.040451f,   -0.015451f,
        -0.050000f,   -0.015451f,    0.040451f,    0.040451f,
        -0.015451f,   -0.050000f,   -0.015451f,    0.040451f,
         0.042632f,   -0.003923f,   -0.046194f,   -0.038020f,
         0.011672f,    0.048618f,    0.032472f,   -0.019134f,
        -0.049846f,   -0.026125f,    0.026125f,    0.049846f,
```

```
         0.019134f,   -0.032472f,   -0.048618f,   -0.011672f,
         0.038020f,    0.046194f,    0.003923f,   -0.042632f,
         0.044550f,    0.007822f,   -0.035355f,   -0.049384f,
        -0.022700f,    0.022700f,    0.049384f,    0.035355f,
        -0.007822f,   -0.044550f,   -0.044550f,   -0.007822f,
         0.035355f,    0.049384f,    0.022700f,   -0.022700f,
        -0.049384f,   -0.035355f,    0.007822f,    0.044550f,
         0.046194f,    0.019134f,   -0.019134f,   -0.046194f,
        -0.046194f,   -0.019134f,    0.019134f,    0.046194f,
         0.046194f,    0.019134f,   -0.019134f,   -0.046194f,
        -0.046194f,   -0.019134f,    0.019134f,    0.046194f,
         0.046194f,    0.019134f,   -0.019134f,   -0.046194f,
         0.047553f,    0.029389f,    0.000000f,   -0.029389f,
        -0.047553f,   -0.047553f,   -0.029389f,   -0.000000f,
         0.029389f,    0.047553f,    0.047553f,    0.029389f,
         0.000000f,   -0.029389f,   -0.047553f,   -0.047553f,
        -0.029389f,   -0.000000f,    0.029389f,    0.047553f,
         0.048618f,    0.038020f,    0.019134f,   -0.003923f,
        -0.026125f,   -0.042632f,   -0.049846f,   -0.046194f,
        -0.032472f,   -0.011672f,    0.011672f,    0.032472f,
         0.046194f,    0.049846f,    0.042632f,    0.026125f,
         0.003923f,   -0.019134f,   -0.038020f,   -0.048618f,
         0.049384f,    0.044550f,    0.035355f,    0.022700f,
         0.007822f,   -0.007822f,   -0.022700f,   -0.035355f,
        -0.044550f,   -0.049384f,   -0.049384f,   -0.044550f,
        -0.035355f,   -0.022700f,   -0.007822f,    0.007822f,
         0.022700f,    0.035355f,    0.044550f,    0.049384f,
         0.049846f,    0.048618f,    0.046194f,    0.042632f,
         0.038020f,    0.032472f,    0.026125f,    0.019134f,
         0.011672f,    0.003923f,   -0.003923f,   -0.011672f,
        -0.019134f,   -0.026125f,   -0.032472f,   -0.038020f,
        -0.042632f,   -0.046194f,   -0.048618f,   -0.049846f,
         0.050000f,    0.050000f,    0.050000f,    0.050000f,
         0.050000f,    0.050000f,    0.050000f,    0.050000f,
         0.050000f,    0.050000f,    0.050000f,    0.050000f,
         0.050000f,    0.050000f,    0.050000f,    0.050000f,
         0.050000f,    0.050000f,    0.050000f,    0.050000f,
         0.049846f,    0.048618f,    0.046194f,    0.042632f,
         0.038020f,    0.032472f,    0.026125f,    0.019134f,
         0.011672f,    0.003923f,   -0.003923f,   -0.011672f,
        -0.019134f,   -0.026125f,   -0.032472f,   -0.038020f,
        -0.042632f,   -0.046194f,   -0.048618f,   -0.049846f,
         0.049384f,    0.044550f,    0.035355f,    0.022700f,
         0.007822f,   -0.007822f,   -0.022700f,   -0.035355f,
        -0.044550f,   -0.049384f,   -0.049384f,   -0.044550f,
        -0.035355f,   -0.022700f,   -0.007822f,    0.007822f,
         0.022700f,    0.035355f,    0.044550f,    0.049384f,
         0.048618f,    0.038020f,    0.019134f,   -0.003923f,
        -0.026125f,   -0.042632f,   -0.049846f,   -0.046194f,
        -0.032472f,   -0.011672f,    0.011672f,    0.032472f,
         0.046194f,    0.049846f,    0.042632f,    0.026125f,
         0.003923f,   -0.019134f,   -0.038020f,   -0.048618f,
         0.047553f,    0.029389f,    0.000000f,   -0.029389f,
        -0.047553f,   -0.047553f,   -0.029389f,   -0.000000f,
         0.029389f,    0.047553f,    0.047553f,    0.029389f,
         0.000000f,   -0.029389f,   -0.047553f,   -0.047553f,
        -0.029389f,   -0.000000f,    0.029389f,    0.047553f,
         0.046194f,    0.019134f,   -0.019134f,   -0.046194f,
        -0.046194f,   -0.019134f,    0.019134f,    0.046194f,
         0.046194f,    0.019134f,   -0.019134f,   -0.046194f,
        -0.046194f,   -0.019134f,    0.019134f,    0.046194f,
         0.046194f,    0.019134f,   -0.019134f,   -0.046194f,
         0.044550f,    0.007822f,   -0.035355f,   -0.049384f,
        -0.022700f,    0.022700f,    0.049384f,    0.035355f,
        -0.007822f,   -0.044550f,   -0.044550f,   -0.007822f,
         0.035355f,    0.049384f,    0.022700f,   -0.022700f,
        -0.049384f,   -0.035355f,    0.007822f,    0.044550f,
         0.042632f,   -0.003923f,   -0.046194f,   -0.038020f,
         0.011672f,    0.048618f,    0.032472f,   -0.019134f,
        -0.049846f,   -0.026125f,    0.026125f,    0.049846f,
         0.019134f,   -0.032472f,   -0.048618f,   -0.011672f,
         0.038020f,    0.046194f,    0.003923f,   -0.042632f,
         0.040451f,   -0.015451f,   -0.050000f,   -0.015451f,
         0.040451f,    0.040451f,   -0.015451f,   -0.050000f,
        -0.015451f,    0.040451f,    0.040451f,   -0.015451f,
        -0.050000f,   -0.015451f,    0.040451f,    0.040451f,
        -0.015451f,   -0.050000f,   -0.015451f,    0.040451f,
         0.038020f,   -0.026125f,   -0.046194f,    0.011672f,
         0.049846f,    0.003923f,   -0.048618f,   -0.019134f,
```

```
    0.042632f,   0.032472f,  -0.032472f,  -0.042632f,
    0.019134f,   0.048618f,  -0.003923f,  -0.049846f,
   -0.011672f,   0.046194f,   0.026125f,  -0.038020f,
    0.035355f,  -0.035355f,  -0.035355f,   0.035355f,
    0.035355f,  -0.035355f,  -0.035355f,   0.035355f,
    0.035355f,  -0.035355f,  -0.035355f,   0.035355f,
    0.035355f,  -0.035355f,  -0.035355f,   0.035355f,
    0.032472f,  -0.042632f,  -0.019134f,   0.048618f,
    0.003923f,  -0.049846f,   0.011672f,   0.046194f,
   -0.026125f,  -0.038020f,   0.038020f,   0.026125f,
   -0.046194f,  -0.011672f,   0.049846f,  -0.003923f,
   -0.048618f,   0.019134f,   0.042632f,  -0.032472f,
    0.029389f,  -0.047553f,  -0.000000f,   0.047553f,
   -0.029389f,  -0.029389f,   0.047553f,   0.000000f,
   -0.047553f,   0.029389f,   0.029389f,  -0.047553f,
   -0.000000f,   0.047553f,  -0.029389f,  -0.029389f,
    0.047553f,  -0.000000f,  -0.047553f,   0.029389f,
    0.026125f,  -0.049846f,   0.019134f,   0.032472f,
   -0.048618f,   0.011672f,   0.038020f,  -0.046194f,
    0.003923f,   0.042632f,  -0.042632f,  -0.003923f,
    0.046194f,  -0.038020f,  -0.011672f,   0.048618f,
   -0.032472f,  -0.019134f,   0.049846f,  -0.026125f,
    0.022700f,  -0.049384f,   0.035355f,   0.007822f,
   -0.044550f,   0.044550f,  -0.007822f,  -0.035355f,
    0.049384f,  -0.022700f,  -0.022700f,   0.049384f,
   -0.035355f,  -0.007822f,   0.044550f,  -0.044550f,
    0.007822f,   0.035355f,  -0.049384f,   0.022700f,
    0.019134f,  -0.046194f,   0.046194f,  -0.019134f,
   -0.019134f,   0.046194f,  -0.046194f,   0.019134f,
    0.019134f,  -0.046194f,   0.046194f,  -0.019134f,
   -0.019134f,   0.046194f,  -0.046194f,   0.019134f,
    0.019134f,  -0.046194f,   0.046194f,  -0.019134f,
    0.015451f,  -0.040451f,   0.050000f,  -0.040451f,
    0.015451f,   0.015451f,  -0.040451f,   0.050000f,
   -0.040451f,   0.015451f,   0.015451f,  -0.040451f,
    0.050000f,  -0.040451f,   0.015451f,   0.015451f,
   -0.040451f,   0.050000f,  -0.040451f,   0.015451f,
    0.011672f,  -0.032472f,   0.046194f,  -0.049846f,
    0.042632f,  -0.026125f,   0.003923f,   0.019134f,
   -0.038020f,   0.048618f,  -0.048618f,   0.038020f,
   -0.019134f,  -0.003923f,   0.026125f,  -0.042632f,
    0.049846f,  -0.046194f,   0.032472f,  -0.011672f,
    0.007822f,  -0.022700f,   0.035355f,  -0.044550f,
    0.049384f,  -0.049384f,   0.044550f,  -0.035355f,
    0.022700f,  -0.007822f,  -0.007822f,   0.022700f,
   -0.035355f,   0.044550f,  -0.049384f,   0.049384f,
   -0.044550f,   0.035355f,  -0.022700f,   0.007822f,
    0.003923f,  -0.011672f,   0.019134f,  -0.026125f,
    0.032472f,  -0.038020f,   0.042632f,  -0.046194f,
    0.048618f,  -0.049846f,   0.049846f,  -0.048618f,
    0.046194f,  -0.042632f,   0.038020f,  -0.032472f,
    0.026125f,  -0.019134f,   0.011672f,  -0.003923f,
    0.000000f,  -0.000000f,   0.000000f,  -0.000000f,
    0.000000f,  -0.000000f,   0.000000f,  -0.000000f,
   -0.000000f,  -0.000000f,  -0.000000f,  -0.000000f,
   -0.000000f,  -0.000000f,  -0.000000f,  -0.000000f,
    0.000000f,  -0.000000f,   0.000000f,  -0.000000f,
   -0.003923f,   0.011672f,  -0.019134f,   0.026125f,
   -0.032472f,   0.038020f,  -0.042632f,   0.046194f,
   -0.048618f,   0.049846f,  -0.049846f,   0.048618f,
   -0.046194f,   0.042632f,  -0.038020f,   0.032472f,
   -0.026125f,   0.019134f,  -0.011672f,   0.003923f,
   -0.007822f,   0.022700f,  -0.035355f,   0.044550f,
   -0.049384f,   0.049384f,  -0.044550f,   0.035355f,
   -0.022700f,   0.007822f,   0.007822f,  -0.022700f,
    0.035355f,  -0.044550f,   0.049384f,  -0.049384f,
    0.044550f,  -0.035355f,   0.022700f,  -0.007822f,
   -0.011672f,   0.032472f,  -0.046194f,   0.049846f,
   -0.042632f,   0.026125f,  -0.003923f,  -0.019134f,
    0.038020f,  -0.048618f,   0.048618f,  -0.038020f,
    0.019134f,   0.003923f,  -0.026125f,   0.042632f,
   -0.049846f,   0.046194f,  -0.032472f,   0.011672f,
   -0.015451f,   0.040451f,  -0.050000f,   0.040451f,
   -0.015451f,  -0.015451f,   0.040451f,  -0.050000f,
    0.040451f,  -0.015451f,  -0.015451f,   0.040451f,
   -0.050000f,   0.040451f,  -0.015451f,  -0.015451f,
    0.040451f,  -0.050000f,   0.040451f,  -0.015451f,
   -0.019134f,   0.046194f,  -0.046194f,   0.019134f,
    0.019134f,  -0.046194f,   0.046194f,  -0.019134f,
   -0.019134f,   0.046194f,  -0.046194f,   0.019134f,
    0.019134f,  -0.046194f,   0.046194f,  -0.019134f,
   -0.019134f,   0.046194f,  -0.046194f,   0.019134f,
   -0.022700f,   0.049384f,  -0.035355f,  -0.007822f,
    0.044550f,  -0.044550f,   0.007822f,   0.035355f,
   -0.049384f,   0.022700f,   0.022700f,  -0.049384f,
    0.035355f,   0.007822f,  -0.044550f,   0.044550f,
   -0.007822f,  -0.035355f,   0.049384f,  -0.022700f,
   -0.026125f,   0.049846f,  -0.019134f,  -0.032472f,
    0.048618f,  -0.011672f,  -0.038020f,   0.046194f,
   -0.003923f,  -0.042632f,   0.042632f,   0.003923f,
   -0.046194f,   0.038020f,   0.011672f,  -0.048618f,
    0.032472f,   V0.019134f,  -0.049846f,   0.026125f,
   -0.029389f,   0.047553f,  -0.000000f,  -0.047553f,
    0.029389f,   0.029389f,  -0.047553f,  -0.000000f,
    0.047553f,  -0.029389f,  -0.029389f,   0.047553f,
   -0.000000f,  -0.047553f,   0.029389f,   0.029389f,
   -0.047553f,   0.000000f,   0.047553f,  -0.029389f,
   -0.032472f,   0.042632f,   0.019134f,  -0.048618f,
   -0.003923f,   0.049846f,  -0.011672f,  -0.046194f,
    0.026125f,   0.038020f,  -0.038020f,  -0.026125f,
    0.046194f,   0.011672f,  -0.049846f,   0.003923f,
    0.048618f,  -0.019134f,  -0.042632f,   0.032472f,
};
```

Each table may correspond to a given value of $M_S$ and includes entries of a matrix of dimension $2M_S \times M_S$.

To summarize, the above may correspond to the processing of an apparatus for decoding an encoded USAC stream as described above (among others, including a QMF harmonic transposer), for which the QMF based harmonic transposer may comprise a real-valued $M_S$ channel synthesis filterbank. The real-valued $M_S$ channel synthesis filterbank may be configured to process an array of $M_S$ real-valued subband samples to obtain an array of $2M_S$ real-values subband samples. Each real-valued subband sample among the $M_S$ real-valued subband samples may be associated with a respective subband among $M_S$ subbands. Processing the array of $M_S$ real-valued subband samples may involve performing a matrix-vector multiplication of a real-valued matrix N and the array of $M_S$ real-valued subband samples. Entries of the real-valued matrix N may depend on a subband index of the respective subband sample to which they are multiplied in the vector-matrix multiplication. Then, the pre-computed information may relate to the entries of the real-valued matrix for the matrix-vector multiplication. The entries of the real-valued matrix N may be determined off-line and stored in one or more look-up tables. The QMF based harmonic transposer may be configured to access the entries of the real-valued matrix N from the one or more look-up tables at run time.

As noted above, the samples in an array v may be shifted by $2M_S$ positions. The oldest $2M_S$ samples may be discarded. The $M_S$ real-valued subband samples may be multiplied by the matrix N, i.e. the matrix-vector product N·V is computed, where $$N(k, n) = \frac{1}{M_S} \cdot \cos\left(\frac{\pi \cdot (k + 0.5) \cdot (2 \cdot n - M_S)}{2M_S}\right), \begin{cases} 0 \leq k < M_S \\ 0 \leq n < 2M_S \end{cases}$$

The output from this operation may be stored in the positions 0 to $2M_S-1$ of array v. Samples from v may be extracted to create a $10M_S$-element array g. The samples of array g may be multiplied by window $c_i$ to produce array w.

The window coefficients $c_i$ may be obtained by linear interpolation of the coefficients c, i.e. through the equation $$c_i(n)=\rho(n)c(\mu(n)+1)+(1-\rho(n))c(\mu(n)), 0 \le n < 10 M_S$$

The coefficients c may be defined in Table 4.A.89 of ISO/IEC 14496-3:2009, which table is hereby incorporated by reference in its entirety.

The formula for determining the window coefficients $c_i$ from the coefficients c may be implemented off-line to derive (e.g., pre-compute) window coefficients $c_i$ prior to run time. At run time, the pre-computed window coefficients $c_i$ may be referred to as needed, without computation. For example, the window coefficients $c_i$ may be obtained (e.g., read, retrieved) from one or more look-up tables. The actual arrangement of the window coefficients $c_i$ within the look-up table(s) may vary, as long as the decoder is provided with a routine to retrieve the appropriate window coefficient(s) $c_i$ at run time.

In one implementation, $c_i(n)$ for all possible values of $M_s$ (e.g., $M_S$=4, 8, 12, 16, 20) may be calculated and stored in a table. For example, all the coefficients corresponding to all possible values of $M_s$ may be pre computed and stored in the (ROM) table sub_samp_qmf window_coeff which is illustrated below.

Based on the value of $M_s$, the corresponding window coefficients are mapped using the function map_prot_filter (ixheaacd_hbe_trans.c) as follows

```
static FLOAT32 * map_prot_filter(WORD32 filt_length)
{
  switch(filt_length)
  {
  case 4:
    return (FLOAT32 *)&sub_samp_qmf_window_coeff[0];
    break;
  case 8:
    return (FLOAT32 *)&sub_samp_qmf_window_coeff[40];
    break;
  case 12:
    return (FLOAT32 *)&sub_samp_qmf_window_coeff[120];
    break;
  case 16:
    return (FLOAT32 *)&sub_samp_qmf_window_coeff[240];
    break;
  case 20:
    return (FLOAT32 *)&sub_samp_qmf_window_coeff[400];
    break;
  case 24:
    return (FLOAT32 *)&sub_samp_qmf_window_coeff[600];
    break;
  case 32:
    return (FLOAT32 *)&sub_samp_qmf_window_coeff[840];
    break;
  case 40:
    return (FLOAT32 *)&sub_samp_qmf_window_coeff[1160],
    break;
  default:
    return (FLOAT32 *)&sub_samp_qmf_window_coeff[0];
  }
}
const FLOAT32 sub_samp_qmf_window_coeff[40 + 80 + 120 + 160 + 200 +
240 + 320 + 400/*1560*/] =
{
     0.000000000000f,-0.000715773669f,-0.000665041502f, 0.000402654026f,
     0.002620175947f, 0.005039302167f, 0.005271575879f, 0.000027604519f,
     0.013271821663f, 0.034462094307f, 0.058591566980f, 0.075313732028f,
     0.070353306830f, 0.029082400724f,-0.058370534331f,-0.192396670580f,
     0.361158996820f, 0.541255354881f, 0.702238857746f, 0.813819110394f,
     0.853738546371f, 0.813819110394f, 0.702238857746f, 0.541255354881f,
    -0.361158996820f,-0.192396670580f,-0.058370534331f, 0.029082400724f,
     0.070353306830f, 0.075313732028f, 0.058591566980f, 0.034462094307f,
    -0.013271821663f, 0.000027604519f, 0.005271575879f, 0.005039302167f,
     0.002620175947f, 0.000402654026f,-0.000665041502f,-0.000715773669f,
     0.000000000000f,-0.000546656549f,-0.000715773669f,-0.000780366478f,
    -0.000665041502f,-0.000289698131f, 0.000402654026f, 0.001390249468f,
     0.002620175947f, 0.003920743242f, 0.005039302167f, 0.005622064229f,
     0.005271575879f, 0.003540124744f, 0.000027604519f,-0.005533721298f,
     0.013271821663f, 0.023068016395f, 0.034462094307f, 0.046684302390f,
     0.058591566980f, 0.068704381585f, 0.075313732028f, 0.076505072415f,
     0.070353306830f, 0.055046003312f, 0.029082400724f,-0.008571174927f,
    -0.058370534331f,-0.120007798076f,-0.192396670580f,-0.273663401604f,
     0.361158996820f, 0.451599657536f, 0.541255354881f, 0.626124262810f,
     0.702238857746f, 0.765867471695f, 0.813819110394f, 0.843623816967f,
     0.853738546371f, 0.843623816967f, 0.813819110394f, 0.765867471695f,
     0.702238857746f, 0.626124262810f, 0.541255354881f, 0.451599657536f,
    -0.361158996820f,-0.273663401604f,-0.192396670580f,-0.120007798076f,
    -0.058370534331f,-0.008571174927f, 0.029082400724f, 0.055046003312f,
     0.070353306830f, 0.076505072415f, 0.075313732028f, 0.068704381585f,
     0.058591566980f, 0.046684302390f, 0.034462094307f, 0.023068016395f,
    -0.013271821663f,-0.005533721298f, 0.000027604519f, 0.003540124744f,
     0.005271575879f, 0.005622064229f, 0.005039302167f, 0.003920743242f,
```

```
0.002620175947f, 0.001390249468f, 0.000402654026f,−0.000289698131f,
−0.000665041502f,−0.000780366478f,−0.000715773669f,−0.000546656549f,
0.000000000000f,−0.000494276581f,−0.000604547502f,−0.000715773669f,
−0.000776134315f,−0.000767318823f,−0.000665041502f,−0.000443592289f,
−0.000089368223f, 0.000402654026f, 0.001034071436f, 0.001785482286f,
0.002620175947f, 0.003494867589f, 0.004324191250f, 0.005039302167f,
0.005507593509f, 0.005630714353f, 0.005271575879f, 0.004295178223f,
0.002582125831f, 0.000027604519f,−0.003442291170f,−0.007873747498f,
0.013271821663f, 0.019609235227f, 0.026719830930f, 0.034462094307f,
0.042579874396f, 0.050749942660f, 0.058591566980f, 0.065628737211f,
0.071387805045f, 0.075313732028f, 0.076819263399f, 0.075348608196f,
0.070353306830f, 0.061245717108f, 0.047619495541f, 0.029082400724f,
0.005301259924f,−0.023842986673f,−0.058370534331f,−0.098213292658f,
−0.143036201596f,−0.192396670580f,−0.245750576258f,−0.302297174931f,
0.361158996820f, 0.421350568533f, 0.481765538454f, 0.541255354881f,
0.598601102829f, 0.652643620968f, 0.702238857746f, 0.746226489544f,
0.783699929714f, 0.813819110394f, 0.835786461830f, 0.849197566509f,
0.853738546371f, 0.849197506905f, 0.835786342621f, 0.813819110394f,
0.783699750900f, 0.746226310730f, 0.702238857746f, 0.652643322945f,
0.598600804806f, 0.541255354881f, 0.481765210629f, 0.421350240707f,
−0.361158996820f,−0.302297025919f,−0.245750263333f,−0.192396670580f,
−0.143036067486f,−0.098213046789f,−0.058370534331f,−0.023842897266f,
0.005301412195f, 0.029082400724f, 0.047619540244f, 0.061245780438f,
0.070353306830f, 0.075348615646f, 0.076819263399f, 0.075313732028f,
0.071387790143f, 0.065628699958f, 0.058591566980f, 0.050749920309f,
0.042579825968f, 0.034462094307f, 0.026719808578f, 0.019609196112f,
−0.013271821663f,−0.007873705588f,−0.003442274174f, 0.000027604519f,
0.002582143992f, 0.004295184277f, 0.005271575879f, 0.005630714819f,
0.005507592112f, 0.005039302167f, 0.004324184265f, 0.003494864097f,
0.002620175947f, 0.001785481116f, 0.001034068293f, 0.000402654026f,
−0.000089371701f,−0.000443593453f,−0.000665041502f,−0.000767319347f,
−0.000776134082f,−0.000715773669f,−0.000604546454f,−0.000494276290f,
0.000000000000f,−0.000487522804f,−0.000546656549f,−0.000631249335f,
−0.000715773669f,−0.000768137164f,−0.000780366478f,−0.000753000146f,
−0.000665041502f,−0.000514557236f,−0.000289698131f, 0.000013494974f,
0.000402654026f, 0.000860844331f, 0.001390249468f, 0.001984114060f,
0.002620175947f, 0.003273961367f, 0.003920743242f, 0.004520985298f,
0.005039302167f, 0.005419677589f, 0.005622064229f, 0.005597712892f,
0.005271575879f, 0.004603953101f, 0.003540124744f, 0.002027417533f,
0.000027604519f,−0.002482672455f,−0.005533721298f,−0.009132533334f,
0.013271821663f, 0.017943337560f, 0.023068016395f, 0.028607217595f,
0.034462094307f, 0.040534917265f, 0.046684302390f, 0.052763074636f,
0.058591566980f, 0.063971586525f, 0.068704381585f, 0.072568260133f
0.075313732028f, 0.076709352434f, 0.076505072415f, 0.074466437101f,
0.070353306830f, 0.063944481313f, 0.055046003312f, 0.043476879597f,
0.029082400724f, 0.011762383394f,−0.008571174927f,−0.031953126192f,
−0.058370534331f,−0.087754756212f,−0.120007798076f,−0.154960706830f,
−0.192396670580f,−0.232069090009f,−0.273663401604f,−0.316827893257f,
0.361158996820f, 0.406231760979f, 0.451599657536f, 0.496770828962f,
0.541255354881f, 0.584540307522f, 0.626124262810f, 0.665513992310f,
0.702238857746f, 0.735821187496f, 0.765867471695f, 0.791973590851f,
0.813819110394f, 0.831103861332f, 0.843623816967f, 0.851197123528f,
0.853738546371f, 0.851197123528f, 0.843623816967f, 0.831103861332f,
0.813819110394f, 0.791973590851f, 0.765867471695f, 0.735821187496f,
0.702238857746f, 0.665513992310f, 0.626124262810f, 0.584540307522f,
0.541255354881f, 0.496770828962f, 0.451599657536f, 0.406231760979f,
−0.361158996820f,−0.316827893257f,−0.273663401604f,−0.232069090009f,
−0.192396670580f,−0.154960706830f,−0.120007798076f,−0.087754756212f,
−0.058370534331f,−0.031953126192f,−0.008571174927f, 0.011762383394f,
0.029082400724f, 0.043476879597f, 0.055046003312f, 0.063944481313f,
0.070353306830f, 0.074466437101f, 0.076505072415f, 0.076709352434f,
0.075313732028f, 0.072568260133f, 0.068704381585f, 0.063971586525f,
0.058591566980f, 0.052763074636f, 0.046684302390f, 0.040534917265f,
0.034462094307f, 0.028607217595f, 0.023068016395f, 0.017943337560f,
−0.013271821663f,−0.009132533334f,−0.005533721298f,−0.002482672455f,
0.000027604519f, 0.002027417533f, 0.003540124744f, 0.004603953101f,
0.005271575879f, 0.005591712892f, 0.005622064229f, 0.005419677589f,
0.005039302167f, 0.004520985298f, 0.003920743242f, 0.003273961367f
0.002620175947f, 0.001984114060f, 0.001390249468f, 0.000860844331f,
0.000402654026f, 0.000013494974f,−0.000289698131f,−0.000514557236f,
−0.000665041502f,−0.000753000146f,−0.000780366478f,−0.000768137164f,
−0.000715773669f,−0.000631249335f,−0.000546656549f,−0.000487522804f,
0.000000000000f,−0.000493306026f,−0.000511505408f,−0.000579367916f,
−0.000649476540f,−0.000715773669f,−0.000752875290f,−0.000781254726f,
−0.000777536596f,−0.000736148562f,−0.000665041502f,−0.000548077514f,
−0.000385754218f,−0.000170716201f, 0.000090249574f, 0.000402654026f,
0.000768811035f, 0.001178124920f, 0.001629814156f, 0.002113749273f,
0.002620175947f, 0.003144826740f, 0.003664653283f, 0.004168645944f,
0.004632714204f, 0.005039302167f, 0.005361670163f, 0.005566063803f,
```

```
0.005641560070f, 0.005550691392f, 0.005271575879f, 0.004769547377f,
0.004013354424f, 0.002990481444f, 0.001668256707f, 0.000027604519f,
−0.001939695445f,−0.004252972547f,−0.006908639334f,−0.009918526746f,
0.013271821663f, 0.016974641010f, 0.020970622078f, 0.025238998234f,
0.029761660844f, 0.034462094307f, 0.039311274886f, 0.044225402176f,
0.049129784107f, 0.053948841989f, 0.058591566980f, 0.062942937016f,
0.066905103624f, 0.070362940431f, 0.073203273118f, 0.075313732028f,
0.076541244984f, 0.076781995595f, 0.075908273458f, 0.073805764318f,
0.070353306830f, 0.065404154360f, 0.058896079659f, 0.050722457469f,
0.040812026709f, 0.029082400724f, 0.015448591672f,−0.000097587261f,
−0.017581636086f,−0.037012770772f,−0.058370534331f,−0.081660762429f,
−0.106792926788f,−0.133693277836f,−0.162268877029f,−0.192396670580f,
−0.223985999823f,−0.256831049919f,−0.290771633387f,−0.325614720583f,
0.361158996820f, 0.397183418274f, 0.433449268341f, 0.469719588757f,
0.505739748478f, 0.541255354881f, 0.575990140438f, 0.609711349010f,
0.642155468464f, 0.673076033592f, 0.702238857746f, 0.729360222816f,
0.754271447659f, 0.776768505573f, 0.796672165394f, 0.813819110394f,
0.828002870083f, 0.839164674282f, 0.847211718559f, 0.852083206177f,
0.853738546371f, 0.852083206177f, 0.847211718559f, 0.839164674282f,
0.828002750874f, 0.813819110394f, 0.796671986580f, 0.776768505573f,
0.754271447659f, 0.729359984398f, 0.702238857746f, 0.673075735569f,
0.642155468464f, 0.609711349010f, 0.575989782810f, 0.541255354881f,
0.505739450455f, 0.469719588757f, 0.433449268341f, 0.397183090448f,
−0.361158996820f,−0.325614541769f,−0.290771633387f,−0.256830900908f,
−0.223985850811f,−0.192396670580f,−0.162268742919f,−0.133693277836f,
−0.106792800128f,−0.081660643220f,−0.058370534331f,−0.037012673914f,
−0.017581636086f,−0.000097508135f, 0.015448661521f, 0.029082400724f,
0.040812078863f, 0.050722457469f, 0.058896116912f, 0.065404184163f,
0.070353306830f, 0.073805779219f, 0.075908273458f, 0.076781995595f,
0.076541237533f, 0.075313732028f, 0.073203265667f, 0.070362940431f,
0.066905081272f, 0.062942922115f, 0.058591566980f, 0.053948819637f,
0.049129784107f, 0.044225379825f, 0.039311248809f, 0.034462094307f,
0.029761638492f, 0.025238998234f, 0.020970601588f, 0.016974622384f,
−0.013271821663f,−0.009918511845f,−0.006908619311f,−0.004252942745f,
−0.001939700567f, 0.000027604519f, 0.001668263576f, 0.002990489826f,
0.004013365135f, 0.004769545514f, 0.005271575879f, 0.005550692324f,
0.005641560070f, 0.005566061940f, 0.005361671094f, 0.005039302167f,
0.004632712342f, 0.004168642685f, 0.003664647229f, 0.003144827904f,
0.002620175947f, 0.002113747410f, 0.001629810315f, 0.001178119797f,
0.000768812315f, 0.000402654026f, 0.000090248475f,−0.000170717947f,
−0.000385756488f,−0.000548077049f,−0.000665041502f,−0.000736148853f,
−0.000777536712f,−0.000781254901f,−0.000752875523f,−0.000715773669f,
−0.000649476249f,−0.000579367450f,−0.000511504768f,−0.000493305910f,
0.000000000000f,−0.000517090957f,−0.000494276581f,−0.000546656549f,
−0.000604547502f,−0.000661945262f,−0.000715773669f,−0.000747404585f,
−0.000776134315f,−0.000780366478f,−0.000767318823f,−0.000728470215f,
−0.000665041502f,−0.000569175696f,−0.000443592289f,−0.000289691131f,
−0.000089368223f, 0.000141059689f, 0.000402654026f, 0.000705181097f,
0.001034071436f, 0.001390249468f, 0.001785487286f, 0.002198014408f,
0.002620175947f, 0.003057343885f, 0.003494867589f, 0.003920743242f,
0.004324191250f, 0.004704849795f, 0.005039302167f, 0.005313484930f,
0.005507593509f, 0.005622064229f, 0.005630714353f, 0.005518750288f,
0.005271575879f, 0.004868620075f, 0.004295178223f, 0.003540124744f,
0.002582125831f, 0.001415721956f, 0.000027604519f,−0.001588239335f,
−0.003442291170f,−0.005533721298f,−0.007873747498f,−0.010453868657f,
0.013271821663f, 0.016335172579f, 0.019609235227f, 0.023068016395f,
0.026719830930f, 0.030534112826f, 0.034462094307f, 0.038497347385f,
0.042579874396f, 0.046684302390f, 0.050749942660f, 0.054735988379f,
0.058591566980f, 0.062239032239f, 0.065628737211f, 0.068704381585f,
0.071387805045f, 0.073608145118f, 0.075313732028f, 0.076399229467f,
0.076819263399f, 0.076505072415f, 0.075348608196f, 0.073319546878f,
0.070353306830f, 0.066330201924f, 0.061245717108f, 0.055046003312f,
0.047619495541f, 0.038977786899f, 0.029082400724f, 0.017846630886f,
0.005301259924f,−0.008571174927f,−0.023842986673f,−0.040445398539f,
−0.058370534331f,−0.077656343579f,−0.098213292658f,−0.120007798076f,
−0.143036201596f,−0.167190954089f,−0.192396670580f,−0.218634754419f,
−0.245750576258f,−0.273663401604f,−0.302297174931f,−0.331498444080f,
0.361158996820f, 0.391159355640f, 0.421350568533f, 0.451599657536f,
0.481765538454f, 0.511695802212f, 0.541255354881f, 0.570261478424f,
0.598601102829f, 0.626124262810f, 0.652643620968f, 0.678056061268f,
0.702238857746f, 0.724978864193f, 0.746226489544f, 0.765867471695f,
0.783699929714f, 0.799714028835f, 0.813819110394f, 0.825832426548f,
0.835786461830f, 0.843623816967f, 0.849197566509f, 0.852570533752f,
0.853738546371f, 0.852570474148f, 0.849197506905f, 0.843623816967f,
0.835786342621f, 0.825832307339f, 0.813819110394f, 0.799713850021f,
0.783699750900f, 0.765867471695f, 0.746226310730f, 0.724978625774f,
0.702238857746f, 0.678055822849f, 0.652643322945f, 0.626124262810f,
0.598600804806f, 0.570261120796f, 0.541255354881f, 0.511695444584f,
0.481765210629f, 0.451599657536f, 0.421350240707f, 0.391158998013f,
```

-0.361158996820f,-0.331498116255f,-0.302297025919f,-0.273663401604f,
-0.245750263333f,-0.218634605408f,-0.192396670580f,-0.167190670967f,
-0.143036067486f,-0.120007798076f,-0.098213046789f,-0.077656231821f,
-0.058370534331f,-0.040445201099f,-0.023842897266f,-0.008571174927f,
0.005301412195f, 0.017846697941f, 0.029082400724f, 0.038977894932f,
0.047619540244f, 0.055046003312f, 0.061245780438f, 0.066330231726f,
0.070353306830f, 0.073319576681f, 0.075348615646f, 0.076505072415f,
0.076819263399f, 0.076399222016f, 0.075313732028f, 0.073608122766f,
0.071387790143f, 0.068704381585f, 0.065628699958f, 0.062239013612f,
0.058591566980f, 0.054735943675f, 0.050749920309f, 0.046684302390f,
0.042579825968f, 0.038497325033f, 0.034462094307f, 0.030534068123f,
0.026719808578f, 0.023068016395f, 0.019609196112f, 0.016335153952f,
-0.013271821663f,-0.010453845374f,-0.007873705588f,-0.005533721298f,
-0.003442274174f,-0.001588209649f, 0.000027604519f, 0.001415733015f,
0.002582143992f, 0.003540124744f, 0.004295184277f, 0.004868627992f,
0.005271575879f, 0.005518751685f, 0.005630714819f, 0.005622064229f,
0.005507592112f, 0.005313480273f, 0.005039302167f, 0.004704846535f,
0.004324184265f, 0.003920743242f, 0.003494864097f, 0.003057336202f,
0.002620175947f, 0.002198010916f, 0.001785481116f, 0.001390249468f,
0.001034068293f, 0.000705175975f, 0.000402654026f, 0.000141057521f,
-0.000089371701f,-0.000289698131f,-0.000443593453f,-0.000569177268f,
-0.000665041502f,-0.000728470448f,-0.000767319347f,-0.000780366478f,
-0.000776134082f,-0.000747404411f,-0.000715773669f,-0.000661944796f,
-0.000604546454f,-0.000546656549f,-0.000494276290f,-0.000517093693f,
0.000000000000f,-0.000561769237f,-0.000487522804f,-0.000504071417f,
-0.000546656549f,-0.000587093062f,-0.000631249335f,-0.000677769072f,
-0.000715773669f,-0.000744094199f,-0.000768137164f,-0.000783433206f,
-0.000780366478f,-0.000775797758f,-0.000753000146f,-0.000721539196f,
-0.000665041502f,-0.000594611920f,-0.000514557236f,-0.000409512140f,
-0.000289698131f,-0.000144638092f, 0.000013494974f, 0.000204301701f,
0.000402654026f, 0.000623937638f, 0.000860844331f, 0.001125015551f,
0.001390249468f, 0.001686808304f, 0.001984114060f, 0.002301725559f,
0.002620175947f, 0.002946944674f, 0.003273961367f, 0.003600826720f,
0.003920743242f, 0.004226427060f, 0.004520985298f, 0.004793256056f,
0.005039302167f, 0.005246116780f, 0.005419677589f, 0.005547571462f,
0.005622064229f, 0.005638919771f, 0.005591712892f, 0.005475378130f,
0.005271575879f, 0.004983968567f, 0.004603953101f, 0.004125164356f,
0.003540124744f, 0.002844675677f, 0.002027417533f, 0.001090232865f,
0.000027604519f,-0.001156813581f,-0.002482672455f,-0.003940112423f,
-0.005533721298f,-0.007261581719f,-0.009132533334f,-0.011315554842f,
0.013271821663f, 0.015540555120f, 0.017943337560f, 0.020453179255f,
0.023068016395f, 0.025787584484f, 0.028607217595f, 0.031501762569f,
0.034462094307f, 0.037481285632f, 0.040534917265f, 0.043609753251f,
0.046684302390f, 0.049738574773f, 0.052763074636f, 0.055717363954f,
0.058591566980f, 0.061345517635f, 0.063971586525f, 0.066436752677f,
0.068704381585f, 0.070762872696f, 0.072568260133f, 0.074100367725f,
0.075313732028f, 0.076199248433f, 0.076709352434f, 0.076823003590f,
0.076505072415f, 0.075730577111f, 0.074466437101f, 0.072677463293f,
0.070353306830f, 0.067452505231f, 0.063944481313f, 0.059816658497f,
0.055046003312f, 0.049597866833f, 0.043476879597f, 0.036641810089f,
0.029082400724f, 0.020799707621f, 0.011762383394f, 0.001976560103f,
-0.008571174927f,-0.019883412868f,-0.031953126192f,-0.044780682772f,
-0.058370534331f,-0.072694331408f,-0.087754756212f,-0.103352955050f,
-0.120007798076f,-0.137155175209f,-0.154960706830f,-0.173380821943f,
-0.192396670580f,-0.211973592639f,-0.232069090009f,-0.252648025751f,
-0.273663401604f,-0.295071661472f,-0.316827893257f,-0.338872283697f,
0.361158996820f, 0.383635014296f, 0.406231760979f, 0.428911983967f,
0.451599657536f, 0.474245309830f, 0.496770828962f, 0.519123494625f,
0.541255354881f, 0.563078939915f, 0.584540307522f, 0.605578362942f,
0.626124262810f, 0.646126985550f, 0.665513992310f, 0.684235334396f,
0.702238857746f, 0.719446241856f, 0.735821187496f, 0.751313745975f,
0.765867471695f, 0.779428780079f, 0.791973590851f, 0.803448557854f,
0.813819110394f, 0.823041975498f, 0.831103861332f, 0.837971746922f,
0.843623816967f, 0.848031580448f, 0.851197123528f, 0.853102087975f,
0.853738546371f, 0.853102087975f, 0.851197123528f, 0.848031580448f,
0.843623816967f, 0.837971746922f, 0.831103861332f, 0.823041975498f,
0.813819110394f, 0.803448557854f, 0.791973590851f, 0.779428780079f,
0.765867471695f, 0.751313745975f, 0.735821187496f, 0.719446241856f,
0.702238857746f, 0.684235334396f, 0.665513992310f, 0.646126985550f,
0.626124262810f, 0.605578362942f, 0.584540307522f, 0.563078939915f,
0.541255354881f, 0.519123494625f, 0.496770828962f, 0.474245309830f,
0.451599657536f, 0.428911983967f, 0.406231760979f, 0.383635014296f,
-0.361158996820f,-0.338872283697f,-0.316827893257f,-0.295071661472f,
-0.273663401604f,-0.252648025751f,-0.232069090009f,-0.211973592639f,
-0.192396670580f,-0.173380821943f,-0.154960706830f,-0.137155175209f,
-0.120007798076f,-0.103352955050f,-0.087754756212f,-0.072694331408f,
-0.05837053433 1f,-0.044780682772f,-0.031953126192f,-0.019883412868f,
-0.008571174927f, 0.001976560103f, 0.011762383394f, 0.020799707621f,
0.029082400724f, 0.036641810089f, 0.043476879597f, 0.049597866833f, 0.055046003312f, 0.059816658497f, 0.063944481313f, 0.067452505231f,
0.070353306830f, 0.072677463293f, 0.074466437101f, 0.075730577111f,
0.076505072415f, 0.076823003590f, 0.076709352434f, 0.076199248433f,
0.075313732028f, 0.074100367725f, 0.072568260133f, 0.070762872696f,
0.068704381585f, 0.066436752677f, 0.063971586525f, 0.061345517635f,
0.058591566980f, 0.055717363954f, 0.052763074636f, 0.049738574773f,
0.046684302390f, 0.043609753251f, 0.040534917265f, 0.037481885632f,
0.034462094307f, 0.031501762569f, 0.028607217595f, 0.025787584484f,
0.023068016395f, 0.020453179255f, 0.017943337560f, 0.015540555120f,
−0.013271821663f,−0.011131554842f,−0.009132533334f,−0.007261581719f,
−0.005533721298f,−0.003940112423f,−0.002482672455f,−0.001156135581f,
0.000027604519f, 0.001090232865f, 0.002027417533f, 0.002844675677f,
0.003540124744f, 0.004125164356f, 0.004603953101f, 0.004983968567f,
0.005271575879f, 0.005475378130f, 0.005591712892f, 0.005638919771f,
0.005622064229f, 0.005547571462f, 0.005419677589f, 0.005246116780f,
0.005039302167f, 0.004793256056f, 0.004520985298f, 0.004226427060f,
0.003920743242f, 0.003600826720f, 0.003273961367f, 0.002946944674f,
0.002620175947f, 0.002301725559f, 0.001984114060f, 0.001686808304f,
0.001390249468f, 0.001125015551f, 0.000860844331f, 0.000623937638f,
0.000402654026f, 0.000204301701f, 0.000013494974f,−0.000144638092f,
−0.000289698131f,−0.000409512140f,−0.000514557236f,−0.000594611920f,
−0.000665041502f,−0.000721539196f,−0.000753000146f,−0.000775797758f,
−0.000780366478f,−0.000783433206f,−0.000768137164f,−0.000744094199f,
−0.000715773669f,−0.000677769072f,−0.000631249335f,−0.000587093062f,
−0.000546656549f,−0.000504071417f,−0.000487522804f,−0.000561769237f,
0.000000000000f,−0.000558072992f,−0.000493306026f,−0.000489007856f,
−0.000511505408f,−0.000546656549f,−0.000579367916f,−0.000616869656f,
−0.000649476540f,−0.000684326049f,−0.000715773669f,−0.000736658229f,
−0.000752875290f,−0.000771615305f,−0.000781254726f,−0.000780366478f,
−0.000777536596f,−0.000761063478f,−0.000736148562f,−0.000709641026f,
−0.000665041502f,−0.000610430841f,−0.000548077514f,−0.000471417530f,
−0.000385754218f,−0.000289698131f,−0.000170716201f,−0.000046687699f,
0.000090249574f, 0.000240562411f, 0.000402654026f, 0.000578658364f,
0.000768811035f, 0.000963047845f, 0.001178124920f, 0.001390249468f,
0.001629814156f, 0.001864684164f, 0.002113749273f, 0.002366060158f,
0.002620175947f, 0.002882985165f, 0.003144826740f, 0.003408302786f,
0.003664653283f, 0.003920743242f, 0.004168645944f, 0.004402655177f,
0.004632714204f, 0.004841458052f, 0.005039302167f, 0.005203964189f,
0.005361670163f, 0.005474018864f, 0.005566063803f, 0.005622064229f,
0.005641560070f, 0.005619631615f, 0.005550691392f, 0.005438786000f,
0.005271575879f, 0.005045672413f, 0.004769547377f, 0.004424938932f,
0.004013354424f, 0.003540124744f, 0.002990481444f, 0.002366164699f,
0.001668256707f, 0.000887429516f, 0.000027604519f,−0.000912658463f,
−0.001939695445f,−0.003051238833f,−0.004252972547f,−0.005533721298f,
−0.006908639334f,−0.008370369673f,−0.009918526746f,−0.011552934535f,
0.013271821663f, 0.015080526471f, 0.016974641010f, 0.018938465044f,
0.020970622078f, 0.023068016395f, 0.025238998234f, 0.027470193803f
0.029761660844f, 0.032091233879f, 0.034462094307f, 0.036876682192f,
0.039311274886f, 0.041758917272f, 0.044225402176f, 0.046684302390f,
0.049129784107f, 0.051557101309f, 0.053948841989f, 0.056295089424f,
0.058591566980f, 0.060800816864f, 0.062942937016f, 0.064974091947f,
0.066905103624f, 0.068704381585f, 0.070362940431f, 0.071873866022f,
0.073203273118f, 0.074358329177f, 0.075313732028f, 0.076039887965f,
0.076541244984f, 0.076795786619f, 0.076781995595f, 0.076505072415f,
0.075908273458f, 0.075019389391f, 0.073805764318f, 0.072239525616f,
0.070353306830f, 0.068058051169f, 0.065404154360f, 0.062357112765f,
0.058896079659f, 0.055046003312f, 0.050722557469f, 0.045999649912f,
0.040812026709f, 0.035168409348f, 0.029082400724f, 0.022492101416f,
0.015448591672f, 0.007923411205f,−0.000975872261f,−0.008571174927f,
−0.017581636086f,−0.027048788965f,−0.037012770772f,−0.047460637987f,
−0.058370534331f,−0.069793038070f,−0.081660762429f,−0.093993641436f,
−0.106792926788f,−0.120007798076f,−0.133693277836f,−0.147773429751f,
−0.162268877029f,−0.177155479789f,−0.192396670580f,−0.208034217358f,
−0.223985999823f,−0.240255206823f,−0.256831049919f,−0.273663401604f,
−0.290771633387f,−0.308093428612f,−0.325614720583f,−0.343320041895f,
0.361158996820f, 0.379132896662f, 0.397183418274f, 0.415302306414f,
0.433449268341f, 0.451599657536f, 0.469719588757f, 0.487774550915f,
0.505739748478f, 0.523563683033f, 0.541255354881f, 0.558729469776f,
0.575990140438f, 0.592998087406f, 0.609711349010f, 0.626124262810f,
0.642155468464f, 0.657824218273f, 0.673076033592f, 0.687872409821f,
0.702238857746f, 0.716044247150f, 0.729360222816f, 0.742110610008f,
0.754271447659f, 0.765867471695f, 0.776768505573f, 0.787063062191f,
0.796672165394f, 0.805576920509f, 0.813819110394f, 0.821256279945f,
0.828002870083f, 0.833975851536f, 0.839164674282f, 0.843623816967f,
0.847211718559f, 0.850063860416f, 0.852083206177f, 0.853290081024f,
0.853738546371f, 0.853290081024f, 0.852083206177f, 0.850063800812f,
0.847211718559f, 0.843623816967f, 0.839164674282f, 0.833975732327f,
0.828002750874f, 0.821256279945f, 0.813819110394f, 0.805576920509f,
0.796671986580f, 0.787062883377f, 0.776768505573f, 0.765867471695f,

```
    0.754271447659f, 0.742110371590f, 0.729359984398f, 0.716044247150f,
    0.702238857746f, 0.687872409821f, 0.673075735569f, 0.657823920250f,
    0.642155468464f, 0.626124262810f, 0.609711349010f, 0.592997789383f,
    0.575989782810f, 0.558729469776f, 0.541255354881f, 0.523563683033f,
    0.505739450455f, 0.487774193287f, 0.469719588757f, 0.451599657536f,
    0.433449268341f, 0.415301978588f, 0.397183090448f, 0.379132896662f,
    -0.361158996820f,-0.343319863081f,-0.325614541769f,-0.308093249798f,
    -0.290771633387f,-0.273663401604f,-0.256830900908f,-0.240255042911f,
    -0.223985850811f,-0.208034217358f,-0.192396670580f,-0.177155330777f,
    -0.162268742919f,-0.147773295641f,-0.133693277836f,-0.120007798076f,
    -0.106792800128f,-0.093993522227f,-0.081660643220f,-0.069793038070f,
    -0.058370534331f,-0.047460533679f,-0.037012673914f,-0.027048695832f,
    -0.017581636086f,-0.008571174927f,-0.000097508135f, 0.007923483849f,
    0.015448661521f, 0.022492101416f, 0.029082400724f, 0.035168465227f,
    0.040812078863f, 0.045999698341f, 0.050722457469f, 0.055046003312f,
    0.058896116912f, 0.062357142568f, 0.065404184163f, 0.068058051169f,
    0.070353306830f, 0.072239540517f, 0.073805779219f, 0.075019404292f,
    0.075908273458f, 0.076505072415f, 0.076781995595f, 0.076795786619f,
    0.076541237533f, 0.076039887965f, 0.075313732028f, 0.074358314276f,
    0.073203265667f, 0.071873851120f, 0.070362940431f, 0.068704381585f,
    0.066905081272f, 0.064974069595f, 0.062942922115f, 0.060800816864f,
    0.058591566980f, 0.056295067072f, 0.053948819637f, 0.051557078958f,
    0.049129784107f, 0.046684302390f, 0.044225379825f, 0.041758891195f,
    0.039311248809f, 0.036876682192f, 0.034462094307f, 0.032091211528f,
    0.029761638492f, 0.027470171452f, 0.025238998234f, 0.023068016395f,
    0.020970601588f, 0.018938446417f, 0.016974622384f, 0.015080526471f,
    -0.013271821663f,-0.011552894488f,-0.009918511845f,-0.008370377123f,
    -0.006908619311f,-0.005533721298f,-0.004252942745f,-0.003051228123f,
    -0.001939700567f,-0.000912644493f, 0.000027604519f, 0.000887448899f,
    0.001668263576f, 0.002366161672f, 0.002990489826f, 0.003540124744f,
    0.004013365135f, 0.004424942192f, 0.004769545514f, 0.005045676138f,
    0.005271575879f, 0.005438789260f, 0.005550692324f, 0.005619631149f,
    0.005641560070f, 0.005622064229f, 0.005566061940f, 0.005474017933f,
    0.005361671094f, 0.005203961395f, 0.005039302167f, 0.004841453396f,
    0.004632712342f, 0.004402656574f, 0.004168642685f, 0.003920743242f,
    0.003664647229f, 0.003408300225f, 0.003144827904f, 0.002882981440f,
    0.002620175947f, 0.002366054105f, 0.002113747410f, 0.001864685910f,
    0.001629810315f, 0.001390249468f, 0.001178119797f, 0.000963046390f,
    0.000768812315f, 0.000578655337f, 0.000402654026f, 0.000240558948f,
    0.000090248475f,-0.000046686841f,-0.000170717947f,-0.000289698131f,
    -0.000385756488f,-0.000471418141f,-0.000548077049f,-0.000610431889f,
    -0.000665041502f,-0.000709642132f,-0.000736148853f,-0.000761063420f,
    -0.000777536712f,-0.000780366478f,-0.000781254901f,-0.000771615247f,
    -0.000752875523f,-0.000736657763f,-0.000715773669f,-0.000684325409f,
    -0.000649476249f,-0.000616869889f,-0.000579367450f,-0.000546656549f,
    -0.000511504768f,-0.000489007856f,-0.000493305910f,-0.000558072818f,
};
```

The table may include, starting from index position 0, the window coefficients $c_i(n)$, $n=0, \ldots, 10M_S-1$ for the first possible value of $M_S$ (e.g., $M_S=4$), then, starting at the next index position, the window coefficients $c_i(n)$ for the second possible value of $M_S$ (e.g., $M_S=8$), and so forth.

To summarize, the above may correspond to the processing of an apparatus for decoding an encoded USAC stream as described above (among others, including a QMF harmonic transposer), for which the QMF based harmonic transposer may comprise a real-valued $M_S$ channel synthesis filterbank and a complex-valued 2M channel analysis filterbank. The pre-computed information may relate to window coefficients for windowing of arrays of samples during synthesis in the real-valued $M_S$ channel synthesis filterbank and/or during analysis in the complex-valued 2M channel analysis filterbank. The window coefficients may be determined off-line based on linear interpolation between tabulated values for all possible values of $M_S$ or M, respectively, and stored in one or more look-up tables. The QMF based harmonic transposer may be configured to access the window coefficients from the one or more look-up tables at run time.

The QMF transposer may include a complex-valued sub-sampled 2M-channel analysis filter bank. M may be equal to $M_S$. The complex-valued sub-sampled M-channel analysis filter bank may be described in clause 7.5.4.2.3 of the USAC standard, for example. This clause is hereby incorporated by reference in its entirety.

In the analysis filter bank, the samples of an array x may be shifted by $2M_S$ positions. The oldest $2M_S$ samples are discarded and $2M_S$ new samples are stored in positions 0 to $2M_S-1$. The samples of array x may be multiplied by the coefficients of window $c_{2i}$. The window coefficients $c_{2i}$ are obtained by linear interpolation of the coefficients c, i.e. through the equation $$c_{2i}(n)=\rho(n)c(\mu(n)+1)+(1-\rho(n))c(\mu(n)), 0 \leq n < 20M_S$$

where $\mu(n)$ and $\rho(n)$ are defined as the integer and fractional parts of $32 \cdot n/M_A$, respectively. The samples may be summed to create the $4M_S$-element array u. $2M_S$ new complex-valued subband samples may be calculated based on the matrix-vector multiplication M·u, where $$M(k, n) = \exp\left(\frac{i \cdot \pi \cdot (k+0.5) \cdot (2 \cdot n - 4 \cdot M_S)}{4M_S}\right), \begin{cases} 0 \leq k < 2M_S \\ 0 \leq n < 4M_S \end{cases}$$

In the equation, exp( ) denotes the complex exponential function, and i is the imaginary unit.

The formula for determining the matrix M(k,n) (or its entries) may be implemented off-line to derive (e.g., pre-compute) matrices (or entries) prior to run time. At run time, the pre-computed matrices may be referred to as needed, without computation. For example, the matrices M(k,n) may be obtained (e.g., read, retrieved) from one or more look-up tables. The actual arrangement of the matrix entries within the look-up table(s) may vary, as long as the decoder is provided with a routine to retrieve the appropriate matrix entries at run time.

In one implementation, M(k,n) for all possible values of $M_s$ (e.g., $M_S$=8, 16, 24, 32, 40) may be calculated and stored in a table, instead of init time (run time) computation. The look up tables may be named analy_cos_sin_tab_kl_8, analy_cos_sin_tab_kl_16, analy_cos_sin_tab_kl_24, analy_cos_sin_tab_kl_32, analy_cos_sin_tab_kl_40 and are illustrated below.

All the even indexed elements in the table may correspond to the real part (cosine values) of the above complex valued coefficients (matrix entries of M(k,n)) and odd indexed elements may correspond to the imaginary part (sine values) of the above complex valued coefficients.

The total number of complex values corresponding to a given $M_s$ are $8*(M_s)^2$ Only half, $4*(M_s)^2$, of the values are sufficient to achieve the processing.

The function ixheaacd_complex_anal_filt illustrates how the tables may be used. This is achieved by the virtue of periodic nature of the values in this matrix.

```
VOID ixheaacd_complex_anal_filt(const FLOAT32 *inp_signal,
                FLOAT32         *anal_buf_r,
                FLOAT32         *anal_buf_i,
                WORD32          anal_size,
                FLOAT32         *x,
                FLOAT32         *analy_cos_sin_tab,
                const FLOAT32   *interp_window_coeff)
{
  WORD32 i,j,k,l;
  FLOAT32 window_output[640];
  FLOAT32 u[128];
  FLOAT32 accu_r, accu_i;
  WORD32 N = (10*anal_size);
  for ( i=N-1; i>=anal_size; i-- )
  {
    x[i] = x[i-anal_size];
  }
  for ( i=anal_size-1; i>=0; i-- )
  {
    x[i] = inp_signal[anal_size- 1 -i];
  }
  /* windowing operation signal */
  for ( i=0; i<N; i++ )
  {
    window_output[i] = x[i] * interp_window_coeff[i];
  }
  /* create array u */
  for ( i=0; i<2*anal_size; i++ )
  {
    accu_r = 0.0;
    for ( j=0; j<5; j++ )
    {
      accu_r = accu_r + window_output[i + j * 2*anal_size];
    }
    u[i] = accu_r;
  }
  for(i=1; i < anal _size; i++)
  {
    FLOAT32 temp1 = u[i] + u[2*anal_size - i];
    FLOAT32 temp2 = u[i] - u[2*anal_size - i];
    u[i] = temp1;
    u[2*anal_size -i] =temp2;
  }
  for ( k=0; k<anal_size; k++ )
  {
    accu_r = u[anal_size];
    if(k & 1)
      accu_i = u[0];
    else
      accu_i = -u[0];
    for ( l=1; l<anal_size; l++ )
    {
    }
      accu_r = accu_r + u[ 0 + l] * analy_cos_sin_tab[2*l + 0];
      accu_i = accu_i + u[2*anal_size - l] * analy_cos_sin_tab[2*l + 1];
    }
    analy_cos_sin_tab += (2*anal_size);
    anal_buf_r[k] = (FLOAT32) accu_r;
    anal_buf_i[k] = (FLOAT32) accu_i;
  }
}
```

The tables themselves may be given as follows:

```
const FLOAT32 analy_cos_sin_tab_kl_8 [8 * 8 * 2] = {
   0.000000f,   -1.000000f,    0.195090f,   -0.980785f,
   0.382683f,   -0.923880f,    0.555570f,   -0.831470f,
   0.707107f,   -0.707107f,    0.831470f,   -0.555570f,
   0.923880f,   -0.382683f,    0.980785f,   -0.195090f,
  -0.000000f,    1.000000f,   -0.555570f,    0.831470f,
  -0.923880f,    0.382683f,   -0.980785f,   -0.195090f,
  -0.707107f,   -0.707107f,   -0.195090f,   -0.980785f,
   0.382683f,   -0.923880f,    0.831470f,   -0.555570f,
   0.000000f,   -1.000000f,    0.831470f,   -0.555570f,
   0.923880f,    0.382683f,    0.195090f,    0.980785f,
  -0.707107f,    0.707107f,   -0.980785f,   -0.195090f,
  -0.382683f,   -0.923880f,    0.555570f,   -0.831470f,
  -0.000000f,    1.000000f,   -0.980785f,    0.195090f,
  -0.382683f,   -0.923880f,    0.831470f,   -0.555570f,
   0.707107f,    0.707107f,   -0.555570f,    0.831470f,
  -0.923880f,   -0.382683f,    0.195090f,   -0.980785f,
   0.000000f,   -1.000000f,    0.980785f,    0.195090f,
  -0.382683f,    0.923880f,   -0.831470f,   -0.555570f,
   0.707107f,   -0.707107f,    0.555570f,    0.831470f,
  -0.923880f,    0.382683f,   -0.195090f,   -0.980785f,
  -0.000000f,    1.000000f,   -0.831470f,   -0.555570f,
   0.923880f,   -0.382683f,   -0.195090f,    0.980785f,
  -0.707107f,    0.707107f,    0.980785f,   -0.195090f,
  -0.382683f,    0.923880f,   -0.555570f,   -0.831470f,
  -0.000000f,   -1.000000f,    0.555570f,    0.831470f,
  -0.923880f,   -0.382683f,    0.980785f,   -0.195090f,
  -0.707107f,    0.707107f,    0.195090f,   -0.980785f,
   0.382683f,    0.923880f,   -0.831470f,   -0.555570f,
  -0.000000f,    1.000000f,   -0.195090f,   -0.980785f,
   0.382683f,    0.923880f,   -0.555570f,   -0.831470f,
   0.707107f,   -0.831470f,   -0.555570f,
   0.923880f,    0.382683f,   -0.980785f,   -0.195090f,
};
const FLOAT32 analy_cos_sin_tab_kl_16 [16 * 16 * 2] = {
   0.000000f,   -1.000000f,    0.098017f,   -0.995185f,
   0.195090f,   -0.980785f,    0.290285f,   -0.956940f,
   0.382683f,   -0.923880f,    0.471397f,   -0.881921f,
   0.555570f,   -0.831470f,    0.634393f,   -0.773010f,
   0.707107f,   -0.707107f,    0.773010f,   -0.634393f,
   0.831470f,   -0.555570f,    0.881921f,   -0.471397f,
   0.923880f,   -0.382683f,    0.956940f,   -0.290285f,
   0.980785f,   -0.195090f,    0.995185f,   -0.098017f,
  -0.000000f,    1.000000f,   -0.290285f,    0.956940f,
  -0.555570f,    0.831470f,   -0.773010f,    0.634393f,
  -0.923880f,    0.382683f,   -0.995185f,    0.098017f,
  -0.980785f,   -0.195090f,   -0.881921f,   -0.471397f,
  -0.707107f,   -0.707107f,   -0.471397f,   -0.881921f,
  -0.195090f,   -0.980785f,    0.098017f,   -0.995185f,
   0.382683f,   -0.923880f,    0.634393f,   -0.773010f,
   0.831470f,   -0.555570f,    0.956940f,   -0.290285f,
   0.000000f,   -1.000000f,    0.471397f,   -0.881921f,
   0.831470f,   -0.555570f,    0.995185f,   -0.098017f,
   0.923880f,    0.382683f,    0.634393f,    0.773010f,
   0.195090f,    0.980785f,   -0.290285f,    0.956940f,
  -0.707107f,    0.707107f,   -0.956940f,    0.290285f,
  -0.980785f,   -0.195090f,   -0.773010f,   -0.634393f,
  -0.382683f,   -0.923880f,    0.098017f,   -0.995185f,
   0.555570f,   -0.831470f,    0.881921f,   -0.471397f,
```

```
        -0.000000f,   1.000000f,  -0.634393f,   0.773010f,
        -0.980785f,   0.195090f,  -0.881921f,  -0.471397f,
        -0.382683f,  -0.923880f,   0.290285f,  -0.956940f,
         0.831470f,  -0.555570f,   0.995185f,   0.098017f,
         0.707107f,   0.707107f,   0.098017f,   0.995185f,
        -0.555570f,   0.831470f,  -0.956940f,   0.290285f,
        -0.923880f,  -0.382683f,  -0.471397f,  -0.881921f,
         0.195090f,  -0.980785f,   0.773010f,  -0.634393f,
         0.000000f,  -1.000000f,   0.773010f,  -0.634393f,
         0.980785f,   0.195090f,   0.471397f,   0.881921f,
        -0.382683f,   0.923880f,  -0.956940f,   0.290285f,
        -0.831470f,  -0.555570f,  -0.098017f,  -0.995185f,
         0.707107f,  -0.707107f,   0.995185f,   0.098017f,
         0.555570f,   0.831470f,  -0.290285f,   0.956940f,
        -0.923880f,   0.382683f,  -0.881921f,  -0.471397f,
        -0.195090f,  -0.980785f,   0.634393f,  -0.773010f,
        -0.000000f,   1.000000f,  -0.881921f,   0.471397f,
        -0.831470f,  -0.555570f,   0.098017f,  -0.995185f,
         0.923880f,  -0.382683f,   0.773010f,   0.634393f,
        -0.195090f,   0.980785f,  -0.956940f,   0.290285f,
        -0.707107f,  -0.707107f,   0.290285f,  -0.956940f,
         0.980785f,  -0.195090f,   0.634393f,   0.773010f,
        -0.382683f,   0.923880f,  -0.995185f,   0.098017f,
        -0.555570f,  -0.831470f,   0.471397f,  -0.881921f,
        -0.000000f,  -1.000000f,   0.956940f,  -0.290285f,
         0.555570f,   0.831470f,  -0.634393f,   0.773010f,
        -0.923880f,  -0.382683f,   0.098017f,  -0.995185f,
         0.980785f,  -0.195090f,   0.471397f,   0.881921f,
        -0.707107f,   0.707107f,  -0.881921f,  -0.471397f,
         0.195090f,  -0.980785f,   0.995185f,  -0.098017f,
         0.382683f,   0.923880f,  -0.773010f,   0.634393f,
        -0.831470f,  -0.555570f,   0.290285f,  -0.956940f,
        -0.000000f,   1.000000f,  -0.995185f,   0.098017f,
        -0.195090f,  -0.980785f,   0.956940f,  -0.290285f,
         0.382683f,  -0.923880f,   0.881921f,   0.471397f,
        -0.555570f,   0.831470f,  -0.773010f,  -0.634393f,
         0.707107f,   0.707107f,  -0.634393f,   0.773010f,
        -0.831470f,   0.555570f,  -0.471397f,  -0.881921f,
         0.923880f,  -0.382683f,   0.290285f,   0.956940f,
        -0.980785f,   0.195090f,  -0.098017f,  -0.995185f,
        -0.000000f,   1.000000f,  -0.956940f,  -0.290285f,
         0.555570f,  -0.831470f,   0.634393f,   0.773010f,
        -0.923880f,   0.382683f,  -0.098017f,  -0.995185f,
         0.980785f,   0.195090f,  -0.471397f,   0.881921f,
        -0.707107f,  -0.707107f,   0.881921f,  -0.471397f,
         0.195090f,   0.980785f,  -0.995185f,  -0.098017f,
         0.382683f,  -0.923880f,   0.773010f,   0.634393f,
        -0.831470f,   0.555570f,  -0.290285f,  -0.956940f,
        -0.000000f,  -1.000000f,   0.881921f,   0.471397f,
        -0.831470f,   0.555570f,  -0.098017f,  -0.995185f,
         0.923880f,   0.382683f,  -0.773010f,   0.634393f,
        -0.195090f,  -0.980785f,   0.956940f,   0.290285f,
        -0.707107f,   0.707107f,  -0.290285f,  -0.956940f,
         0.980785f,   0.195090f,  -0.634393f,   0.773010f,
        -0.382683f,  -0.923880f,   0.995185f,   0.098017f,
        -0.555570f,   0.831470f,  -0.471397f,  -0.881921f,
        -0.000000f,   1.000000f,  -0.773010f,  -0.634393f,
         0.980785f,  -0.195090f,  -0.471397f,   0.881921f,
        -0.382683f,  -0.923880f,   0.956940f,   0.290285f,
        -0.831470f,   0.555570f,   0.098017f,  -0.995185f,
         0.707107f,   0.707107f,  -0.995185f,   0.098017f,
         0.555570f,  -0.831470f,   0.290285f,   0.956940f,
        -0.923880f,  -0.382683f,   0.881921f,  -0.471397f,
        -0.195090f,   0.980785f,  -0.634393f,  -0.773010f,
        -0.000000f,  -1.000000f,   0.634393f,   0.773010f,
        -0.980785f,  -0.195090f,   0.881921f,  -0.471397f,
        -0.382683f,   0.923880f,  -0.290285f,  -0.956940f,
         0.831470f,   0.555570f,  -0.995185f,   0.098017f,
         0.707107f,  -0.707107f,  -0.098017f,   0.995185f,
        -0.555570f,  -0.831470f,   0.956940f,   0.290285f,
        -0.923880f,   0.382683f,   0.471397f,  -0.881921f,
         0.195090f,   0.980785f,  -0.773010f,  -0.634393f,
        -0.000000f,   1.000000f,  -0.471397f,  -0.881921f,
         0.831470f,   0.555570f,  -0.995185f,  -0.098017f,
         0.923880f,  -0.382683f,  -0.634393f,   0.773010f,
         0.195090f,  -0.980785f,   0.290285f,   0.956940f,
        -0.707107f,  -0.707107f,   0.956940f,   0.290285f,
        -0.980785f,   0.195090f,   0.773010f,  -0.634393f,
        -0.382683f,   0.923880f,  -0.098017f,  -0.995185f,
         0.555570f,   0.831470f,  -0.881921f,  -0.471397f,
        -0.000000f,  -1.000000f,   0.290285f,   0.956940f,
        -0.555570f,  -0.831470f,   0.773010f,   0.634393f,
        -0.923880f,  -0.382683f,   0.995185f,   0.098017f,
        -0.980785f,   0.195090f,   0.881921f,  -0.471397f,
        -0.707107f,   0.707107f,   0.471397f,  -0.881921f,
        -0.195090f,   0.980785f,  -0.098017f,  -0.995185f,
         0.382683f,   0.923880f,  -0.634393f,  -0.773010f,
         0.831470f,   0.555570f,  -0.956940f,  -0.290285f,
        -0.000000f,   1.000000f,  -0.098017f,  -0.995185f,
         0.195090f,   0.980785f,  -0.290285f,  -0.956940f,
         0.382683f,   0.923880f,  -0.471397f,  -0.881921f,
         0.555570f,   0.831470f,  -0.634393f,  -0.773010f,
         0.707107f,   0.707107f,  -0.773010f,  -0.634393f,
         0.831470f,   0.555570f,  -0.881921f,  -0.471397f,
         0.923880f,   0.382683f,  -0.956940f,  -0.290285f,
         0.980785f,   0.195090f,  -0.995185f,  -0.098017f,
};
const FLOAT32 analy_cos_sin_tab_kl_24 [24 * 24 * 2] = {
        -0.000000f,  -1.000000f,   0.065403f,  -0.997859f,
         0.130526f,  -0.991445f,   0.195090f,  -0.980785f,
         0.258819f,  -0.965926f,   0.321439f,  -0.946930f,
         0.382683f,  -0.923880f,   0.442289f,  -0.896873f,
         0.500000f,  -0.866025f,   0.555570f,  -0.831470f,
         0.608761f,  -0.793353f,   0.659346f,  -0.751840f,
         0.707107f,  -0.707107f,   0.751840f,  -0.659346f,
         0.793353f,  -0.608761f,   0.831470f,  -0.555570f,
         0.866025f,  -0.500000f,   0.896873f,  -0.442289f,
         0.923880f,  -0.382683f,   0.946930f,  -0.321439f,
         0.965926f,  -0.258819f,   0.980785f,  -0.195090f,
         0.991445f,  -0.130526f,   0.997859f,  -0.065403f,
         0.000000f,   1.000000f,  -0.195090f,   0.980785f,
        -0.382683f,   0.923880f,  -0.555570f,   0.831470f,
        -0.707107f,   0.707107f,  -0.831470f,   0.555570f,
        -0.923880f,   0.382683f,  -0.980785f,   0.195090f,
        -1.000000f,   0.000000f,  -0.980785f,  -0.195090f,
        -0.923880f,  -0.382683f,  -0.831470f,  -0.555570f,
        -0.707107f,  -0.707107f,  -0.555570f,  -0.831470f,
        -0.382683f,  -0.923880f,  -0.195090f,  -0.980785f,
        -0.000000f,  -1.000000f,   0.195090f,  -0.980785f,
         0.382683f,  -0.923880f,   0.555570f,  -0.831470f,
         0.707107f,  -0.707107f,   0.831470f,  -0.555570f,
         0.923880f,  -0.382683f,   0.980785f,  -0.195090f,
        -0.000000f,  -1.000000f,   0.321439f,  -0.946930f,
         0.608761f,  -0.793353f,   0.831470f,  -0.555570f,
         0.965926f,  -0.258819f,   0.997859f,   0.065403f,
         0.923880f,   0.382683f,   0.751840f,   0.659346f,
         0.500000f,   0.866025f,   0.195090f,   0.980785f,
        -0.130526f,   0.991445f,  -0.442289f,   0.896873f,
        -0.707107f,   0.707107f,  -0.896873f,   0.442289f,
        -0.991445f,   0.130526f,  -0.980785f,  -0.195090f,
        -0.866025f,  -0.500000f,  -0.659346f,  -0.751840f,
        -0.382683f,  -0.923880f,  -0.065403f,  -0.997859f,
         0.258819f,  -0.965926f,   0.555570f,  -0.831470f,
         0.793353f,  -0.608761f,   0.946930f,  -0.321439f,
         0.000000f,   1.000000f,  -0.442289f,   0.896873f,
        -0.793353f,   0.608761f,  -0.980785f,   0.195090f,
        -0.965926f,  -0.258819f,  -0.751840f,  -0.659346f,
        -0.382683f,  -0.923880f,   0.065403f,  -0.997859f,
         0.500000f,  -0.866025f,   0.831470f,  -0.555570f,
         0.991445f,  -0.130526f,   0.946930f,   0.321439f,
         0.707107f,   0.707107f,   0.321439f,   0.946930f,
        -0.130526f,   0.991445f,  -0.555570f,   0.831470f,
        -0.866025f,   0.500000f,  -0.997859f,   0.065403f,
        -0.923880f,  -0.382683f,  -0.659346f,  -0.751840f,
        -0.258819f,  -0.965926f,   0.195090f,  -0.980785f,
         0.608761f,  -0.793353f,   0.896873f,  -0.442289f,
        -0.000000f,  -1.000000f,   0.555570f,  -0.831470f,
         0.923880f,  -0.382683f,   0.980785f,   0.195090f,
         0.707107f,   0.707107f,   0.195090f,   0.980785f,
        -0.382683f,   0.923880f,  -0.831470f,   0.555570f,
```

| | | | |
|---|---|---|---|
| −1.000000f, | 0.000000f, | −0.831470f, | −0.555570f, |
| −0.382683f, | −0.923880f, | 0.195090f, | −0.980785f, |
| 0.707107f, | −0.707107f, | 0.980785f, | −0.195090f, |
| 0.923880f, | 0.382683f, | 0.555570f, | 0.831470f, |
| 0.000000f, | 1.000000f, | −0.555570f, | 0.831470f, |
| −0.923880f, | 0.382683f, | −0.980785f, | −0.195090f, |
| −0.707107f, | −0.707107f, | −0.195090f, | −0.980785f, |
| 0.382683f, | −0.923880f, | 0.831470f, | −0.555570f, |
| 0.000000f, | 1.000000f, | −0.659346f, | 0.751840f, |
| −0.991445f, | 0.130526f, | −0.831470f, | −0.555570f, |
| −0.258819f, | −0.965926f, | 0.442289f, | −0.896873f, |
| 0.923880f, | −0.382683f, | 0.946930f, | 0.321439f, |
| 0.500000f, | 0.866025f, | −0.195090f, | 0.980785f, |
| −0.793353f, | 0.608761f, | −0.997859f, | −0.065403f, |
| −0.707107f, | −0.707107f, | −0.065403f, | −0.997859f, |
| 0.608761f, | −0.793353f, | 0.980785f, | −0.195090f, |
| 0.866025f, | 0.500000f, | 0.321439f, | 0.946930f, |
| −0.382683f, | 0.923880f, | −0.896873f, | 0.442289f, |
| −0.965926f, | −0.258819f, | −0.555570f, | −0.831470f, |
| 0.130526f, | −0.991445f, | 0.751840f, | −0.659346f, |
| −0.000000f, | −1.000000f, | 0.751840f, | −0.659346f, |
| 0.991445f, | 0.130526f, | 0.555570f, | 0.831470f, |
| −0.258819f, | 0.965926f, | −0.896873f, | 0.442289f, |
| −0.923880f, | −0.382683f, | −0.321439f, | −0.946930f, |
| 0.500000f, | −0.866025f, | 0.980785f, | −0.195090f, |
| 0.793353f, | 0.608761f, | 0.065403f, | 0.997859f, |
| −0.707107f, | 0.707107f, | −0.997859f, | −0.065403f, |
| −0.608761f, | −0.793353f, | 0.195090f, | −0.980785f, |
| 0.866025f, | −0.500000f, | 0.946930f, | 0.321439f, |
| 0.382683f, | 0.923880f, | −0.442289f, | 0.896873f, |
| −0.965926f, | 0.258819f, | −0.831470f, | −0.555570f, |
| −0.130526f, | −0.991445f, | 0.659346f, | −0.751840f, |
| 0.000000f, | 1.000000f, | −0.831470f, | 0.555570f, |
| −0.923880f, | −0.382683f, | −0.195090f, | −0.980785f, |
| 0.707107f, | −0.707107f, | 0.980785f, | 0.195090f, |
| 0.382683f, | 0.923880f, | −0.555570f, | 0.831470f, |
| −1.000000f, | 0.000000f, | −0.555570f, | −0.831470f, |
| 0.382683f, | −0.923880f, | 0.980785f, | −0.195090f, |
| 0.707107f, | 0.707107f, | −0.195090f, | 0.980785f, |
| −0.923880f, | 0.382683f, | −0.831470f, | −0.555570f, |
| −0.000000f, | −1.000000f, | 0.831470f, | −0.555570f, |
| 0.923880f, | 0.382683f, | 0.195090f, | 0.980785f, |
| −0.707107f, | 0.707107f, | −0.980785f, | −0.195090f, |
| −0.382683f, | −0.923880f, | 0.555570f, | −0.831470f, |
| −0.000000f, | −1.000000f, | 0.896873f, | −0.442289f, |
| 0.793353f, | 0.608761f, | −0.195090f, | 0.980785f, |
| −0.965926f, | 0.258819f, | −0.659346f, | −0.751840f, |
| 0.382683f, | −0.923880f, | 0.997859f, | −0.065403f, |
| 0.500000f, | 0.866025f, | −0.555570f, | 0.831470f, |
| −0.991445f, | −0.130526f, | −0.321439f, | −0.946930f, |
| 0.707107f, | −0.707107f, | 0.946930f, | 0.321439f, |
| 0.130526f, | 0.991445f, | −0.831470f, | 0.555570f, |
| −0.866025f, | −0.500000f, | 0.065403f, | −0.997859f, |
| 0.923880f, | −0.382683f, | 0.751840f, | 0.659346f, |
| −0.258819f, | 0.965926f, | −0.980785f, | 0.195090f, |
| −0.608761f, | −0.793353f, | 0.442289f, | −0.896873f, |
| 0.000000f, | 1.000000f, | −0.946930f, | 0.321439f, |
| −0.608761f, | −0.793353f, | 0.555570f, | −0.831470f, |
| 0.965926f, | 0.258819f, | 0.065403f, | 0.997859f, |
| −0.923880f, | 0.382683f, | −0.659346f, | −0.751840f, |
| 0.500000f, | −0.866025f, | 0.980785f, | 0.195090f, |
| 0.130526f, | 0.991445f, | −0.896873f, | 0.442289f, |
| −0.707107f, | −0.707107f, | 0.442289f, | −0.896873f, |
| 0.991445f, | 0.130526f, | 0.195090f, | 0.980785f, |
| −0.866025f, | 0.500000f, | −0.751840f, | −0.659346f, |
| 0.382683f, | −0.923880f, | 0.997859f, | 0.065403f, |
| 0.258819f, | 0.965926f, | −0.831470f, | 0.555570f, |
| −0.793353f, | −0.608761f, | 0.321439f, | −0.946930f, |
| −0.000000f, | −1.000000f, | 0.980785f, | −0.195090f, |
| 0.382683f, | 0.923880f, | −0.831470f, | 0.555570f, |
| −0.707107f, | −0.707107f, | 0.555570f, | −0.831470f, |
| 0.923880f, | 0.382683f, | −0.195090f, | 0.980785f, |
| −1.000000f, | 0.000000f, | −0.195090f, | −0.980785f, |
| 0.923880f, | −0.382683f, | 0.555570f, | 0.831470f, |
| −0.707107f, | 0.707107f, | −0.831470f, | −0.555570f, |
| 0.382683f, | −0.923880f, | 0.980785f, | 0.195090f, |
| 0.000000f, | 1.000000f, | −0.980785f, | 0.195090f, |
| −0.382683f, | −0.923880f, | 0.831470f, | −0.555570f, |
| 0.707107f, | 0.707107f, | −0.555570f, | 0.831470f, |

| | | | |
|---|---|---|---|
| −0.923880f, | −0.382683f, | 0.195090f, | −0.980785f, |
| 0.000000f, | 1.000000f, | −0.997859f, | 0.065403f, |
| −0.130526f, | −0.991445f, | 0.980785f, | −0.195090f, |
| 0.258819f, | 0.965926f, | −0.946930f, | 0.321439f, |
| −0.382683f, | −0.923880f, | 0.896873f, | −0.442289f, |
| 0.500000f, | 0.866025f, | −0.831470f, | 0.555570f, |
| −0.608761f, | −0.793353f, | 0.751840f, | −0.659346f, |
| 0.707107f, | 0.707107f, | −0.659346f, | 0.751840f, |
| −0.793353f, | −0.608761f, | 0.555570f, | −0.831470f, |
| 0.866025f, | 0.500000f, | −0.442289f, | 0.896873f, |
| −0.923880f, | −0.382683f, | 0.321439f, | −0.946930f, |
| 0.965926f, | 0.258819f, | −0.195090f, | 0.980785f, |
| −0.991445f, | −0.130526f, | 0.065403f, | −0.997859f, |
| −0.000000f, | −1.000000f, | 0.997859f, | 0.065403f, |
| −0.130526f, | 0.991445f, | −0.980785f, | −0.195090f, |
| 0.258819f, | −0.965926f, | 0.946930f, | 0.321439f, |
| −0.382683f, | 0.923880f, | −0.896873f, | −0.442289f, |
| 0.500000f, | −0.866025f, | 0.831470f, | 0.555570f, |
| −0.608761f, | 0.793353f, | −0.751840f, | −0.659346f, |
| 0.707107f, | −0.707107f, | 0.659346f, | 0.751840f, |
| −0.793353f, | 0.608761f, | −0.555570f, | −0.831470f, |
| 0.866025f, | −0.500000f, | 0.442289f, | 0.896873f, |
| −0.923880f, | 0.382683f, | −0.321439f, | −0.946930f, |
| 0.965926f, | −0.258819f, | 0.195090f, | 0.980785f, |
| −0.991445f, | 0.130526f, | −0.065403f, | −0.997859f, |
| 0.000000f, | 1.000000f, | −0.980785f, | −0.195090f, |
| 0.382683f, | −0.923880f, | 0.831470f, | 0.555570f, |
| −0.707107f, | 0.707107f, | −0.555570f, | −0.831470f, |
| 0.923880f, | −0.382683f, | 0.195090f, | 0.980785f, |
| −1.000000f, | 0.000000f, | 0.195090f, | −0.980785f, |
| 0.923880f, | 0.382683f, | −0.555570f, | 0.831470f, |
| −0.707107f, | −0.707107f, | 0.831470f, | −0.555570f, |
| 0.382683f, | 0.923880f, | −0.980785f, | 0.195090f, |
| −0.000000f, | −1.000000f, | 0.980785f, | 0.195090f, |
| −0.382683f, | 0.923880f, | −0.831470f, | −0.555570f, |
| 0.707107f, | −0.707107f, | 0.555570f, | 0.831470f, |
| −0.923880f, | 0.382683f, | −0.195090f, | −0.980785f, |
| −0.000000f, | −1.000000f, | 0.946930f, | 0.321439f, |
| −0.608761f, | 0.793353f, | −0.555570f, | −0.831470f, |
| 0.965926f, | −0.258819f, | −0.065403f, | 0.997859f, |
| −0.923880f, | −0.382683f, | 0.659346f, | −0.751840f, |
| 0.500000f, | 0.866025f, | −0.980785f, | 0.195090f, |
| 0.130526f, | −0.991445f, | 0.896873f, | 0.442289f, |
| −0.707107f, | 0.707107f, | −0.442289f, | −0.896873f, |
| 0.991445f, | −0.130526f, | −0.195090f, | 0.980785f, |
| −0.866025f, | −0.500000f, | 0.751840f, | −0.659346f, |
| 0.382683f, | 0.923880f, | −0.997859f, | 0.065403f, |
| 0.258819f, | −0.965926f, | 0.831470f, | 0.555570f, |
| −0.793353f, | 0.608761f, | −0.321439f, | −0.946930f, |
| 0.000000f, | 1.000000f, | −0.896873f, | −0.442289f, |
| 0.793353f, | −0.608761f, | 0.195090f, | 0.980785f, |
| −0.965926f, | −0.258819f, | 0.659346f, | −0.751840f, |
| 0.382683f, | 0.923880f, | −0.997859f, | −0.065403f, |
| 0.500000f, | −0.866025f, | 0.555570f, | 0.831470f, |
| −0.991445f, | 0.130526f, | 0.321439f, | −0.946930f, |
| 0.707107f, | 0.707107f, | −0.946930f, | 0.321439f, |
| 0.130526f, | −0.991445f, | 0.831470f, | 0.555570f, |
| −0.866025f, | 0.500000f, | −0.065403f, | −0.997859f, |
| 0.923880f, | 0.382683f, | −0.751840f, | 0.659346f, |
| −0.258819f, | −0.965926f, | 0.980785f, | 0.195090f, |
| −0.608761f, | 0.793353f, | −0.442289f, | −0.896873f, |
| −0.000000f, | −1.000000f, | 0.831470f, | 0.555570f, |
| −0.923880f, | 0.382683f, | 0.195090f, | −0.980785f, |
| 0.707107f, | 0.707107f, | −0.980785f, | 0.195090f, |
| 0.382683f, | −0.923880f, | 0.555570f, | 0.831470f, |
| −1.000000f, | 0.000000f, | 0.555570f, | −0.831470f, |
| 0.382683f, | 0.923880f, | −0.980785f, | −0.195090f, |
| 0.707107f, | −0.707107f, | 0.195090f, | 0.980785f, |
| −0.923880f, | −0.382683f, | 0.831470f, | −0.555570f, |
| 0.000000f, | 1.000000f, | −0.831470f, | −0.555570f, |
| 0.923880f, | −0.382683f, | −0.195090f, | 0.980785f, |
| −0.707107f, | −0.707107f, | 0.980785f, | −0.195090f, |
| −0.382683f, | 0.923880f, | −0.555570f, | −0.831470f, |
| 0.000000f, | 1.000000f, | −0.751840f, | −0.659346f, |
| 0.991445f, | −0.130526f, | −0.555570f, | 0.831470f, |
| −0.258819f, | −0.965926f, | 0.896873f, | 0.442289f, |
| −0.923880f, | 0.382683f, | 0.321439f, | −0.946930f, |
| 0.500000f, | 0.866025f, | −0.980785f, | −0.195090f, |
| 0.793353f, | −0.608761f, | −0.065403f, | 0.997859f, |

| | | | |
|---|---|---|---|
| −0.707107f, | −0.707107f, | 0.997859f, | −0.065403f, |
| −0.608761f, | 0.793353f, | −0.195090f, | −0.980785f, |
| 0.866025f, | 0.500000f, | −0.946930f, | 0.321439f, |
| 0.382683f, | −0.923880f, | 0.442289f, | 0.896873f, |
| −0.965926f, | −0.258819f, | 0.831470f, | −0.555570f, |
| −0.130526f, | 0.991445f, | −0.659346f, | −0.751840f, |
| −0.000000f, | −1.000000f, | 0.659346f, | 0.751840f, |
| −0.991445f, | −0.130526f, | 0.831470f, | −0.555570f, |
| −0.258819f, | 0.965926f, | −0.442289f, | −0.896873f, |
| 0.923880f, | 0.382683f, | −0.946930f, | 0.321439f, |
| 0.500000f, | −0.866025f, | 0.195090f, | 0.980785f, |
| −0.793353f, | −0.608761f, | 0.997859f, | −0.065403f, |
| −0.707107f, | 0.707107f, | 0.065403f, | −0.997859f, |
| 0.608761f, | 0.793353f, | −0.980785f, | −0.195090f, |
| 0.866025f, | −0.500000f, | −0.321439f, | 0.946930f, |
| −0.382683f, | −0.923880f, | 0.896873f, | 0.442289f, |
| −0.965926f, | 0.258819f, | 0.555570f, | −0.831470f, |
| 0.130526f, | 0.991445f, | −0.751840f, | −0.659346f, |
| 0.000000f, | 1.000000f, | −0.555570f, | −0.831470f, |
| 0.923880f, | 0.382683f, | −0.980785f, | 0.195090f, |
| 0.707107f, | −0.707107f, | −0.195090f, | 0.980785f, |
| −0.382683f, | −0.923880f, | 0.831470f, | 0.555570f, |
| −1.000000f, | 0.000000f, | 0.831470f, | −0.555570f, |
| −0.382683f, | 0.923880f, | −0.195090f, | −0.980785f, |
| 0.707107f, | 0.707107f, | −0.980785f, | −0.195090f, |
| 0.923880f, | −0.382683f, | −0.555570f, | 0.831470f, |
| −0.000000f, | −1.000000f, | 0.555570f, | 0.831470f, |
| −0.923880f, | −0.382683f, | 0.980785f, | −0.195090f, |
| −0.707107f, | 0.707107f, | 0.195090f, | −0.980785f, |
| 0.382683f, | 0.923880f, | −0.831470f, | −0.555570f, |
| −0.000000f, | −1.000000f, | 0.442289f, | 0.896873f, |
| −0.793353f, | −0.608761f, | 0.980785f, | 0.195090f, |
| −0.965926f, | 0.258819f, | 0.751840f, | −0.659346f, |
| −0.382683f, | 0.923880f, | −0.065403f, | −0.997859f, |
| 0.500000f, | 0.866025f, | −0.831470f, | −0.555570f, |
| 0.991445f, | 0.130526f, | −0.946930f, | 0.321439f, |
| 0.707107f, | −0.707107f, | −0.321439f, | 0.946930f, |
| −0.130526f, | −0.991445f, | 0.555570f, | 0.831470f, |
| −0.866025f, | −0.500000f, | 0.997859f, | 0.065403f, |
| −0.923880f, | 0.382683f, | 0.659346f, | −0.751840f, |
| −0.258819f, | 0.965926f, | −0.195090f, | −0.980785f, |
| 0.608761f, | 0.793353f, | −0.896873f, | −0.442289f, |
| 0.000000f, | 1.000000f, | −0.321439f, | −0.946930f, |
| 0.608761f, | 0.793353f, | −0.831470f, | −0.555570f, |
| 0.965926f, | 0.258819f, | −0.997859f, | 0.065403f, |
| 0.923880f, | −0.382683f, | −0.751840f, | 0.659346f, |
| 0.500000f, | −0.866025f, | −0.195090f, | 0.980785f, |
| −0.130526f, | −0.991445f, | 0.442289f, | 0.896873f, |
| −0.707107f, | −0.707107f, | 0.896873f, | 0.442289f, |
| −0.991445f, | −0.130526f, | 0.980785f, | −0.195090f, |
| −0.866025f, | 0.500000f, | 0.659346f, | −0.751840f, |
| −0.382683f, | 0.923880f, | 0.065403f, | −0.997859f, |
| 0.258819f, | 0.965926f, | −0.555570f, | −0.831470f, |
| 0.793353f, | 0.608761f, | −0.946930f, | −0.321439f, |
| 0.000000f, | −1.000000f, | 0.195090f, | 0.980785f, |
| −0.382683f, | −0.923880f, | 0.555570f, | 0.831470f, |
| −0.707107f, | −0.707107f, | 0.831470f, | 0.555570f, |
| −0.923880f, | −0.382683f, | 0.980785f, | 0.195090f, |
| −1.000000f, | 0.000000f, | 0.980785f, | −0.195090f, |
| −0.923880f, | 0.382683f, | 0.831470f, | −0.555570f, |
| −0.707107f, | 0.707107f, | 0.555570f, | −0.831470f, |
| −0.382683f, | 0.923880f, | 0.195090f, | −0.980785f, |
| 0.000000f, | 1.000000f, | −0.195090f, | −0.980785f, |
| 0.382683f, | 0.923880f, | −0.555570f, | −0.831470f, |
| 0.707107f, | 0.707107f, | −0.831470f, | −0.555570f, |
| 0.923880f, | 0.382683f, | −0.980785f, | −0.195090f, |
| 0.000000f, | 1.000000f, | −0.065403f, | −0.997859f, |
| 0.130526f, | 0.991445f, | −0.195090f, | −0.980785f, |
| 0.258819f, | 0.965926f, | −0.321439f, | −0.946930f, |
| 0.382683f, | 0.923880f, | −0.442289f, | −0.896873f, |
| 0.500000f, | 0.866025f, | −0.555570f, | −0.831470f, |
| 0.608761f, | 0.793353f, | −0.659346f, | −0.751840f, |
| 0.707107f, | 0.707107f, | −0.751840f, | −0.659346f, |
| 0.793353f, | 0.608761f, | −0.831470f, | −0.555570f, |
| 0.866025f, | 0.500000f, | −0.896873f, | −0.442289f, |
| 0.923880f, | 0.382683f, | −0.946930f, | −0.321439f, |
| 0.965926f, | 0.258819f, | −0.980785f, | −0.195090f, |
| 0.991445f, | 0.130526f, | −0.997859f, | −0.065403f, |
};

```
const FLOAT32 analy_cos_sin_tab_kl_32 [32 * 32 * 2] = {
```

| | | | |
|---|---|---|---|
| 0.000000f, | −1.000000f, | 0.049068f, | −0.998795f, |
| 0.098017f, | −0.995185f, | 0.146730f, | −0.989177f, |
| 0.195090f, | −0.980785f, | 0.242980f, | −0.970031f, |
| 0.290285f, | −0.956940f, | 0.336890f, | −0.941544f, |
| 0.382683f, | −0.923880f, | 0.427555f, | −0.903989f, |
| 0.471397f, | −0.881921f, | 0.514103f, | −0.857729f, |
| 0.555570f, | −0.831470f, | 0.595699f, | −0.803208f, |
| 0.634393f, | −0.773010f, | 0.671559f, | −0.740951f, |
| 0.707107f, | −0.707107f, | 0.740951f, | −0.671559f, |
| 0.773010f, | −0.634393f, | 0.803208f, | −0.595699f, |
| 0.831470f, | −0.555570f, | 0.857729f, | −0.514103f, |
| 0.881921f, | −0.471397f, | 0.903989f, | −0.427555f, |
| 0.923880f, | −0.382683f, | 0.941544f, | −0.336890f, |
| 0.956940f, | −0.290285f, | 0.970031f, | −0.242980f, |
| 0.980785f, | −0.195090f, | 0.989177f, | −0.146730f, |
| 0.995185f, | −0.098017f, | 0.998795f, | −0.049068f, |
| −0.000000f, | 1.000000f, | −0.146730f, | 0.989177f, |
| −0.290285f, | 0.956940f, | −0.427555f, | 0.903989f, |
| −0.555570f, | 0.831470f, | −0.671559f, | 0.740951f, |
| −0.773010f, | 0.634393f, | −0.857729f, | 0.514103f, |
| −0.923880f, | 0.382683f, | −0.970031f, | 0.242980f, |
| −0.995185f, | 0.098017f, | −0.998795f, | −0.049068f, |
| −0.980785f, | −0.195090f, | −0.941544f, | −0.336890f, |
| −0.881921f, | −0.471397f, | −0.803208f, | −0.595699f, |
| −0.707107f, | −0.707107f, | −0.595699f, | −0.803208f, |
| −0.471397f, | −0.881921f, | −0.336890f, | −0.941544f, |
| −0.195090f, | −0.980785f, | −0.049068f, | −0.998795f, |
| 0.098017f, | −0.995185f, | 0.242980f, | −0.970031f, |
| 0.382683f, | −0.923880f, | 0.514103f, | −0.857729f, |
| 0.634393f, | −0.773010f, | 0.740951f, | −0.671559f, |
| 0.831470f, | −0.555570f, | 0.903989f, | −0.427555f, |
| 0.956940f, | −0.290285f, | 0.989177f, | −0.146730f, |
| 0.000000f, | −1.000000f, | 0.242980f, | −0.970031f, |
| 0.471397f, | −0.881921f, | 0.671559f, | −0.740951f, |
| 0.831470f, | −0.555570f, | 0.941544f, | −0.336890f, |
| 0.995185f, | −0.098017f, | 0.989177f, | 0.146730f, |
| 0.923880f, | 0.382683f, | 0.803208f, | 0.595699f, |
| 0.634393f, | 0.773010f, | 0.427555f, | 0.903989f, |
| 0.195090f, | 0.980785f, | −0.049068f, | 0.998795f, |
| −0.290285f, | 0.956940f, | −0.514103f, | 0.857729f, |
| −0.707107f, | 0.707107f, | −0.857729f, | 0.514103f, |
| −0.956940f, | 0.290285f, | −0.998795f, | 0.049068f, |
| −0.980785f, | −0.195090f, | −0.903989f, | −0.427555f, |
| −0.773010f, | −0.634393f, | −0.595699f, | −0.803208f, |
| −0.382683f, | −0.923880f, | −0.146730f, | −0.989177f, |
| 0.098017f, | −0.995185f, | 0.336890f, | −0.941544f, |
| 0.555570f, | −0.831470f, | 0.740951f, | −0.671559f, |
| 0.881921f, | −0.471397f, | 0.970031f, | −0.242980f, |
| −0.000000f, | 1.000000f, | −0.336890f, | 0.941544f, |
| −0.634393f, | 0.773010f, | −0.857729f, | 0.514103f, |
| −0.980785f, | 0.195090f, | −0.989177f, | −0.146730f, |
| −0.881921f, | −0.471397f, | −0.671559f, | −0.740951f, |
| −0.382683f, | −0.923880f, | −0.049068f, | −0.998795f, |
| 0.290285f, | −0.956940f, | 0.595699f, | −0.803208f, |
| 0.831470f, | −0.555570f, | 0.970031f, | −0.242980f, |
| 0.995185f, | 0.098017f, | 0.903989f, | 0.427555f, |
| 0.707107f, | 0.707107f, | 0.427555f, | 0.903989f, |
| 0.098017f, | 0.995185f, | −0.242980f, | 0.970031f, |
| −0.555570f, | 0.831470f, | −0.803208f, | 0.595699f, |
| −0.956940f, | 0.290285f, | −0.998795f, | −0.049068f, |
| −0.923880f, | −0.382683f, | −0.740951f, | −0.671559f, |
| −0.471397f, | −0.881921f, | −0.146730f, | −0.989177f, |
| 0.195090f, | −0.980785f, | 0.514103f, | −0.857729f, |
| 0.773010f, | −0.634393f, | 0.941544f, | −0.336890f, |
| 0.000000f, | −1.000000f, | 0.427555f, | −0.903989f, |
| 0.773010f, | −0.634393f, | 0.970031f, | −0.242980f, |
| 0.980785f, | 0.195090f, | 0.803208f, | 0.595699f, |
| 0.471397f, | 0.881921f, | 0.049068f, | 0.998795f, |
| −0.382683f, | 0.923880f, | −0.740951f, | 0.671559f, |
| −0.956940f, | 0.290285f, | −0.989177f, | −0.146730f, |
| −0.831470f, | −0.555570f, | −0.514103f, | −0.857729f, |
| −0.098017f, | −0.995185f, | 0.336890f, | −0.941544f, |
| 0.707107f, | −0.707107f, | 0.941544f, | −0.336890f, |
| 0.995185f, | 0.098017f, | 0.857729f, | 0.514103f, |
| 0.555570f, | 0.831470f, | 0.146730f, | 0.989177f, |
| −0.290285f, | 0.956940f, | −0.671559f, | 0.740951f, |
| −0.923880f, | 0.382683f, | −0.998795f, | −0.049068f, |
| −0.881921f, | −0.471397f, | −0.595699f, | −0.803208f, |

| | | | |
|---|---|---|---|
| −0.195090f, | −0.980785f, | 0.242980f, | −0.970031f, |
| 0.634393f, | −0.773010f, | 0.903989f, | −0.427555f, |
| −0.000000f, | 1.000000f, | −0.514103f, | 0.857729f, |
| −0.881921f, | 0.471397f, | −0.998795f, | −0.049068f, |
| −0.831470f, | −0.555570f, | −0.427555f, | −0.903989f, |
| 0.098017f, | −0.995185f, | 0.595699f, | −0.803208f, |
| 0.923880f, | −0.382683f, | 0.989177f, | 0.146730f, |
| 0.773010f, | 0.634393f, | 0.336890f, | 0.941544f, |
| −0.195090f, | 0.980785f, | −0.671559f, | 0.740951f, |
| −0.956940f, | 0.290285f, | −0.970031f, | −0.242980f, |
| −0.707107f, | −0.707107f, | −0.242980f, | −0.970031f, |
| 0.290285f, | −0.956940f, | 0.740951f, | −0.671559f, |
| 0.980785f, | −0.195090f, | 0.941544f, | 0.336890f, |
| 0.634393f, | 0.773010f, | 0.146730f, | 0.989177f, |
| −0.382683f, | 0.923880f, | −0.803208f, | 0.595699f, |
| −0.995185f, | 0.098017f, | −0.903989f, | −0.427555f, |
| −0.555570f, | −0.831470f, | −0.049068f, | −0.998795f, |
| 0.471397f, | −0.881921f, | 0.857729f, | −0.514103f, |
| −0.000000f, | −1.000000f, | 0.595699f, | −0.803208f, |
| 0.956940f, | −0.290285f, | 0.941544f, | 0.336890f, |
| 0.555570f, | 0.831470f, | −0.049068f, | 0.998795f, |
| −0.634393f, | 0.773010f, | −0.970031f, | 0.242980f, |
| −0.923880f, | −0.382683f, | −0.514103f, | −0.857729f, |
| 0.098017f, | −0.995185f, | 0.671559f, | −0.740951f, |
| 0.980785f, | −0.195090f, | 0.903989f, | 0.427555f, |
| 0.471397f, | 0.881921f, | −0.146730f, | 0.989177f, |
| −0.707107f, | 0.707107f, | −0.989177f, | 0.146730f, |
| −0.881921f, | −0.471397f, | −0.427555f, | −0.903989f, |
| 0.195090f, | −0.980785f, | 0.740951f, | −0.671559f, |
| 0.995185f, | −0.098017f, | 0.857729f, | 0.514103f, |
| 0.382683f, | 0.923880f, | −0.242980f, | 0.970031f, |
| −0.773010f, | 0.634393f, | −0.998795f, | 0.049068f, |
| −0.831470f, | −0.555570f, | −0.336890f, | −0.941544f, |
| 0.290285f, | −0.956940f, | 0.803208f, | −0.595699f, |
| −0.000000f, | 1.000000f, | −0.671559f, | 0.740951f, |
| −0.995185f, | 0.098017f, | −0.803208f, | −0.595699f, |
| −0.195090f, | −0.980785f, | 0.514103f, | −0.857729f, |
| 0.956940f, | −0.290285f, | 0.903989f, | 0.427555f, |
| 0.382683f, | 0.923880f, | −0.336890f, | 0.941544f, |
| −0.881921f, | 0.471397f, | −0.970031f, | −0.242980f, |
| −0.555570f, | −0.831470f, | 0.146730f, | −0.989177f, |
| 0.773010f, | −0.634393f, | 0.998795f, | 0.049068f, |
| 0.707107f, | 0.707107f, | 0.049068f, | 0.998795f, |
| −0.634393f, | 0.773010f, | −0.989177f, | 0.146730f, |
| −0.831470f, | −0.555570f, | −0.242980f, | −0.970031f, |
| 0.471397f, | −0.881921f, | 0.941544f, | −0.336890f, |
| 0.923880f, | 0.382683f, | 0.427555f, | 0.903989f, |
| −0.290285f, | 0.956940f, | −0.857729f, | 0.514103f, |
| −0.980785f, | −0.195090f, | −0.595699f, | −0.803208f, |
| 0.098017f, | −0.995185f, | 0.740951f, | −0.671559f, |
| −0.000000f, | −1.000000f, | 0.740951f, | −0.671559f, |
| 0.995185f, | 0.098017f, | 0.595699f, | 0.803208f, |
| −0.195090f, | 0.980785f, | −0.857729f, | 0.514103f, |
| −0.956940f, | −0.290285f, | −0.427555f, | −0.903989f, |
| 0.382683f, | −0.923880f, | 0.941544f, | −0.336890f, |
| 0.881921f, | 0.471397f, | 0.242980f, | 0.970031f, |
| −0.555570f, | 0.831470f, | −0.989177f, | 0.146730f, |
| −0.773010f, | −0.634393f, | −0.049068f, | −0.998795f, |
| 0.707107f, | −0.707107f, | 0.998795f, | 0.049068f, |
| 0.634393f, | 0.773010f, | −0.146730f, | 0.989177f, |
| −0.831470f, | 0.555570f, | −0.970031f, | −0.242980f, |
| −0.471397f, | −0.881921f, | 0.336890f, | −0.941544f, |
| 0.923880f, | −0.382683f, | 0.903989f, | 0.427555f, |
| 0.290285f, | 0.956940f, | −0.514103f, | 0.857729f, |
| −0.980785f, | 0.195090f, | −0.803208f, | −0.595699f, |
| −0.098017f, | −0.995185f, | 0.671559f, | −0.740951f, |
| −0.000000f, | 1.000000f, | −0.803208f, | 0.595699f, |
| −0.956940f, | −0.290285f, | −0.336890f, | −0.941544f, |
| 0.555570f, | −0.831470f, | 0.998795f, | −0.049068f, |
| 0.634393f, | 0.773010f, | −0.242980f, | 0.970031f, |
| −0.923880f, | 0.382683f, | −0.857729f, | −0.514103f, |
| −0.098017f, | −0.995185f, | 0.740951f, | −0.671559f, |
| 0.980785f, | 0.195090f, | 0.427555f, | 0.903989f, |
| −0.471397f, | 0.881921f, | −0.989177f, | 0.146730f, |
| −0.707107f, | −0.707107f, | 0.146730f, | −0.989177f, |
| 0.881921f, | −0.471397f, | 0.903989f, | 0.427555f, |
| 0.195090f, | 0.980785f, | −0.671559f, | 0.740951f, |
| −0.995185f, | −0.098017f, | −0.514103f, | −0.857729f, |
| 0.382683f, | −0.923880f, | 0.970031f, | −0.242980f, |

| | | | |
|---|---|---|---|
| 0.773010f, | 0.634393f, | −0.049068f, | 0.998795f, |
| −0.831470f, | 0.555570f, | −0.941544f, | −0.336890f, |
| −0.290285f, | −0.956940f, | 0.595699f, | −0.803208f, |
| −0.000000f, | −1.000000f, | 0.857729f, | −0.514103f, |
| 0.881921f, | 0.471397f, | 0.049068f, | 0.998795f, |
| −0.831470f, | 0.555570f, | −0.903989f, | −0.427555f, |
| −0.098017f, | −0.995185f, | 0.803208f, | −0.595699f, |
| 0.923880f, | 0.382683f, | 0.146730f, | 0.989177f, |
| −0.773010f, | 0.634393f, | −0.941544f, | −0.336890f, |
| −0.195090f, | −0.980785f, | 0.740951f, | −0.671559f, |
| 0.956940f, | 0.290285f, | 0.242980f, | 0.970031f, |
| −0.707107f, | 0.707107f, | −0.970031f, | −0.242980f, |
| −0.290285f, | −0.956940f, | 0.671559f, | −0.740951f, |
| 0.980785f, | 0.195090f, | 0.336890f, | 0.941544f, |
| −0.634393f, | 0.773010f, | −0.989177f, | −0.146730f, |
| −0.382683f, | −0.923880f, | 0.595699f, | −0.803208f, |
| 0.995185f, | 0.098017f, | 0.427555f, | 0.903989f, |
| −0.555570f, | 0.831470f, | −0.998795f, | −0.049068f, |
| −0.471397f, | −0.881921f, | 0.514103f, | −0.857729f, |
| −0.000000f, | 1.000000f, | −0.903989f, | 0.427555f, |
| −0.773010f, | −0.634393f, | 0.242980f, | −0.970031f, |
| 0.980785f, | −0.195090f, | 0.595699f, | 0.803208f, |
| −0.471397f, | 0.881921f, | −0.998795f, | −0.049068f, |
| −0.382683f, | −0.923880f, | 0.671559f, | −0.740951f, |
| 0.956940f, | 0.290285f, | 0.146730f, | 0.989177f, |
| −0.831470f, | 0.555570f, | −0.857729f, | −0.514103f, |
| 0.098017f, | −0.995185f, | 0.941544f, | −0.336890f, |
| 0.707107f, | 0.707107f, | −0.336890f, | 0.941544f, |
| −0.995185f, | 0.098017f, | −0.514103f, | −0.857729f, |
| 0.555570f, | −0.831470f, | 0.989177f, | −0.146730f, |
| 0.290285f, | 0.956940f, | −0.740951f, | 0.671559f, |
| −0.923880f, | −0.382683f, | −0.049068f, | −0.998795f, |
| 0.881921f, | −0.471397f, | 0.803208f, | 0.595699f, |
| −0.195090f, | 0.980785f, | −0.970031f, | 0.242980f, |
| −0.634393f, | −0.773010f, | 0.427555f, | −0.903989f, |
| −0.000000f, | −1.000000f, | 0.941544f, | −0.336890f, |
| 0.634393f, | 0.773010f, | −0.514103f, | 0.857729f, |
| −0.980785f, | −0.195090f, | −0.146730f, | −0.989177f, |
| 0.881921f, | −0.471397f, | 0.740951f, | 0.671559f, |
| −0.382683f, | 0.923880f, | −0.998795f, | −0.049068f, |
| −0.290285f, | −0.956940f, | 0.803208f, | −0.595699f, |
| 0.831470f, | 0.555570f, | −0.242980f, | 0.970031f, |
| −0.995185f, | 0.098017f, | −0.427555f, | −0.903989f, |
| 0.707107f, | −0.707107f, | 0.903989f, | 0.427555f, |
| −0.098017f, | 0.995185f, | −0.970031f, | 0.242980f, |
| −0.555570f, | −0.831470f, | 0.595699f, | −0.803208f, |
| 0.956940f, | 0.290285f, | 0.049068f, | 0.998795f, |
| −0.923880f, | 0.382683f, | −0.671559f, | −0.740951f, |
| 0.471397f, | −0.881921f, | 0.989177f, | 0.146730f, |
| 0.195090f, | 0.980785f, | −0.857729f, | 0.514103f, |
| −0.773010f, | −0.634393f, | 0.336890f, | −0.941544f, |
| −0.000000f, | 1.000000f, | −0.970031f, | 0.242980f, |
| −0.471397f, | −0.881921f, | 0.740951f, | −0.671559f, |
| 0.831470f, | 0.555570f, | −0.336890f, | 0.941544f, |
| −0.995185f, | −0.098017f, | −0.146730f, | −0.989177f, |
| 0.923880f, | −0.382683f, | 0.595699f, | 0.803208f, |
| −0.634393f, | 0.773010f, | −0.903989f, | −0.427555f, |
| 0.195090f, | −0.980785f, | 0.998795f, | −0.049068f, |
| 0.290285f, | 0.956940f, | −0.857729f, | 0.514103f, |
| −0.707107f, | −0.707107f, | 0.514103f, | −0.857729f, |
| 0.956940f, | 0.290285f, | −0.049068f, | 0.998795f, |
| −0.980785f, | 0.195090f, | −0.427555f, | −0.903989f, |
| 0.773010f, | −0.634393f, | 0.803208f, | 0.595699f, |
| −0.382683f, | 0.923880f, | −0.989177f, | −0.146730f, |
| −0.098017f, | −0.995185f, | 0.941544f, | −0.336890f, |
| 0.555570f, | 0.831470f, | −0.671559f, | 0.740951f, |
| −0.881921f, | −0.471397f, | 0.242980f, | −0.970031f, |
| −0.000000f, | −1.000000f, | 0.989177f, | −0.146730f, |
| 0.290285f, | 0.956940f, | −0.903989f, | 0.427555f, |
| −0.555570f, | −0.831470f, | 0.740951f, | −0.671559f, |
| 0.773010f, | 0.634393f, | −0.514103f, | 0.857729f, |
| −0.923880f, | −0.382683f, | 0.242980f, | −0.970031f, |
| 0.995185f, | 0.098017f, | 0.049068f, | 0.998795f, |
| −0.980785f, | 0.195090f, | −0.336890f, | −0.941544f, |
| 0.881921f, | −0.471397f, | 0.595699f, | 0.803208f, |
| −0.707107f, | 0.707107f, | −0.803208f, | −0.595699f, |
| 0.471397f, | −0.881921f, | 0.941544f, | 0.336890f, |
| −0.195090f, | 0.980785f, | −0.998795f, | −0.049068f, |
| −0.098017f, | −0.995185f, | 0.970031f, | −0.242980f, |

55

-continued

```
 0.382683f,  0.923880f, -0.857729f,  0.514103f,
-0.634393f, -0.773010f,  0.671559f, -0.740951f,
 0.831470f,  0.555570f, -0.427555f,  0.903989f,
-0.956940f, -0.290285f,  0.146730f, -0.989177f,
-0.000000f,  1.000000f, -0.998795f,  0.049068f,
-0.098017f, -0.995185f,  0.989177f, -0.146730f,
 0.195090f,  0.980785f, -0.970031f,  0.242980f,
-0.290285f, -0.956940f,  0.941544f, -0.336890f,
 0.382683f,  0.923880f, -0.903989f,  0.427555f,
-0.471397f, -0.881921f,  0.857729f, -0.514103f,
 0.555570f,  0.831470f, -0.803208f,  0.595699f,
-0.634393f, -0.773010f,  0.740951f, -0.671559f,
 0.707107f,  0.707107f, -0.671559f,  0.740951f,
-0.773010f, -0.634393f,  0.595699f, -0.803208f,
 0.831470f,  0.555570f, -0.514103f,  0.857729f,
-0.881921f, -0.471397f,  0.427555f, -0.903989f,
 0.923880f,  0.382683f, -0.336890f,  0.941544f,
-0.956940f, -0.290285f,  0.242980f, -0.970031f,
 0.980785f,  0.195090f, -0.146730f,  0.989177f,
-0.995185f, -0.098017f,  0.049068f, -0.998795f,
 0.000000f, -1.000000f,  0.998795f,  0.049068f,
-0.098017f,  0.995185f, -0.989177f, -0.146730f,
 0.195090f, -0.980785f,  0.970031f,  0.242980f,
-0.290285f,  0.956940f, -0.941544f, -0.336890f,
 0.382683f, -0.923880f,  0.903989f,  0.427555f,
-0.471397f,  0.881921f, -0.857729f, -0.514103f,
 0.555570f, -0.831470f,  0.803208f,  0.595699f,
-0.634393f,  0.773010f, -0.740951f, -0.671559f,
 0.707107f, -0.707107f,  0.671559f,  0.740951f,
-0.773010f,  0.634393f, -0.595699f, -0.803208f,
 0.831470f, -0.555570f,  0.514103f,  0.857729f,
-0.881921f,  0.471397f, -0.427555f, -0.903989f,
 0.923880f, -0.382683f,  0.336890f,  0.941544f,
-0.956940f,  0.290285f, -0.242980f, -0.970031f,
 0.980785f, -0.195090f,  0.146730f,  0.989177f,
-0.995185f,  0.098017f, -0.049068f, -0.998795f,
-0.000000f,  1.000000f, -0.989177f, -0.146730f,
 0.290285f, -0.956940f,  0.903989f,  0.427555f,
-0.555570f,  0.831470f, -0.740951f, -0.671559f,
 0.773010f, -0.634393f,  0.514103f,  0.857729f,
-0.923880f,  0.382683f, -0.242980f, -0.970031f,
 0.995185f, -0.098017f, -0.049068f,  0.998795f,
-0.980785f, -0.195090f,  0.336890f, -0.941544f,
 0.881921f,  0.471397f, -0.595699f,  0.803208f,
-0.707107f, -0.707107f,  0.803208f, -0.595699f,
 0.471397f,  0.881921f, -0.941544f,  0.336890f,
-0.195090f, -0.980785f,  0.998795f, -0.049068f,
-0.098017f,  0.995185f, -0.970031f, -0.242980f,
 0.382683f, -0.923880f,  0.857729f,  0.514103f,
-0.634393f,  0.773010f, -0.671559f, -0.740951f,
 0.831470f, -0.555570f,  0.427555f,  0.903989f,
-0.956940f,  0.290285f, -0.146730f, -0.989177f,
 0.000000f, -1.000000f,  0.970031f,  0.242980f,
-0.471397f,  0.881921f, -0.740951f, -0.671559f,
 0.831470f, -0.555570f,  0.336890f,  0.941544f,
-0.995185f,  0.098017f,  0.146730f, -0.989177f,
 0.923880f,  0.382683f, -0.595699f,  0.803208f,
-0.634393f, -0.773010f,  0.903989f, -0.427555f,
 0.195090f,  0.980785f, -0.998795f, -0.049068f,
 0.290285f, -0.956940f,  0.857729f,  0.514103f,
-0.707107f,  0.707107f, -0.514103f, -0.857729f,
 0.956940f, -0.290285f,  0.049068f,  0.998795f,
-0.980785f, -0.195090f,  0.427555f, -0.903989f,
 0.773010f,  0.634393f, -0.803208f,  0.595699f,
-0.382683f, -0.923880f,  0.989177f, -0.146730f,
-0.098017f,  0.995185f, -0.941544f, -0.336890f,
 0.555570f, -0.831470f,  0.671559f,  0.740951f,
-0.881921f,  0.471397f, -0.242980f, -0.970031f,
-0.000000f,  1.000000f, -0.941544f, -0.336890f,
 0.634393f, -0.773010f,  0.514103f,  0.857729f,
-0.980785f,  0.195090f,  0.146730f, -0.989177f,
 0.881921f,  0.471397f, -0.740951f,  0.671559f,
-0.382683f, -0.923880f,  0.998795f, -0.049068f,
-0.290285f,  0.956940f, -0.803208f, -0.595699f,
 0.831470f, -0.555570f,  0.242980f,  0.970031f,
-0.995185f, -0.098017f,  0.427555f, -0.903989f,
 0.707107f,  0.707107f, -0.903989f,  0.427555f,
-0.098017f, -0.995185f,  0.970031f,  0.242980f,
-0.555570f,  0.831470f, -0.595699f, -0.803208f,
```

56

-continued

```
 0.956940f, -0.290285f, -0.049068f,  0.998795f,
-0.923880f, -0.382683f,  0.671559f, -0.740951f,
 0.471397f,  0.881921f, -0.989177f,  0.146730f,
 0.195090f, -0.980785f,  0.857729f,  0.514103f,
-0.773010f,  0.634393f, -0.336890f, -0.941544f,
 0.000000f, -1.000000f,  0.903989f,  0.427555f,
-0.773010f,  0.634393f, -0.242980f, -0.970031f,
 0.980785f,  0.195090f, -0.595699f,  0.803208f,
-0.471397f, -0.881921f,  0.998795f, -0.049068f,
-0.382683f,  0.923880f, -0.671559f, -0.740951f,
 0.956940f, -0.290285f, -0.146730f,  0.989177f,
-0.831470f, -0.555570f,  0.857729f, -0.514103f,
 0.098017f,  0.995185f, -0.941544f, -0.336890f,
 0.707107f, -0.707107f,  0.336890f,  0.941544f,
-0.995185f, -0.098017f,  0.514103f, -0.857729f,
 0.555570f,  0.831470f, -0.989177f,  0.146730f,
 0.290285f, -0.956940f,  0.740951f,  0.671559f,
-0.923880f,  0.382683f,  0.049068f, -0.998795f,
 0.881921f,  0.471397f, -0.803208f,  0.595699f,
-0.195090f, -0.980785f,  0.970031f,  0.242980f,
-0.634393f,  0.773010f, -0.427555f, -0.903989f,
-0.000000f,  1.000000f, -0.857729f, -0.514103f,
 0.881921f, -0.471397f, -0.049068f,  0.998795f,
-0.831470f, -0.555570f,  0.903989f, -0.427555f,
-0.098017f,  0.995185f, -0.803208f, -0.595699f,
 0.923880f, -0.382683f, -0.146730f,  0.989177f,
-0.773010f, -0.634393f,  0.941544f, -0.336890f,
-0.195090f,  0.980785f, -0.740951f, -0.671559f,
 0.956940f, -0.290285f, -0.242980f,  0.970031f,
-0.707107f, -0.707107f,  0.970031f, -0.242980f,
-0.290285f,  0.956940f, -0.671559f, -0.740951f,
 0.980785f, -0.195090f, -0.336890f,  0.941544f,
-0.634393f, -0.773010f,  0.989177f, -0.146730f,
-0.382683f,  0.923880f, -0.595699f, -0.803208f,
 0.995185f, -0.098017f, -0.427555f,  0.903989f,
-0.555570f, -0.831470f,  0.998795f, -0.049068f,
-0.471397f,  0.881921f, -0.514103f, -0.857729f,
 0.000000f, -1.000000f,  0.803208f,  0.595699f,
-0.956940f,  0.290285f,  0.336890f, -0.941544f,
 0.555570f,  0.831470f, -0.998795f, -0.049068f,
 0.634393f, -0.773010f,  0.242980f,  0.970031f,
-0.923880f, -0.382683f,  0.857729f, -0.514103f,
-0.098017f,  0.995185f, -0.740951f, -0.671559f,
 0.980785f, -0.195090f, -0.427555f,  0.903989f,
-0.471397f, -0.881921f,  0.989177f,  0.146730f,
-0.707107f,  0.707107f, -0.146730f, -0.989177f,
 0.881921f,  0.471397f, -0.903989f,  0.427555f,
 0.195090f, -0.980785f,  0.671559f,  0.740951f,
-0.995185f,  0.098017f,  0.514103f, -0.857729f,
 0.382683f,  0.923880f, -0.970031f, -0.242980f,
 0.773010f, -0.634393f,  0.049068f,  0.998795f,
-0.831470f, -0.555570f,  0.941544f, -0.336890f,
-0.290285f,  0.956940f, -0.595699f, -0.803208f,
 0.000000f,  1.000000f, -0.740951f, -0.671559f,
 0.995185f, -0.098017f, -0.595699f,  0.803208f,
-0.195090f, -0.980785f,  0.857729f,  0.514103f,
-0.956940f,  0.290285f,  0.427555f, -0.903989f,
 0.382683f,  0.923880f, -0.941544f, -0.336890f,
 0.881921f, -0.471397f, -0.242980f,  0.970031f,
-0.555570f, -0.831470f,  0.989177f,  0.146730f,
-0.773010f,  0.634393f,  0.049068f, -0.998795f,
 0.707107f,  0.707107f, -0.998795f,  0.049068f,
 0.634393f, -0.773010f,  0.146730f,  0.989177f,
-0.831470f, -0.555570f,  0.970031f, -0.242980f,
-0.471397f,  0.881921f, -0.336890f, -0.941544f,
 0.923880f,  0.382683f, -0.903989f,  0.427555f,
 0.290285f, -0.956940f,  0.514103f,  0.857729f,
-0.980785f, -0.195090f,  0.803208f, -0.595699f,
-0.098017f,  0.995185f, -0.671559f, -0.740951f,
 0.000000f, -1.000000f,  0.671559f,  0.740951f,
-0.995185f, -0.098017f,  0.803208f, -0.595699f,
-0.195090f,  0.980785f, -0.514103f, -0.857729f,
 0.956940f,  0.290285f, -0.903989f,  0.427555f,
 0.382683f, -0.923880f,  0.336890f,  0.941544f,
-0.881921f, -0.471397f,  0.970031f, -0.242980f,
-0.555570f,  0.831470f, -0.146730f, -0.989177f,
 0.773010f,  0.634393f, -0.998795f,  0.049068f,
 0.707107f, -0.707107f, -0.049068f,  0.998795f,
-0.634393f, -0.773010f,  0.989177f,  0.146730f,
```

| −0.831470f, | 0.555570f, | 0.242980f, | −0.970031f, |
| 0.471397f, | 0.881921f, | −0.941544f, | −0.336890f, |
| 0.923880f, | −0.382683f, | −0.427555f, | 0.903989f, |
| −0.290285f, | −0.956940f, | 0.857729f, | 0.514103f, |
| −0.980785f, | 0.195090f, | 0.595699f, | −0.803208f, |
| 0.098017f, | 0.995185f, | −0.740951f, | −0.671559f, |
| −0.000000f, | 1.000000f, | −0.595699f, | −0.803208f, |
| 0.956940f, | 0.290285f, | −0.941544f, | 0.336890f, |
| 0.555570f, | −0.831470f, | 0.049068f, | 0.998795f, |
| −0.634393f, | −0.773010f, | 0.970031f, | 0.242980f, |
| −0.923880f, | 0.382683f, | 0.514103f, | −0.857729f, |
| 0.098017f, | 0.995185f, | −0.671559f, | −0.740951f, |
| 0.980785f, | 0.195090f, | −0.903989f, | 0.427555f, |
| 0.471397f, | −0.881921f, | 0.146730f, | 0.989177f, |
| −0.707107f, | −0.707107f, | 0.989177f, | 0.146730f, |
| −0.881921f, | 0.471397f, | 0.427555f, | −0.903989f, |
| 0.195090f, | 0.980785f, | −0.740951f, | −0.671559f, |
| 0.995185f, | 0.098017f, | −0.857729f, | 0.514103f, |
| 0.382683f, | −0.923880f, | 0.242980f, | 0.970031f, |
| −0.773010f, | −0.634393f, | 0.998795f, | 0.049068f, |
| −0.831470f, | 0.555570f, | 0.336890f, | −0.941544f, |
| 0.290285f, | 0.956940f, | −0.803208f, | −0.595699f, |
| 0.000000f, | −1.000000f, | 0.514103f, | 0.857729f, |
| −0.881921f, | −0.471397f, | 0.998795f, | −0.049068f, |
| −0.831470f, | 0.555570f, | 0.427555f, | −0.903989f, |
| 0.098017f, | 0.995185f, | −0.595699f, | −0.803208f, |
| 0.923880f, | 0.382683f, | −0.989177f, | 0.146730f, |
| 0.773010f, | −0.634393f, | −0.336890f, | 0.941544f, |
| −0.195090f, | −0.980785f, | 0.671559f, | 0.740951f, |
| −0.956940f, | −0.290285f, | 0.970031f, | −0.242980f, |
| −0.707107f, | 0.707107f, | 0.242980f, | −0.970031f, |
| 0.290285f, | 0.956940f, | −0.740951f, | −0.671559f, |
| 0.980785f, | 0.195090f, | −0.941544f, | 0.336890f, |
| 0.634393f, | −0.773010f, | −0.146730f, | 0.989177f, |
| −0.382683f, | −0.923880f, | 0.803208f, | 0.595699f, |
| −0.995185f, | −0.098017f, | 0.903989f, | −0.427555f, |
| −0.555570f, | 0.831470f, | 0.049068f, | −0.998795f, |
| 0.471397f, | 0.881921f, | −0.857729f, | −0.514103f, |
| 0.000000f, | 1.000000f, | −0.427555f, | −0.903989f, |
| 0.773010f, | 0.634393f, | −0.970031f, | −0.242980f, |
| 0.980785f, | −0.195090f, | −0.803208f, | 0.595699f, |
| 0.471397f, | −0.881921f, | −0.049068f, | 0.998795f, |
| −0.382683f, | −0.923880f, | 0.740951f, | 0.671559f, |
| −0.956940f, | −0.290285f, | 0.989177f, | −0.146730f, |
| −0.831470f, | 0.555570f, | 0.514103f, | −0.857729f, |
| −0.098017f, | 0.995185f, | −0.336890f, | −0.941544f, |
| 0.707107f, | 0.707107f, | −0.941544f, | −0.336890f, |
| 0.995185f, | −0.098017f, | −0.857729f, | 0.514103f, |
| 0.555570f, | −0.831470f, | −0.146730f, | 0.989177f, |
| −0.290285f, | −0.956940f, | 0.671559f, | 0.740951f, |
| −0.923880f, | −0.382683f, | 0.998795f, | −0.049068f, |
| −0.881921f, | 0.471397f, | 0.595699f, | −0.803208f, |
| −0.195090f, | 0.980785f, | −0.242980f, | −0.970031f, |
| 0.634393f, | 0.773010f, | −0.903989f, | −0.427555f, |
| 0.000000f, | −1.000000f, | 0.336890f, | 0.941544f, |
| −0.634393f, | −0.773010f, | 0.857729f, | 0.514103f, |
| −0.980785f, | −0.195090f, | 0.989177f, | −0.146730f, |
| −0.881921f, | 0.471397f, | 0.671559f, | −0.740951f, |
| −0.382683f, | 0.923880f, | 0.049068f, | −0.998795f, |
| 0.290285f, | 0.956940f, | −0.595699f, | −0.803208f, |
| 0.831470f, | 0.555570f, | −0.970031f, | −0.242980f, |
| 0.995185f, | −0.098017f, | −0.903989f, | 0.427555f, |
| 0.707107f, | −0.707107f, | −0.427555f, | 0.903989f, |
| 0.098017f, | −0.995185f, | 0.242980f, | 0.970031f, |
| −0.555570f, | −0.831470f, | 0.803208f, | 0.595699f, |
| −0.956940f, | −0.290285f, | 0.998795f, | −0.049068f, |
| −0.923880f, | 0.382683f, | 0.740951f, | −0.671559f, |
| −0.471397f, | 0.881921f, | 0.146730f, | −0.989177f, |
| 0.195090f, | 0.980785f, | −0.514103f, | −0.857729f, |
| 0.773010f, | 0.634393f, | −0.941544f, | −0.336890f, |
| −0.000000f, | 1.000000f, | −0.242980f, | −0.970031f, |
| 0.471397f, | 0.881921f, | −0.671559f, | −0.740951f, |
| 0.831470f, | 0.555570f, | −0.941544f, | −0.336890f, |
| 0.995185f, | 0.098017f, | −0.989177f, | 0.146730f, |
| 0.923880f, | −0.382683f, | −0.803208f, | 0.595699f, |
| 0.634393f, | −0.773010f, | −0.427555f, | 0.903989f, |
| 0.195090f, | −0.980785f, | 0.049068f, | 0.998795f, |
| −0.290285f, | −0.956940f, | 0.514103f, | 0.857729f, |
| −0.707107f, | −0.707107f, | 0.857729f, | 0.514103f, |

| −0.956940f, | −0.290285f, | 0.998795f, | 0.049068f, |
| −0.980785f, | 0.195090f, | 0.903989f, | −0.427555f, |
| −0.773010f, | 0.634393f, | 0.595699f, | −0.803208f, |
| −0.382683f, | 0.923880f, | 0.146730f, | −0.989177f, |
| 0.098017f, | 0.995185f, | −0.336890f, | −0.941544f, |
| 0.555570f, | 0.831470f, | −0.740951f, | −0.671559f, |
| 0.881921f, | 0.471397f, | −0.970031f, | −0.242980f, |
| 0.000000f, | −1.000000f, | 0.146730f, | 0.989177f, |
| −0.290285f, | −0.956940f, | 0.427555f, | 0.903989f, |
| −0.555570f, | −0.831470f, | 0.671559f, | 0.740951f, |
| −0.773010f, | −0.634393f, | 0.857729f, | 0.514103f, |
| −0.923880f, | −0.382683f, | 0.970031f, | 0.242980f, |
| −0.995185f, | −0.098017f, | 0.998795f, | −0.049068f, |
| −0.980785f, | 0.195090f, | 0.941544f, | −0.336890f, |
| −0.881921f, | 0.471397f, | 0.803208f, | −0.595699f, |
| −0.707107f, | 0.707107f, | 0.595699f, | −0.803208f, |
| −0.471397f, | 0.881921f, | 0.336890f, | −0.941544f, |
| −0.195090f, | 0.980785f, | 0.049068f, | −0.998795f, |
| 0.098017f, | 0.995185f, | −0.242980f, | −0.970031f, |
| 0.382683f, | 0.923880f, | −0.514103f, | −0.857729f, |
| 0.634393f, | 0.773010f, | −0.740951f, | −0.671559f, |
| 0.831470f, | 0.555570f, | −0.903989f, | −0.427555f, |
| 0.956940f, | 0.290285f, | −0.989177f, | −0.146730f, |
| 0.000000f, | 1.000000f, | −0.049068f, | −0.998795f, |
| 0.098017f, | 0.995185f, | −0.146730f, | −0.989177f, |
| 0.195090f, | 0.980785f, | −0.242980f, | −0.970031f, |
| 0.290285f, | 0.956940f, | −0.336890f, | −0.941544f, |
| 0.382683f, | 0.923880f, | −0.427555f, | −0.903989f, |
| 0.471397f, | 0.881921f, | −0.514103f, | −0.857729f, |
| 0.555570f, | 0.831470f, | −0.595699f, | −0.803208f, |
| 0.634393f, | 0.773010f, | −0.671559f, | −0.740951f, |
| 0.707107f, | 0.707107f, | −0.740951f, | −0.671559f, |
| 0.773010f, | 0.634393f, | −0.803208f, | −0.595699f, |
| 0.831470f, | 0.555570f, | −0.857729f, | −0.514103f, |
| 0.881921f, | 0.471397f, | −0.903989f, | −0.427555f, |
| 0.923880f, | 0.382683f, | −0.941544f, | −0.336890f, |
| 0.956940f, | 0.290285f, | −0.970031f, | −0.242980f, |
| 0.980785f, | 0.195090f, | −0.989177f, | −0.146730f, |
| 0.995185f, | 0.098017f, | −0.998795f, | −0.049068f, |

};
const FLOAT32 analy_cos_sin_tab_kl_40 [40 * 40 * 2] = {

| 0.000000f, | −1.000000f, | 0.039260f, | −0.999229f, |
| 0.078459f, | −0.996917f, | 0.117537f, | −0.993068f, |
| 0.156434f, | −0.987688f, | 0.195090f, | −0.980785f, |
| 0.233445f, | −0.972370f, | 0.271440f, | −0.962455f, |
| 0.309017f, | −0.951057f, | 0.346117f, | −0.938191f, |
| 0.382683f, | −0.923880f, | 0.418660f, | −0.908143f, |
| 0.453990f, | −0.891007f, | 0.488621f, | −0.872496f, |
| 0.522499f, | −0.852640f, | 0.555570f, | −0.831470f, |
| 0.587785f, | −0.809017f, | 0.619094f, | −0.785317f, |
| 0.649448f, | −0.760406f, | 0.678801f, | −0.734322f, |
| 0.707107f, | −0.707107f, | 0.734322f, | −0.678801f, |
| 0.760406f, | −0.649448f, | 0.785317f, | −0.619094f, |
| 0.809017f, | −0.587785f, | 0.831470f, | −0.555570f, |
| 0.852640f, | −0.522499f, | 0.872496f, | −0.488621f, |
| 0.891007f, | −0.453990f, | 0.908143f, | −0.418660f, |
| 0.923880f, | −0.382683f, | 0.938191f, | −0.346117f, |
| 0.951057f, | −0.309017f, | 0.962455f, | −0.271440f, |
| 0.972370f, | −0.233445f, | 0.980785f, | −0.195090f, |
| 0.987688f, | −0.156434f, | 0.993068f, | −0.117537f, |
| 0.996917f, | −0.078459f, | 0.999229f, | −0.039260f, |
| −0.000000f, | 1.000000f, | −0.117537f, | 0.993068f, |
| −0.233445f, | 0.972370f, | −0.346117f, | 0.938191f, |
| −0.453990f, | 0.891007f, | −0.555570f, | 0.831470f, |
| −0.649448f, | 0.760406f, | −0.734322f, | 0.678801f, |
| −0.809017f, | 0.587785f, | −0.872496f, | 0.488621f, |
| −0.923880f, | 0.382683f, | −0.962455f, | 0.271440f, |
| −0.987688f, | 0.156434f, | −0.999229f, | 0.039260f, |
| −0.996917f, | −0.078459f, | −0.980785f, | −0.195090f, |
| −0.951057f, | −0.309017f, | −0.908143f, | −0.418660f, |
| −0.852640f, | −0.522499f, | −0.785317f, | −0.619094f, |
| −0.707107f, | −0.707107f, | −0.619094f, | −0.785317f, |
| −0.522499f, | −0.852640f, | −0.418660f, | −0.908143f, |
| −0.309017f, | −0.951057f, | −0.195090f, | −0.980785f, |
| −0.078459f, | −0.996917f, | 0.039260f, | −0.999229f, |
| 0.156434f, | −0.987688f, | 0.271440f, | −0.962455f, |
| 0.382683f, | −0.923880f, | 0.488621f, | −0.872496f, |
| 0.587785f, | −0.809017f, | 0.678801f, | −0.734322f, |
| 0.760406f, | −0.649448f, | 0.831470f, | −0.555570f, |
| 0.891007f, | −0.453990f, | 0.938191f, | −0.346117f, |
| 0.972370f, | −0.233445f, | 0.993068f, | −0.117537f, |

```
0.000000f,   -1.000000f,   0.195090f,   -0.980785f,
0.382683f,   -0.923880f,   0.555570f,   -0.831470f,
0.707107f,   -0.707107f,   0.831470f,   -0.555570f,
0.923880f,   -0.382683f,   0.980785f,   -0.195090f,
1.000000f,   0.000000f,    0.980785f,   0.195090f,
0.923880f,   0.382683f,    0.831470f,   0.555570f,
0.707107f,   0.707107f,    0.555570f,   0.831470f,
0.382683f,   0.923880f,    0.195090f,   0.980785f,
-0.000000f,  1.000000f,    -0.195090f,  0.980785f,
-0.382683f,  0.923880f,    -0.555570f,  0.831470f,
-0.707107f,  0.707107f,    -0.831470f,  0.555570f,
-0.923880f,  0.382683f,    -0.980785f,  0.195090f,
-1.000000f,  -0.000000f,   -0.980785f,  -0.195090f,
-0.923880f,  -0.382683f,   -0.831470f,  -0.555570f,
-0.707107f,  -0.707107f,   -0.555570f,  -0.831470f,
-0.382683f,  -0.923880f,   -0.195090f,  -0.980785f,
0.000000f,   -1.000000f,   0.195090f,   -0.980785f,
0.382683f,   -0.923880f,   0.555570f,   -0.831470f,
0.707107f,   -0.707107f,   0.831470f,   -0.555570f,
0.923880f,   -0.382683f,   0.980785f,   -0.195090f,
-0.000000f,  1.000000f,    -0.271440f,  0.962455f,
-0.522499f,  0.852640f,    -0.734322f,  0.678801f,
-0.891007f,  0.453990f,    -0.980785f,  0.195090f,
-0.996917f,  -0.078459f,   -0.938191f,  -0.346117f,
-0.809017f,  -0.587785f,   -0.619094f,  -0.785317f,
-0.382683f,  -0.923880f,   -0.117537f,  -0.993068f,
0.156434f,   -0.987688f,   0.418660f,   -0.908143f,
0.649448f,   -0.760406f,   0.831470f,   -0.555570f,
0.951057f,   -0.309017f,   0.999229f,   -0.039260f,
0.972370f,   0.233445f,    0.872496f,   0.488621f,
0.707107f,   0.707107f,    0.488621f,   0.872496f,
0.233445f,   0.972370f,    -0.039260f,  0.999229f,
-0.309017f,  0.951057f,    -0.555570f,  0.831470f,
-0.760406f,  0.649448f,    -0.908143f,  0.418660f,
-0.987688f,  0.156434f,    -0.993068f,  -0.117537f,
-0.923880f,  -0.382683f,   -0.785317f,  -0.619094f,
-0.587785f,  -0.809017f,   -0.346117f,  -0.938191f,
-0.078459f,  -0.996917f,   0.195090f,   -0.980785f,
0.453990f,   -0.891007f,   0.678801f,   -0.734322f,
0.852640f,   -0.522499f,   0.962455f,   -0.271440f,
0.000000f,   -1.000000f,   0.346117f,   -0.938191f,
0.649448f,   -0.760406f,   0.872496f,   -0.488621f,
0.987688f,   -0.156434f,   0.980785f,   0.195090f,
0.852640f,   0.522499f,    0.619094f,   0.785317f,
0.309017f,   0.951057f,    -0.039260f,  0.999229f,
-0.382683f,  0.923880f,    -0.678801f,  0.734322f,
-0.891007f,  0.453990f,    -0.993068f,  0.117537f,
-0.972370f,  -0.233445f,   -0.831470f,  -0.555570f,
-0.587785f,  -0.809017f,   -0.271440f,  -0.962455f,
0.078459f,   -0.996917f,   0.418660f,   -0.908143f,
0.707107f,   -0.707107f,   0.908143f,   -0.418660f,
0.996917f,   -0.078459f,   0.962455f,   0.271440f,
0.809017f,   0.587785f,    0.555570f,   0.831470f,
0.233445f,   0.972370f,    -0.117537f,  0.993068f,
-0.453990f,  0.891007f,    -0.734322f,  0.678801f,
-0.923880f,  0.382683f,    -0.999229f,  0.039260f,
-0.951057f,  -0.309017f,   -0.785317f,  -0.619094f,
-0.522499f,  -0.852640f,   -0.195090f,  -0.980785f,
0.156434f,   -0.987688f,   0.488621f,   -0.872496f,
0.760406f,   -0.649448f,   0.938191f,   -0.346117f,
-0.000000f,  1.000000f,    -0.418660f,  0.908143f,
-0.760406f,  0.649448f,    -0.962455f,  0.271440f,
-0.987688f,  -0.156434f,   -0.831470f,  -0.555570f,
-0.522499f,  -0.852640f,   -0.117537f,  -0.993068f,
0.309017f,   -0.951057f,   0.678801f,   -0.734322f,
0.923880f,   -0.382683f,   0.999229f,   0.039260f,
0.891007f,   0.453990f,    0.619094f,   0.785317f,
0.233445f,   0.972370f,    -0.195090f,  0.980785f,
-0.587785f,  0.809017f,    -0.872496f,  0.488621f,
-0.996917f,  0.078459f,    -0.938191f,  -0.346117f,
-0.707107f,  -0.707107f,   -0.346117f,  -0.938191f,
0.078459f,   -0.996917f,   0.488621f,   -0.872496f,
0.809017f,   -0.587785f,   0.980785f,   -0.195090f,
0.972370f,   0.233445f,    0.785317f,   0.619094f,
0.453990f,   0.891007f,    0.039260f,   0.999229f,
-0.382683f,  0.923880f,    -0.734322f,  0.678801f,
-0.951057f,  0.309017f,    -0.993068f,  -0.117537f,
-0.852640f,  -0.522499f,   -0.555570f,  -0.831470f,
-0.156434f,  -0.987688f,   0.271440f,   -0.962455f,
```

```
0.649448f,   -0.760406f,   0.908143f,   -0.418660f,
-0.000000f,  -1.000000f,   0.488621f,   -0.872496f,
0.852640f,   -0.522499f,   0.999229f,   -0.039260f,
0.891007f,   0.453990f,    0.555570f,   0.831470f,
0.078459f,   0.996917f,    -0.418660f,  0.908143f,
-0.809017f,  0.587785f,    -0.993068f,  0.117537f,
-0.923880f,  -0.382683f,   -0.619094f,  -0.785317f,
-0.156434f,  -0.987688f,   0.346117f,   -0.938191f,
0.760406f,   -0.649448f,   0.980785f,   -0.195090f,
0.951057f,   0.309017f,    0.678801f,   0.734322f,
0.233445f,   0.972370f,    -0.271440f,  0.962455f,
-0.707107f,  0.707107f,    -0.962455f,  0.271440f,
-0.972370f,  -0.233445f,   -0.734322f,  -0.678801f,
-0.309017f,  -0.951057f,   0.195090f,   -0.980785f,
0.649448f,   -0.760406f,   0.938191f,   -0.346117f,
0.987688f,   0.156434f,    0.785317f,   0.619094f,
0.382683f,   0.923880f,    -0.117537f,  0.993068f,
-0.587785f,  0.809017f,    -0.908143f,  0.418660f,
-0.996917f,  -0.078459f,   -0.831470f,  -0.555570f,
-0.453990f,  -0.891007f,   0.039260f,   -0.999229f,
0.522499f,   -0.852640f,   0.872496f,   -0.488621f,
-0.000000f,  1.000000f,    -0.555570f,  0.831470f,
-0.923880f,  0.382683f,    -0.980785f,  -0.195090f,
-0.707107f,  -0.707107f,   -0.195090f,  -0.980785f,
0.382683f,   -0.923880f,   0.831470f,   -0.555570f,
1.000000f,   0.000000f,    0.831470f,   0.555570f,
0.382683f,   0.923880f,    -0.195090f,  0.980785f,
-0.707107f,  0.707107f,    -0.980785f,  0.195090f,
-0.923880f,  -0.382683f,   -0.555570f,  -0.831470f,
0.000000f,   -1.000000f,   0.555570f,   -0.831470f,
0.923880f,   -0.382683f,   0.980785f,   0.195090f,
0.707107f,   0.707107f,    0.195090f,   0.980785f,
-0.382683f,  0.923880f,    -0.831470f,  0.555570f,
-1.000000f,  -0.000000f,   -0.831470f,  -0.555570f,
-0.382683f,  -0.923880f,   0.195090f,   -0.980785f,
0.707107f,   -0.707107f,   0.980785f,   -0.195090f,
0.923880f,   0.382683f,    0.555570f,   0.831470f,
-0.000000f,  1.000000f,    -0.555570f,  0.831470f,
-0.923880f,  0.382683f,    -0.980785f,  -0.195090f,
-0.707107f,  -0.707107f,   -0.195090f,  -0.980785f,
0.382683f,   -0.923880f,   0.831470f,   -0.555570f,
-0.000000f,  -1.000000f,   0.619094f,   -0.785317f,
0.972370f,   -0.233445f,   0.908143f,   0.418660f,
0.453990f,   0.891007f,    -0.195090f,  0.980785f,
-0.760406f,  0.649448f,    -0.999229f,  0.039260f,
-0.809017f,  -0.587785f,   -0.271440f,  -0.962455f,
0.382683f,   -0.923880f,   0.872496f,   -0.488621f,
0.987688f,   0.156434f,    0.678801f,   0.734322f,
0.078459f,   0.996917f,    -0.555570f,  0.831470f,
-0.951057f,  0.309017f,    -0.938191f,  -0.346117f,
-0.522499f,  -0.852640f,   0.117537f,   -0.993068f,
0.707107f,   -0.707107f,   0.993068f,   -0.117537f,
0.852640f,   0.522499f,    0.346117f,   0.938191f,
-0.309017f,  0.951057f,    -0.831470f,  0.555570f,
-0.996917f,  -0.078459f,   -0.734322f,  -0.678801f,
-0.156434f,  -0.987688f,   0.488621f,   -0.872496f,
0.923880f,   -0.382683f,   0.962455f,   0.271440f,
0.587785f,   0.809017f,    -0.039260f,  0.999229f,
-0.649448f,   0.760406f,   -0.980785f,  0.195090f,
-0.891007f,  -0.453990f,   -0.418660f,  -0.908143f,
0.233445f,   -0.972370f,   0.785317f,   -0.619094f,
-0.000000f,  1.000000f,    -0.678801f,  0.734322f,
-0.996917f,  0.078459f,    -0.785317f,  -0.619094f,
-0.156434f,  -0.987688f,   0.555570f,   -0.831470f,
0.972370f,   -0.233445f,   0.872496f,   0.488621f,
0.309017f,   0.951057f,    -0.418660f,  0.908143f,
-0.923880f,  0.382683f,    -0.938191f,  -0.346117f,
-0.453990f,  -0.891007f,   0.271440f,   -0.962455f,
0.852640f,   -0.522499f,   0.980785f,   0.195090f,
0.587785f,   0.809017f,    -0.117537f,  0.993068f,
-0.760406f,  0.649448f,    -0.999229f,  -0.039260f,
-0.707107f,  -0.707107f,   -0.039260f,  -0.999229f,
0.649448f,   -0.760406f,   0.993068f,   -0.117537f,
0.809017f,   0.587785f,    0.195090f,   0.980785f,
-0.522499f,  0.852640f,    -0.962455f,  0.271440f,
-0.891007f,  -0.453990f,   -0.346117f,  -0.938191f,
0.382683f,   -0.923880f,   0.908143f,   -0.418660f,
0.951057f,   0.309017f,    0.488621f,   0.872496f,
-0.233445f,  0.972370f,    -0.831470f,  0.555570f,
```

| | | | |
|---|---|---|---|
| −0.987688f, | −0.156434f, | −0.619094f, | −0.785317f, |
| 0.078459f, | −0.996917f, | 0.734322f, | −0.678801f, |
| −0.000000f, | −1.000000f, | 0.734322f, | −0.678801f, |
| 0.996917f, | 0.078459f, | 0.619094f, | 0.785317f, |
| −0.156434f, | 0.987688f, | −0.831470f, | 0.555570f, |
| −0.972370f, | −0.233445f, | −0.488621f, | −0.872496f, |
| 0.309017f, | −0.951057f, | 0.908143f, | −0.418660f, |
| 0.923880f, | 0.382683f, | 0.346117f, | 0.938191f, |
| −0.453990f, | 0.891007f, | −0.962455f, | 0.271440f, |
| −0.852640f, | −0.522499f, | −0.195090f, | −0.980785f, |
| 0.587785f, | −0.809017f, | 0.993068f, | −0.117537f, |
| 0.760406f, | 0.649448f, | 0.039260f, | 0.999229f, |
| −0.707107f, | 0.707107f, | −0.999229f, | −0.039260f, |
| −0.649448f, | −0.760406f, | 0.117537f, | −0.993068f, |
| 0.809017f, | −0.587785f, | 0.980785f, | 0.195090f, |
| 0.522499f, | 0.852640f, | −0.271440f, | 0.962455f, |
| −0.891007f, | 0.453990f, | −0.938191f, | −0.346117f, |
| −0.382683f, | −0.923880f, | 0.418660f, | −0.908143f, |
| 0.951057f, | −0.309017f, | 0.872496f, | 0.488621f, |
| 0.233445f, | 0.972370f, | −0.555570f, | 0.831470f, |
| −0.987688f, | 0.156434f, | −0.785317f, | −0.619094f, |
| −0.078459f, | −0.996917f, | 0.678801f, | −0.734322f, |
| −0.000000f, | 1.000000f, | −0.785317f, | 0.619094f, |
| −0.972370f, | −0.233445f, | −0.418660f, | −0.908143f, |
| 0.453990f, | −0.891007f, | 0.980785f, | −0.195090f, |
| 0.760406f, | 0.649448f, | −0.039260f, | 0.999229f, |
| −0.809017f, | 0.587785f, | −0.962455f, | −0.271440f, |
| −0.382683f, | −0.923880f, | 0.488621f, | −0.872496f, |
| 0.987688f, | −0.156434f, | 0.734322f, | 0.678801f, |
| −0.078459f, | 0.996917f, | −0.831470f, | 0.555570f, |
| −0.951057f, | −0.309017f, | −0.346117f, | −0.938191f, |
| 0.522499f, | −0.852640f, | 0.993068f, | −0.117537f, |
| 0.707107f, | 0.707107f, | −0.117537f, | 0.993068f, |
| −0.852640f, | 0.522499f, | −0.938191f, | −0.346117f, |
| −0.309017f, | −0.951057f, | 0.555570f, | −0.831470f, |
| 0.996917f, | −0.078459f, | 0.678801f, | 0.734322f, |
| −0.156434f, | 0.987688f, | −0.872496f, | 0.488621f, |
| −0.923880f, | −0.382683f, | −0.271440f, | −0.962455f, |
| 0.587785f, | −0.809017f, | 0.999229f, | −0.039260f, |
| 0.649448f, | 0.760406f, | −0.195090f, | 0.980785f, |
| −0.891007f, | 0.453990f, | −0.908143f, | −0.418660f, |
| −0.233445f, | −0.972370f, | 0.619094f, | −0.785317f, |
| −0.000000f, | −1.000000f, | 0.831470f, | −0.555570f, |
| 0.923880f, | 0.382683f, | 0.195090f, | 0.980785f, |
| −0.707107f, | 0.707107f, | −0.980785f, | −0.195090f, |
| −0.382683f, | −0.923880f, | 0.555570f, | −0.831470f, |
| 1.000000f, | 0.000000f, | 0.555570f, | 0.831470f, |
| −0.382683f, | 0.923880f, | −0.980785f, | 0.195090f, |
| −0.707107f, | −0.707107f, | 0.195090f, | −0.980785f, |
| 0.923880f, | −0.382683f, | 0.831470f, | 0.555570f, |
| −0.000000f, | 1.000000f, | −0.831470f, | 0.555570f, |
| −0.923880f, | −0.382683f, | −0.195090f, | −0.980785f, |
| 0.707107f, | −0.707107f, | 0.980785f, | 0.195090f, |
| 0.382683f, | 0.923880f, | −0.555570f, | 0.831470f, |
| −1.000000f, | −0.000000f, | −0.555570f, | −0.831470f, |
| 0.382683f, | −0.923880f, | 0.980785f, | −0.195090f, |
| 0.707107f, | 0.707107f, | −0.195090f, | 0.980785f, |
| −0.923880f, | 0.382683f, | −0.831470f, | −0.555570f, |
| 0.000000f, | −1.000000f, | 0.831470f, | −0.555570f, |
| 0.923880f, | 0.382683f, | 0.195090f, | 0.980785f, |
| −0.707107f, | 0.707107f, | −0.980785f, | −0.195090f, |
| −0.382683f, | −0.923880f, | 0.555570f, | −0.831470f, |
| −0.000000f, | 1.000000f, | −0.872496f, | 0.488621f, |
| −0.852640f, | −0.522499f, | 0.039260f, | −0.999229f, |
| 0.891007f, | −0.453990f, | 0.831470f, | 0.555570f, |
| −0.078459f, | 0.996917f, | −0.908143f, | 0.418660f, |
| −0.809017f, | −0.587785f, | 0.117537f, | −0.993068f, |
| 0.923880f, | −0.382683f, | 0.785317f, | 0.619094f, |
| −0.156434f, | 0.987688f, | −0.938191f, | 0.346117f, |
| −0.760406f, | −0.649448f, | 0.195090f, | −0.980785f, |
| 0.951057f, | −0.309017f, | 0.734322f, | 0.678801f, |
| −0.233445f, | 0.972370f, | −0.962455f, | 0.271440f, |
| −0.707107f, | −0.707107f, | 0.271440f, | −0.962455f, |
| 0.972370f, | −0.233445f, | 0.678801f, | 0.734322f, |
| −0.309017f, | 0.951057f, | −0.980785f, | 0.195090f, |
| −0.649448f, | −0.760406f, | 0.346117f, | −0.938191f, |
| 0.987688f, | −0.156434f, | 0.619094f, | 0.785317f, |
| −0.382683f, | 0.923880f, | −0.993068f, | 0.117537f, |
| −0.587785f, | −0.809017f, | 0.418660f, | −0.908143f, |

| | | | |
|---|---|---|---|
| 0.996917f, | −0.078459f, | 0.555570f, | 0.831470f, |
| −0.453990f, | 0.891007f, | −0.999229f, | 0.039260f, |
| −0.522499f, | −0.852640f, | 0.488621f, | −0.872496f, |
| −0.000000f, | −1.000000f, | 0.908143f, | −0.418660f, |
| 0.760406f, | 0.649448f, | −0.271440f, | 0.962455f, |
| −0.987688f, | 0.156434f, | −0.555570f, | −0.831470f, |
| 0.522499f, | −0.852640f, | 0.993068f, | 0.117537f, |
| 0.309017f, | 0.951057f, | −0.734322f, | 0.678801f, |
| −0.923880f, | −0.382683f, | −0.039260f, | −0.999229f, |
| 0.891007f, | −0.453990f, | 0.785317f, | 0.619094f, |
| −0.233445f, | 0.972370f, | −0.980785f, | 0.195090f, |
| −0.587785f, | −0.809017f, | 0.488621f, | −0.872496f, |
| 0.996917f, | 0.078459f, | 0.346117f, | 0.938191f, |
| −0.707107f, | 0.707107f, | −0.938191f, | −0.346117f, |
| −0.078459f, | −0.996917f, | 0.872496f, | −0.488621f, |
| 0.809017f, | 0.587785f, | −0.195090f, | 0.980785f, |
| −0.972370f, | 0.233445f, | −0.619094f, | −0.785317f, |
| 0.453990f, | −0.891007f, | 0.999229f, | 0.039260f, |
| 0.382683f, | 0.923880f, | −0.678801f, | 0.734322f, |
| −0.951057f, | −0.309017f, | −0.117537f, | −0.993068f, |
| 0.852640f, | −0.522499f, | 0.831470f, | 0.555570f, |
| −0.156434f, | 0.987688f, | −0.962455f, | 0.271440f, |
| −0.649448f, | −0.760406f, | 0.418660f, | −0.908143f, |
| −0.000000f, | 1.000000f, | −0.938191f, | 0.346117f, |
| −0.649448f, | −0.760406f, | 0.488621f, | −0.872496f, |
| 0.987688f, | 0.156434f, | 0.195090f, | 0.980785f, |
| −0.852640f, | 0.522499f, | −0.785317f, | −0.619094f, |
| 0.309017f, | −0.951057f, | 0.999229f, | −0.039260f, |
| 0.382683f, | 0.923880f, | −0.734322f, | 0.678801f, |
| −0.891007f, | −0.453990f, | 0.117537f, | −0.993068f, |
| 0.972370f, | −0.233445f, | 0.555570f, | 0.831470f, |
| −0.587785f, | 0.809017f, | −0.962455f, | −0.271440f, |
| −0.078459f, | −0.996917f, | 0.908143f, | −0.418660f, |
| 0.707107f, | 0.707107f, | −0.418660f, | 0.908143f, |
| −0.996917f, | −0.078459f, | −0.271440f, | −0.962455f, |
| 0.809017f, | −0.587785f, | 0.831470f, | 0.555570f, |
| −0.233445f, | 0.972370f, | −0.993068f, | 0.117537f, |
| −0.453990f, | −0.891007f, | 0.678801f, | −0.734322f, |
| 0.923880f, | 0.382683f, | −0.039260f, | 0.999229f, |
| −0.951057f, | 0.309017f, | −0.619094f, | −0.785317f, |
| 0.522499f, | −0.852640f, | 0.980785f, | 0.195090f, |
| 0.156434f, | 0.987688f, | −0.872496f, | 0.488621f, |
| −0.760406f, | −0.649448f, | 0.346117f, | −0.938191f, |
| 0.000000f, | −1.000000f, | 0.962455f, | −0.271440f, |
| 0.522499f, | 0.852640f, | −0.678801f, | 0.734322f, |
| −0.891007f, | −0.453990f, | 0.195090f, | −0.980785f, |
| 0.996917f, | −0.078459f, | 0.346117f, | 0.938191f, |
| −0.809017f, | 0.587785f, | −0.785317f, | −0.619094f, |
| 0.382683f, | −0.923880f, | 0.993068f, | 0.117537f, |
| 0.156434f, | 0.987688f, | −0.908143f, | 0.418660f, |
| −0.649448f, | −0.760406f, | 0.555570f, | −0.831470f, |
| 0.951057f, | 0.309017f, | −0.039260f, | 0.999229f, |
| −0.972370f, | 0.233445f, | −0.488621f, | −0.872496f, |
| 0.707107f, | −0.707107f, | 0.872496f, | 0.488621f, |
| −0.233445f, | 0.972370f, | −0.999229f, | 0.039260f, |
| −0.309017f, | −0.951057f, | 0.831470f, | −0.555570f, |
| 0.760406f, | 0.649448f, | −0.418660f, | 0.908143f, |
| −0.987688f, | −0.156434f, | −0.117537f, | −0.993068f, |
| 0.923880f, | −0.382683f, | 0.619094f, | 0.785317f, |
| −0.587785f, | 0.809017f, | −0.938191f, | −0.346117f, |
| 0.078459f, | −0.996917f, | 0.980785f, | −0.195090f, |
| 0.453990f, | 0.891007f, | −0.734322f, | 0.678801f, |
| −0.852640f, | −0.522499f, | 0.271440f, | −0.962455f, |
| −0.000000f, | 1.000000f, | −0.980785f, | 0.195090f, |
| −0.382683f, | −0.923880f, | 0.831470f, | −0.555570f, |
| 0.707107f, | 0.707107f, | −0.555570f, | 0.831470f, |
| −0.923880f, | −0.382683f, | 0.195090f, | −0.980785f, |
| 1.000000f, | 0.000000f, | 0.195090f, | 0.980785f, |
| −0.923880f, | 0.382683f, | −0.555570f, | −0.831470f, |
| 0.707107f, | −0.707107f, | 0.831470f, | 0.555570f, |
| −0.382683f, | 0.923880f, | −0.980785f, | −0.195090f, |
| −0.000000f, | −1.000000f, | 0.980785f, | −0.195090f, |
| 0.382683f, | 0.923880f, | −0.831470f, | 0.555570f, |
| −0.707107f, | −0.707107f, | 0.555570f, | −0.831470f, |
| 0.923880f, | 0.382683f, | −0.195090f, | 0.980785f, |
| −1.000000f, | −0.000000f, | −0.195090f, | −0.980785f, |
| 0.923880f, | −0.382683f, | 0.555570f, | 0.831470f, |
| −0.707107f, | 0.707107f, | −0.831470f, | −0.555570f, |
| 0.382683f, | −0.923880f, | 0.980785f, | 0.195090f, |

-continued

| | | | |
|---|---|---|---|
| −0.000000f, | 1.000000f, | −0.980785f, | 0.195090f, |
| −0.382683f, | −0.923880f, | 0.831470f, | −0.555570f, |
| 0.707107f, | 0.707107f, | −0.555570f, | 0.831470f, |
| −0.923880f, | −0.382683f, | 0.195090f, | −0.980785f, |
| 0.000000f, | −1.000000f, | 0.993068f, | −0.117537f, |
| 0.233445f, | 0.972370f, | −0.938191f, | 0.346117f, |
| −0.453990f, | −0.891007f, | 0.831470f, | −0.555570f, |
| 0.649448f, | 0.760406f, | −0.678801f, | 0.734322f, |
| −0.809017f, | −0.587785f, | 0.488621f, | −0.872496f, |
| 0.923880f, | 0.382683f, | −0.271440f, | 0.962455f, |
| −0.987688f, | −0.156434f, | 0.039260f, | −0.999229f, |
| 0.996917f, | −0.078459f, | 0.195090f, | 0.980785f, |
| −0.951057f, | 0.309017f, | −0.418660f, | −0.908143f, |
| 0.852640f, | −0.522499f, | 0.619094f, | 0.785317f, |
| −0.707107f, | 0.707107f, | −0.785317f, | −0.619094f, |
| 0.522499f, | −0.852640f, | 0.908143f, | 0.418660f, |
| −0.309017f, | 0.951057f, | −0.980785f, | −0.195090f, |
| 0.078459f, | −0.996917f, | 0.999229f, | −0.039260f, |
| 0.156434f, | 0.987688f, | −0.962455f, | 0.271440f, |
| −0.382683f, | −0.923880f, | 0.872496f, | −0.488621f, |
| 0.587785f, | 0.809017f, | −0.734322f, | 0.678801f, |
| −0.760406f, | −0.649448f, | 0.555570f, | −0.831470f, |
| 0.891007f, | 0.453990f, | −0.346117f, | 0.938191f, |
| −0.972370f, | −0.233445f, | 0.117537f, | −0.993068f, |
| −0.000000f, | 1.000000f, | −0.999229f, | 0.039260f, |
| −0.078459f, | −0.996917f, | 0.993068f, | −0.117537f, |
| 0.156434f, | 0.987688f, | −0.980785f, | 0.195090f, |
| −0.233445f, | −0.972370f, | 0.962455f, | −0.271440f, |
| 0.309017f, | 0.951057f, | −0.938191f, | 0.346117f, |
| −0.382683f, | −0.923880f, | 0.908143f, | −0.418660f, |
| 0.453990f, | 0.891007f, | −0.872496f, | 0.488621f, |
| −0.522499f, | −0.852640f, | 0.831470f, | −0.555570f, |
| 0.587785f, | 0.809017f, | −0.785317f, | 0.619094f, |
| −0.649448f, | −0.760406f, | 0.734322f, | −0.678801f, |
| 0.707107f, | 0.707107f, | −0.678801f, | 0.734322f, |
| −0.760406f, | −0.649448f, | 0.619094f, | −0.785317f, |
| 0.809017f, | 0.587785f, | −0.555570f, | 0.831470f, |
| −0.852640f, | −0.522499f, | 0.488621f, | −0.872496f, |
| 0.891007f, | 0.453990f, | −0.418660f, | 0.908143f, |
| −0.923880f, | −0.382683f, | 0.346117f, | −0.938191f, |
| 0.951057f, | 0.309017f, | −0.271440f, | 0.962455f, |
| −0.972370f, | −0.233445f, | 0.195090f, | −0.980785f, |
| 0.987688f, | 0.156434f, | −0.117537f, | 0.993068f, |
| −0.996917f, | −0.078459f, | 0.039260f, | −0.999229f, |
| 0.000000f, | −1.000000f, | 0.999229f, | 0.039260f, |
| −0.078459f, | 0.996917f, | −0.993068f, | −0.117537f, |
| 0.156434f, | −0.987688f, | 0.980785f, | 0.195090f, |
| −0.233445f, | 0.972370f, | −0.962455f, | −0.271440f, |
| 0.309017f, | −0.951057f, | 0.938191f, | 0.346117f, |
| −0.382683f, | 0.923880f, | −0.908143f, | −0.418660f, |
| 0.453990f, | −0.891007f, | 0.872496f, | 0.488621f, |
| −0.522499f, | 0.852640f, | −0.831470f, | −0.555570f, |
| 0.587785f, | −0.809017f, | 0.785317f, | 0.619094f, |
| −0.649448f, | 0.760406f, | −0.734322f, | −0.678801f, |
| 0.707107f, | −0.707107f, | 0.678801f, | 0.734322f, |
| −0.760406f, | 0.649448f, | −0.619094f, | −0.785317f, |
| 0.809017f, | −0.587785f, | 0.555570f, | 0.831470f, |
| −0.852640f, | 0.522499f, | −0.488621f, | −0.872496f, |
| 0.891007f, | −0.453990f, | 0.418660f, | 0.908143f, |
| −0.923880f, | 0.382683f, | −0.346117f, | −0.938191f, |
| 0.951057f, | −0.309017f, | 0.271440f, | 0.962455f, |
| −0.972370f, | 0.233445f, | −0.195090f, | −0.980785f, |
| 0.987688f, | −0.156434f, | 0.117537f, | 0.993068f, |
| −0.996917f, | 0.078459f, | −0.039260f, | −0.999229f, |
| −0.000000f, | 1.000000f, | −0.993068f, | −0.117537f, |
| 0.233445f, | −0.972370f, | 0.938191f, | 0.346117f, |
| −0.453990f, | 0.891007f, | −0.831470f, | −0.555570f, |
| 0.649448f, | −0.760406f, | 0.678801f, | 0.734322f, |
| −0.809017f, | 0.587785f, | −0.488621f, | −0.872496f, |
| 0.923880f, | −0.382683f, | 0.271440f, | 0.962455f, |
| −0.987688f, | 0.156434f, | −0.039260f, | −0.999229f, |
| 0.996917f, | 0.078459f, | −0.195090f, | 0.980785f, |
| −0.951057f, | −0.309017f, | 0.418660f, | −0.908143f, |
| 0.852640f, | 0.522499f, | −0.619094f, | 0.785317f, |
| −0.707107f, | −0.707107f, | 0.785317f, | −0.619094f, |
| 0.522499f, | 0.852640f, | −0.908143f, | 0.418660f, |
| −0.309017f, | −0.951057f, | 0.980785f, | −0.195090f, |
| 0.078459f, | 0.996917f, | −0.999229f, | −0.039260f, |
| 0.156434f, | −0.987688f, | 0.962455f, | 0.271440f, |

-continued

| | | | |
|---|---|---|---|
| −0.382683f, | 0.923880f, | −0.872496f, | −0.488621f, |
| 0.587785f, | −0.809017f, | 0.734322f, | 0.678801f, |
| −0.760406f, | 0.649448f, | −0.555570f, | −0.831470f, |
| 0.891007f, | −0.453990f, | 0.346117f, | 0.938191f, |
| −0.972370f, | 0.233445f, | −0.117537f, | −0.993068f, |
| 0.000000f, | −1.000000f, | 0.980785f, | 0.195090f, |
| −0.382683f, | 0.923880f, | −0.831470f, | −0.555570f, |
| 0.707107f, | −0.707107f, | 0.555570f, | 0.831470f, |
| −0.923880f, | 0.382683f, | −0.195090f, | −0.980785f, |
| 1.000000f, | 0.000000f, | −0.195090f, | 0.980785f, |
| −0.923880f, | −0.382683f, | 0.555570f, | −0.831470f, |
| 0.707107f, | 0.707107f, | −0.831470f, | 0.555570f, |
| −0.382683f, | −0.923880f, | 0.980785f, | −0.195090f, |
| −0.000000f, | 1.000000f, | −0.980785f, | −0.195090f, |
| 0.382683f, | −0.923880f, | 0.831470f, | 0.555570f, |
| −0.707107f, | 0.707107f, | −0.555570f, | −0.831470f, |
| 0.923880f, | −0.382683f, | 0.195090f, | 0.980785f, |
| −1.000000f, | −0.000000f, | 0.195090f, | −0.980785f, |
| 0.923880f, | 0.382683f, | −0.555570f, | 0.831470f, |
| −0.707107f, | −0.707107f, | 0.831470f, | −0.555570f, |
| 0.382683f, | 0.923880f, | −0.980785f, | 0.195090f, |
| 0.000000f, | −1.000000f, | 0.980785f, | 0.195090f, |
| −0.382683f, | 0.923880f, | −0.831470f, | −0.555570f, |
| 0.707107f, | −0.707107f, | 0.555570f, | 0.831470f, |
| −0.923880f, | 0.382683f, | −0.195090f, | −0.980785f, |
| 0.000000f, | 1.000000f, | −0.962455f, | −0.271440f, |
| 0.522499f, | −0.852640f, | 0.678801f, | 0.734322f, |
| −0.891007f, | 0.453990f, | −0.195090f, | −0.980785f, |
| 0.996917f, | 0.078459f, | −0.346117f, | 0.938191f, |
| −0.809017f, | −0.587785f, | 0.785317f, | −0.619094f, |
| 0.382683f, | 0.923880f, | −0.993068f, | 0.117537f, |
| 0.156434f, | −0.987688f, | 0.908143f, | 0.418660f, |
| −0.649448f, | 0.760406f, | −0.555570f, | −0.831470f, |
| 0.951057f, | −0.309017f, | 0.039260f, | 0.999229f, |
| −0.972370f, | −0.233445f, | 0.488621f, | −0.872496f, |
| 0.707107f, | 0.707107f, | −0.872496f, | 0.488621f, |
| −0.233445f, | −0.972370f, | 0.999229f, | 0.039260f, |
| −0.309017f, | 0.951057f, | −0.831470f, | −0.555570f, |
| 0.760406f, | −0.649448f, | 0.418660f, | 0.908143f, |
| −0.987688f, | 0.156434f, | 0.117537f, | −0.993068f, |
| 0.923880f, | 0.382683f, | −0.619094f, | 0.785317f, |
| −0.587785f, | −0.809017f, | 0.938191f, | −0.346117f, |
| 0.078459f, | 0.996917f, | −0.980785f, | −0.195090f, |
| 0.453990f, | −0.891007f, | 0.734322f, | 0.678801f, |
| −0.852640f, | 0.522499f, | −0.271440f, | −0.962455f, |
| 0.000000f, | −1.000000f, | 0.938191f, | 0.346117f, |
| −0.649448f, | 0.760406f, | −0.488621f, | −0.872496f, |
| 0.987688f, | −0.156434f, | −0.195090f, | 0.980785f, |
| −0.852640f, | −0.522499f, | 0.785317f, | −0.619094f, |
| 0.309017f, | 0.951057f, | −0.999229f, | −0.039260f, |
| 0.382683f, | −0.923880f, | 0.734322f, | 0.678801f, |
| −0.891007f, | 0.453990f, | −0.117537f, | −0.993068f, |
| 0.972370f, | 0.233445f, | −0.555570f, | 0.831470f, |
| −0.587785f, | −0.809017f, | 0.962455f, | −0.271440f, |
| −0.078459f, | 0.996917f, | −0.908143f, | −0.418660f, |
| 0.707107f, | −0.707107f, | 0.418660f, | 0.908143f, |
| −0.996917f, | 0.078459f, | 0.271440f, | −0.962455f, |
| 0.809017f, | 0.587785f, | −0.831470f, | 0.555570f, |
| −0.233445f, | −0.972370f, | 0.993068f, | 0.117537f, |
| −0.453990f, | 0.891007f, | −0.678801f, | −0.734322f, |
| 0.923880f, | −0.382683f, | 0.039260f, | 0.999229f, |
| −0.951057f, | −0.309017f, | 0.619094f, | −0.785317f, |
| 0.522499f, | 0.852640f, | −0.980785f, | 0.195090f, |
| 0.156434f, | −0.987688f, | 0.872496f, | 0.488621f, |
| −0.760406f, | 0.649448f, | −0.346117f, | −0.938191f, |
| −0.000000f, | 1.000000f, | −0.908143f, | −0.418660f, |
| 0.760406f, | −0.649448f, | 0.271440f, | 0.962455f, |
| −0.987688f, | −0.156434f, | 0.555570f, | −0.831470f, |
| 0.522499f, | 0.852640f, | −0.993068f, | 0.117537f, |
| 0.309017f, | −0.951057f, | 0.734322f, | 0.678801f, |
| −0.923880f, | 0.382683f, | 0.039260f, | −0.999229f, |
| 0.891007f, | 0.453990f, | −0.785317f, | 0.619094f, |
| −0.233445f, | −0.972370f, | 0.980785f, | 0.195090f, |
| −0.587785f, | 0.809017f, | −0.488621f, | −0.872496f, |
| 0.996917f, | −0.078459f, | −0.346117f, | 0.938191f, |
| −0.707107f, | −0.707107f, | 0.938191f, | −0.346117f, |
| −0.078459f, | 0.996917f, | −0.872496f, | −0.488621f, |
| 0.809017f, | −0.587785f, | 0.195090f, | 0.980785f, |
| −0.972370f, | −0.233445f, | 0.619094f, | −0.785317f, |

| 0.453990f, | 0.891007f, | −0.999229f, | 0.039260f, | | 0.522499f, | −0.852640f, | 0.271440f, | 0.962455f, |
| 0.382683f, | −0.923880f, | 0.678801f, | 0.734322f, | | −0.891007f, | −0.453990f, | 0.938191f, | −0.346117f, |
| −0.951057f, | 0.309017f, | 0.117537f, | −0.993068f, | | −0.382683f, | 0.923880f, | −0.418660f, | −0.908143f, |
| 0.852640f, | 0.522499f, | −0.831470f, | 0.555570f, | 5 | 0.951057f, | 0.309017f, | −0.872496f, | 0.488621f, |
| −0.156434f, | −0.987688f, | 0.962455f, | 0.271440f, | | 0.233445f, | −0.972370f, | 0.555570f, | 0.831470f, |
| −0.649448f, | 0.760406f, | −0.418660f, | −0.908143f, | | −0.987688f, | −0.156434f, | 0.785317f, | −0.619094f, |
| 0.000000f, | −1.000000f, | 0.872496f, | 0.488621f, | | −0.078459f, | 0.996917f, | −0.678801f, | −0.734322f, |
| −0.852640f, | 0.522499f, | −0.039260f, | −0.999229f, | | −0.000000f, | −1.000000f, | 0.678801f, | 0.734322f, |
| 0.891007f, | 0.453990f, | −0.831470f, | 0.555570f, | | −0.996917f, | −0.078459f, | 0.785317f, | −0.619094f, |
| −0.078459f, | −0.996917f, | 0.908143f, | 0.418660f, | 10 | −0.156434f, | 0.987688f, | −0.555570f, | −0.831470f, |
| −0.809017f, | 0.587785f, | −0.117537f, | −0.993068f, | | 0.972370f, | 0.233445f, | −0.872496f, | 0.488621f, |
| 0.923880f, | 0.382683f, | −0.785317f, | 0.619094f, | | 0.309017f, | −0.951057f, | 0.418660f, | 0.908143f, |
| −0.156434f, | −0.987688f, | 0.938191f, | 0.346117f, | | −0.923880f, | −0.382683f, | 0.938191f, | −0.346117f, |
| −0.760406f, | 0.649448f, | −0.195090f, | −0.980785f, | | −0.453990f, | 0.891007f, | −0.271440f, | −0.962455f, |
| 0.951057f, | 0.309017f, | −0.734322f, | 0.678801f, | | 0.852640f, | 0.522499f, | −0.980785f, | 0.195090f, |
| −0.233445f, | −0.972370f, | 0.962455f, | 0.271440f, | 15 | 0.587785f, | −0.809017f, | 0.117537f, | 0.993068f, |
| −0.707107f, | 0.707107f, | −0.271440f, | −0.962455f, | | −0.760406f, | −0.649448f, | 0.999229f, | −0.039260f, |
| 0.972370f, | 0.233445f, | −0.678801f, | 0.734322f, | | −0.707107f, | 0.707107f, | 0.039260f, | −0.999229f, |
| −0.309017f, | −0.951057f, | 0.980785f, | 0.195090f, | | 0.649448f, | 0.760406f, | −0.993068f, | −0.117537f, |
| −0.649448f, | 0.760406f, | −0.346117f, | −0.938191f, | | 0.809017f, | −0.587785f, | −0.195090f, | 0.980785f, |
| 0.987688f, | 0.156434f, | −0.619094f, | 0.785317f, | | −0.522499f, | −0.852640f, | 0.962455f, | 0.271440f, |
| −0.382683f, | −0.923880f, | 0.993068f, | 0.117537f, | 20 | −0.891007f, | 0.453990f, | 0.346117f, | −0.938191f, |
| −0.587785f, | 0.809017f, | −0.418660f, | −0.908143f, | | 0.382683f, | 0.923880f, | −0.908143f, | −0.418660f, |
| 0.996917f, | 0.078459f, | −0.555570f, | 0.831470f, | | 0.951057f, | −0.309017f, | −0.488621f, | 0.872496f, |
| −0.453990f, | −0.891007f, | 0.999229f, | 0.039260f, | | −0.233445f, | −0.972370f, | 0.831470f, | 0.555570f, |
| −0.522499f, | 0.852640f, | −0.488621f, | −0.872496f, | | −0.987688f, | 0.156434f, | 0.619094f, | −0.785317f, |
| −0.000000f, | 1.000000f, | −0.831470f, | −0.555570f, | | 0.078459f, | 0.996917f, | −0.734322f, | −0.678801f, |
| 0.923880f, | −0.382683f, | −0.195090f, | 0.980785f, | 25 | −0.000000f, | 1.000000f, | −0.619094f, | −0.785317f, |
| −0.707107f, | −0.707107f, | 0.980785f, | −0.195090f, | | 0.972370f, | 0.233445f, | −0.908143f, | 0.418660f, |
| −0.382683f, | 0.923880f, | −0.555570f, | −0.831470f, | | 0.453990f, | −0.891007f, | 0.195090f, | 0.980785f, |
| 1.000000f, | 0.000000f, | −0.555570f, | 0.831470f, | | −0.760406f, | −0.649448f, | 0.999229f, | 0.039260f, |
| −0.382683f, | −0.923880f, | 0.980785f, | 0.195090f, | | −0.809017f, | 0.587785f, | 0.271440f, | −0.962455f, |
| −0.707107f, | 0.707107f, | −0.195090f, | −0.980785f, | | 0.382683f, | 0.923880f, | −0.872496f, | −0.488621f, |
| 0.923880f, | 0.382683f, | −0.831470f, | 0.555570f, | | 0.987688f, | −0.156434f, | −0.678801f, | 0.734322f, |
| 0.000000f, | −1.000000f, | 0.831470f, | 0.555570f, | 30 | 0.078459f, | −0.996917f, | 0.555570f, | 0.831470f, |
| −0.923880f, | 0.382683f, | 0.195090f, | −0.980785f, | | −0.951057f, | −0.309017f, | 0.938191f, | −0.346117f, |
| 0.707107f, | 0.707107f, | −0.980785f, | 0.195090f, | | −0.522499f, | 0.852640f, | −0.117537f, | −0.993068f, |
| 0.382683f, | −0.923880f, | 0.555570f, | 0.831470f, | | 0.707107f, | 0.707107f, | −0.993068f, | −0.117537f, |
| −1.000000f, | −0.000000f, | 0.555570f, | −0.831470f, | | 0.852640f, | −0.522499f, | −0.346117f, | 0.938191f, |
| 0.382683f, | 0.923880f, | −0.980785f, | −0.195090f, | | −0.309017f, | −0.951057f, | 0.831470f, | 0.555570f, |
| 0.707107f, | −0.707107f, | 0.195090f, | 0.980785f, | 35 | −0.996917f, | 0.078459f, | 0.734322f, | −0.678801f, |
| −0.923880f, | −0.382683f, | 0.831470f, | −0.555570f, | | −0.156434f, | 0.987688f, | −0.488621f, | −0.872496f, |
| −0.000000f, | 1.000000f, | −0.831470f, | −0.555570f, | | 0.923880f, | 0.382683f, | −0.962455f, | 0.271440f, |
| 0.923880f, | −0.382683f, | −0.195090f, | 0.980785f, | | 0.587785f, | −0.809017f, | 0.039260f, | 0.999229f, |
| −0.707107f, | −0.707107f, | 0.980785f, | −0.195090f, | | −0.649448f, | −0.760406f, | 0.980785f, | 0.195090f, |
| −0.382683f, | 0.923880f, | −0.555570f, | −0.831470f, | | −0.891007f, | 0.453990f, | 0.418660f, | −0.908143f, |
| −0.000000f, | −1.000000f, | 0.785317f, | 0.619094f, | 40 | 0.233445f, | 0.972370f, | −0.785317f, | −0.619094f, |
| −0.972370f, | 0.233445f, | 0.418660f, | −0.908143f, | | −0.000000f, | −1.000000f, | 0.555570f, | 0.831470f, |
| 0.453990f, | 0.891007f, | −0.980785f, | −0.195090f, | | −0.923880f, | −0.382683f, | 0.980785f, | −0.195090f, |
| 0.760406f, | −0.649448f, | 0.039260f, | 0.999229f, | | −0.707107f, | 0.707107f, | 0.195090f, | −0.980785f, |
| −0.809017f, | −0.587785f, | 0.962455f, | −0.271440f, | | 0.382683f, | 0.923880f, | −0.831470f, | −0.555570f, |
| −0.382683f, | 0.923880f, | −0.488621f, | −0.872496f, | | 1.000000f, | −0.000000f, | −0.831470f, | 0.555570f, |
| 0.987688f, | 0.156434f, | −0.734322f, | 0.678801f, | | 0.382683f, | −0.923880f, | 0.195090f, | 0.980785f, |
| −0.078459f, | −0.996917f, | 0.831470f, | 0.555570f, | 45 | −0.707107f, | −0.707107f, | 0.980785f, | 0.195090f, |
| −0.951057f, | 0.309017f, | 0.346117f, | −0.938191f, | | −0.923880f, | 0.382683f, | 0.555570f, | −0.831470f, |
| 0.522499f, | 0.852640f, | −0.993068f, | −0.117537f, | | 0.000000f, | 1.000000f, | −0.555570f, | −0.831470f, |
| 0.707107f, | −0.707107f, | 0.117537f, | 0.993068f, | | 0.923880f, | 0.382683f, | −0.980785f, | 0.195090f, |
| −0.852640f, | −0.522499f, | 0.938191f, | −0.346117f, | | 0.707107f, | −0.707107f, | −0.195090f, | 0.980785f, |
| −0.309017f, | 0.951057f, | −0.555570f, | −0.831470f, | | −0.382683f, | −0.923880f, | 0.831470f, | 0.555570f, |
| 0.996917f, | 0.078459f, | −0.678801f, | 0.734322f, | 50 | −1.000000f, | 0.000000f, | 0.831470f, | −0.555570f, |
| −0.156434f, | −0.987688f, | 0.872496f, | 0.488621f, | | −0.382683f, | 0.923880f, | −0.195090f, | −0.980785f, |
| −0.923880f, | 0.382683f, | 0.271440f, | −0.962455f, | | 0.707107f, | 0.707107f, | −0.980785f, | −0.195090f, |
| 0.587785f, | 0.809017f, | −0.999229f, | −0.039260f, | | 0.923880f, | −0.382683f, | −0.555570f, | 0.831470f, |
| 0.649448f, | −0.760406f, | 0.195090f, | 0.980785f, | | −0.000000f, | −1.000000f, | 0.555570f, | 0.831470f, |
| −0.891007f, | −0.453990f, | 0.908143f, | −0.418660f, | | −0.923880f, | −0.382683f, | 0.980785f, | −0.195090f, |
| −0.233445f, | 0.972370f, | −0.619094f, | −0.785317f, | 55 | −0.707107f, | 0.707107f, | 0.195090f, | −0.980785f, |
| −0.000000f, | 1.000000f, | −0.734322f, | −0.678801f, | | 0.382683f, | 0.923880f, | −0.831470f, | −0.555570f, |
| 0.996917f, | −0.078459f, | −0.619094f, | 0.785317f, | | −0.000000f, | 1.000000f, | −0.488621f, | −0.872496f, |
| −0.156434f, | −0.987688f, | 0.831470f, | 0.555570f, | | 0.852640f, | 0.522499f, | −0.999229f, | −0.039260f, |
| −0.972370f, | 0.233445f, | 0.488621f, | −0.872496f, | | 0.891007f, | −0.453990f, | −0.555570f, | 0.831470f, |
| 0.309017f, | 0.951057f, | −0.908143f, | −0.418660f, | | 0.078459f, | −0.996917f, | 0.418660f, | 0.908143f, |
| 0.923880f, | −0.382683f, | −0.346117f, | 0.938191f, | 60 | −0.809017f, | −0.587785f, | 0.993068f, | 0.117537f, |
| −0.453990f, | −0.891007f, | 0.962455f, | 0.271440f, | | −0.923880f, | 0.382683f, | 0.619094f, | −0.785317f, |
| −0.852640f, | 0.522499f, | 0.195090f, | −0.980785f, | | −0.156434f, | 0.987688f, | −0.346117f, | −0.938191f, |
| 0.587785f, | 0.809017f, | −0.993068f, | −0.117537f, | | 0.760406f, | 0.649448f, | −0.980785f, | −0.195090f, |
| 0.760406f, | −0.649448f, | −0.039260f, | 0.999229f, | | 0.951057f, | −0.309017f, | −0.678801f, | 0.734322f, |
| −0.707107f, | −0.707107f, | 0.999229f, | −0.039260f, | | 0.233445f, | −0.972370f, | 0.271440f, | 0.962455f, |
| −0.649448f, | 0.760406f, | −0.117537f, | −0.993068f, | 65 | −0.707107f, | −0.707107f, | 0.962455f, | 0.271440f, |
| 0.809017f, | 0.587785f, | −0.980785f, | 0.195090f, | | −0.972370f, | 0.233445f, | 0.734322f, | −0.678801f, |

| | | | |
|---|---|---|---|
| −0.309017f, | 0.951057f, | −0.195090f, | −0.980785f, |
| 0.649448f, | 0.760406f, | −0.938191f, | −0.346117f, |
| 0.987688f, | −0.156434f, | −0.785317f, | 0.619094f, |
| 0.382683f, | −0.923880f, | 0.117537f, | 0.993068f, |
| −0.587785f, | −0.809017f, | 0.908143f, | 0.418660f, |
| −0.996917f, | 0.078459f, | 0.831470f, | −0.555570f, |
| −0.453990f, | 0.891007f, | −0.039260f, | −0.999229f, |
| 0.522499f, | 0.852640f, | −0.872496f, | −0.488621f, |
| 0.000000f, | −1.000000f, | 0.418660f, | 0.908143f, |
| −0.760406f, | −0.649448f, | 0.962455f, | 0.271440f, |
| −0.987688f, | 0.156434f, | 0.831470f, | −0.555570f, |
| −0.522499f, | 0.852640f, | 0.117537f, | −0.993068f, |
| 0.309017f, | 0.951057f, | −0.678801f, | −0.734322f, |
| 0.923880f, | 0.382683f, | −0.999229f, | 0.039260f, |
| 0.891007f, | −0.453990f, | −0.619094f, | 0.785317f, |
| 0.233445f, | −0.972370f, | 0.195090f, | 0.980785f, |
| −0.587785f, | −0.809017f, | 0.872496f, | 0.488621f, |
| −0.996917f, | −0.078459f, | 0.938191f, | −0.346117f, |
| −0.707107f, | 0.707107f, | 0.346117f, | −0.938191f, |
| 0.078459f, | 0.996917f, | −0.488621f, | −0.872496f, |
| 0.809017f, | 0.587785f, | −0.980785f, | −0.195090f, |
| 0.972370f, | −0.233445f, | −0.785317f, | 0.619094f, |
| 0.453990f, | −0.891007f, | −0.039260f, | 0.999229f, |
| −0.382683f, | −0.923880f, | 0.734322f, | 0.678801f, |
| −0.951057f, | −0.309017f, | 0.993068f, | −0.117537f, |
| −0.852640f, | 0.522499f, | 0.555570f, | −0.831470f, |
| −0.156434f, | 0.987688f, | −0.271440f, | −0.962455f, |
| 0.649448f, | 0.760406f, | −0.908143f, | −0.418660f, |
| −0.000000f, | 1.000000f, | −0.346117f, | −0.938191f, |
| 0.649448f, | 0.760406f, | −0.872496f, | −0.488621f, |
| 0.987688f, | 0.156434f, | −0.980785f, | 0.195090f, |
| 0.852640f, | −0.522499f, | −0.619094f, | 0.785317f, |
| 0.309017f, | −0.951057f, | 0.039260f, | 0.999229f, |
| −0.382683f, | −0.923880f, | 0.678801f, | 0.734322f, |
| −0.891007f, | −0.453990f, | 0.993068f, | 0.117537f, |
| −0.972370f, | 0.233445f, | 0.831470f, | −0.555570f, |
| −0.587785f, | 0.809017f, | 0.271440f, | −0.962455f, |
| 0.078459f, | 0.996917f, | −0.418660f, | −0.908143f, |
| 0.707107f, | 0.707107f, | −0.908143f, | −0.418660f, |
| 0.996917f, | 0.078459f, | −0.962455f, | 0.271440f, |
| 0.809017f, | −0.587785f, | −0.555570f, | 0.831470f, |
| 0.233445f, | −0.972370f, | 0.117537f, | 0.993068f, |
| −0.453990f, | −0.891007f, | 0.734322f, | 0.678801f, |
| −0.923880f, | −0.382683f, | 0.999229f, | 0.039260f, |
| −0.951057f, | 0.309017f, | 0.785317f, | −0.619094f, |
| −0.522499f, | 0.852640f, | 0.195090f, | −0.980785f, |
| 0.156434f, | 0.987688f, | −0.488621f, | −0.872496f, |
| 0.760406f, | 0.649448f, | −0.938191f, | −0.346117f, |
| −0.000000f, | −1.000000f, | 0.271440f, | 0.962455f, |
| −0.522499f, | −0.852640f, | 0.734322f, | 0.678801f, |
| −0.891007f, | −0.453990f, | 0.980785f, | 0.195090f, |
| −0.996917f, | 0.078459f, | 0.938191f, | −0.346117f, |
| −0.809017f, | 0.587785f, | 0.619094f, | −0.785317f, |
| −0.382683f, | 0.923880f, | 0.117537f, | −0.993068f, |
| 0.156434f, | 0.987688f, | −0.418660f, | −0.908143f, |
| 0.649448f, | 0.760406f, | −0.831470f, | −0.555570f, |
| 0.951057f, | 0.309017f, | −0.999229f, | −0.039260f, |
| 0.972370f, | −0.233445f, | −0.872496f, | 0.488621f, |
| 0.707107f, | −0.707107f, | −0.488621f, | 0.872496f, |
| 0.233445f, | −0.972370f, | 0.039260f, | 0.999229f, |
| −0.309017f, | −0.951057f, | 0.555570f, | 0.831470f, |
| −0.760406f, | −0.649448f, | 0.908143f, | 0.418660f, |
| −0.987688f, | −0.156434f, | 0.993068f, | −0.117537f, |
| −0.923880f, | 0.382683f, | 0.785317f, | −0.619094f, |
| −0.587785f, | 0.809017f, | 0.346117f, | −0.938191f, |
| −0.078459f, | 0.996917f, | −0.195090f, | −0.980785f, |
| 0.453990f, | 0.891007f, | −0.678801f, | −0.734322f, |
| 0.852640f, | 0.522499f, | −0.962455f, | −0.271440f, |
| −0.000000f, | 1.000000f, | −0.195090f, | −0.980785f, |
| 0.382683f, | 0.923880f, | −0.555570f, | −0.831470f, |
| 0.707107f, | 0.707107f, | −0.831470f, | −0.555570f, |
| 0.923880f, | 0.382683f, | −0.980785f, | −0.195090f, |
| 1.000000f, | 0.000000f, | −0.980785f, | 0.195090f, |
| 0.923880f, | −0.382683f, | −0.831470f, | 0.555570f, |
| 0.707107f, | −0.707107f, | −0.555570f, | 0.831470f, |
| 0.382683f, | −0.923880f, | −0.195090f, | 0.980785f, |
| 0.000000f, | −1.000000f, | 0.195090f, | 0.980785f, |
| −0.382683f, | −0.923880f, | 0.555570f, | 0.831470f, |
| −0.707107f, | −0.707107f, | 0.831470f, | 0.555570f, |
| −0.923880f, | −0.382683f, | 0.980785f, | 0.195090f, |
| −1.000000f, | −0.000000f, | 0.980785f, | −0.195090f, |
| −0.923880f, | 0.382683f, | 0.831470f, | −0.555570f, |
| −0.707107f, | 0.707107f, | 0.555570f, | −0.831470f, |
| −0.382683f, | 0.923880f, | 0.195090f, | −0.980785f, |
| −0.000000f, | 1.000000f, | −0.195090f, | −0.980785f, |
| 0.382683f, | 0.923880f, | −0.555570f, | −0.831470f, |
| 0.707107f, | 0.707107f, | −0.831470f, | −0.555570f, |
| 0.923880f, | 0.382683f, | −0.980785f, | −0.195090f, |
| −0.000000f, | −1.000000f, | 0.117537f, | 0.993068f, |
| −0.233445f, | −0.972370f, | 0.346117f, | 0.938191f, |
| −0.453990f, | −0.891007f, | 0.555570f, | 0.831470f, |
| −0.649448f, | −0.760406f, | 0.734322f, | 0.678801f, |
| −0.809017f, | −0.587785f, | 0.872496f, | 0.488621f, |
| −0.923880f, | −0.382683f, | 0.962455f, | 0.271440f, |
| −0.987688f, | −0.156434f, | 0.999229f, | 0.039260f, |
| −0.996917f, | 0.078459f, | 0.980785f, | −0.195090f, |
| −0.951057f, | 0.309017f, | 0.908143f, | −0.418660f, |
| −0.852640f, | 0.522499f, | 0.785317f, | −0.619094f, |
| −0.707107f, | 0.707107f, | 0.619094f, | −0.785317f, |
| −0.522499f, | 0.852640f, | 0.418660f, | −0.908143f, |
| −0.309017f, | 0.951057f, | 0.195090f, | −0.980785f, |
| −0.078459f, | 0.996917f, | −0.039260f, | −0.999229f, |
| 0.156434f, | 0.987688f, | −0.271440f, | −0.962455f, |
| 0.382683f, | 0.923880f, | −0.488621f, | −0.872496f, |
| 0.587785f, | 0.809017f, | −0.678801f, | −0.734322f, |
| 0.760406f, | 0.649448f, | −0.831470f, | −0.555570f, |
| 0.891007f, | 0.453990f, | −0.938191f, | −0.346117f, |
| 0.972370f, | 0.233445f, | −0.993068f, | −0.117537f, |
| −0.000000f, | 1.000000f, | −0.039260f, | −0.999229f, |
| 0.078459f, | 0.996917f, | −0.117537f, | −0.993068f, |
| 0.156434f, | 0.987688f, | −0.195090f, | −0.980785f, |
| 0.233445f, | 0.972370f, | −0.271440f, | −0.962455f, |
| 0.309017f, | 0.951057f, | −0.346117f, | −0.938191f, |
| 0.382683f, | 0.923880f, | −0.418660f, | −0.908143f, |
| 0.453990f, | 0.891007f, | −0.488621f, | −0.872496f, |
| 0.522499f, | 0.852640f, | −0.555570f, | −0.831470f, |
| 0.587785f, | 0.809017f, | −0.619094f, | −0.785317f, |
| 0.649448f, | 0.760406f, | −0.678801f, | −0.734322f, |
| 0.707107f, | 0.707107f, | −0.734322f, | −0.678801f, |
| 0.760406f, | 0.649448f, | −0.785317f, | −0.619094f, |
| 0.809017f, | 0.587785f, | −0.831470f, | −0.555570f, |
| 0.852640f, | 0.522499f, | −0.872496f, | −0.488621f, |
| 0.891007f, | 0.453990f, | −0.908143f, | −0.418660f, |
| 0.923880f, | 0.382683f, | −0.938191f, | −0.346117f, |
| 0.951057f, | 0.309017f, | −0.962455f, | −0.271440f, |
| 0.972370f, | 0.233445f, | −0.980785f, | −0.195090f, |
| 0.987688f, | 0.156434f, | −0.993068f, | −0.117537f, |
| 0.996917f, | 0.078459f, | −0.999229f, | −0.039260f, |

};

Each table may correspond to a given value of $M_S$ and include complex entries of a matrix of dimension $(2 M_S) \times (4 M_S)$. As noted above, even-indexed elements (assuming that the indexing start at zero) of the tables may correspond to the real parts of respective matrix entries, whereas odd-indexed elements may correspond to the imaginary parts of respective matrix entries.

To summarize, the above may correspond to the processing of an apparatus for decoding an encoded USAC stream as described above (among others, including a QMF harmonic transposer), for which the QMF based harmonic transposer may comprise a complex-valued $2M_S$ channel analysis filterbank. The complex-valued $2M_S$ channel analysis filterbank may be configured to process an array of $4M_S$ subband samples to obtain an array of $2M_S$ complex-values subband samples. Each complex-valued subband sample among the $2M_S$ real-valued subband samples may be associated with a respective subband among $2M_S$ subbands. Processing the array of $4M_S$ subband samples may involve performing a matrix-vector multiplication of a complex-valued matrix M and the array of $4M_S$ subband samples. Entries of the complex-valued matrix M may depend on a subband index of the respective subband sample among the $2M_S$ complex-valued subband samples to which these matrix entries contribute in the vector-matrix multiplication. The pre-computed information may relate to the entries of the complex-valued matrix M for the matrix-vector multiplication. The entries of the complex-valued matrix M may be determined off-line and stored in one or more look-up tables. The QMF based harmonic transposer may be configured to access the entries of the complex-valued matrix M from the one or more look-up tables at run time.

Moreover, in the QMF transposer, the following code may be performed:

```
#ifndef NEON_CODE
    for ( l=20*resolution-1; l>=2*resolution; l-- ) {
        working_buffer[l] = working_buffer[l-2*resolution];
    }
#else
{
    int32x4x4_t data;
    int32_t    *src, *des;
    register int32_t loopCount, counter;
    loopCount = 18*resolution;
    src = &working_buffer[18*resolution];
    des = &working_buffer[20*resolution];
    for (counter = 0; counter < loopCount; counter += 16)
    {
        src -= 16;
        data = vld4q_s32 (src);
        des -= 16;
        vst4q_s32 (des, data);
    }
}
#endif
```

This vld4q_s32 function is for vector loading of 16 32-bit data elements from a memory location(pointer to this memory is passed as input to this function). Similarly vst4q_s32 function is for vector storing of 16 32-bit data elements into a memory location(pointer to this memory is passed as input to this function). The Vld4q_s32 provides platform optimal instruction and coding, maintenance is easier than actual assembly coding. These two functions achieve the same purpose as assembly coding as well however readability is better for the intrinsic version.

The decoder 2000 may further include a LPC filter tool 2903, which produces a time domain signal from an excitation domain signal by filtering the reconstructed excitation signal through a linear prediction synthesis filter.

The LPC filter(s) may be transmitted in the USAC bitstream (both in ACELP and TCX mode). Therein, the actual number of LPC filters nb_lpc which are encoded within the bitstream depends on the ACELP/TCX mode combination of the USAC frame. The ACELP/TCX mode combination may be extracted from a field (e.g., the lpd_mode field) of the USAC frame, which in turn determines the coding modes, mod[k] for k=0 to 3, for each of the 4 subframes composing the USAC frame. The mode value may be 0 for ACELP, 1 for short TCX (coreCoderFrameLength/4 samples), 2 for medium size TCX (coreCoderFrameLength/2 samples), 3 for long TCX (coreCoderFrameLength samples).

The bitstream may be parsed to extract the quantization indices corresponding to each of the LPC filters required by the ACELP/TCX mode combination. Operations required for decoding one of the LPC filters are described next.

Figure 5:
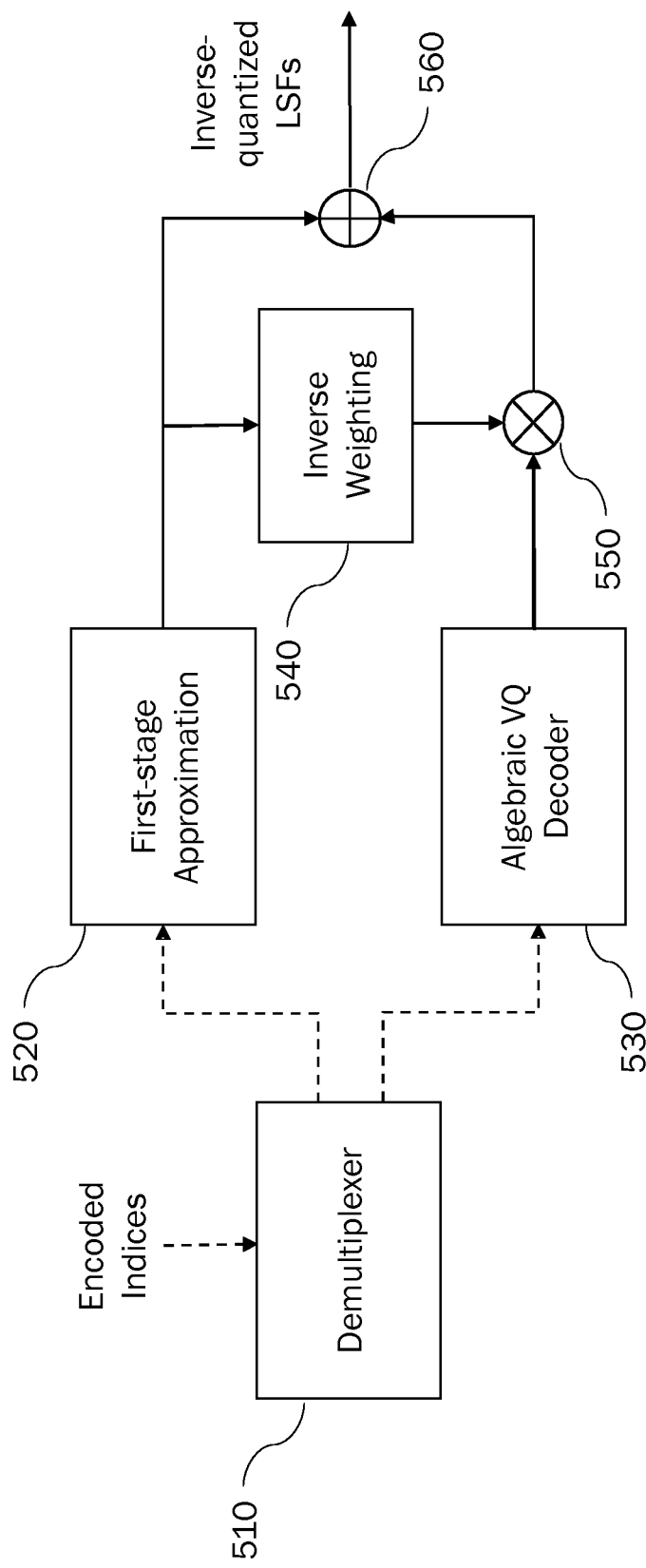
FIG. 5 is a block diagram schematically illustrating inverse quantization of an LPC filter, FIG. 6 schematically illustrates an IMDCT block of the decoder of FIG. 2, and FIG. 7 and FIG. 8 are flowcharts schematically illustrating examples of methods of decoding an encoded USAC stream.

Inverse quantization of an LPC filter is performed as described in FIG. 5.

The LPC filters are quantized using the line spectral frequency (LSF) representation. A first-stage approximation is computed by absolute quantization mode or relative quantization modes. This is described in clause 7.13.6 of the USAC standard, for example, which clause is hereby incorporated by reference in its entirety. Information indicating the quantization mode (mode_lpc) is included in the bitstream. The decoder may extract the quantization mode as a first step of decoding the LPC filter.

An optional algebraic vector quantized (AVQ) refinement is then calculated based on an 8-dimensional RE8 lattice vector quantizer (Gosset Matrix). This is described in clause 7.13.7 of the USAC standard, for example, which clause is hereby incorporated by reference in its entirety. The quantized LSF vector is reconstructed by adding the first-stage approximation and the inverse-weighted AVQ contribution. (For more details refer clauses 7.13.5, 7.13.6, 7.13.7 of ISO/IEC 23003-3:2012). The inverse-quantized LSF vector may be subsequently converted into a vector of LSP (line spectral pair) parameters, then interpolated and converted again into LPC parameters.

In FIG. 5, encoded indices from the USAC bitstream are received by a demultiplexer 510 which outputs data to a first-stage approximation block 520 and an algebraic VQ (AVQ) decoder 530. A first stage approximation of a LSF vector is obtained in block 510. A residual LSF vector is obtained by the AVQ decoder 530. Inverse weights for the residual LSF vector may be determined based on the first-stage approximation of the LSF vector in block 540. Inverse weighting is performed in multiplication unit 550 by applying respective inverse weights to the components of the residual LSF vector. An inverse-quantized LSF vector is obtained in adding unit 560 by adding the first-stage approximation of the LSF vector and the inversely-weighted residual LSF vector.

To build the inverse-quantized LSF vector, information related to the AVQ refinement is extracted from the bitstream. The AVQ is based on an 8-dimensional $RE_8$ lattice vector quantizer. Decoding the LPC filters involves decoding the two 8-dimensional sub-vectors $\hat{B}_k$, k=1, 2 of the weighted residual LSF vector.

The AVQ information for these two sub-vectors may be extracted from the bitstream. It may comprise two encoded codebook numbers qn1 and qn2, and the corresponding AVQ indices. A weighted residual LSF vector is obtained by concatenating the two AVQ refinement subvectors $\hat{B}_1$ and $\hat{B}_2$. This weighted residual LSF vector needs to be inverse-weighted to reverse the weighting that has been performed at the USAC encoder. The following approach for inverse weighting may be used when absolute quantization mode is used.

1) In absolute quantization mode the LSF values may be taken from a table.
2) Next we compute the LSF weights using the following equation $$w(i) = \frac{1}{W} * \frac{400}{\sqrt{d_i . d_{i+1}}}, i = 0...15$$

$$d_0 = LSF1st[0]$$

$$d_{16} = SF/2 - LSF1st[15]$$

$$d_i = LSF1st[i] - LSF1st[i-1], i = 1...15$$

3) As the LSF values are taken from a table, the existing table may be replaced with a pre calculated table in which the LSF weights shown below are already factored in $$\frac{400}{\sqrt{d_i.d_{i+1}}}$$

Accordingly, the inverse weighting by the LSF weights may be implemented off-line to derive (e.g., pre-compute) weighted LSF values prior to run time. At run time, the pre-computed weighted LSF values may be referred to as needed, without computation. For example, the inverse weighted LSF values may be obtained (e.g., read, retrieved) from one or more look-up tables. The actual arrangement of the weighted LSF values within the look-up table(s) may vary, as long as the decoder is provided with a routine to retrieve the appropriate inverse weighted LSF values at run time.

An example of the look up table for use in step 3) is shown below. The use of this look up table allows for avoiding calculation of LSF distance, multiplication of adjacent distance followed by sqrt and division.

```
double weight_table_avq_flt[17 * 256] =
{ 0.85595373254321,
    0.94437839781058,  0.94897456022618,  0.79910696439234,  0.85239492827213,
    0.91887118943841,  0.93248540371499,  0.92672601014431,  0.92333414716754,
    0.92716733877468,  0.93868579306505,  0.97240076035934,  0.97140933716786,
    0.96353221046842,  0.96131228641078,  1.04832811823676,  1.33394815480725,
    1.32261776059138,  0.96096463897978,  0.73009145150866,  0.73913117513624,
    0.82285102423154,  0.86877431502080,  0.87327692519144,  0.85734861723261,
    0.89420070699041,  0.91658705877904,  0.93080442120705,  0.95710742532838,
    0.92362310871747,  0.92295995630919,  0.92908323651360,  0.99576632173507,
    1.24042414105480,  1.02995667382484,  0.97537621081057,  0.91390841527490,
    0.66539003294520,  0.68472422553904,  0.81002183351766,  0.94178263390358,
    0.97800777842415,  0.94112335609774,  0.85559459356390,  0.81263038387255,
    0.85417319138795,  0.87852103977392,  0.93427013034853,  1.05146629989408,
    1.19021996282685,  1.22731010597413,  0.97914389632577,  1.02185267900266,
    1.00612789572312,  0.78248026754809,  0.71750970497005,  0.70878033398294,
    0.72479528718746,  0.77677728048488,  0.86129170397441,  0.94195911036027,
    1.02319651577098,  1.09088647138116,  1.07372679085581,  1.01458846029912,
    0.99008923351943,  1.05357141776010,  0.97769127510350,  0.45840915115910,
    0.43357385905951,  1.21477699586534,  1.08599529897040,  0.60613292050958,
    0.70853570458038,  0.68575155898038,  0.81168126749434,  0.90220792215764,
    0.71725340938257,  0.69674119282821,  1.19028319834431,  1.75210441495995,
    1.15678421034636,  0.87517309626990,  0.93590310989781,  1.08351630364644,
    0.65535915077882,  0.58100763881179,  0.95880508513109,  0.64426900658018,
    0.61790708076220,  1.04534041000414,  0.76739066237464,  0.72128603972492,
    0.82961729730329,  0.61761886847732,  0.60171825807312,  0.94345990631831,
    1.77874332214276,  1.62615512494916,  0.94634538935676,  0.89881574251680,
    1.06784774079492,  0.58035788483398,  0.50693261618010,  0.98212589264723,
    0.75642145791289,  0.64978904565555,  0.83717645106587,  0.75626412993782,
    0.77059807624723,  0.79177345321432,  0.65221438538494,  0.84225194675269,
    1.69694263625979,  1.31412551871200,  0.78197086885406,  0.96747331727553,
    1.21931643126254,  0.96077489968068,  0.46578316685737,  0.50071578236033,
    0.73738770253759,  1.08469564354601,  1.07163148034979,  0.69357639858372,
    0.72434885858900,  0.68538422357448,  0.64519061011961,  1.04628040387400,
    1.59965479627336,  1.17806088197046,  0.81951265322256,  0.92082245393550,
    1.20361627369228,  1.15138510748432,  1.00514081180758,  0.55650264823516,
    0.46242075747358,  0.61438485833339,  0.50994939046334,  0.94780615702001,
    1.39207044265030,  0.78181050049663,  0.95541962297908,  0.86252969578229,
    0.78664944207833,  1.27480190436058,  1.16903532140574,  0.91180718936860,
    0.88345316276254,  0.91907312243723,  1.06866929295103,  1.07836242268417,
    0.55428141969520,  0.52001338735139,  0.73340363083745,  0.54915422075763,
    0.53830185696326,  1.16813634263480,  1.29237483121154,  0.72689187181961,
    1.06737031409789,  1.13785779093191,  0.76863440160708,  0.86801265394350,
    0.97392404920072,  0.90815181078587,  1.03597959947556,  1.28248211369837,
    0.86484302256307,  0.42018721457960,  0.51785682331407,  1.06975287057255,
    1.21814014944603,  0.78366368280128,  0.57615712310786,  0.76814423645064,
    1.15658619212177,  0.86762194243816,  0.86273786888669,  1.41200969753890,
    1.00333715009531,  0.71149797060698,  0.89415616283524,  1.14978024135630,
    1.20740732597291,  1.00604306020314,  0.61592418126590,  0.64182976766077,
    0.94420476135673,  0.75355337965824,  0.73891025471873,  0.96191667160455,
    0.90992365726464,  1.04057088914008,  1.30554723032667,  1.32107678940250,
    1.26481910146337,  1.00867048423668,  0.79515330795239,  0.80626244716684,
    0.79534397646590,  0.91444679505750,  0.91887508278302,  0.56673595648534,
    0.72679597616509,  0.90232844955326,  0.60495791902651,  0.62405457118219,
    0.93227520177938,  1.20194786539111,  1.04759854877602,  1.03344306195794,
    1.06712603368072,  1.02780910598958,  1.05906992019756,  1.01466992939059,
    0.98737563401637,  0.97601604755481,  1.05301157555975,  1.08548807789322,
    0.65842058758335,  0.52839937056214,  1.00448825698835,  0.89853529135696,
    0.59481345715665,  0.88362380468229,  0.85772238642527,  0.85389270975842,
    1.06361730018292,  0.80235823506965,  0.84564491962357,  1.16339267628101,
    0.91617296935587,  0.74258879388914,  0.90112242710089,  1.32709891934003,
    1.11219496926190,  0.37677897147873,  0.54552058712445,  1.37457922755600,
    0.73970317414546,  0.59386809297247,  0.71264418346149,  0.83208151305165,
    0.71996299164252,  0.92218565945723,  1.46294706740199,  0.94726199069948,
```

-continued

| | | | |
|---|---|---|---|
| 0.79373639679877, | 0.85770645113434, | 0.89520409303379, | 1.10913164394451, |
| 1.24200994720635, | 0.88008298123305, | 0.44743238809029, | 0.58846467881264, |
| 1.37391154880164, | 0.81712531979052, | 0.81072829968578, | 0.99375939488206, |
| 0.88073940088267, | 1.21525429593045, | 0.96802803274390, | 0.78389694377403, |
| 0.82147658176371, | 0.84552951475592, | 0.85072684652659, | 0.90063252961193, |
| 0.95771232142232, | 1.06606312923605, | 1.05782253421303, | 0.53621430221199, |
| 0.41189860423475, | 0.61914777153489, | 0.55627354699943, | 0.81838198758638, |
| 1.92750629291728, | 1.50546211112531, | 0.73894592728670, | 0.66811081102554, |
| 0.70909683482309, | 0.63664420189592, | 0.70826432475475, | 0.93315501585264, |
| 0.99160275237076, | 1.02800187091681, | 1.33329959144894, | 1.12704164412313, |
| 0.49765023232431, | 0.51235926564359, | 0.90460990370159, | 0.67671048107267, |
| 0.51159777384827, | 0.60301397301650, | 1.29807920718213, | 1.53414628037613, |
| 0.78024714423007, | 0.78900314999230, | 0.72350822538708, | 0.87759107709805, |
| 1.41764853554107, | 1.25384713035801, | 0.94724226896221, | 0.91462672348933, |
| 0.93686765176057, | 0.55744741034260, | 0.49019093275163, | 0.92155390660884, |
| 0.88585377216730, | 0.61366388334174, | 1.05060936060345, | 1.36985414208499, |
| 0.79082129693058, | 0.87403171358932, | 1.10675770960479, | 0.73420649263795, |
| 0.72916265487958, | 1.09565937285831, | 1.14008159656528, | 0.97469493594059, |
| 1.04344621366785, | 0.95062999422127, | 0.55512881439577, | 0.55140799225572, |
| 0.68145396858709, | 1.11165365116117, | 1.38686172881086, | 1.05649073144331, |
| 1.01934987971749, | 0.73337120125455, | 0.65421865450957, | 0.85595091722288, |
| 1.15325943923953, | 1.17364716016862, | 0.90319661662985, | 0.77366301828774, |
| 0.87980651939285, | 1.10730683492742, | 0.88032362986672, | 0.40512567695389, |
| 0.42102227575113, | 0.95425094763489, | 1.10319807668815, | 1.06311627185893, |
| 1.19939825567189, | 0.86431975068818, | 0.54968662646969, | 0.59762734651798, |
| 1.18482660832784, | 1.42332453801872, | 1.01311304537849, | 0.97314987764014, |
| 1.14680376683255, | 1.01654198469879, | 0.85442856762327, | 0.78053054054267, |
| 0.40624060826176, | 0.37441534056606, | 0.55048843007391, | 1.01081062562976, |
| 1.66768319598333, | 0.88729048710967, | 0.55970837912161, | 0.61874822062329, |
| 1.03521165363873, | 1.41587784292951, | 1.36177897987351, | 1.14279181770547, |
| 0.78240309774156, | 0.70517224293904, | 0.80767399736855, | 1.08691052931137, |
| 0.81625989676305, | 0.36852747799472, | 0.35118539885952, | 0.72812458094984, |
| 1.47510404200042, | 0.94457141318198, | 0.48394983966064, | 0.69849321849508, |
| 1.36833372751703, | 1.60780758936566, | 0.98357823054983, | 0.67045609740723, |
| 0.80193794855714, | 1.05705760796635, | 1.01522932760724, | 0.95000288415302, |
| 1.01704340289487, | 0.90099069800649, | 0.46275623172391, | 0.43606921067604, |
| 0.63226151592752, | 0.91893897229151, | 1.62624412616516, | 0.99983110265439, |
| 0.68545975593732, | 0.75591074052647, | 0.87014537645483, | 1.05019422274819, |
| 0.79299403707653, | 0.67562300204935, | 0.89171234703907, | 1.27411052491883, |
| 1.24963597869160, | 1.16045949681639, | 0.89635498851745, | 0.40999466341448, |
| 0.37054776287374, | 0.53042569143003, | 1.03796797206988, | 1.46534155606511, |
| 0.88697952575083, | 0.74752997743189, | 0.74440880711593, | 0.96699895765323, |
| 1.09328439717796, | 1.05342335348184, | 1.16654443917445, | 1.10729253382154, |
| 1.00573123513886, | 1.01282208014727, | 1.05832584731234, | 0.81439366743576, |
| 0.41856146545526, | 0.39298614777407, | 0.59698914917070, | 1.14989528541627, |
| 1.63964481620572, | 1.06052644083981, | 0.79232835619669, | 0.74338572612363, |
| 0.97227515967182, | 1.15836356269618, | 1.01209859976081, | 0.93995764868636, |
| 0.92158595882111, | 0.96447496476597, | 0.98970625857194, | 1.02952884033472, |
| 0.88939116060146, | 0.45493493896244, | 0.43057210695307, | 0.58976414783657, |
| 0.69302385551796, | 1.49783949319000, | 1.27521614752200, | 0.86493808620798, |
| 0.97664438257486, | 0.83590779652096, | 1.09052097294032, | 1.19336353450494, |
| 0.98830827912773, | 0.85450698284833, | 0.79326515048049, | 0.81838457813830, |
| 0.96269111607466, | 0.72619627888715, | 0.31634290903855, | 0.34692195992777, |
| 0.89271373733265, | 1.48013792143378, | 1.25637434259698, | 1.06182967075770, |
| 1.04555458477319, | 1.01331660480335, | 0.97768007881782, | 0.95799231213776, |
| 0.95447764400028, | 0.95591829536825, | 0.94451678431030, | 0.92520003823911, |
| 0.91116444481404, | 0.98635377540094, | 0.88706785447921, | 0.42203978240671, |
| 0.34467715354391, | 0.47266822987007, | 0.67227581095806, | 1.44482524712446, |
| 1.44197128904492, | 1.07435754798772, | 0.91771583717722, | 0.71439608196155, |
| 0.87222816114460, | 1.14287284657956, | 1.18204402125727, | 1.01950399324880, |
| 0.93488894274766, | 0.96766134720563, | 1.04285914698135, | 0.70184053228046, |
| 0.31121350263077, | 0.45333671117853, | 1.32205006278583, | 1.34606623584335, |
| 1.03421731330806, | 1.01627188162550, | 0.98117738034424, | 0.97124732178184, |
| 0.94933428387956, | 0.94612142142623, | 0.94412930205677, | 0.94208572000855, |
| 0.92590149906399, | 0.91684596384328, | 0.89475968708908, | 0.97900758183881, |
| 0.91669962944081, | 0.49244532981568, | 0.47683797314349, | 0.61964259278336, |
| 0.65950162112119, | 1.43787924848871, | 1.31883577279073, | 0.78368695622022, |
| 0.95394214551889, | 0.82546484106895, | 0.74645630231433, | 0.89523385887138, |
| 1.04857907621325, | 1.07997832386215, | 1.04383022354605, | 0.97081167431038, |
| 1.00110643338394, | 0.85592855279647, | 0.46869364081258, | 0.56678181638293, |
| 1.00663953748410, | 1.24376115564065, | 1.38284351470530, | 1.27390968648453, |
| 1.06272091278940, | 0.89063559008125, | 0.84321879883632, | 0.79295114752489, |
| 0.76609044349139, | 0.80908060261353, | 0.86118392187713, | 0.92377581205749, |
| 0.97574085023076, | 1.08164913400353, | 1.08374278378807, | 0.71557922556599, |
| 0.65725373229257, | 0.93253707719935, | 1.09802156605608, | 1.01643477945894, |
| 0.98302629553042, | 0.98528525844891, | 0.91427685025707, | 0.95958466981520, |
| 0.98091352449590, | 0.94456292531364, | 0.94662888619437, | 0.93803895445395, |
| 0.89813364349382, | 0.87572641256295, | 0.99414235510985, | 1.03599313395488, |
| 0.82566246167335, | 1.013472942008 81, | 1.02163927122269, | 0.88607648614620, |

-continued

| | | | |
|---|---|---|---|
| 1.04624176731025, | 1.03851319310612, | 0.96319078100192, | 0.85451714002678, |
| 0.77095306414550, | 0.75757026137846, | 0.81443195758043, | 0.88988578970875, |
| 0.92578981119052, | 0.94876004770045, | 0.98479054409625, | 1.06826768780519, |
| 1.14615166774442, | 1.01206563448728, | 1.09845162640267, | 1.05888457146714, |
| 0.92401161599867, | 1.00532392110442, | 1.03658374028281, | 0.96860787305925, |
| 0.87534960483029, | 0.81501841439740, | 0.75265106780314, | 0.74947939882359, |
| 0.79734964338835, | 0.84287780262091, | 0.89355826257876, | 0.92594895930929, |
| 1.02451457278536, | 1.24339907015239, | 1.20105166188085, | 1.15655279399527, |
| 0.98473701953374, | 0.95412867094767, | 1.09529115027035, | 1.07827874463258, |
| 1.01533243915615, | 0.88745383807580, | 0.78105068827714, | 0.71109324445840, |
| 0.70699413372640, | 0.72945432915557, | 0.76338450780763, | 0.83129363778666, |
| 0.87814397416708, | 0.95774393184330, | 1.22766487696990, | 1.36299263568387, |
| 1.24295833257188, | 1.11388702703608, | 1.15911148316924, | 1.13492830205689, |
| 0.92183802460816, | 0.80211056700307, | 0.75633224569103, | 0.68976744851626, |
| 0.66625646225253, | 0.73017762623822, | 0.78361583898698, | 0.80849336931526, |
| 0.84157760915356, | 0.84201393745309, | 0.90405534068615, | 1.20676881723048, |
| 1.19765239111939, | 1.07827886723016, | 0.98993063335909, | 0.87536454079091, |
| 0.95427681505408, | 1.03790604477082, | 1.03591665786926, | 1.02100147586263, |
| 0.98660652126718, | 0.89171970476543, | 0.86090392238940, | 0.83094160704980, |
| 0.76369543747906, | 0.73443154670753, | 0.73150033844161, | 0.79218644323786, |
| 0.96833873052854, | 1.00074733483058, | 0.99726155093894, | 0.86946329276338, |
| 0.75689688157317, | 0.87742109095216, | 0.98633242624384, | 0.97260352651874, |
| 0.94250487903545, | 0.96098628815257, | 0.97074961584656, | 0.95940760213366, |
| 0.93790754978522, | 0.91278414785560, | 0.90018350364602, | 0.88434821612976, |
| 0.96077975069377, | 0.77624529109220, | 0.38231100503386, | 0.43236296441663, |
| 1.03044660201836, | 1.07662816983542, | 0.82222382955671, | 0.82612628421835, |
| 0.70183643101925, | 1.12130023441753, | 1.12700724764165, | 0.66916708327477, |
| 0.95812344331321, | 1.20254095937887, | 1.12580155377474, | 0.98127438715376, |
| 0.91824158809235, | 1.07972248340219, | 0.95881315867810, | 0.46782859054495, |
| 0.45260782049745, | 0.61262168975441, | 0.64372528105172, | 1.24862586018593, |
| 1.05552937971909, | 0.92323257360462, | 1.05127024171400, | 0.69795360057817, |
| 0.72627719104170, | 0.74760920843579, | 1.00305491289615, | 1.43589878799492, |
| 1.30798283356968, | 1.05558402044596, | 0.95937106778460, | 0.96548712387308, |
| 0.55764240816208, | 0.48527634189816, | 0.52010819547216, | 0.84867897345163, |
| 1.23848847719675, | 0.78390067383294, | 0.78434810777174, | 0.64424580603122, |
| 0.63449233596329, | 0.83829333077567, | 0.84790025027972, | 0.91418981218255, |
| 1.36079942855389, | 1.53618139928187, | 1.17468840599786, | 1.11607111244203, |
| 1.22254284074569, | 0.83481662914970, | 0.54639043305100, | 0.61440487410159, |
| 0.61969564279808, | 0.62732052968274, | 0.93633493417554, | 0.89195499057133, |
| 0.77697217595481, | 0.94482772836748, | 0.98937710867228, | 0.93993145286938, |
| 0.91469930620984, | 1.25131131929247, | 1.60761639256945, | 1.23307365106106, |
| 0.92768462232315, | 0.94625337634957, | 0.57446207933253, | 0.50238421269583, |
| 0.65137047124232, | 0.61188643360911, | 0.90524182380332, | 0.95520146735085, |
| 0.86682931637776, | 0.77459937395054, | 0.71265147299358, | 1.03467022501334, |
| 1.09752578875075, | 1.22208690293485, | 1.40403973987677, | 1.17749351726709, |
| 1.05296538875047, | 1.06094767567723, | 0.95588089374254, | 0.51032198496405, |
| 0.54295240401417, | 0.68020632428927, | 0.60727863970921, | 0.65246018619899, |
| 0.78376143520279, | 1.51508515818014, | 1.21184862527740, | 0.72197370101913, |
| 0.89939079464296, | 1.50463988262872, | 1.51604497907961, | 0.87278417296150, |
| 0.73156251640515, | 0.69618053211287, | 0.83206846854554, | 0.93943940417650, |
| 0.46172349610141, | 0.43514964454707, | 0.52047481617786, | 0.77042574192407, |
| 1.16330865381269, | 0.79468600633843, | 0.80170758027220, | 0.67559195020729, |
| 1.01484207792086, | 1.45616938851121, | 0.95593951261896, | 0.97338066362312, |
| 0.88322494662599, | 0.90081271501145, | 1.19495596600923, | 1.18694373405597, |
| 1.13201127490814, | 0.68080684748697, | 0.46640964246698, | 0.48448503638232, |
| 0.45368784020561, | 0.89535747739855, | 1.25537571118985, | 0.79179245192638, |
| 0.90703138031741, | 0.77263753807005, | 0.89985725589095, | 1.26021148709808, |
| 0.82472394735492, | 0.90425211549724, | 1.29264300699366, | 1.23415145803586, |
| 1.06964313896111, | 1.01926387142898, | 0.68043433237368, | 0.52894256947334, |
| 0.53422703905776, | 0.50254149557749, | 1.00509905590401, | 1.48831798356698, |
| 0.82372983918836, | 0.62418983869626, | 0.55084814941734, | 0.69769638087818, |
| 1.08930810221581, | 1.04720355105351, | 1.25393821371581, | 1.45082654926858, |
| 1.17636355518817, | 1.04070937409167, | 0.82689435145173, | 0.42185984359647, |
| 0.40570704248027, | 0.58719439935551, | 0.84635547358474, | 1.22421918146524, |
| 1.00710664332185, | 1.03262735132474, | 1.10441981997349, | 1.04830275893516, |
| 1.08447519044851, | 1.06242197001556, | 1.06128920251134, | 1.00593094546454, |
| 1.00107881281834, | 1.01797499175950, | 1.03195959787030, | 0.76431947277785, |
| 0.38150766872468, | 0.45405673414438, | 0.95242425521781, | 1.24912883311495, |
| 1.20212028890846, | 0.74378550188173, | 0.47764237285287, | 0.83010030158813, |
| 1.45049843033882, | 1.11536498769165, | 1.07217898701507, | 1.07129716172891, |
| 0.74645892084980, | 0.81060310250462, | 1.01560388410552, | 1.08830453928204, |
| 0.89482547728177, | 0.57178926119342, | 0.85975749989695, | 1.02335312040537, |
| 0.72414964594507, | 0.84320185036169, | 0.98095381909661, | 1.03609668907543, |
| 1.02210349789132, | 1.01936226079764, | 1.04660893952712, | 1.00677197370637, |
| 0.98476033232067, | 0.95973916250101, | 0.93848902372250, | 0.89976783257572, |
| 0.98168697037534, | 0.91638692383955, | 0.44416141336789, | 0.44309269286120, |
| 1.13013306555790, | 0.90910079593416, | 0.71705239166468, | 0.87163988059863, |
| 0.67925588605870, | 0.92091648984187, | 0.93725043405233, | 0.68265925911360, |
| 1.07199866295546, | 1.42940740321387, | 0.97701629194843, | 0.86363850478634, |

-continued

| | | | |
|---|---|---|---|
| 0.98450953435416, | 1.14684472803005, | 1.06543720510691, | 0.52528757140859, |
| 0.49405020683131, | 1.13597168396925, | 0.81477527444299, | 0.62620729359775, |
| 1.00713161645259, | 0.71935866776494, | 0.94381635533672, | 1.30361402384038, |
| 0.75718328729041, | 0.72219574163241, | 1.02892075417404, | 1.10291662364834, |
| 0.95968584060525, | 0.91226368056568, | 1.05789714329211, | 1.00448578814879, |
| 0.45770399272074, | 0.59383263817525, | 0.95803635127755, | 0.63245595066486, |
| 0.70476382470115, | 0.77375672472953, | 0.77394320185938, | 0.69989352056095, |
| 0.60723666715267, | 0.98111859888735, | 1.69764245255927, | 1.50658139683199, |
| 1.04155815409235, | 1.02479605459725, | 1.06633381717956, | 0.97925018748104, |
| 0.84253780029215, | 0.40039663203292, | 0.63201826861868, | 1.27119260168486, |
| 0.75040230142165, | 0.66934563009748, | 0.73471968262811, | 0.81066431398888, |
| 0.69396950258250, | 0.60438654166695, | 0.92856452415034, | 1.68810010621627, |
| 1.40522280229293, | 0.81528735457245, | 0.89255901312870, | 0.97643151698794, |
| 0.99430595720060, | 1.06327830336813, | 0.56433116352037, | 0.42453866664786, |
| 1.00524330071387, | 1.19015231699103, | 0.56940191862853, | 0.52406511020245, |
| 0.62150410274176, | 0.73450789737846, | 1.24182403524911, | 1.01271927100693, |
| 0.66899404335648, | 0.94892601430984, | 0.98036522575224, | 0.84206118100807, |
| 1.28346967942010, | 1.47606667581562, | 0.91252574057554, | 0.43720699210580, |
| 0.56793587905348, | 0.89537034788442, | 0.79694057457510, | 0.91635681447197, |
| 0.84408254700036, | 0.79894600864325, | 0.87447534436947, | 1.10275705691715, |
| 1.29615386522200, | 1.31309824175094, | 1.21815676720022, | 0.96244836665661, |
| 0.83525720908534, | 0.86306311356665, | 1.06944319952214, | 1.12372129450760, |
| 0.66741661418707, | 0.54719947224962, | 0.73392116144541, | 0.63404246614580, |
| 0.88330397287101, | 1.19594678113584, | 0.87793637114263, | 1.06028400759320, |
| 1.02201754453601, | 0.87357514308204, | 1.11669879714831, | 1.16887540001093, |
| 0.97193570314199, | 0.90292414866140, | 0.85083331840960, | 0.96708589118012, |
| 0.98760492916257, | 0.48994580114557, | 0.55902544571939, | 0.73464471045248, |
| 0.54669051305527, | 0.61251986542790, | 0.90498425987677, | 1.00084680398705, |
| 1.05182949234154, | 1.34918998543389, | 1.45807690607355, | 1.40136273111997, |
| 1.07760032231029, | 0.85198495839502, | 0.84254554838094, | 0.86050438744000, |
| 0.93201775884417, | 1.00695831747958, | 0.54053390530486, | 0.58651444820339, |
| 0.87476761724202, | 0.64795464931331, | 0.72393376058166, | 0.79577067235058, |
| 0.96488646465077, | 0.94328600376520, | 0.62787158308735, | 0.90614867824237, |
| 1.73562094122502, | 1.29792684523831, | 0.75460888487502, | 0.71183046941829, |
| 0.83342636563137, | 1.20184157530792, | 0.96052691556266, | 0.38584862267904, |
| 0.49482294437367, | 1.40487839277766, | 0.94954300320366, | 0.61560342671263, |
| 0.76281589914105, | 0.84968472863839, | 0.83764338730629, | 0.80501763015260, |
| 1.05708581294565, | 1.20027289422706, | 1.06495556199619, | 0.98157937398948, |
| 1.05918416521074, | 1.05492942611578, | 1.04408658591881, | 0.89469332580636, |
| 0.44006863220049, | 0.56473088388758, | 1.22308915572063, | 0.69896513158919, |
| 0.49236368077011, | 0.58578653557487, | 0.92565264688365, | 1.03870774088169, |
| 0.92561463866256, | 1.12853052824049, | 1.12888803853505, | 1.11190557588521, |
| 1.04191642603787, | 1.03690255510976, | 1.01976640800847, | 1.09015769648254, |
| 0.81133591775424, | 0.38944521807692, | 0.48418030798572, | 1.16796833157582, |
| 0.98136456502209, | 0.67473263731193, | 0.70180220059396, | 1.03340452440961, |
| 1.33858750160901, | 0.97004612724545, | 0.98491104061089, | 1.07523600620522, |
| 0.99277483931433, | 0.98737939439434, | 1.00519828313125, | 0.95746295908510, |
| 0.99408859061294, | 0.73472090152102, | 0.35657572090761, | 0.41991793040612, |
| 1.03519143445866, | 1.54014550152936, | 0.88375992418576, | 0.57221138028051, |
| 0.91115210120952, | 1.25877870858124, | 1.09233666812983, | 0.98793732839422, |
| 0.96725887890574, | 0.93433458855802, | 0.89161329387706, | 0.87770512143777, |
| 0.93000077369360, | 1.10016582207185, | 0.93503692759978, | 0.44153914088250, |
| 0.46777018342247, | 1.19742392474690, | 0.83448201234133, | 0.71011221558038, |
| 0.89143841102163, | 0.68678889975432, | 1.10960756402048, | 0.90574685187691, |
| 0.83689286456420, | 1.35488829055257, | 1.15466207397688, | 0.85417276823793, |
| 0.83648507244230, | 0.83023843452328, | 0.91127132400715, | 0.85942445134669, |
| 0.42086889706713, | 0.43786957059181, | 1.05299824239384, | 1.48909739645804, |
| 0.92340417260536, | 0.83660717104800, | 0.98678325034741, | 0.87429959482426, |
| 1.12874125680436, | 1.24806576270197, | 0.86985015914746, | 0.76260834246258, |
| 0.84644395259428, | 0.86477357997711, | 0.89060780251112, | 1.03101712616770, |
| 0.76327120288435, | 0.44371141020621, | 0.85595207269191, | 1.35720236892895, |
| 1.01369668272828, | 0.98387166534982, | 0.98596391886642, | 0.97338980192220, |
| 0.92786768580292, | 0.92515217608795, | 0.92820312449912, | 0.92517322968601, |
| 0.92099569518989, | 0.91175372184456, | 0.90545944600266, | 0.89299974493283, |
| 0.96744774207537, | 0.89517301240352, | 0.44999738164687, | 0.57216323791670, |
| 0.92127089706584, | 0.78429897603725, | 0.94437839387394, | 0.86313597979026, |
| 1.04523441989020, | 0.88355876817608, | 1.01295937568710, | 1.22911770827895, |
| 0.75682594334064, | 0.73240338697369, | 0.74885902418941, | 0.80743177960138, |
| 1.07116255530849, | 1.31007162747548, | 1.15603799978674, | 0.66137215050478, |
| 0.50807828328895, | 0.80012943470262, | 0.76610070832112, | 0.65744632470298, |
| 1.02255496683735, | 0.97523198673909, | 0.85060557381731, | 1.13067898021510, |
| 0.85678341151380, | 0.70093084584937, | 0.96381347491362, | 0.89196068073490, |
| 0.72609319378622, | 1.13681087376677, | 1.59914290361700, | 1.18773054619563, |
| 0.90160608025120, | 1.14099565811009, | 1.13149818204483, | 0.78155826864516, |
| 0.71629228053971, | 0.81053987972056, | 0.89945839079739, | 0.91490457748449, |
| 0.95300639327348, | 0.94289698267617, | 0.92046635989901, | 0.93453172857186, |
| 0.94327995812822, | 0.93199781611127, | 0.91569250290556, | 1.00555932617955, |
| 1.15373294607052, | 1.20248380240459, | 1.33649974538976, | 1.16949895171450, |
| 1.00606779527753, | 0.90101288231619, | 0.72444382834715, | 0.64284902801612, |

-continued

| | | | |
|---|---|---|---|
| 0.65182835598398, | 0.73876641008382, | 0.82082296803186, | 0.88757374604848, |
| 0.93585576937648, | 0.92869573242063, | 0.91772907489686, | 0.92348432195632, |
| 1.00185641724861, | 1.08853351263908, | 1.05736810148110, | 1.31124427937822, |
| 1.13271601479231, | 0.79107525481653, | 0.69375373877047, | 0.65788491558836, |
| 0.71455551393638, | 0.79395286792243, | 0.88645945523714, | 0.92050753202359, |
| 0.93380605222992, | 0.96239008833283, | 0.95379091958881, | 0.94588589893548, |
| 0.96343091395849, | 1.04455885893598, | 1.10960022551980, | 0.79436779786638, |
| 0.70098032425141, | 0.66255879842894, | 0.59809376600402, | 0.94319384006315, |
| 1.20822623831239, | 0.97563344360632, | 1.10476313975741, | 1.14079382707337, |
| 0.84503207326103, | 0.74724518495907, | 0.73618001099981, | 0.80180560050475, |
| 0.99801011553142, | 1.17050742818367, | 1.21216281523504, | 1.06234627845408, |
| 0.53065706113309, | 0.51671221503323, | 1.04744237383058, | 0.70882046704667, |
| 0.75079406250635, | 1.14551466380849, | 0.73543843587980, | 0.93036928891435, |
| 1.01071747717852, | 0.66121822158369, | 0.68290717302121, | 0.76931736508710, |
| 0.85230944183316, | 1.29183127422690, | 1.53266907512072, | 1.11270336667682, |
| 0.85141835730149, | 0.41463898743814, | 0.40800690992888, | 1.41642600119634, |
| 1.31329350621998, | 0.59081582495033, | 0.60416418066144, | 0.65683318833165, |
| 0.77896074935211, | 0.75791875472424, | 0.57615188975281, | 0.62461176952550, |
| 0.77234536638463, | 0.98878056600974, | 1.62678756253257, | 1.49103229392910, |
| 1.00494960560706, | 0.77929760938266, | 0.44180667154124, | 0.53729037597736, |
| 1.01628074114168, | 1.38082954951213, | 1.07754851268538, | 0.59588364632416, |
| 0.48677226974150, | 0.81711933866755, | 1.37296985879328, | 0.87831014410770, |
| 0.68292256459720, | 0.79526858623403, | 0.75604168622391, | 0.82627006227048, |
| 1.29231282794412, | 1.53779245319238, | 1.20029275110064, | 0.59405696744224, |
| 0.51677296279890, | 0.54510886285192, | 0.61028407103199, | 1.30547508112474, |
| 0.97307320651235, | 0.83599220247925, | 0.86079290081802, | 0.52424806629561, |
| 0.54223449295606, | 1.17419584787614, | 1.59730451790078, | 0.92955222755881, |
| 0.86896521637976, | 0.88470391349817, | 1.01593874496077, | 1.20157709722215, |
| 0.80819163806607, | 0.61353242028263, | 0.68159561288511, | 1.06248878354904, |
| 0.94791786834101, | 0.72443436177483, | 0.88767227160575, | 0.77175415178467, |
| 0.79868699368262, | 1.16937763538359, | 1.13692227645968, | 0.90038572616817, |
| 0.89990520105017, | 0.95101997968961, | 0.91073664592159, | 1.13616652610536, |
| 0.98812747388514, | 0.42739531081399, | 0.40757679679536, | 0.84785041934537, |
| 1.37501199622214, | 0.92528963798376, | 0.73188333051770, | 1.04010553883531, |
| 0.83810875427993, | 0.72387851988753, | 1.26667663676551, | 1.06029957568853, |
| 0.54592924009302, | 0.65260440742778, | 1.08090681127881, | 1.26529421163067, |
| 1.18654778763514, | 0.85950236919383, | 0.40087126524438, | 0.42730663910188, |
| 1.03645757079249, | 1.10343951796392, | 0.74949999796112, | 0.91831440865417, |
| 0.86422297677691, | 0.70201677260498, | 1.19714592699524, | 1.26506946720995, |
| 0.76314799335963, | 0.89638574230500, | 1.14646588347305, | 1.06813877532164, |
| 1.02397455576805, | 1.03908793886136, | 1.12648743769525, | 0.67149366173161, |
| 0.52152879423995, | 0.87539058010406, | 0.71449533553218, | 0.56753623173335, |
| 1.06760040741118, | 1.01187027890480, | 0.64160902537879, | 1.04375087523156, |
| 1.05749896940983, | 0.59753885965293, | 0.51382547465002, | 0.92101979655729, |
| 1.50177857986302, | 1.22065017165419, | 1.08412803279180, | 0.85073407395358, |
| 0.42370801974144, | 0.48589096466594, | 1.00535197194229, | 0.96679199047854, |
| 1.05878247675231, | 0.90085999879095, | 0.62632825920932, | 0.60638358959418, |
| 0.93472224041262, | 1.35479999083393, | 0.85355649655183, | 0.71812367178941, |
| 1.05653758118632, | 1.34477872255456, | 1.13836020970198, | 1.07198999250179, |
| 0.80525318076071, | 0.41813739632848, | 0.53292976972320, | 1.03837975554723, |
| 1.07962867116141, | 0.77709308619372, | 0.49052876278419, | 0.55664338840552, |
| 1.15614424548111, | 1.45192682952613, | 1.23492579909540, | 1.00879537290462, |
| 1.02817738055583, | 1.02187250839011, | 1.04489638988611, | 0.99286568370811, |
| 0.91599730094118, | 1.05349872596867, | 0.52965659610085, | 0.40871837246418, |
| 1.11526512225714, | 1.45644701744161, | 0.63351345547983, | 0.53559136215650, |
| 0.70173376945696, | 0.66672185719030, | 0.92743067849647, | 1.17281753591702, |
| 0.76691086180872, | 0.65086908852799, | 0.85022639278386, | 1.26224458135535, |
| 1.49114121051844, | 1.11819861972231, | 0.80718034862640, | 0.39751226350554, |
| 0.39903580199311, | 1.35058766727676, | 1.23983934368865, | 0.53467787314443, |
| 0.56095268344038, | 0.65448327629912, | 0.89862485943454, | 0.89859719322159, |
| 0.82084426778120, | 1.21916780222357, | 1.22971101665519, | 0.89722128242877, |
| 0.80836028994985, | 0.91836093636351, | 1.16118348598803, | 1.02840095617023, |
| 0.46423612561479, | 0.61860696839636, | 0.97459219337668, | 0.64823455103476, |
| 0.92792328532543, | 0.76948889767797, | 0.83902162929510, | 1.09133749542880, |
| 0.56502381138109, | 0.65908883046091, | 1.26169979142038, | 1.36148144776668, |
| 0.98791110993064, | 0.82133451377665, | 0.83422886363249, | 1.07761110246890, |
| 1.23854016475457, | 0.60729671969427, | 0.52946099128474, | 0.96911870695675, |
| 0.61835314556513, | 0.63288377407686, | 0.93320883368368, | 0.76603542195455, |
| 1.02908121994142, | 0.87264666345367, | 0.63350965539286, | 1.06845474631328, |
| 1.55798511203336, | 1.14764322841806, | 0.85885404375737, | 0.82003474382902, |
| 1.00739562626012, | 1.15545023953024, | 0.60465203293573, | 0.47699157551277, |
| 0.58532418086812, | 0.47089617072879, | 0.78602008591641, | 1.19932155308374, |
| 0.83570263322236, | 1.01245481357292, | 0.91674566227142, | 1.01805790204638, |
| 1.21703766688798, | 1.22247753094414, | 1.37165784520495, | 1.11506120967069, |
| 0.88035686368946, | 0.83734084446128, | 0.84356054931533, | 0.50552146142686, |
| 0.49731132269781, | 0.81638108607561, | 0.73464820140820, | 0.88379050746952, |
| 1.14315580386510, | 0.97456454533637, | 1.24360140043460, | 1.18841982940260, |
| 0.78211894650214, | 0.74235893469791, | 0.79217123359612, | 0.82579385924660, |
| 1.03078221114193, | 1.28013737278740, | 1.24547253847772, | 1.06681260343760, |

-continued

| | | | |
|---|---|---|---|
| 0.51145074943578, | 0.56259166594152, | 0.90824157683694, | 0.57313947458412, |
| 0.53370598396711, | 0.64583727765699, | 1.16359688836160, | 1.13009790839275, |
| 0.58664545355931, | 0.68519064553278, | 0.78059450592583, | 0.95758282697242, |
| 1.45277819507646, | 1.49507502432585, | 1.21467437990747, | 1.04877071383816, |
| 0.85206717784156, | 0.43138631077100, | 0.53334156972307, | 1.06113399687343, |
| 0.75522804211824, | 0.74416593847198, | 0.89263454197607, | 0.82234961207180, |
| 0.81074999267053, | 0.93283431928102, | 0.89140305868325, | 1.01216560867724, |
| 1.41222762168824, | 1.21003343676592, | 1.08450828565580, | 1.04458963570372, |
| 1.04968794627633, | 1.13850563770024, | 0.69520230919365, | 0.54175138768006, |
| 0.86717780408562, | 0.76930708945722, | 0.62587618513226, | 0.77577193929213, |
| 0.79749204434293, | 0.88197562735516, | 0.86821628376380, | 0.71601254424188, |
| 0.84184739322049, | 0.95596146311694, | 1.09279362380343, | 1.47381580138293, |
| 1.48693575258117, | 1.20956678511027, | 0.96934761447933, | 0.48097162159214, |
| 0.48373248528480, | 1.13089830798174, | 0.79006754174172, | 0.63431761695912, |
| 0.79310062128105, | 0.78795051377769, | 0.89010742156885, | 0.70169382879125, |
| 0.89819003453470, | 0.99159784821241, | 0.78690206012605, | 1.20177805890029, |
| 1.46633243993372, | 1.21015758283454, | 1.10621801745323, | 1.03202174963849, |
| 0.64523546956517, | 0.47075628505140, | 0.81266186614018, | 1.18174522907781, |
| 0.62914572650852, | 0.59876142846476, | 1.14812764939315, | 0.83556798191350, |
| 0.70652518191354, | 1.12313468862953, | 0.91801696903729, | 0.68173249215866, |
| 0.93626096202897, | 1.24645368257151, | 1.20627817509475, | 1.16799430928220, |
| 1.00142669161963, | 0.49065240044738, | 0.46076694347872, | 1.09396658896219, |
| 0.88125092742229, | 0.62759666488083, | 0.94902173054077, | 0.75231189654521, |
| 0.88950170669326, | 1.04491659023464, | 0.77069525208684, | 0.90967575480005, |
| 1.39150190962467, | 1.41532821375704, | 0.98565330004006, | 0.79323709176324, |
| 0.82627780841450, | 0.81446578185260, | 0.42188483006709, | 0.46874529938695, |
| 0.98442374017116, | 0.79756507804789, | 0.83526079636464, | 0.93570795331666, |
| 0.94489368132320, | 1.02488104835112, | 0.75595725053913, | 0.93560027398480, |
| 1.09044881818861, | 1.11950640519034, | 1.18160647540786, | 1.08493304377219, |
| 1.03702778828146, | 1.03496222241652, | 0.85976688500146, | 0.46443644693147, |
| 0.56109349579575, | 0.97576072630765, | 0.76730998706263, | 1.01624359989679, |
| 1.04041074460981, | 0.84109738819897, | 0.96989098582395, | 0.83067505167947, |
| 0.93492263562489, | 0.97833728661894, | 0.94595179498677, | 1.07426097706074, |
| 1.14472286867601, | 1.04728748922920, | 1.03591018042422, | 0.95719334473321, |
| 0.46634497390369, | 0.46870662148366, | 1.22743011339475, | 0.89405361655096, |
| 0.69299481422855, | 0.93530103544859, | 0.69727675618174, | 0.87381693245989, |
| 0.92929460621124, | 0.68315890700739, | 0.73004428491189, | 0.82225231603150, |
| 1.19142622714945, | 1.61371084101847, | 1.16629623323745, | 0.91511013333111, |
| 0.85906386747582, | 0.43339568096494, | 0.48967724216610, | 1.46709568506568, |
| 0.93555142359501, | 0.56897498993517, | 0.74151804571940, | 0.71580404093829, |
| 1.00801224887672, | 1.02875419720785, | 0.68246381713784, | 0.64246812777619, |
| 0.68862262496173, | 0.96151637253538, | 1.29719028603326, | 1.18612606474177, |
| 1.23139009800916, | 1.18309490901865, | 0.70068437907444, | 0.48899006467106, |
| 0.77958825067144, | 1.26504290187036, | 0.82110778418488, | 0.61896935058269, |
| 0.87292879862266, | 0.79924616328333, | 0.71240497800224, | 0.94747699090643, |
| 0.92142598607578, | 0.84619784862754, | 1.03747998255426, | 0.95006958183398, |
| 0.96239713480801, | 1.44677326835087, | 1.38851188426286, | 0.68216694081634, |
| 0.50201358268062, | 0.60315012108148, | 0.50870987626632, | 0.62092387212705, |
| 1.39934405135769, | 1.44461835891317, | 0.89133503410918, | 0.77477250788084, |
| 0.67526872499684, | 0.62032192119565, | 0.84689372374561, | 1.15184405507169, |
| 1.18087011658216, | 1.27707939966977, | 1.29179622886775, | 1.15145793160655, |
| 0.73073403587645, | 0.58904372702825, | 0.69224797436697, | 0.54804747390251, |
| 0.85011292849812, | 1.22245619962352, | 0.76923790610092, | 0.73198050026689, |
| 0.62978415570274, | 0.56452465545272, | 0.82728141320189, | 0.93807370136254, |
| 1.20674506539697, | 1.71512798775172, | 1.35468284011268, | 1.05108431198717, |
| 0.96057689549032, | 0.50539240415152, | 0.43442940741869, | 0.53899222871364, |
| 0.56750485843914, | 1.18940484272784, | 1.10031581921113, | 0.74826983622027, |
| 0.79025775713301, | 0.75073724622761, | 1.05558961531108, | 1.33914301505921, |
| 1.34410560519886, | 1.16091774744632, | 0.99269311296726, | 0.92849451420448, |
| 0.98550400598755, | 1.18052836976620, | 0.83131266295142, | 0.53371675556827, |
| 0.53261599095445, | 0.49943611642455, | 0.52858263764180, | 1.06492641268726, |
| 1.36653961948959, | 0.80279648964020, | 0.82660269232275, | 0.94735142978640, |
| 0.71979640934610, | 0.94462660748531, | 1.38467933328163, | 1.06173359111704, |
| 0.92502314202415, | 1.20086982723371, | 1.29237542639537, | 0.72152936494582, |
| 0.52926211252633, | 0.73826407778425, | 0.61758685917758, | 0.55538480654311, |
| 0.85874317870799, | 0.86391977915911, | 0.99428086229451, | 1.06821895643293, |
| 0.92161987488684, | 1.05826609582779, | 1.33635020958862, | 1.46443853930365, |
| 1.04462317246005, | 0.78267289150368, | 0.90015220811357, | 0.98491250405378, |
| 0.55092282585583, | 0.55875088374836, | 0.65747898763221, | 0.50422545268680, |
| 0.56367181957635, | 1.13837704776288, | 1.19179325470270, | 0.63024329099913, |
| 0.75013184289288, | 0.88787613473301, | 1.08365639589811, | 1.38713750812611, |
| 1.27975041102022, | 1.12115053569780, | 1.03847536606905, | 1.04269342809816, |
| 0.93781829684740, | 0.44467360753869, | 0.48919208080358, | 0.88022079240516, |
| 0.62278054958700, | 0.56052856127167, | 0.72508547328874, | 1.03325957426029, |
| 0.91945983680715, | 1.01002485495498, | 1.24375649573886, | 1.18412844745371, |
| 1.30283563531043, | 1.17120310383527, | 1.07254561520514, | 0.95076366960764, |
| 0.97127381474155, | 0.81684716736624, | 0.45374082836953, | 0.67090452706171, |
| 1.42241220930611, | 1.09478935741437, | 1.02913835201868, | 1.16758665428352, |
| 1.12655888255441, | 1.10747068632291, | 0.96661745756688, | 0.86882822720548, |

-continued 0.80199773130191, 0.79021763051537, 0.78541471685518, 0.80903442707346,
0.82658518561761, 0.92968814367384, 0.83371940395645, 0.55668683639270,
0.97067097113861, 1.12032191054829, 0.66690905463531, 0.72445008899104,
0.82556541275717, 0.90231362899280, 0.83034445660399, 0.85755667416981,
0.95972257961956, 1.06569544181221, 1.10528807527179, 0.99010803096894,
0.96516073772430, 0.98539898653414, 1.06714536711600, 0.86056441356792,
0.37432329300872, 0.40162658112207, 1.43662427279205, 1.49974796642342,
0.61158050683596, 0.55183475259602, 0.61484618664880, 0.73511805913115,
0.75368202840212, 0.63257926731989, 0.68905793402688, 1.04581076393596,
1.63435272054457, 1.25228629682356, 0.91007003271694, 1.00172748883175,
0.79129471640574, 0.36291772055226, 0.71619634090588, 1.55608871701815,
0.71935936642483, 0.61794841090422, 0.67406541420074, 0.63446856403749,
0.51922250642467, 0.58901012802671, 1.22326032255027, 1.47939668826810,
1.22401558332174, 0.93545924383698, 0.95630835831125, 1.06959936686113,
0.96101326115005, 0.83089212161618, 0.47259843530361, 0.67200089869193,
1.06082746975358, 0.98007152337494, 0.79799845914556, 0.76725329335888,
1.03932319513443, 0.62205341864422, 0.47276380757879, 0.65373153208161,
0.75696332489494, 1.25367492680759, 2.00155389141767, 1.11933528976675,
0.69437360212321, 0.87102568429415, 0.80046060785353, 0.51142014326886,
0.81655595762633, 1.04244941135863, 0.80239073235185, 0.95419493226571,
0.98816766280031, 1.09239590130318, 0.87768111771295, 0.75193622873570,
0.89928909980658, 0.92439339865361, 0.99074338968315, 0.99495689679120,
0.94976117824559, 1.00278960407631, 1.13636457185725, 1.01524926627315,
0.52737915862797, 0.66580296431800, 0.95285404218422, 0.66315213459486,
0.85490959463334, 1.01160563973544, 0.94665816587536, 0.72475371793603,
0.77565952563367, 1.13842670301063, 1.09708240528651, 0.84158055498238,
0.78554728066668, 0.87802939698220, 1.06695485281038, 1.42339443005276,
1.20636826317049, 0.56120702133326, 0.50511845054900, 0.98389433128520,
0.79204940237024, 0.59652162771913, 0.77370105636144, 0.84739287512790,
0.83048960599230, 0.84033364192935, 1.01109267324350, 0.98441526383752,
1.20227969150667, 1.76403914054896, 1.33293495445037, 0.84085160240941,
0.77338274536521, 1.04283897134874, 0.72614606549698, 0.48607164707924,
0.60045592195164, 0.59660562537619, 0.75649531101639, 0.86807012432208,
0.76421278671519, 0.95534409880750, 0.78845737964544, 0.79706754882392,
1.51169560468314, 1.40901052406028, 0.81644071843425, 0.66923151543021,
0.96308686623638, 1.41395326448688, 1.34361679659699, 0.71177929808347,
0.57226150198671, 0.91002329451335, 0.74716337594879, 0.64073410773251,
0.84748549595570, 0.87034470692744, 0.92980229821804, 0.93412841513489,
0.74257644356668, 0.68343968927728, 0.84506065060966, 0.91655160718461,
0.90240060284592, 1.36341329868793, 1.68620352884534, 1.28176381398664,
0.65562805387692, 0.55259185299654, 1.06563395431692, 1.05212123069180,
0.71188300324610, 0.79570329255312, 0.97418478861596, 0.84504117341246,
0.78588472022740, 0.88589897050114, 0.77210510983110, 0.65320249986910,
0.68933643395304, 0.78383635917642, 1.01901168986463, 1.69519262243571,
1.47283653881301, 0.55472751572744, 0.48913360884928, 0.51544575727923,
0.72664036087890, 1.36091608169977, 0.99145597213356, 0.76414285035668,
0.63390916371810, 0.98574546491793, 1.22013278736170, 0.83109205948953,
0.85730613553375, 0.80025427892702, 0.78901522049090, 1.08252646342300,
1.45138554390223, 1.24427075264342, 0.59457689165675, 0.52722396972058,
0.68210425808387, 0.60101919841238, 0.69383667124543, 0.77297709746850,
1.20411367785608, 1.21836688263024, 0.96965978293560, 1.04037144002447,
0.76565559609985, 0.64519285977572, 0.78776023737545, 1.27477934564200,
1.49259198895914, 1.18002246513351, 1.06475389775187, 0.61175878603387,
0.54017997256383, 0.63992445197620, 0.58546879071298, 1.20425187320250,
1.18735965234638, 0.71575443603721, 0.89455321803417, 0.76316503114146,
0.59332851033930, 0.65585272231826, 0.79078310532636, 0.92406180060363,
0.93006202964843, 1.30465835072226, 1.65937002197424, 1.19346082094017,
0.59595447364296, 0.59062486532488, 1.33511998101267, 1.18498998561030,
0.63498090151166, 0.72561640859006, 0.80658986182448, 0.78569326334708,
0.99295608390988, 0.93417552721324, 0.78148090249421, 0.84420465015080,
0.92432603418300, 0.92120638437347, 0.99923586865034, 1.27789304465433,
1.09934800058369, 0.50816494184170, 0.51823855453084, 0.68674254544361,
0.66179877688895, 1.29067884787531, 1.09205817449686, 0.77112986460449,
1.26986061500325, 0.91343195037187, 0.56370895997608, 0.53546796508678,
0.58864108193171, 0.69045592814413, 0.87662343277938, 1.44061182994056,
1.63156032470872, 1.16570016627968, 0.58895995790465, 0.44930420738627,
0.93337227609914, 1.37869729024812, 0.77129334277353, 0.70266745163242,
1.05523259080584, 0.79419955840485, 0.68757582639102, 1.04188196699809,
0.91837024372862, 0.68478512771784, 0.79603857775757, 0.88838869411297,
0.87368738365173, 1.32204558222145, 1.25754791530105, 0.42798701086029,
0.42342239598858, 1.45318924732855, 1.45519964610127, 0.67753922070298,
0.64880994716859, 0.60198239161387, 0.67934069466621, 0.79882141154367,
0.67051478132982, 0.59252605406695, 0.62950096005308, 0.75040364020130,
1.01303727956708, 1.60453605938844, 1.59922671329396, 0.93544846613729,
0.43257751669633, 0.35960570841126, 0.82190689849466, 1.89454665646193,
1.60233372992013, 0.70091862431887, 0.53304600815889, 0.60281684229891,
0.67088292511354, 0.85069905553961, 0.81244025974544, 0.69958586571415,
0.85117036879723, 1.13087489363542, 1.30576538182196, 1.25265737865883,
0.86195053154479, 0.52148934579247, 0.95708863946081, 1.50896018671966, -continued

| | | | |
|---|---|---|---|
| 0.86767918073807, | 0.75070820374852, | 0.77403333723667, | 0.80731786214131, |
| 0.84045714058897, | 0.83311395349565, | 0.89242775985096, | 0.93117048483962, |
| 0.98656529417721, | 0.99898649046249, | 0.98042882563550, | 0.97235154725776, |
| 1.05183127564826, | 0.96321070965340, | 0.46758120170105, | 0.39388612617479, |
| 1.02080057351489, | 1.91978986376493, | 1.25447202675672, | 0.63286141026504, |
| 0.58560774733220, | 0.62846913908942, | 0.69602166732295, | 0.92011894761510, |
| 0.83480209020138, | 0.63201684864645, | 0.64519974730302, | 0.77740583189338, |
| 0.96803367371309, | 1.54548923556375, | 1.15824552330103, | 0.64936517744718, |
| 1.06199645235303, | 1.06619684821607, | 0.73986115659773, | 0.87867837108160, |
| 0.97626003069165, | 0.98663495662042, | 0.96908805533343, | 0.95024752737565, |
| 0.97182857504391, | 0.96420235181472, | 0.95194176528032, | 0.93549185973295, |
| 0.92809115524428, | 0.91835010222975, | 0.98455981074209, | 1.18196870049239, |
| 1.19282938832819, | 0.95662891435284, | 0.69333128125895, | 0.63966424701926, |
| 0.74406525284081, | 0.87922280741270, | 0.93569857992702, | 0.91088218415832, |
| 0.93166072997806, | 0.97125277643217, | 1.02558804967304, | 1.05475929735193, |
| 0.99696962577500, | 0.94270266471743, | 0.91467424176685, | 0.97576094445067, |
| 1.20974201038657, | 1.15178690289235, | 1.05195559052808, | 0.96007300476489, |
| 0.87312522237948, | 0.92114962168937, | 0.97254426444029, | 0.97766141031132, |
| 0.95452918770516, | 0.97852728883374, | 0.93729334962692, | 0.88965452506770, |
| 0.88062967155346, | 0.84047319745612, | 0.80459462871626, | 0.78781220295839, |
| 0.84355322045837, | 1.02555740770975, | 0.98888441505360, | 0.80655500445558, |
| 0.64009851271548, | 0.67586156060598, | 0.92405350904601, | 1.02289661262336, |
| 0.93141334142267, | 0.84436383059343, | 0.85683884673780, | 0.90450122946196, |
| 1.01784522949724, | 1.13302861912803, | 1.08519607890428, | 0.99614900867000, |
| 0.94047666008122, | 1.02338763565789, | 0.99524925122760, | 0.43789706222718, |
| 0.49891715106008, | 1.45253854770076, | 0.80729593253657, | 0.50684243739348, |
| 0.64508087380776, | 0.74149441557364, | 1.09798194164516, | 0.80518969692653, |
| 0.61097561323388, | 0.98265100564598, | 1.52471973362003, | 1.12920910188632, |
| 0.84966447981404, | 0.88760003612433, | 1.00548289024159, | 0.98480186589364, |
| 0.43893722791012, | 0.53171186640046, | 1.50523001926219, | 0.96959719502598, |
| 0.58611277716860, | 0.65919289635203, | 0.66388699448642, | 0.82487287650592, |
| 0.77178537809681, | 0.59428005345830, | 0.57472991407500, | 0.72645312190967, |
| 1.45350575080430, | 1.82279254612489, | 1.13371706451776, | 0.96812869932808, |
| 0.97967946845238, | 0.51629675686740, | 0.41866460532263, | 1.02384189158141, |
| 0.99616535170353, | 0.54496357213907, | 0.56052846146090, | 0.61838227854958, |
| 0.97091476113228, | 1.09314112755723, | 0.72499584403265, | 0.98350443962904, |
| 1.15007038006372, | 0.99359378349333, | 1.22299828896501, | 1.23726468635517, |
| 1.16438331758827, | 1.02118747986078, | 0.47969303781512, | 0.63306495433803, |
| 1.19368070357129, | 0.71345858753597, | 0.66181938882938, | 0.70758558011345, |
| 0.81293952766018, | 0.85264212428341, | 0.60228246697953, | 0.63717472741628, |
| 0.73860335105126, | 0.83606820231618, | 1.43649214312336, | 1.80818185970372, |
| 1.23616506372150, | 1.03198099215255, | 0.81869738335176, | 0.50189391014150, |
| 0.72807351141835, | 0.93521715738110, | 0.88682718553362, | 1.02633191061754, |
| 0.88859365926374, | 0.85796692673724, | 0.76700020586723, | 0.96239189785824, |
| 1.18132089553828, | 1.07911378316458, | 1.04919549225731, | 0.99223023828688, |
| 0.97760398646099, | 0.95796968515102, | 1.01242651076646, | 0.81884507204514, |
| 0.39969351804148, | 0.56882359508726, | 1.52941877019607, | 0.94031338659149, |
| 0.63347979032561, | 0.75429306403422, | 0.86060364912610, | 1.05202277523689, |
| 0.96852731885279, | 0.98661840954442, | 0.96973564417679, | 0.95925585954451, |
| 0.99417018702533, | 0.99913548665534, | 0.96200947180123, | 1.00090236839541, |
| 0.91607045529389, | 0.52823248261759, | 0.56923245636611, | 0.83840576163766, |
| 0.76307946659486, | 1.16175708321196, | 1.28784283089344, | 1.08645597025351, |
| 1.18132780004778, | 0.94011038352328, | 0.74732804568970, | 0.63209969253666, |
| 0.72099385582697, | 1.09150633739410, | 1.33478769613455, | 1.01777580733491, |
| 0.84557575345873, | 1.03756001663423, | 0.87467489163165, | 0.62914763038366, |
| 0.54745095431861, | 0.70410086992917, | 1.13387229982693, | 1.24399784807998, |
| 1.09346092742194, | 0.89434753630757, | 0.77015837203513, | 0.74479764739961, |
| 0.92519145311030, | 1.21778671101523, | 1.14268137034715, | 0.95964532222328, |
| 0.87305731327550, | 0.95477110547846, | 1.12083419043684, | 0.98377861139108, |
| 0.77692255509276, | 0.61893843426559, | 0.79409356767318, | 1.17538282057636, |
| 1.16761163120461, | 1.07293898467584, | 0.97165904030606, | 0.92137077660528, |
| 0.89025657546870, | 0.86979275456216, | 0.88371269311559, | 0.88948830854533, |
| 0.89445813060916, | 0.88729662828524, | 0.97988776638930, | 1.25735959303898, |
| 1.04894897130603, | 0.71678177241736, | 0.62720666297408, | 0.84496273085425, |
| 1.12493620982263, | 0.99229294532123, | 0.85814851520094, | 0.78513446995622, |
| 0.79823672284859, | 0.86869214230263, | 0.93871055800414, | 0.99091852606332, |
| 0.96971748934801, | 0.94523884963498, | 0.96101431303754, | 1.08351567762846, |
| 1.19615162812577, | 1.06539461961738, | 1.12223596222163, | 1.03593917301985, |
| 0.95829801309556, | 0.99309015501396, | 0.89102067220564, | 0.77192173958206, |
| 0.69003666924030, | 0.71255286667889, | 0.77651411233028, | 0.84875177181820, |
| 0.92190602115551, | 0.95517933343832, | 0.96540314272583, | 0.97925714621585, |
| 1.06620342971680, | 1.14535258795435, | 0.92838333975234, | 1.00726462012949, |
| 1.07948700941761, | 0.94641581389073, | 0.89600470308008, | 0.80604861323284, |
| 0.75641733157129, | 0.72245057519090, | 0.73667594910742, | 0.80228748229165, |
| 0.87919064160817, | 0.96230843396829, | 1.01379888937446, | 1.02978301003722, |
| 1.05404795948498, | 1.13195601604924, | 1.29696795414276, | 0.98404622213217, |
| 0.85555868300871, | 0.77158083306429, | 0.62182936775815, | 0.70649182371345, |
| 0.86217391445127, | 0.95433602958162, | 0.90973814031631, | 0.88329725732749, |
| 0.85843544495263, | 0.82148041277704, | 0.91457325743079, | 1.06786005254618, |

| | | | |
|---|---|---|---|
| 1.10823718632863, | 1.10520659270840, | 1.15295001594397, | 1.26833888566124, |
| 1.01632411591161, | 0.81427303427265, | 0.63237078843473, | 0.55231145305713, |
| 0.75526594921313, | 1.05436712440145, | 1.15343823814007, | 1.08580113066000, |
| 1.04199187086614, | 0.95267278241398, | 0.88539033900537, | 0.87176392095297, |
| 0.87580266325122, | 0.92661452317741, | 0.98429664213131, | 1.06529683092972, |
| 1.12456857633873, | 0.63611009470004, | 0.54390690099359, | 0.70520316541785, |
| 0.51713904402756, | 0.81695835769399, | 1.54577028708492, | 0.81748773816082, |
| 0.74553447027244, | 1.11815969922143, | 0.73831312464374, | 0.52850380185289, |
| 0.62184814371113, | 1.18385174896065, | 1.60458851665920, | 1.11679054309495, |
| 0.92529536845920, | 1.01278846027484, | 0.69018148600176, | 0.54384076186291, |
| 0.74837403258155, | 0.66196671623109, | 0.62118348219108, | 1.22814668835193, |
| 1.49072846995975, | 0.82966292519732, | 0.76407069815731, | 0.87796312545094, |
| 0.69664430841480, | 0.72343868401762, | 0.92083649570807, | 0.88341918383790, |
| 0.88586743574262, | 1.38625068894568, | 1.31903538197045, | 0.56506080222609, |
| 0.48860445257593, | 1.06342113809946, | 1.04320337947292, | 0.59222958702562, |
| 0.97753740626908, | 1.06084457298221, | 0.70827548460083, | 1.05297921277418, |
| 1.13681909532395, | 0.79792179326551, | 0.91588895604666, | 0.93411313044638, |
| 0.70749533849282, | 0.76240208058226, | 1.16036066676230, | 1.10989824074902, |
| 0.53891212689063, | 0.53944767888625, | 1.18791669621244, | 0.98063749436426, |
| 0.88158181325789, | 0.95095355006893, | 0.74595527722930, | 1.10828348803274, |
| 0.88845398848681, | 0.68374958264096, | 0.74576891821779, | 0.71207636548999, |
| 0.69459959118725, | 0.84858786345691, | 1.26980901803184, | 1.40296409773446, |
| 1.15270107348271, | 0.56523973538207, | 0.41245924500923, | 0.57473402996340, |
| 0.52912742514624, | 0.61296306524024, | 1.40804917066674, | 1.76447270198891, |
| 0.84748526902710, | 0.70434645374489, | 0.85381100763885, | 0.74667869904448, |
| 0.95655966289376, | 1.17288315977149, | 1.09098893754322, | 1.07841346805072, |
| 1.08452744592443, | 0.94109716509843, | 0.91350788732519, | 1.06995104737992, |
| 1.01690651315208, | 0.97227965771551, | 0.95686315528389, | 0.94677037340346, |
| 0.93647472369498, | 0.92117694171977, | 0.92732885429700, | 0.91616388048418, |
| 0.91809778442906, | 0.90930545624047, | 0.90708062456395, | 0.89685085467076, |
| 0.87877668301818, | 0.96725044939223, | 0.75888545560603, | 0.71859793541011, |
| 1.04879926252624, | 1.08335305316266, | 1.02603403175789, | 0.99575236171555, |
| 0.97256644815295, | 0.95803104906629, | 0.94411187612993, | 0.93698491398080, |
| 0.92923976290888, | 0.92357011166348, | 0.92036951596256, | 0.90597357608778, |
| 0.88689753224791, | 0.85198210995677, | 0.97844728248090, | 1.05364263781350, |
| 0.51190509907150, | 0.49941904566098, | 1.27677106417484, | 1.00222090474587, |
| 0.65497793787719, | 0.77999581056692, | 0.68346576306711, | 0.82841624347795, |
| 0.98912245695252, | 0.70524449118702, | 0.59025927731104, | 0.70161712766607, |
| 0.82790287462378, | 0.94366605459929, | 1.48107107656869, | 1.69339147078908, |
| 1.28799035647737, | 0.86070860752731, | 0.62469600452131, | 0.69503809732878, |
| 0.67812488456440, | 0.57854104852482, | 0.90862454615725, | 1.40869362023191, |
| 0.89661027160534, | 0.69809189535995, | 0.80103134602778, | 0.66003415125936, |
| 0.66639963113197, | 1.02530215269700, | 1.11842364872408, | 1.04153145643477, |
| 1.45541591960589, | 1.36127134280855, | 0.64215550349466, | 0.50077737205705, |
| 0.64667258538741, | 0.61098401752370, | 1.02912125318931, | 1.57391176527729, |
| 0.92544391947562, | 0.76598856135836, | 0.69706786692525, | 0.66535628798901, |
| 1.08543955060383, | 1.17542686097054, | 0.79668733132173, | 0.77332514733090, |
| 0.90414837769290, | 1.26883109655080, | 1.23623645392817, | 0.52770797815693, |
| 0.52734888972529, | 0.67124140687713, | 0.63049185238380, | 0.92787639229413, |
| 1.05254455615231, | 0.88472742276864, | 0.72706695012751, | 0.79969575292600, |
| 1.50017531249347, | 1.70893424104888, | 0.89945188113547, | 0.61788483321191, |
| 0.74087864237785, | 1.04437279381682, | 1.15840651058303, | 0.83326268676005, |
| 0.40310737828675, | 0.47427854077762, | 1.28624972523178, | 1.08952945941177, |
| 0.49738469386011, | 0.47450050206616, | 0.91646022435118, | 1.07873190656740, |
| 0.68625256740474, | 0.75808402877622, | 1.11298923652282, | 1.60690506955067, |
| 1.28685148596761, | 0.92414414079362, | 0.85371266305400, | 0.88482770679931, |
| 0.98098742266145, | 0.48453446799971, | 0.47357941501258, | 0.93565993077364, |
| 0.60889206260961, | 0.48793711237717, | 0.53627566639938, | 0.94973493135368, |
| 1.19317717343663, | 0.75402726787082, | 1.04887811093692, | 0.93474331955614, |
| 0.97960413652671, | 1.38747444677987, | 1.29260896732981, | 1.12883205267665, |
| 0.93394260396369, | 0.83630319455618, | 0.44898301084771, | 0.40809127723630, |
| 0.53851221267464, | 1.03541085108776, | 1.59041682771435, | 0.83824835023997, |
| 0.74692656362376, | 0.65724042653146, | 0.57962553531529, | 0.76510488072038, |
| 1.33490163418832, | 1.38551555741619, | 0.80679060972420, | 0.81209964903071, |
| 1.01549785505224, | 1.12022726507103, | 1.00791161691245, | 0.52672104014511, |
| 0.48209132440983, | 0.62975786760571, | 0.65273452703047, | 0.92987856697142, |
| 1.09120421558534, | 1.15508638012632, | 0.96746069896703, | 0.96375450767305, |
| 0.92003693275305, | 0.79836481222789, | 1.04010269748060, | 1.16037441370753, |
| 1.17798813571429, | 1.16062680691870, | 1.11054534547709, | 0.97612013539304, |
| 0.49331918970187, | 0.45804353588595, | 0.58571281335453, | 0.65298670003711, |
| 1.51035967704841, | 1.13177619842322, | 0.64624403700940, | 0.71606204429635, |
| 0.59515197848924, | 0.61130968936112, | 0.71729095130875, | 0.93526277451972, |
| 1.46887840219035, | 1.49716011693537, | 1.07163647371308, | 1.04200650866605, |
| 1.11556185457470, | 0.69803653866033, | 0.55817540552375, | 0.74976817404667, |
| 0.60290061562703, | 0.68614586110009, | 0.94510880593874, | 0.81229736143305, |
| 1.19285476198310, | 1.15405008909287, | 0.80941841068309, | 1.12304126269340, |
| 1.14382783853030, | 0.85194364892796, | 0.76042987897262, | 0.77493667361792, |
| 1.17174652322504, | 1.12279090844289, | 0.47502554635331, | 0.69417552860429, |
| 1.24899717518365, | 0.69302072284108, | 0.62211876684743, | 0.68312652844461, |

-continued 0.99615690599572, 1.05132957385756, 0.73538848652484, 0.94846247303346,
0.92762349544481, 0.80816622670260, 0.97941531525594, 1.16357707227196,
1.21586423415427, 1.15316887679529, 0.91624699760997, 0.50116006797948,
0.43487582454588, 0.99177268844609, 1.11183340386971, 0.70483450322253,
0.98093150949103, 1.07027107565711, 0.76186509914951, 1.00134968282066,
1.04506457160777, 0.64862649695421, 0.54750608806826, 0.62130555482073,
0.97315904054290, 1.52481572712063, 1.43791764433082, 0.81479544261130,
0.40774085672444, 0.55780347141356, 1.09443285918469, 1.21246981761791,
0.76081519190193, 0.55417805921484, 1.04466278100844, 1.09060047741977,
0.76641694361574, 0.80604467748320, 0.60641366715418, 0.79498371835245,
1.54048984801061, 1.37464402391170, 0.96985280838410, 0.97914953740470,
0.96491418117302, 0.51801351790466, 0.38635334716883, 0.85289318711252,
1.68612981879666, 1.08504979612499, 0.63341516075678, 0.69343848431374,
0.68609947690521, 0.71235650458870, 0.90199289502129, 0.86347601572066,
0.75412520396914, 0.78961882741375, 0.92070514209706, 1.31116435053522,
1.55996068853928, 1.02446607051687, 0.43701819653538, 0.72184307630392,
1.18547341560437, 0.65559771706136, 0.68340140911736, 0.78735280227658,
0.95190572571776, 0.78642102684409, 0.60159471571880, 0.68782038040816,
1.04089462125466, 1.35736459311809, 1.16488730900192, 1.03134231191066,
1.03297852175292, 1.15853072753216, 0.94062089877565, 0.39299262744741,
0.39807768117658, 1.35922214855225, 1.15781459512713, 0.57563516176640,
0.58989367244857, 0.62804707842538, 0.71945477769187, 0.69193405391365,
0.60360704410227, 0.83707027990533, 1.63452567605995, 1.32672239897575,
0.83281870668256, 1.02406390342523, 1.19285137292876, 1.23482574541868,
0.87706317332051, 0.56733903416535, 0.66431182288185, 0.83868634336103,
0.62473214312264, 0.61806634396394, 0.95512341151710, 0.87235217501255,
0.80198013917935, 1.08617743898635, 0.98715235396652, 0.87979611033546,
1.08951009620759, 1.03899395645047, 1.06464812219643, 1.37301128432920,
1.26923650885598, 0.57660201956743, 0.57491991310947, 0.69911006761474,
0.59865778793731, 0.82220125400302, 0.86722771978286, 0.94287048396165,
0.73280536066474, 0.59203090100141, 0.80602644999879, 0.84370869488809,
1.11271364117325, 1.62365513919828, 1.34572436252661, 1.15341712333190,
1.14169519967369, 0.97721629466595, 0.47288788699717, 0.56492282332512,
0.98853584607809, 0.73454992893107, 0.86664200614034, 0.91303253375504,
0.93303429509694, 0.79027886638565, 0.62002116070850, 0.72594833341539,
0.80384747904966, 1.34239929559163, 1.41152045560390, 0.83812143371984,
0.95171749372467, 1.27760873960996, 0.96032811548934, 0.47025561214017,
0.54207422129055, 1.44442938334218, 1.43484791547804, 0.71949170060280,
0.76927178064811, 0.95793554940149, 0.80161972440956, 0.99304690068697,
1.16957199352185, 0.87217851957244, 0.88434692203445, 0.95088621118425,
0.81360639691986, 0.75987398175396, 0.91887095477462, 0.92406411808912,
0.77032710355908, 1.10941105239978, 1.20940775338166, 0.94857105771643,
0.94061613284456, 0.98189791813475, 1.00090939189604, 0.98135812048885,
0.99593571098209, 0.95768468396190, 0.90471630463015, 0.88477425361114,
0.84418630818554, 0.81660431603070, 0.80579954472016, 0.87285461466903,
0.76887788605885, 0.59593908394668, 1.06358714260534, 1.42682620678897,
1.13312228515197, 1.20760922108272, 1.10970762148624, 0.91034641076991,
0.78092308854582, 0.72358133850191, 0.69470141646568, 0.73907042261196,
0.82006151051684, 0.84648145711244, 0.88324660158347, 0.92691464667386,
1.00199088304326, 0.81494534916721, 0.36628178454981, 0.41005726242175,
1.48894705450813, 1.43528377256195, 0.56437614446396, 0.52204788775864,
0.66563267673232, 0.89508271500869, 0.83134377875220, 0.76444417103366,
1.14310216639009, 1.38126036171889, 1.06158656980994, 0.84440797350687,
0.86171631064290, 0.94636096414507, 0.80876506558203, 0.36125568755918,
0.67249223636717, 1.66048531393748, 0.72611779645264, 0.55292678537722,
0.64518952358086, 0.71460466173534, 0.62005649275178, 0.50043628994004,
0.56306956556973, 0.75630203205164, 1.65355943140754, 1.68934389178751,
0.97025251145371, 0.99077882788987, 0.94522148750966, 0.76063104398394,
0.49160854912175, 0.40923095386930, 0.81913570596368, 1.48474144431013,
1.10913188978362, 0.79106888008892, 0.79689948512285, 0.65549781456334,
0.61603010935074, 1.03859753911694, 1.09788888554159, 0.68839289803639,
0.84980616413725, 1.36829530670224, 1.30392254342104, 1.02499146507652,
0.87967778408895, 0.45628768716283, 0.52760624964630, 1.15717164967132,
0.71623704625711, 0.82501103262863, 1.06991948732144, 0.72303042214175,
0.99869861467332, 0.80113524127146, 0.61664073835922, 0.98703457111917,
1.34556307092869, 1.09283497044667, 0.93498511706074, 0.91710789952841,
0.97796183566992, 1.11026946585761, 0.61310936323718, 0.49949040492536,
0.65785846990859, 0.55013295494820, 0.91046937383057, 1.16703765184988,
0.80539759498980, 0.83845001974064, 0.76894920521527, 0.72393889864826,
1.04789046407162, 1.51777863497612, 1.15481207384412, 0.80857431460810,
0.94952871852253, 1.22174063879320, 1.18677621508192, 0.63558247905351,
0.53733979420492, 0.68368232855572, 0.60510369201613, 0.95201071654064,
1.18508018549427, 0.82723272860361, 0.83679055975192, 0.85719415236515,
0.85962694174085, 0.89282430717395, 0.83303935642243, 0.80660860917886,
1.19389163638496, 1.59114819006712, 1.24989731932252, 1.04983320022409,
0.58626846295802, 0.52423535101565, 1.07563083552142, 0.92821005977630,
0.69771378457324, 0.84812696081309, 0.81000939846381, 0.84627416927977,
0.85187529690389, 0.71947449795101, 0.74122076912492, 0.78878930468025,
0.82238212453964, 1.39650241689592, 1.71784822012817, 1.10881420604909, -continued 0.94329141767733, 0.58196804450764, 0.46992046019437, 0.83026757439353,
0.86842934891199, 0.59829220319608, 0.58977292330475, 0.58731809136008,
1.03255992711976, 1.89494355751878, 1.11624773434189, 0.71364358425441,
0.87735593233457, 0.83802989364102, 0.68755545322067, 1.04240859012134,
1.45962358989133, 1.24190920614259, 0.60199495399804, 0.44230930860905,
0.83789305960653, 0.86546652282643, 0.55033787081644, 0.57631923389150,
0.57155906068954, 0.80927645251111, 1.57271083262018, 0.92275655705284,
0.67420727190368, 1.12911928684000, 1.06091475357910, 1.01479767297595,
1.28598249642919, 1.24634354853408, 1.11045187828894, 0.55555131339321,
0.48485478161707, 1.02788262318732, 0.78966657566927, 0.52755043466860,
0.58690920150889, 0.62161953385874, 1.15948983503146, 1.43879108338981,
0.72009649027932, 0.60244262501826, 0.77078027118841, 0.76368080154968,
1.07993129007777, 1.63697419485036, 1.34669171084596, 0.90470260966980,
0.45237472230389, 0.48005442807306, 0.67548605995591, 0.57602735576147,
0.66872875522500, 1.08872497272001, 1.32189424837107, 1.14177586059306,
1.19611645571755, 1.13683034526202, 1.02422490105539, 1.03097195578784,
1.04099298389785, 1.02121739910731, 0.99796877724176, 1.02022654152312,
1.01281358284092, 0.60904288909748, 0.53848197508822, 0.99960923184822,
0.83286162172771, 0.61433939968321, 0.87660424401508, 0.80996196782268,
0.87390816695468, 1.06609863984517, 0.87900553969922, 0.81406203916398,
0.88189781390566, 1.40569041512622, 1.51977523274249, 0.94525716458086,
0.85752377328192, 0.85988867484849, 0.44648373325104, 0.41884017179693,
1.22480121592023, 1.17614200053176, 0.62292146622894, 0.66030437638250,
0.69339253622461, 0.81245648116289, 0.83573022323330, 0.72912122003526,
0.86994236689440, 0.96779105223168, 1.06136802236957, 1.36585248515017,
1.36783610476029, 1.16725921900568, 1.00360009467584, 0.44252852767049,
0.50594484320137, 1.11656859378075, 0.61935698118281, 0.47504957631284,
0.57626045377182, 0.88490148960202, 0.92253429849401, 0.65360404189673,
0.88036347180969, 1.03238959746830, 1.35735655958193, 1.47083112491613,
1.12989125224385, 1.09240276772960, 1.09572170900711, 0.82210654179703,
0.42737777672462, 0.48243912620580, 1.01507858263262, 1.19282360121318,
0.93666373660504, 0.72825192844684, 0.56703640871518, 0.53853680899829,
0.92273684787859, 1.45220850915123, 1.23296445811352, 1.18715268360311,
1.08839578805036, 0.97699606572515, 1.06379269698223, 1.03705163714868,
0.86965560598612, 0.49044455906602, 0.48641257454922, 1.00869275327316,
1.00897238131142, 0.98849920209666, 1.14121822006224, 0.82451012046236,
0.98346679420717, 0.98396477791374, 0.87117664893807, 0.90444329928883,
0.83894120919132, 0.82027628927509, 0.89833548600991, 1.13222052941024,
1.21067171506956, 1.23007326043924, 0.87836032578710, 0.66658641473740,
0.73235751870346, 0.74846973043739, 0.70368830051462, 0.79891824874782,
0.86356229817446, 0.80258232106876, 1.02425743774422, 1.17523343204265,
0.97118742048003, 1.04834064585882, 1.17406723651915, 1.11719890565319,
0.99982311058918, 0.99164231774905, 1.05765757028829, 0.53116835664364,
0.43866454127373, 0.90796678669027, 0.72038805705681, 0.52427921152757,
0.58474986600091, 0.64611571400486, 1.10319512049898, 1.01903088421751,
0.96291179581092, 1.28709764657010, 1.10352856289461, 1.16259202334511,
1.27277521825746, 1.12544836123555, 1.03148486774967, 0.98840787270294,
0.50742499789781, 0.53863676256666, 0.75962242046070, 0.63574453326201,
0.86473595668510, 0.80430450770799, 0.92134821070512, 0.78834898719662,
0.88006107568269, 1.53366835229253, 0.99291069232224, 0.78092673555594,
0.81278519262545, 0.72841077617670, 0.98398001671008, 1.44038441234078,
1.14212310566801, 0.48471700033874, 0.37621835353874, 0.57227227223620,
0.58346864430584, 0.90110651254740, 1.72837536500026, 1.10721761921332,
0.83151711399340, 1.18366666786431, 0.81896496106210, 0.57153241941846,
0.73044852513348, 1.02866466611531, 1.31342216407698, 1.23271892642125,
1.02908119196268, 0.91619265101808, 0.46231577420494, 0.47836703180051,
0.76026868295301, 0.54960442580707, 0.52147053732997, 0.62113197165718,
1.19640559884200, 1.31922386834900, 0.99125073321992, 1.15897179540854,
1.11366893000232, 1.08264307763987, 1.08359151205617, 1.05405806773063,
1.01630940310330, 1.04676842158669, 0.91574312530140, 0.45953696893091,
0.40656578342268, 0.56293650461252, 0.55230484053152, 1.18540890863972,
1.37962741850133, 0.85503936625190, 0.87349363039231, 0.81698957458026,
0.99669916661439, 1.29280317616005, 1.43506404906408, 1.14594283225845,
0.87021687912042, 0.76314243521678, 0.80360617664371, 0.78610116256395,
0.40106739064072, 0.45129564006363, 1.15249708036114, 0.94739844138484,
0.78765697734565, 0.90600237193607, 0.97171433647545, 1.12632708459323,
0.68605074012134, 0.48893732214222, 0.62758421003977, 1.18496233414319,
1.44515918101280, 1.17105597768363, 1.08378612354022, 1.05042423516406,
1.01565239959501, 0.55624263865743, 0.44538887499432, 0.58649739240900,
0.51734186413215, 1.07329099211362, 1.65717912799227, 0.80989340696718,
0.76634911243106, 0.73917606564744, 0.63777889734533, 0.81022131941067,
0.81221503741479, 0.82151912452912, 1.32286681860239, 1.55393229890799,
1.05279301352738, 0.70980778702057, 0.35985549071910, 0.42488312340409,
1.18361988672971, 1.40706333037420, 0.89074998864993, 0.88237887516158,
1.21483994203995, 1.14410750703102, 0.78294670007226, 0.64666090785519,
0.71224567697169, 0.87862932526314, 1.00695032507520, 1.05140033605110,
1.07036861224976, 1.12133746447515, 0.78146026218440, 0.36497592110416,
0.46387234140893, 1.14473349451800, 1.03053166842775, 0.95540155898153,
1.09984638940600, 0.95361251272199, 1.04007283186735, 1.01669102068245, -continued

| | | | |
|---|---|---|---|
| 0.98564632513839, | 0.98344098877470, | 0.97537339905533, | 0.97437172947733, |
| 0.97399260396366, | 0.93350784296120, | 0.96927840229236, | 0.93325666268192, |
| 0.51601330908785, | 0.48114557395410, | 0.62601122242675, | 0.64529293956424, |
| 1.32191302100405, | 1.30316445087910, | 0.84362000786704, | 1.05285709040525, |
| 1.17280272145499, | 1.01578378232012, | 0.78565533167194, | 0.80519158254726, |
| 0.77019412040763, | 0.72262191785760, | 0.78496543710240, | 1.17327551115710, |
| 0.95435564150201, | 0.39633007011421, | 0.47071030504221, | 0.81127738645632, |
| 1.27194957116216, | 1.13114410153412, | 0.72440709738592, | 0.98602233754174, |
| 1.23964156671444, | 0.80143921506010, | 0.56570760380254, | 0.78203993759346, |
| 1.35883617790312, | 1.35886240521747, | 1.01632870756442, | 0.90397666741928, |
| 0.92445236042416, | 0.88625371854219, | 0.43808330103734, | 0.49854736393874, |
| 0.77198394950936, | 0.72930613612315, | 1.25396607662025, | 0.99325512809759, |
| 0.93106091043098, | 0.92732337031270, | 0.52620905741102, | 0.58223430597684, |
| 1.04775817954843, | 1.61733831601639, | 1.12140045000609, | 0.83297857760505, |
| 0.85209086475254, | 0.97504128114258, | 0.88389996968946, | 0.43115893439567, |
| 0.42785511064743, | 0.61483727091825, | 1.08456381506333, | 1.42413817665239, |
| 0.91114802805747, | 0.74276804324520, | 0.74277479683498, | 1.21372029390922, |
| 1.16929702376796, | 0.80646576666582, | 0.80517760489253, | 0.77728333276947, |
| 0.80403636681601, | 1.00675084728096, | 1.33954859957177, | 1.07168599142347, |
| 0.49409942394901, | 0.46536287618151, | 0.56610804776810, | 0.92083324229578, |
| 1.18372483147770, | 0.82602085908234, | 0.85819145474597, | 0.75310813670649, |
| 0.82379890272791, | 0.80361707820197, | 0.81176639204676, | 1.39396507580988, |
| 1.40644921046521, | 0.96199223312859, | 1.00890693628785, | 1.12150682141872, |
| 0.96240952584506, | 0.49253961375807, | 0.55827533468676, | 0.93861538422312, |
| 0.66840950116519, | 0.95559800270772, | 1.04051645703539, | 0.76163283466280, |
| 0.92380980287856, | 0.76973664714467, | 0.66159446048861, | 0.68086896023320, |
| 0.78076682667138, | 1.30110824342622, | 1.66298739818621, | 1.21187364534029, |
| 1.00732368836012, | 0.86173706643826, | 0.51487732764405, | 0.56588333827760, |
| 1.00579135648585, | 1.30908986921459, | 1.05201756407123, | 0.90716265006726, |
| 0.89903803730359, | 0.68857112921050, | 0.73020865583832, | 0.80373438850758, |
| 0.84579215803464, | 1.12575135445493, | 1.16771655308686, | 0.93428419079190, |
| 1.00304833452844, | 1.20247423454685, | 1.01667230256400, | 0.45675687815431, |
| 0.38692219209908, | 0.52230564420081, | 0.61486439199637, | 1.56719133912311, |
| 1.53649163203514, | 0.69217110921212, | 0.64719335230667, | 0.61180460122571, |
| 0.68772813885388, | 0.87637643148250, | 0.90716732234555, | 1.13995263345367, |
| 1.36753703684892, | 1.13413846798793, | 1.00036200326255, | 0.79549084856801, |
| 0.62389593787473, | 1.12565093687460, | 1.40066657992033, | 1.03466617565423, |
| 1.10375395819628, | 1.14894350426992, | 1.08981415800114, | 0.99166917337200, |
| 0.90883331589031, | 0.81033693599672, | 0.77087147524693, | 0.76196206666168, |
| 0.74212427070118, | 0.75540788309159, | 0.77751321304538, | 0.86924652278787, |
| 1.17307198571196, | 1.26880496905881, | 1.16511789293786, | 1.01466973581026, |
| 0.99455107394206, | 1.16322609237142, | 1.13344771075619, | 0.98754420865821, |
| 0.91310007137681, | 0.85702056531583, | 0.78022696301794, | 0.74541999453771, |
| 0.72572875631203, | 0.72340608769598, | 0.73846392526132, | 0.74340768505260, |
| 0.82931507387106, | 1.16986836293898, | 1.30980441872891, | 1.11967637692873, |
| 0.90142273303989, | 0.80699203242323, | 0.83752123513474, | 0.85431769687664, |
| 0.85849102815186, | 0.85191468258005, | 0.88351471312194, | 0.88869819442844, |
| 0.90005667342456, | 0.93020714284337, | 0.89878578755264, | 0.87701125008658, |
| 0.86606942468694, | 0.93442848558028, | 0.82259428342052, | 0.41249866762488, |
| 0.48530364526283, | 1.52689717228147, | 1.15801466252499, | 0.61773880697020, |
| 0.70252824855708, | 0.76502988867364, | 1.05262262335666, | 1.03135767279811, |
| 0.86562887844166, | 0.82933128999612, | 0.79401372771820, | 0.84700958188438, |
| 0.91904635638544, | 0.97320897322385, | 1.16807405529479, | 0.96864953461780, |
| 0.46949426464418, | 0.48866119921038, | 0.54527499812338, | 0.96389703384750, |
| 1.15456589271574, | 0.88970332854759, | 0.99464503051318, | 0.56203152382536, |
| 0.47535412089120, | 0.57634975813544, | 0.72511267927643, | 1.23116642574303, |
| 1.81928691045029, | 1.24937134780309, | 0.84899333794232, | 0.96956951753312, |
| 0.96845382190404, | 0.48579439831319, | 0.40040705866111, | 0.53688251857205, |
| 0.54161793634269, | 1.16401085059290, | 1.50949090070910, | 0.81228784909834, |
| 0.74910612759430, | 0.72918038158524, | 0.98867194341228, | 1.13434657712390, |
| 0.88465567723545, | 1.04666263054262, | 1.20371377634571, | 1.12463338090133, |
| 1.03778161123244, | 0.77278023745431, | 0.40369997244069, | 0.40514230246928, |
| 0.96394566842215, | 1.62759327583382, | 0.96784402615213, | 0.56801728229913, |
| 0.55560358994405, | 0.89581876414938, | 1.13363241399890, | 0.80295245455874, |
| 0.83028026099689, | 1.05368307828905, | 1.17927492623312, | 1.20286753422282, |
| 1.09826953318562, | 0.99271229765115, | 0.94234258841416, | 0.46162174522629, |
| 0.40724426511710, | 0.54259615514866, | 0.59368514942807, | 1.38929303659119, |
| 1.25055634717386, | 0.73481182946335, | 0.72116036858609, | 0.63527796654255, |
| 0.68902166889171, | 1.06056544415778, | 1.52047791274605, | 1.14776993542912, |
| 0.91257666154268, | 0.97948287218709, | 1.10350550313578, | 1.10253937218842, |
| 0.62258643822193, | 0.53323953739138, | 0.70643598641027, | 0.57047452375118, |
| 0.85802988474102, | 1.27865806049845, | 0.88838340642684, | 0.86494163113708, |
| 0.78566280277597, | 0.67475859852359, | 0.77312283307564, | 1.27738680315883, |
| 1.73220740032253, | 1.19764914032380, | 0.84029170072640, | 0.85901585107513, |
| 0.96752879630414, | 0.48094716007340, | 0.51470470170768, | 0.89498926946528, |
| 0.61831489064310, | 0.51667064127240, | 0.58037058063207, | 1.23407200753528, |
| 1.04623460197989, | 0.53376759031597, | 0.67724628269190, | 1.15374489677545, |
| 1.67564426575429, | 1.22525430840183, | 0.96127334833778, | 0.83177449677189, |
| 0.90241639556919, | 0.96800210721866, | 0.49358349577786, | 0.51457224730879, |

-continued 0.61783262756095, 0.84602800080354, 1.15492281821018, 0.87592456260520,
0.88559848604313, 0.60229560911544, 0.49563193609475, 0.68697918244908,
1.32075791617822, 1.77618596106616, 0.94626406016354, 0.66446987183473,
1.02294091489349, 1.25319578931640, 0.96655552346968, 0.47174003028180,
0.64819001939661, 1.11235411981789, 0.62440342438089, 0.71324109920147,
0.79567359443420, 0.88567195748380, 0.89999413936271, 0.61944879218858,
0.63236912530368, 0.91695097730151, 1.63960547117609, 1.36925318682160,
1.00788715828995, 0.98466432100283, 0.92538786374844, 0.93562886756729,
0.57081478771418, 0.56776560739405, 0.60759238990681, 0.73946804033874,
1.21968125823797, 0.85363856597178, 0.97074397450207, 0.88403186327715,
0.57265943198146, 1.00420836037368, 1.60830806974246, 1.13534669544247,
0.78741755691758, 0.78654303038988, 0.82236327982940, 1.04380754317058,
1.08644784097971, 0.50327296918020, 0.54944540931260, 0.73427175121259,
0.56954884182463, 0.67437445422845, 0.81963287324433, 0.84226742077275,
0.66835039020722, 0.83580514533032, 1.58907180116120, 1.40406614040766,
1.00690213160993, 0.92015577291819, 0.92270419374302, 1.17610375285187,
1.16121935865974, 1.02375695182859, 0.58580514640115, 0.53849294541831,
0.92881782188570, 0.70089172349263, 0.59928716555688, 0.76156148747435,
0.92035275363768, 1.24420441761586, 0.90234589908428, 0.86815962160153,
1.10595725413238, 0.78765480361848, 0.79805928090779, 1.23856434880605,
1.35700801845896, 1.16826638947475, 1.02513323479221, 0.51038353897724,
0.45411784805504, 0.88923350528050, 0.65213940484947, 0.50436805155157,
0.53086460269020, 0.68316576366168, 1.52946097024656, 1.24544856108171,
0.83674354281233, 1.14064769513368, 1.13291607232198, 1.01272004714379,
1.00706358399727, 1.00315771787533, 1.11574791276054, 0.80754011768827,
0.37890363825444, 0.45658128601719, 0.87459803839680, 0.83207877210525,
1.01253524119824, 1.30557018775715, 1.14909037347952, 1.06332394264330,
1.03236893106302, 1.02498249758229, 0.99348740227369, 0.98488621086545,
0.97750120066776, 0.96148052920667, 0.93448544784738, 1.00711514983098,
0.76686906392404, 0.36255267991756, 0.34631482351543, 0.65391159753185,
1.25841451114114, 1.27008415898586, 1.00262708587344, 1.06274826131592,
1.07021905019473, 1.02612394268860, 0.95750854532572, 0.98751018766689,
0.99609078317088, 0.98926958214555, 0.98123597359503, 0.96609955809049,
1.01365501936641, 0.77177892698676, 0.37028509699682, 0.42176176678885,
0.95329149608363, 1.08178033227272, 1.12720929861043, 0.96287014598618,
0.72290903144885, 1.11611195051097, 1.09852951247415, 0.85938323021979,
1.18275700868894, 1.43048395549312, 1.07709401113147, 0.82186058256246,
0.64123958486702, 0.74907818451583, 0.99645311263284, 0.60123549471113,
0.49871875959806, 0.67779569778055, 0.60256649012454, 0.74916726396610,
1.68548262303300, 1.44940294675892, 0.71967545600896, 0.83601551658538,
1.02057819423526, 0.80523575358330, 0.98133488286129, 1.03646328683305,
0.79190376110957, 0.79438783880333, 1.03335422688061, 1.00618896310965,
0.53528671668010, 0.55684356772503, 0.60480515504954, 0.76659173029954,
1.22240193019066, 0.94101727202038, 1.02367818475955, 0.91024991221330,
0.91555069749267, 1.04883679658086, 0.93074288413107, 1.03010531217235,
0.99350579758691, 0.92985352634591, 0.91938798996055, 1.13197533782821,
0.95239483600184, 0.45346116795618, 0.61680884913705, 0.95307233565653,
0.72546577060841, 1.05662366481221, 0.96471995795916, 0.99774286551134,
1.09814030059824, 0.74922043308635, 0.98629808963179, 1.12728425415771,
0.98945039028297, 0.89566976662799, 0.83237930591866, 0.87004655674219,
1.04716581085219, 0.91934552980437, 0.48375662420868, 0.44391646280545,
0.96503370664057, 1.42277710066245, 0.71232263763449, 0.72733005861458,
1.11366257934444, 0.71534874530574, 0.80451441150701, 1.20986012774891,
0.90598663919919, 0.86258188642634, 1.12324470596416, 1.07495560596183,
0.94663511734362, 0.96806391025877, 0.90895931074245, 0.47634344422739,
0.37913892589034, 0.90130417889248, 1.85528692577623, 1.10055907877573,
0.58968955836495, 0.60850148676278, 0.61466797447459, 0.76653740742958,
1.12626312304511, 0.94935506256729, 0.76717895976109, 0.91915719891580,
1.11459584756612, 1.14688263045535, 1.12405428101274, 0.88147816120270,
0.39117224929875, 0.49121962226692, 1.70950122941440, 1.14029023944242,
0.51119593430952, 0.57308813612396, 0.69059516288178, 0.97064218661208,
0.92773962961295, 0.76801419280787, 0.73544342740536, 0.69458556064259,
0.93341910271080, 1.24281594287042, 1.14474648221760, 1.12788689815061,
0.85187777300095, 0.41479023795855, 0.73038963075381, 1.59377833649745,
0.81708805511858, 0.66033473465221, 0.78867854181658, 0.83003160292283,
0.73065209976637, 0.62151458760696, 0.76554009880134, 0.99319349134293,
1.11824014775478, 1.18286685513208, 1.18160026905474, 1.05155824278427,
1.05650380683148, 1.36648859726840, 1.70376286579412, 1.25766474950995,
0.89626793913972, 0.79178307314986, 0.67366346255099, 0.62940192556159,
0.63786203409561, 0.71168734952287, 0.85499542451563, 0.91658223816981,
0.90981615959699, 0.90174576838669, 0.86666827439119, 0.85247145008306,
0.86129301925274, 0.99234690165436, 0.88796877798954, 0.41403438985674,
0.39014361682980, 1.18978098352724, 1.54629157337518, 0.69958255147497,
0.56568281849519, 0.62357690020537, 0.85644630667826, 0.92313141620908,
0.70491594605118, 0.84097792572780, 1.44713956537167, 1.49866157025880,
0.91861180310614, 0.78908775455360, 0.86145089148663, 0.85706476047515,
0.41517092531657, 0.63137139783444, 1.11352522011231, 0.63412459218319,
0.65821373949067, 0.72019986525138, 0.79201062789903, 0.61484753829475,
0.57293606604757, 1.32794873513039, 1.36609909096060, 0.94201900681281,

```
0.88787482933431,  0.73351299079424,  1.13295527516071,  1.35963361242576,
0.87379183400868,  0.49390027059983,  0.56716240509193,  0.76641749482172,
0.99874954553817,  1.09237918377496,  0.75089106107051,  0.80225557379238,
0.71394259136358,  0.68300189570329,  0.99532252416698,  1.23578835304815,
1.38102070579753,  1.35519678309012,  1.05241225741641,  0.83544067032775,
0.87512166340909,  0.98570708163918,  0.59600726019572,  0.53518783982898,
0.78034920016927,  0.62262846076508,  0.74914442330876,  1.22714046870200,
0.97787600875511,  1.02280811052425,  0.98137722308807,  0.88265218766684,
0.98222984037935,  1.03142298034758,  1.39960998155537,  1.27113457710662,
0.81858126942993,  0.78343018347310,  0.74243461615014,  0.44969116316829,
0.60921380209357,  1.15317921720796,  1.03641622836038,  1.07155364739398,
1.12571824001694,  1.05533360245943,  1.09040482969903,  1.05977413546333,
1.01961616899090,  0.96654332202665,  0.96672636397273,  0.89846067746577,
0.82208231469255,  0.77649130327915,  0.87942033229259,  0.91970108936651,
0.51667234295336,  0.64867393560846,  1.32260762535184,  0.80986013486607,
0.79548542814760,  0.97776865961639,  0.92115865875088,  0.92881259251435,
0.69639157402102,  0.72752230099335,  0.81034478089563,  0.87277076380937,
1.07064384207956,  1.23776460848189,  1.07567220161490,  1.04121645555839,
1.09407875383376,  0.72397725811063,  0.80580648619230,  1.02449075631278,
0.63731401871642,  0.62100197609698,  0.73280647578278,  0.86216735313079,
1.10792677529279,  0.99819928170638,  1.05261921914002,  1.22540071030836,
1.14054947867979,  0.96658775924043,  0.88966002976604,  0.87559871206552,
0.97512862504693,  0.99217321733009,  0.52413948699035,  0.62581360877453,
0.84937426323239,  0.58510010944888,  0.61059710385407,  0.90628762072896,
1.05890979696911,  0.93816473587991,  1.08325676113263,  0.84255643581034,
1.06625967453135,  1.79805369696441,  1.14940508573879,  0.77837011461010,
0.71330097112937,  0.82480945181459,  0.88658321765762,  0.40650138089408,
0.62723181884847,  1.26052973525032,  0.66491924265002,  0.58377771203840,
0.68352534618110,  0.80648302745928,  0.64650077190638,  0.52392370815027,
0.68974382059284,  1.10297366363284,  1.70543323185742,  1.41527974167092,
1.07661407227863,  1.08754967250234,  1.07455639810854,  0.92267167058573,
0.49142732731060,  0.46303534037451,  1.22870776786566,  1.12251334116702,
0.55439982287862,  0.71172212455771,  0.82271411994816,  0.74632278442069,
1.15500711575087,  1.13398809557865,  0.68904235606041,  0.68601240438345,
1.08925208105994,  1.30810063544474,  1.04524825759451,  1.01566437872913,
0.83745744788357,  0.61909007175689,  1.12447371411976,  1.56564488609123,
1.07217279535399,  0.88086349611249,  0.77316770737124,  0.73391693433741,
0.74152347346462,  0.81471198371897,  0.86715918788465,  0.88892383060305,
0.93554242440839,  0.93696787319442,  0.91833508440408,  0.91950291539796,
1.00356285422491,  1.21911213920259,  1.27058283002614,  1.16537284365061,
1.04954955555719,  1.11223420140270,  1.13393032557219,  0.92778589799922,
0.75697909479321,  0.67701104430551,  0.64538772454157,  0.67411493634016,
0.78206158325749,  0.87995704371624,  0.89769511933497,  0.91159077313288,
0.91659301416901,  0.96580369599323,  1.25890705027063,  1.49758736125802,
1.40374306250819,  1.15373085797292,  0.99533065932040,  0.86468772252843,
0.70650128501461,  0.63029339471079,  0.65120634127355,  0.72075351954225,
0.79060477708832,  0.86958799486307,  0.91369798782629,  0.88020361854637,
0.84792174956322,  0.83534106184875,  0.92797703192035,  1.36008801114308,
1.61131282422306,  1.13027496388862,  0.76959211111878,  0.65676834893455,
0.64107198686013,  0.67558038668463,  0.72536852403188,  0.81541400998789,
0.92332952935052,  0.95851308400102,  0.92932151861094,  0.91116562586550,
0.87266541866380,  0.87914652582160,  0.90581887111362,  1.03931052781019,
1.21961441278013,  1.14968039955442,  1.05061866774983,  0.89663073513324,
0.85213058776295,  0.90027931409462,  0.91486206545441,  0.89904391379329,
0.88769587316443,  0.92440055530665,  0.93291476263113,  0.93836656806989,
0.93404374126117,  0.90291494345339,  0.88635227087679,  0.87229272395439,
0.92150279592429,  0.76172861227412,  0.47917755757272,  0.73929719203532,
1.10482916114774,  1.02770280627891,  1.11637233541548,  1.03557638840796,
0.99563208762931,  0.90556634976261,  0.89828118502772,  0.92698815052928,
0.92533186349373,  0.94107743627930,  0.92440904411712,  0.95523514229218,
0.95980830668236,  1.01669992340873,  0.88939710369018,  0.45425036382719,
0.40919266434930,  1.11345790509790,  2.07941076300535,  1.00525336884598,
0.53808169254526,  0.59328946825662,  0.60071851840980,  0.79396686417395,
1.20478602516240,  0.91322385370616,  0.79574649851195,  0.93086297343716,
0.78285397077496,  0.75626242543093,  1.10439526309145,  0.97151142831272,
0.40567935051674,  0.55666584833892,  1.52451834491998,  1.46502641303945,
1.13508196328337,  1.00091887807154,  0.83465590553743,  0.79750645328493,
0.69835205632583,  0.70887950351321,  0.81188668886436,  0.88673872136047,
0.92781936457309,  0.96740169793989,  0.97413537753922,  1.05276915370416,
0.81491972742679,  0.36919697959756,  0.50720430004501,  1.48291706374777,
1.35501702109777,  0.97479304106791,  0.98073054741379,  0.75376634747300,
0.64447465677278,  0.72648170520338,  0.85434003383423,  0.98965148774214,
1.07513926725123,  1.01493914492665,  0.98671480937965,  1.02648090660716,
1.03926799948262,  0.89817195931335,  0.50366317903876,  0.42602203733690,
0.89621595196921,  1.02644482296698,  0.69055709124052,  1.02843461026713,
1.00886684175931,  0.73360351552953,  1.02273681479373,  0.87422591000660,
0.69430071463757,  1.00412106782266,  1.08296136016874,  1.03316350452123,
1.22334732757421,  1.20476074957153,  0.00000000000000}
```

The following example code illustrates the usage of weight_table_avq_flt discussed above.

```
static WORD32 ixheaacd_avq_first_approx_abs(FLOAT *lsf,
WORD32 *indx)
{
  WORD32 i;
  const FLOAT32 *p_dico;
  extern const FLOAT32 dico_lsf_abs_8b[ ];
  extern const FLOAT32 weight_table_avq[ ];
  WORD32 position = 0, lsf_min;
  const FLOAT32 *ptr_w = &weight_table_avq_flt[indx[0] * 17];
  WORD32 avq[ORDER];
  p_dico = &dico_lsf_abs_8b[indx[0] * ORDER];
  position++;
  position += ixheaacd_decoding_avq_tool(&indx[position], avq);
  lsf_min = LSF_GAP;
  for (i = 0; i<ORDER; i++)
  {
    lsf[i] = *p_dico++ + (ptr_w[i] * avq[i]);
    if (lsf[i] < lsf_min)
      lsf[i] = lsf_min;
    lsf_min = lsf[i] + LSF_GAP;
  }
  return position;
}
```

To summarize, the above may correspond to the processing of an apparatus for decoding an encoded USAC stream that is configured as follows. The apparatus may comprise a core decoder for decoding the encoded USAC stream. The encoded USAC stream may include a representation of a linear predictive coding, LPC, filter that has been quantized using a line spectral frequency, LSF, representation. The core decoder may be configured to decode the LPC filter from the USAC stream. Decoding the LPC filter from the USAC stream may comprise computing a first-stage approximation of a LSF vector, reconstructing a residual LSF vector, if an absolute quantization mode has been used for quantizing the LPC filter, determining inverse LSF weights for inverse weighting of the residual LSF vector by referring to pre-computed values for the inverse LSF weights or their respective corresponding LSF weights, inverse weighting the residual LSF vector by the determined inverse LSF weights, and calculating the LPC filter based on the inversely-weighted residual LSF vector and the first-stage approximation of the LSF vector. The LSF weights may be obtainable using the following equations $$w(i) = \frac{1}{W} * \frac{400}{\sqrt{d_i . d_{i+1}}}, i = 0...15$$

$$d_0 = LSF1st[0]$$

$$d_{16} = SF/2 - LSF1st[15]$$

$$d_i = LSF1st[i] - LSF1st[i-1], i = 1...15,$$

where i is an index indicating a component of the LSF vector, w(i) are the LSF weights, W is a scaling factor, and LSF1st is the first-stage approximation of the LSF vector.

The LSF weights or inverse LSF weights may pre-computed off-line (prior to run time) and stored in one or more look-up tables. Decoding the LPC filter from the USAC stream may involve calling the pre-computed values for the LSF weights or inverse LSF weights from one or more look-up tables during decoding.

Decoding the LPC filter from the USAC stream may further comprise reconstructing algebraic vector quantization, AVQ, refinement sub-vectors of the residual LSF vector from the USAC stream, and concatenating the AVQ refinement sub-vectors to obtain the residual LSF vector. Decoding the LPC filter from the USAC stream may further comprise determining a LSF vector by adding the first-stage approximation of the LSF vector and the inversely-weighted residual LSF vector, converting the LSF vector to the cosine domain to obtain a LSP vector, and determining linear prediction coefficients of the LPF filter based on the LSP vector. Decoding the LPC filter from the USAC stream may further comprise extracting information indicating a quantization mode from the USAC stream and determining whether the absolute quantization mode has been used for quantizing the LPC filter.

Decoding the LPC filter from the USAC stream may comprise retrieving the components of the residual LSF vector from a look-up table. The look-up table may include the components of the inversely-weighted LSF residual vector.

Figure 8:
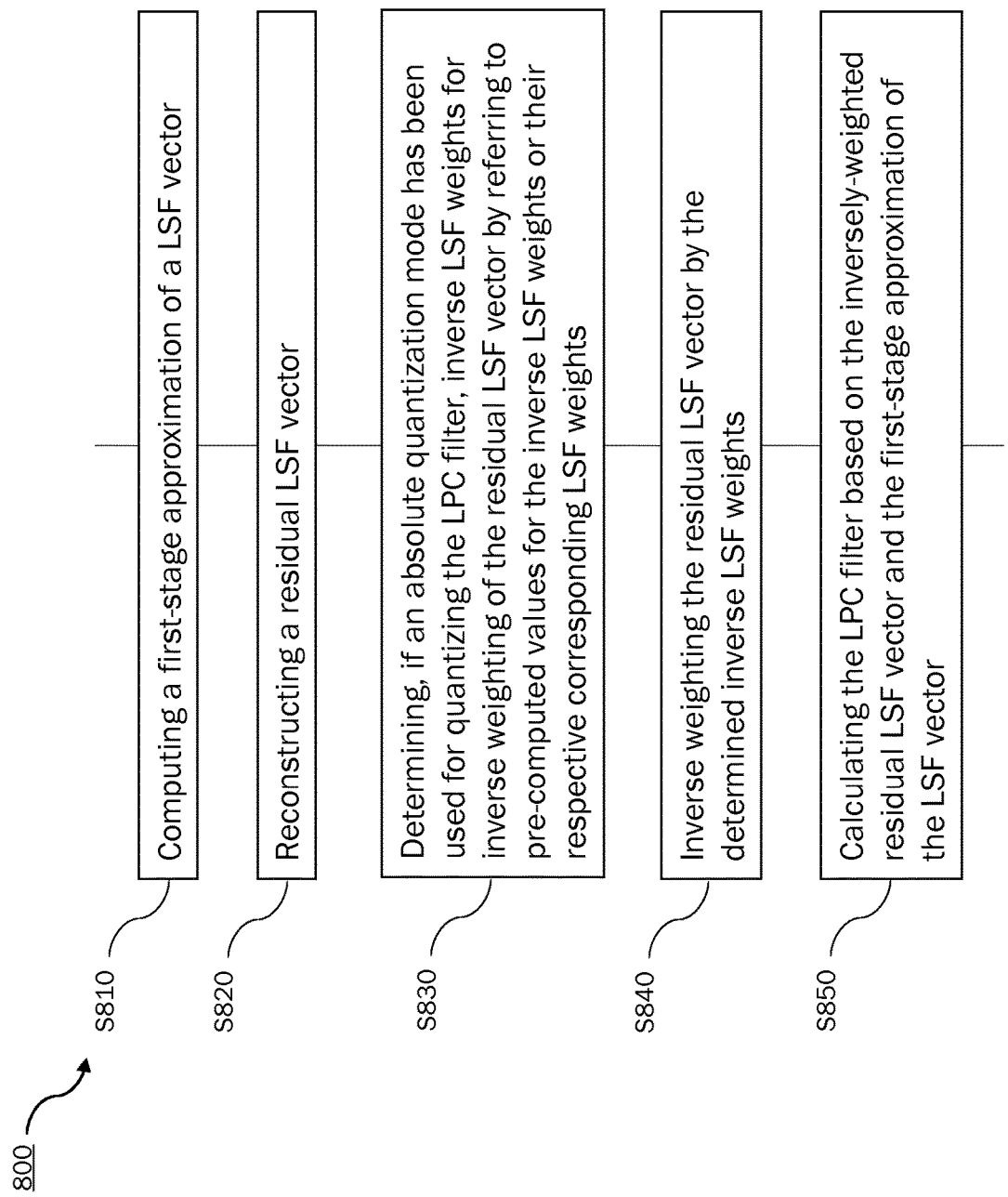

An example of a corresponding method 800 of decoding an LPC filter in the context of decoding a USAC stream is shown in the flowchart of FIG. 8.

At step S810, a first-stage approximation of a LSF vector is computed. At step S820, a residual LSF vector is reconstructed. At step S830, if an absolute quantization mode has been used for quantizing the LPC filter, inverse LSF weights for inverse weighting of the residual LSF vector are determined by referring to pre-computed values for the inverse LSF weights or their respective corresponding LSF weights. At step S840, the residual LSF vector is inversely weighted by the determined inverse LSF weights. At step S850, the LPC filter is calculated based on the inversely-weighted residual LSF vector and the first-stage approximation of the LSF vector. In the above, the LSF are obtainable using the following equations $$w(i) = \frac{1}{W} * \frac{400}{\sqrt{d_i . d_{i+1}}}, i = 0...15$$

$$d_0 = LSF1st[0]$$

$$d_{16} = SF/2 - LSF1st[15]$$

$$d_i = LSF1st[i] - LSF1st[i-1], i = 1...15,$$

where i is an index indicating a component of the LSF vector, w(i) are the LSF weights, W is a scaling factor, and LSF1st is the first-stage approximation of the LSF vector.

The decoder 2000 of FIG. 2 may further include additional components that may be compliant with the Unified Speech and Audio Codec, such as:

a bitstream payload demultiplexer tool 2904, which separates the bitstream payload into the parts for each tool, and provides each of the tools with the bitstream payload information related to that tool;

a scalefactor noiseless decoding tool 2905, which takes information from the bitstream payload demultiplexer, parses that information, and decodes the Huffman and DPCM coded scalefactors;

a spectral noiseless decoding tool 2905, which takes information from the bitstream payload demultiplexer, parses that information, decodes the arithmetically coded data, and reconstructs the quantized spectra;

an inverse quantizer tool 2905, which takes the quantized values for the spectra, and converts the integer values to the non-scaled, reconstructed spectra; this quantizer is preferably a companding quantizer, whose companding factor depends on the chosen core coding mode;

a noise filling tool 2905, which is used to fill spectral gaps in the decoded spectra, which occur when spectral values are quantized to zero e.g. due to a strong restriction on bit demand in the encoder;

a rescaling tool 2905, which converts the integer representation of the scalefactors to the actual values, and multiplies the un-scaled inversely quantized spectra by the relevant scalefactors;

a M/S tool 2906, as described in ISO/IEC 14496-3;

a temporal noise shaping (TNS) tool 2907, as described in ISO/IEC 14496-3;

a filter bank/block switching tool 2908, which applies the inverse of the frequency mapping that was carried out in the encoder; an inverse modified discrete cosine transform (IMDCT) is preferably used for the filter bank tool;

a time-warped filter bank/block switching tool 2908, which replaces the normal filter bank/block switching tool when the time warping mode is enabled; the filter bank preferably is the same (IMDCT) as for the normal filter bank, additionally the windowed time domain samples are mapped from the warped time domain to the linear time domain by time-varying resampling;

an MPEG Surround (MPEGS) tool 2902, which produces multiple signals from one or more input signals by applying a sophisticated upmix procedure to the input signal(s) controlled by appropriate spatial parameters; in the USAC context, MPEGS is preferably used for coding a multichannel signal, by transmitting parametric side information alongside a transmitted downmixed signal;

a Signal Classifier tool, which analyses the original input signal and generates from it control information which triggers the selection of the different coding modes; the analysis of the input signal is typically implementation dependent and will try to choose the optimal core coding mode for a given input signal frame; the output of the signal classifier may optionally also be used to influence the behavior of other tools, for example MPEG Surround, enhanced SBR, time-warped filterbank and others;

an ACELP tool 2909, which provides a way to efficiently represent a time domain excitation signal by combining a long term predictor (adaptive codeword) with a pulse-like sequence (innovation codeword).

Figure 6:
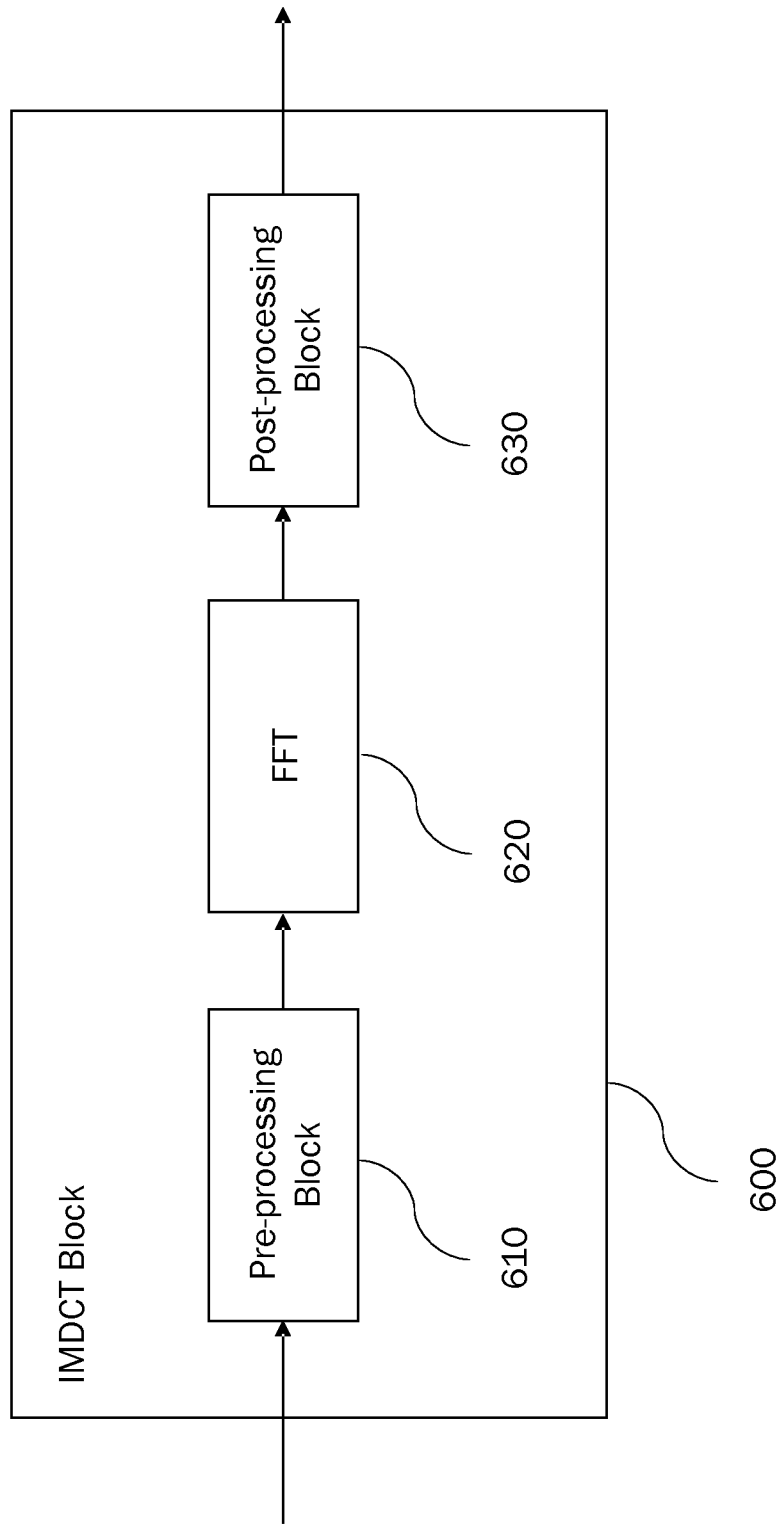

An example of an IMDCT block 600 is schematically illustrated in FIG. 6. In the IMDCT block 600, an FFT module 620 may be utilized. In one implementation, the FFT module implementation is based on Cooley-Tuckey algorithm. The DFT is recursively broken down into small FFTs. The algorithm uses radix-4 for number of points being a power of 4 and mixed radix is used if not power of 4.

The twiddle matrix used by the four point FFT is split as shown below and applied on the input data.

$$\begin{bmatrix} 1 & 1 & 1 & 1 \\ 1 & -j & -1 & j \\ 1 & -1 & 1 & -1 \\ 1 & j & -1 & -j \end{bmatrix} = \begin{bmatrix} 1 & 0 & 1 & 0 \\ 0 & 1 & 0 & -j \\ 1 & 0 & -1 & 0 \\ 0 & 1 & 0 & j \end{bmatrix} \times \begin{bmatrix} 1 & 0 & 1 & 0 \\ 1 & 0 & -1 & 0 \\ 0 & 1 & 0 & 1 \\ 0 & 1 & 0 & -1 \end{bmatrix}$$

The twiddle matrix used by the four point IFFT is split as shown below and applied on the input data.

$$\begin{bmatrix} 1 & 1 & 1 & 1 \\ 1 & j & -1 & -j \\ 1 & -1 & 1 & -1 \\ 1 & -j & -1 & j \end{bmatrix} = \begin{bmatrix} 1 & 0 & 1 & 0 \\ 0 & 1 & 0 & -j \\ 1 & 0 & -1 & 0 \\ 0 & 1 & 0 & j \end{bmatrix} \times \begin{bmatrix} 1 & 0 & 1 & 0 \\ 1 & 0 & -1 & 0 \\ 0 & 1 & 0 & 1 \\ 0 & -1 & 0 & 1 \end{bmatrix}$$

The splitting of the matrix in the above manner helps in utilizing the available ARM registers effectively without additional stack push pops. The reason is that applying the above split matrices requires only one addition subtraction per index, since each column and each row of the split matrices includes only two non-zero entries.

All twiddle factors are pre-computed and the implementation needs only (514) (257 cosine and 257 sine values) twiddle factors for computing all $2^n$ point FFTs up to 1024 ($2^{10}$) point.

C—Implementation can be vectorized according to different processors (e.g., ARM,DSP, X86).

The MDCT block and IMDCT block may be implemented using a pre-computed twiddle block 610 followed by an FFT block (FFT module) 620 and a post twiddle block 630 reducing the processing complexity. Complexity of the blocks is much less than for a direct implementation. Moreover, the block takes leverage of all advantages that the FFT block has. The twiddle table used by pre/post processing blocks may be taken from look up tables.

The following code illustrates the FFT of the present invention:

```
x0r=x0r+(x2r);
x0i=x0i+(x2i);
x2r=x0r-(x2r<<1);
x2i=x0i-(x2i<<1);
x1r=x1r+x3r;
x1i=x1i+x3i;
x3r=x1r-(x3r<<1);
x3i=x1i-(x3i<<1);
x0r=x0r+(x1r);
x0i=x0i+(x1i);
x1r=x0r-(x1r<<1);
x1i=x0i-(x1i<<1);
x2r=x2r+(x3i);
x2i=x2i-(x3r);
x3i=x2r-(x3i<<1);
x3r=x2i+(x3r<<1);
x0r=x0r+x2r;
x0i=x0i+x2i;
x2r=x0r-(x2r<<1);
x2i=x0i-(x2i<<1);
x1r=x1r+x3r;
x1i=x1i+x3i;
x3r=x1r-(x3r<<1);
x3i=x1i-(x3i<<1);
x0r+x0r+x1r;
x0i=x0i+x1i;
x1r=x0r-(x1r<<1);
x1i=x0i-(x1i<<1);
x2r=x2r-x3i;
x2i=x2i+x3r;
x3i=x2r+(x3i<<1);
x3r=x2i-(x3r<<1);
```

To summarize, the above may correspond to the processing of an apparatus for decoding an encoded USAC stream that is configured as follows. The apparatus may comprise a core decoder for decoding the encoded USAC stream. The core decoder may include a fast Fourier transform, FFT, module implementation based on a Cooley-Tuckey algorithm. The FFT module is configured to determine a discrete Fourier transform, DFT. Determining the DFT may involve recursively breaking down the DFT into small FFTs based on the Cooley-Tucker algorithm. Determining the DFT may further involve using radix-4 if a number of points of the FFT is a power of 4 and using mixed radix if the number is not a power of 4. Performing the small FFTs may involve applying twiddle factors. Applying the twiddle factors may involve referring to pre-computed values for the twiddle factors.

The FFT module may be configured to determine the twiddle factors by referring to pre-computed values. The twiddle factors may be pre-computed off-line and stored in one or more look-up tables. Applying the twiddle factors may involve calling the pre-computed values for the twiddle factors from one or more look-up tables during decoding.

The FFT module may be configured to use a twiddle matrix for a 4-point FFT, the twiddle matrix including a plurality of twiddle factors as its entries. The twiddle matrix may be split up into a first intermediate matrix and a second intermediate matrix. A matrix product of the first intermediate matrix and the second intermediate matrix may yield the twiddle matrix. Each of the first and second intermediate matrices may have exactly two entries in each row and in each column. The FFT module may be configured to successively apply the first and second intermediate matrixes to input data to which the twiddle factors are to be applied. The FFT module may be configured to refer to pre-computed values for the entries of the twiddle matrix or to pre-computed values for the entries of the first and second intermediate matrices.

During decoding, complex stereo prediction requires the downmix MDCT spectrum of the current channel pair and, in case of complex_coef=1, an estimate of the downmix MDST spectrum of the current channel pair, i.e. the imaginary counterpart of the MDCT spectrum. The downmix MDST estimate is computed from the current frame's MDCT downmix and, in case of use_prev_frame=1, the previous frame's MDCT downmix. The previous frame's MDCT downmix dmx_re_prev[g] [b] of window group g and group window b is obtained from that frame's reconstructed left and right spectra and the current frame's pred_dir indicator.

During this process, a dmx_length value may be used, where dmx_length value is the even-valued MDCT transform length, which depends on window_sequence. During filtering, a helper function filterAndAdd( ) may perform actual filtering and addition and may be defined based on the following:

Code Snippet of FilterandAdd

```
for (i = 3; i < length-4; i += 2) {
  s = filter[6]*in[i-3] + filter[5]*in[i-2] + filter[4]*in[i-1] +
    filter[3]*in[i] + filter[2]*in[i+1] +
    filter[1]*in[i+2] + filter[0]*in[i+3];
  out[i] += s*factorOdd;
  s = filter[6]*in[i-2] + filter[5]*in[i-1] + filter[4]*in[i] +
    filter[3]*in[i+1] + filter[2]*in[i+2] +
    filter[1]*in[i+3] + filter[0]*in[i+4];
  out[i+1] += s*factorEven;
}
```

Code Snippet of ixheaacd_filter_and_add

```
for (1 = 3; 1 < length-4; i += 2)
{
  sum = 0;
  sum= ixheaacd_mac32x32in64_7(sum, &in[i-3], filter);
  *out += (WORD32)((sum*factor_odd)>>15);
  out++;
  sum = 0,
  sum= izheaacd_mac32x32in64_7(sum, &in[i-2],filter);
  *out += (WORD32)((sum*factor_even)>>15);
    out++,
}
```

The code snippet above indicates that the filter coefficient pointer is accessed in decreasing order while input is accessed in an increasing order. In Neon when these two vectors are loaded, input gets loaded from [v1[0]-v1[3]) and the filter gets loaded from [v2[0]-v2[3]]. As per the formulae above v1[0] will be multiplied with v2[3], which is not supported in Neon. So we would have to reverse the filter or the inputs at run time. This is addressed by the proposed procedure (e.g., shown in the lower code snipped) in which we have re-arranged filter coefficient while storing itself and avoiding any re-arrangement at run time, thus giving improvement in performance (MCPS numbers)

The method and system described in the present document may be implemented as software, firmware and/or hardware. Certain components may e.g. be implemented as software running on a digital signal processor or microprocessor. Other component may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the internet. Typical devices making use of the method and system described in the present document are set-top boxes or other customer premises equipment which decode audio signals. On the encoding side, the method and system may be used in broadcasting stations, e.g. in video headend systems.

The invention claimed is:

1. An apparatus for decoding an encoded Unified Audio and Speech, MPEG-D USAC, stream, the apparatus comprising:
   a core decoder for decoding the encoded Unified Audio and Speech, MPEG-D USAC, stream;
   wherein the core decoder includes a fast Fourier transform, FFT, module implementation based on a Cooley-Tukey algorithm,
   wherein the FFT module is configured to determine a discrete Fourier transform, DFT,
   wherein determining the DFT involves:
     recursively breaking down the DFT into small FFTs based on the Cooley-Tukey algorithm, and
     using radix-4 if a number of points of the FFT is a power of 4 and using mixed radix if the number is not a power of 4, and
   wherein performing the small FFTs involves applying twiddle factors,
   wherein applying the twiddle factors involves referring to pre-computed values for the twiddle factors, and
   wherein the FFT module is further configured to use a twiddle matrix for a 4-point FFT, the twiddle matrix including a plurality of twiddle factors as its entries,
   wherein the twiddle matrix is split up into a first intermediate matrix and a second intermediate matrix, wherein a matrix product of the first intermediate matrix and the second intermediate matrix yields the twiddle matrix, and wherein each of the first and second intermediate matrices has two non-zero entries in each row and in each column, wherein the FFT module is configured to successively apply the first and second intermediate matrixes to input data to which the twiddle factors are to be applied, and wherein the twiddle matrix is split as follows:

$$\begin{bmatrix} 1 & 1 & 1 & 1 \\ 1 & -j & -1 & j \\ 1 & -1 & 1 & -1 \\ 1 & j & -1 & -j \end{bmatrix} = \begin{bmatrix} 1 & 0 & 1 & 0 \\ 0 & 1 & 0 & -j \\ 1 & 0 & -1 & 0 \\ 0 & 1 & 0 & j \end{bmatrix} \times \begin{bmatrix} 1 & 0 & 1 & 0 \\ 1 & 0 & -1 & 0 \\ 0 & 1 & 0 & 1 \\ 0 & 1 & 0 & -1 \end{bmatrix}$$

and applied to the input data.

2. The apparatus according to claim 1, wherein the FFT module is configured to determine the twiddle factors by referring to pre-computed values.

3. The apparatus according to claim 1, wherein the twiddle factors are pre-computed off-line and stored in one or more look-up tables.

4. The apparatus according to claim 1, wherein applying the twiddle factors involves calling the pre-computed values for the twiddle factors from one or more look-up tables during decoding.

5. The apparatus according to claim 1,
wherein the FFT module is configured to refer to pre-computed values for the entries of the twiddle matrix or to pre-computed values for the entries of the first and second intermediate matrices.

6. A method for decoding an encoded Unified Audio and Speech, MPEG-D USAC, stream, the method comprising:
decoding the encoded Unified Audio and Speech, MPEG-D USAC, stream;
wherein the decoding includes using a fast Fourier transform, FFT, module implementation based on a Cooley-Tukey algorithm,
wherein the FFT module implementation includes determining a discrete Fourier transform, DFT,
wherein determining the DFT involves:
recursively breaking down the DFT into smaller FFTs based on the Cooley-Tukey algorithm, and
using radix-4 if a number of points of the FFT is a power of 4 and using mixed radix if the number is not power of 4,
wherein performing the small FFTs involves applying twiddle factors, and
wherein applying the twiddle factors involves referring to pre-computed values for the twiddle factors, and
wherein the FFT module implementation comprises using a twiddle matrix for a 4-point FFT, the twiddle matrix including a plurality of twiddle factors as its entries,
wherein the twiddle matrix is split up into a first intermediate matrix and a second intermediate matrix,
wherein a matrix product of the first intermediate matrix and the second intermediate matrix yields the twiddle matrix, and wherein each of the first and second intermediate matrices has two non-zero entries in each row and in each column,
wherein the FFT module implementation comprises successively applying the first and second intermediate matrixes to input data to which the twiddle factors are to be applied, and
wherein the twiddle matrix is split as follows:

$$\begin{bmatrix} 1 & 1 & 1 & 1 \\ 1 & -j & -1 & j \\ 1 & -1 & 1 & -1 \\ 1 & j & -1 & -j \end{bmatrix} = \begin{bmatrix} 1 & 0 & 1 & 0 \\ 0 & 1 & 0 & -j \\ 1 & 0 & -1 & 0 \\ 0 & 1 & 0 & j \end{bmatrix} \times \begin{bmatrix} 1 & 0 & 1 & 0 \\ 1 & 0 & -1 & 0 \\ 0 & 1 & 0 & 1 \\ 0 & 1 & 0 & -1 \end{bmatrix}$$

and applied to the input data.

7. The method according to claim 6, wherein the FFT module implementation further includes determining the twiddle factors by referring to pre-computed values.

8. The method according to claim 6, wherein the twiddle factors are pre-computed off-line and stored in one or more look-up tables.

9. The method according to claim 6, wherein applying the twiddle factors involves calling the pre-computed values for the twiddle factors from one or more look-up tables during decoding.

10. The method according to claim 6,
wherein the FFT module implementation comprises referring to pre-computed values for the entries of the twiddle matrix or to pre-computed values for the entries of the first and second intermediate matrices.

11. A storage medium comprising a software program adapted for execution on a processor and for performing the method of claim 6 when carried out on a computing device.

* * * * *